(12) United States Patent
Hatakeyama et al.

(10) Patent No.: US 11,342,506 B2
(45) Date of Patent: May 24, 2022

(54) ORGANIC ELECTROLUMINESCENT ELEMENT

(71) Applicants: KWANSEI GAKUIN EDUCATIONAL FOUNDATION, Hyogo (JP); JNC CORPORATION, Tokyo (JP)

(72) Inventors: Takuji Hatakeyama, Hyogo (JP); Yukihiro Fujita, Chiba (JP)

(73) Assignees: KWANSEI GAKUIN EDUCATIONAL FOUNDATION, Hyogo (JP); SK MATERIALS JNC CO., LTD., Gyeonggi-Do (KR)

( * ) Notice: Subject to any disclaimer, the term of this patent is extended or adjusted under 35 U.S.C. 154(b) by 375 days.

(21) Appl. No.: 16/442,701

(22) Filed: Jun. 17, 2019

(65) Prior Publication Data

US 2019/0393419 A1 Dec. 26, 2019

(30) Foreign Application Priority Data

Jun. 20, 2018 (JP) .............................. JP2018-116724
Mar. 15, 2019 (JP) .............................. JP2019-048819

(51) Int. Cl.
*H01L 51/00* (2006.01)
*H01L 51/50* (2006.01)

(52) U.S. Cl.
CPC ........ *H01L 51/0058* (2013.01); *H01L 51/006* (2013.01); *H01L 51/008* (2013.01);
(Continued)

(58) Field of Classification Search
CPC .. C07D 209/80; C07D 209/86; C07D 307/77; C07D 307/91; C07D 333/76; C07F 5/02; C07F 5/027; C09K 11/02; C09K 11/06; C09K 2211/1007; C09K 2211/1014; C09K 2211/1096; H01L 27/32; H01L 51/0052; H01L 51/0059; H01L 51/0061; H01L 51/0071; H01L 51/0072; H01L 51/0073; H01L 51/0074; H01L 51/008;
(Continued)

(56) References Cited

U.S. PATENT DOCUMENTS

2008/0154040 A1* 6/2008 Kosuge ................ C07D 401/04
546/111
2015/0171359 A1* 6/2015 Forrest ................ H01L 51/5004
257/40
(Continued)

FOREIGN PATENT DOCUMENTS

JP 2011-6397 1/2011
JP WO2014/141725 9/2014
(Continued)

OTHER PUBLICATIONS

Sid, vol. 50, Issue 1, Jun. 2019, pp. 1924-1927. (Year: 2019).*

*Primary Examiner* — Dawn L Garrett
(74) *Attorney, Agent, or Firm* — Wenderoth, Lind & Ponack, L.L.P.

(57) ABSTRACT

An organic electroluminescent element includes a light emitting layer containing a polycyclic aromatic compound represented by (1) or its multimer having plural structures represented by (1) and an anthracene-based compound represented by (3). In (1) and (3), rings A to C represent optionally substituted aryl rings or heteroaryl rings, $X^1$ and $X^2$ represent >O, >N—R, >C(—R)$_2$, >S, or >Se, R in >N—R represents aryl etc., R in >C(—R)$_2$ represents hydrogen etc., R in >N—R and/or R in >C(—R)$_2$ may be bonded to ring A, B, and/or C via linking group or single bond, X's and $Ar^4$'s represent hydrogen or optionally substituted aryls, not all X's and $Ar^4$'s represent hydrogen simultaneously, and at least one hydrogen in compound represented by (1) or (3) may be substituted by halogen etc. In the light emitting layer, concentration of the polycyclic aromatic compound or its multimer changes from a positive electrode layer to a negative electrode layer.

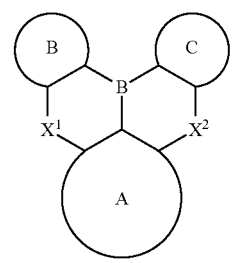

(1)

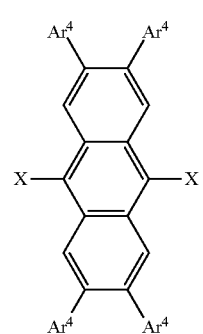

(3)

17 Claims, 1 Drawing Sheet

(52) U.S. Cl.
CPC ...... *H01L 51/0059* (2013.01); *H01L 51/0061* (2013.01); *H01L 51/0072* (2013.01); *H01L 51/0073* (2013.01); *H01L 51/0074* (2013.01); H01L 51/508 (2013.01); H01L 51/5092 (2013.01)

(58) Field of Classification Search
CPC . H01L 51/50; H01L 51/5012; H01L 51/5064; H01L 51/5076; H01L 51/508; H01L 51/5092; H01L 2251/5346; H01L 51/0054; H01L 51/0058; H01L 51/006; H01L 51/504
See application file for complete search history.

(56) References Cited

U.S. PATENT DOCUMENTS

| | | | |
|---|---|---|---|
| 2015/0236274 A1* | 8/2015 | Hatakeyama | H01L 51/0052 257/40 |
| 2015/0325800 A1 | 11/2015 | Ito et al. | |
| 2018/0198077 A1 | 7/2018 | Ito et al. | |
| 2018/0301629 A1 | 10/2018 | Hatakeyama et al. | |
| 2019/0115538 A1* | 4/2019 | Lim | H01L 51/0071 |
| 2019/0165279 A1 | 5/2019 | Fujita | |
| 2019/0280209 A1 | 9/2019 | Fujita | |

FOREIGN PATENT DOCUMENTS

| | | |
|---|---|---|
| JP | WO2016/152544 | 9/2016 |
| JP | 2017-227031 | 12/2017 |
| JP | 2018-42049 | 3/2018 |

* cited by examiner

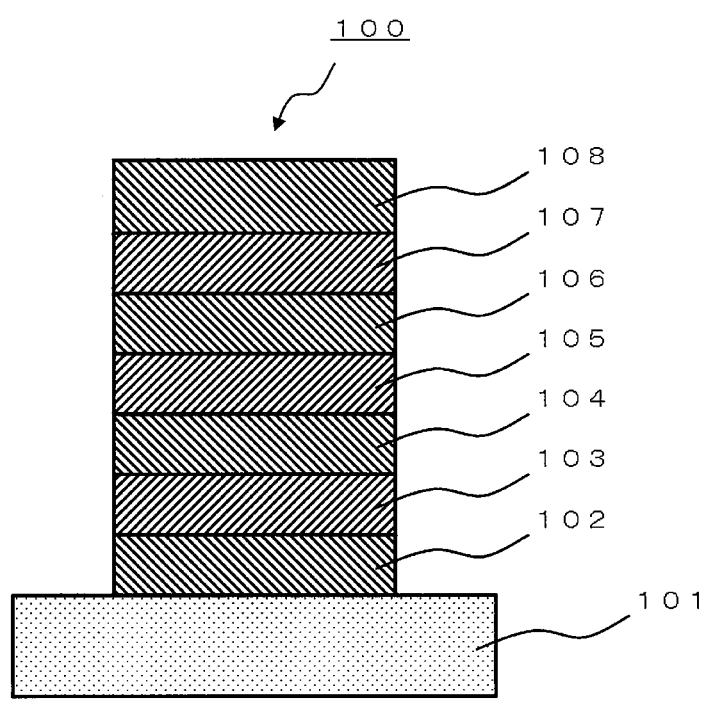

ORGANIC ELECTROLUMINESCENT ELEMENT

TECHNICAL FIELD

The present invention relates to an organic electroluminescent element (hereinafter also referred to as an organic EL element) containing a polycyclic aromatic compound and/or a multimer thereof (hereinafter also simply referred to as a polycyclic aromatic compound) and an anthracene-based compound in a light emitting layer such that the concentrations thereof are changed, and a display apparatus and a lighting apparatus using the organic EL element.

BACKGROUND ART

Conventionally, a display apparatus employing a luminescent element that is electroluminescent can be reduced in power consumption or thickness, and therefore various studies have been conducted thereon. Furthermore, an organic EL element formed of an organic material has been studied actively because weight reduction or size expansion is easily achieved. Particularly, active studies have been hitherto conducted on development of an organic material having luminescence characteristics for blue light which is one of the primary colors of light, or the like, and a combination of a plurality of materials having optimum luminescence characteristics, irrespective of whether the organic material is a high molecular weight compound or a low molecular weight compound.

The organic EL element has a structure having a pair of electrodes composed of a positive electrode and a negative electrode, and a single layer or a plurality of layers disposed between the pair of electrodes and containing an organic compound. The layer containing an organic compound includes a light emitting layer, a charge transport/injection layer for transporting or injecting charges such as holes or electrons, and the like, and various organic materials suitable for these layers have been developed.

The light emitting layer emits light by recombining a hole injected from the positive electrode and an electron injected from the negative electrode between electrodes to which an electric field is applied. As a light emitting layer of a general blue element, a structure having a single light emitting layer including a pyrene-based dopant and an anthracene-based host is widely adopted. In general, an anthracene-based compound is known as a host material (WO 2014/141725 A and WO 2016/152544 A). In addition, a dibenzochrysene-based compound is also known as a host material (JP 2011-6397 A).

CITATION LIST

Patent Literature

Patent Literature 1: WO 2014/141725 A
Patent Literature 2: WO 2016/152544 A
Patent Literature 3: JP 2011-006397 A

SUMMARY OF INVENTION

Technical Problem

However, in such a single light emitting layer, it is difficult to adjust a carrier balance between a dopant and a host and to cause light emission at the center of the light emitting layer. A recombination region is often unevenly distributed on a hole transport layer side or an electron transport layer side. As a result, carriers flow into the hole transport layer or the electron transport layer, this leads to a decrease in element efficiency and element lifetime.

Solution to Problem

Meanwhile, the present inventors have found technology for optimizing the carrier balance by causing the light emitting layer to have a two-layer configuration using two types of host materials, and have filed patent applications (Japanese Patent Application No. 2017-227031 and Japanese Patent Application No. 2018-042049). In the present technology, the carrier balance can be improved by causing the light emitting layer to have a two-layer configuration, and the recombination region can be kept away from an interface with an adjacent layer. Therefore, a flow of carriers into the adjacent layer can be suppressed. As a result, a burden on a carrier transport layer can be suppressed, and element efficiency and element lifetime can be improved.

As a result of intensive studies to solve the above problems, the present inventors have further proceeded development and have considered that also by forming a light emitting layer with a host material and a dopant material and changing the doping concentration of a dopant in the light emitting layer, for example, by forming the light emitting layer with two layers having different concentrations, a recombination region can be formed apart from an interface between the light emitting layer and an adjacent layer, a flow of carriers into the adjacent layer can be suppressed, and a carrier balance can be improved. In Examples of the present application, it has been proved that such an element configuration leads to improvement in element efficiency and element lifetime. It is considered that this is because the carrier balance is improved and a burden on a carrier transport layer can be suppressed.

Here, a chemical structure or a substituent may be represented by the number of carbon atoms. However, in a case where a chemical structure is substituted by a substituent or in a case where a substituent is further substituted by a substituent, the number of carbon atoms means the number of carbon atoms of each chemical structure or each substituent, and does not mean the total number of carbon atoms of a chemical structure and a substituent or the total number of carbon atoms of a substituent and a substituent. For example, "substituent B having the number of carbon atoms of Y substituted by substituent A having the number of carbon atoms X" means that "substituent B having the number of carbon atoms of Y" is substituted by "substituent A having the number of carbon atoms of X", and the number of carbon atoms of Y is not the total number of carbon atoms of the substituent A and the substituent B. For example, "substituent B having the number of carbon atoms of Y substituted by substituent A" means that substituent B having the number of carbon atoms of Y is substituted by "substituent A (in which the number of carbon atoms is not limited), and the number of carbon atoms of Y is not the total carbon number of the substituent A and the substituent B.

Item 1.

An organic electroluminescent element including: a pair of electrode layers composed of a positive electrode layer and a negative electrode layer; and a light emitting layer disposed between the pair of electrode layers, in which the light emitting layer includes a polycyclic aromatic compound represented by the following general formula (1) or a multimer of the polycyclic aromatic compound having a plurality of structures each represented by the following general formula (1) and an anthracene-based compound represented by the following general formula (3), and in the light emitting layer, the concentration of the polycyclic aromatic compound or a multimer thereof changes from the positive electrode layer or a layer on the positive electrode side to the negative electrode layer or a layer on the negative electrode side, which sandwich the light emitting layer.

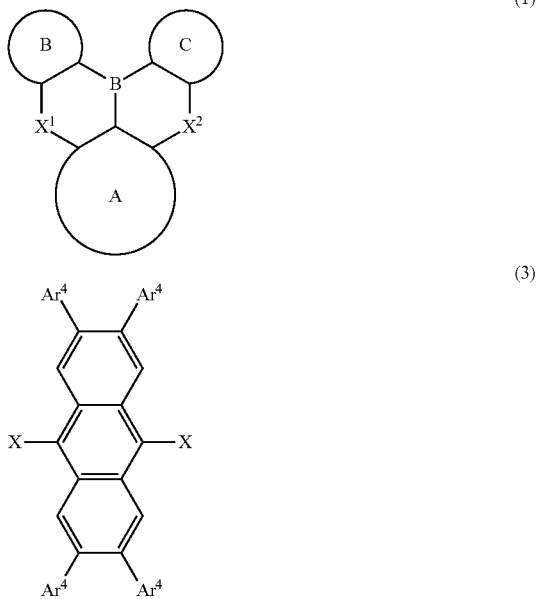

(In the above formula (1), ring A, ring B, and ring C each independently represent an aryl ring or a heteroaryl ring, and at least one hydrogen atom in these rings may be substituted, $X^1$ and $X^2$ each independently represent >O, >N—R, >C(—R)$_2$, >S, or >Se, R in the moiety >N—R represents an optionally substituted aryl, an optionally substituted heteroaryl, an optionally substituted alkyl, or an optionally substituted cycloalkyl, R in the moiety >C(—R)$_2$ represents a hydrogen atom, an optionally substituted aryl, an optionally substituted alkyl, or an optionally substituted cycloalkyl, and R in the moiety >N—R and/or R in the moiety >C(—R)$_2$ may be bonded to at least one of the ring A, the ring B, and the ring C via a linking group or a single bond, at least one hydrogen atom in the compound or structure represented by formula (1) may be substituted by a deuterium atom, cyano, or a halogen atom, and in the above formula (3), X's and Ar$^4$'s each independently represent a hydrogen atom, an optionally substituted aryl, an optionally substituted heteroaryl, an optionally substituted diarylamino, an optionally substituted diheteroarylamino, an optionally substituted arylheteroarylamino, an optionally substituted alkyl, an optionally substituted cycloalkyl, an optionally substituted alkenyl, an optionally substituted alkoxy, an optionally substituted aryloxy, an optionally substituted arylthio, or an optionally substituted silyl, and not all X's and Ar$^4$'s represent hydrogen atoms simultaneously, and at least one hydrogen atom in the compound represented by formula (3) may be substituted by a deuterium atom, cyano, a halogen atom, or an optionally substituted heteroaryl.)

Item 2.

The organic electroluminescent element according to item 1, in which in the above formula (1), ring A, ring B, and ring C each independently represent an aryl ring or a heteroaryl ring, at least one hydrogen atom in these rings may be substituted by a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino, a substituted or unsubstituted diarylboryl (the two aryls may be bonded to each other via a single bond or a linking group), a substituted or unsubstituted alkyl, a substituted or unsubstituted cycloalkyl, a substituted or unsubstituted alkoxy, or a substituted or unsubstituted aryloxy, and each of these rings has a 5-membered or 6-membered ring sharing a bond with a fused bicyclic structure at a center of the above formula constituted by B, $X^1$, and $X^2$, $X^1$ and $X^2$ each independently represent >O, >N—R, >C(—R)$_2$, >S, or >Se, R in the moiety >N—R represents an aryl optionally substituted by an alkyl or a cycloalkyl, a heteroaryl optionally substituted by an alkyl or a cycloalkyl, an alkyl, or a cycloalkyl, R in the moiety >C(—R)$_2$ represents a hydrogen atom, an aryl optionally substituted by an alkyl or a cycloalkyl, an alkyl, or a cycloalkyl, R in the moiety >N—R and/or R in the moiety >C(—R)$_2$ may be bonded to at least one of the ring A, the ring B, and the ring C via —O—, —S—, —C(—R)$_2$—, or a single bond, and R in the moiety —C(—R)$_2$— represents a hydrogen atom, an alkyl, or a cycloalkyl, at least one hydrogen atom in the compound or structure represented by formula (1) may be substituted by a deuterium atom, cyano, or a halogen atom, and in a case of the multimer, the multimer is a dimer or a trimer having two or three structures each represented by general formula (1).

Item 3.

The organic electroluminescent element according to item 1, in which the polycyclic aromatic compound or a multimer thereof is a polycyclic aromatic compound represented by the following general formula (2) or a multimer of the polycyclic aromatic compound having a plurality of structures each represented by the following general formula (2).

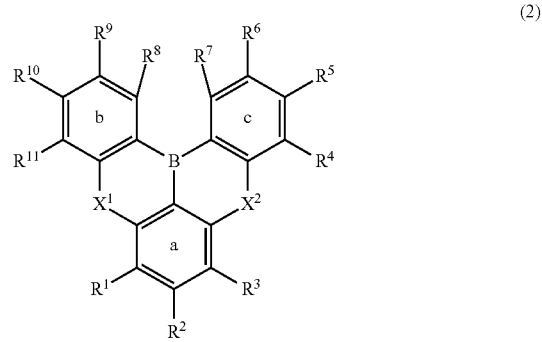

(In the above formula (2), $R^1$ to $R^{11}$ each independently represent a hydrogen atom, an aryl, a heteroaryl, a diarylamino, a diheteroarylamino, an arylheteroarylamino, a diarylboryl (the two aryls may be bonded to each other via a single bond or a linking group), an alkyl, a cycloalkyl, an alkoxy, or an aryloxy, at least one hydrogen atom in these may be substituted by an aryl, a heteroaryl, an alkyl, or a cycloalkyl, adjacent groups among $R^1$ to $R^{11}$ may be bonded to each other to form an aryl ring or a heteroaryl ring together with at least one of ring a, ring b, and ring c, at least one hydrogen atom in the ring thus formed may be substituted by an aryl, a heteroaryl, a diarylamino, a diheteroarylamino, an arylheteroarylamino, a diarylboryl (the two aryls may be bonded to each other via a single bond or a linking group), an alkyl, a cycloalkyl, an alkoxy, or an aryloxy, and at least one hydrogen atom in these may be substituted by an aryl, a heteroaryl, an alkyl, or a cycloalkyl, $X^1$ and $X^2$ each independently represent >O, >N—R, >C(—R)$_2$, >S, or >Se, R in the moiety >N—R represents an aryl having 6 to 12 carbon atoms, optionally substituted by an alkyl having 1 to 6 carbon atoms or a cycloalkyl having 3 to 14 carbon atoms, a heteroaryl having 2 to 15 carbon atoms, optionally substituted by an alkyl having 1 to 6 carbon atoms or a cycloalkyl having 3 to 14 carbon atoms, an alkyl having 1 to 6 carbon atoms, or a cycloalkyl having 3 to 14 carbon atoms, R in the moiety >C(—R)$_2$ represents a hydrogen atom, an aryl having 6 to 12 carbon atoms, optionally substituted by an alkyl having 1 to 6 carbon atoms or a cycloalkyl having 3 to 14 carbon atoms, an alkyl having 1 to 6 carbon atoms, or a cycloalkyl having 3 to 14 carbon atoms, R in the moiety >N—R and/or R in the moiety >C(—R)$_2$ may be bonded to at least one of the ring a, the ring b, and the ring c via —O—, —S—, —C(—R)$_2$—, or a single bond, and R in the moiety —C(—R)$_2$— represents an alkyl having 1 to 6 carbon atoms or a cycloalkyl having 3 to 14 carbon atoms, at least one hydrogen atom in the compound or structure represented by formula (2) may be substituted by a deuterium atom, cyano, or a halogen atom, and in a case of the multimer, the multimer is a dimer or a trimer having two or three structures each represented by general formula (2).)

Item 4.

The organic electroluminescent element according to item 3, in which in the above formula (2), $R^1$ to $R^{11}$ each independently represent a hydrogen atom, an aryl having 6 to 30 carbon atoms, optionally substituted by an alkyl having 1 to 6 carbon atoms or a cycloalkyl having 3 to 14 carbon atoms, a heteroaryl having 2 to 30 carbon atoms, optionally substituted by an alkyl having 1 to 6 carbon atoms or a cycloalkyl having 3 to 14 carbon atoms, a diarylamino (the aryl is an aryl having 6 to 12 carbon atoms, optionally substituted by an alkyl having 1 to 6 carbon atoms or a cycloalkyl having 3 to 14 carbon atoms), a diarylboryl (the aryl is an aryl having 6 to 12 carbon atoms, optionally substituted by an alkyl having 1 to 6 carbon atoms or a cycloalkyl having 3 to 14 carbon atoms), an alkyl having 1 to 24 carbon atoms, or a cycloalkyl having 3 to 24 carbon atoms, adjacent groups among $R^1$ to $R^{11}$ may be bonded to each other to form an aryl ring having 9 to 16 carbon atoms or a heteroaryl ring having 6 to 15 carbon atoms together with at least one of ring a, ring b, and ring c, and at least one hydrogen atom in the ring thus formed may be substituted by an aryl having 6 to 30 carbon atoms, optionally substituted by an alkyl having 1 to 6 carbon atoms or a cycloalkyl having 3 to 14 carbon atoms, a heteroaryl having 2 to 30 carbon atoms, optionally substituted by an alkyl having 1 to 6 carbon atoms or a cycloalkyl having 3 to 14 carbon atoms, a diarylamino (the aryl is an aryl having 6 to 12 carbon atoms, optionally substituted by an alkyl having 1 to 6 carbon atoms or a cycloalkyl having 3 to 14 carbon atoms), a diarylboryl (the aryl is an aryl having 6 to 12 carbon atoms, optionally substituted by an alkyl having 1 to 6 carbon atoms or a cycloalkyl having 3 to 14 carbon atoms), an alkyl having 1 to 24 carbon atoms, or a cycloalkyl having 3 to 24 carbon atoms, $X^1$ and $X^2$ each independently represent >O, >N—R, >C(—R)$_2$, or >S, R in the moiety >N—R represents an aryl having 6 to 10 carbon atoms, optionally substituted by an alkyl having 1 to 4 carbon atoms or a cycloalkyl having 5 to 10 carbon atoms, an alkyl having 1 to 4 carbon atoms, or a cycloalkyl having 5 to 10 carbon atoms, and R in the moiety >C(—R)$_2$ represents a hydrogen atom, an aryl having 6 to 10 carbon atoms, optionally substituted by an alkyl having 1 to 4 carbon atoms or a cycloalkyl having 5 to 10 carbon atoms, an alkyl having 1 to 4 carbon atoms, or a cycloalkyl having 5 to 10 carbon atoms, at least one hydrogen atom in the compound or structure represented by formula (2) may be substituted by a deuterium atom, cyano, or a halogen atom, and in a case of the multimer, the multimer is a dimer or a trimer having two structures each represented by general formula (2).

Item 5.

The organic electroluminescent element according to item 3, in which in the above formula (2), $R^1$ to $R^{11}$ each independently represent a hydrogen atom, an aryl having 6 to 16 carbon atoms, optionally substituted by an alkyl having 1 to 4 carbon atoms or a cycloalkyl having 5 to 10 carbon atoms, a heteroaryl having 2 to 20 carbon atoms, optionally substituted by an alkyl having 1 to 4 carbon atoms or a cycloalkyl having 5 to 10 carbon atoms, a diarylamino (the aryl is an aryl having 6 to 10 carbon atoms, optionally substituted by an alkyl having 1 to 4 carbon atoms or a cycloalkyl having 5 to 10 carbon atoms), a diarylboryl (the aryl is an aryl having 6 to 10 carbon atoms, optionally substituted by an alkyl having 1 to 4 carbon atoms or a cycloalkyl having 5 to 10 carbon atoms), an alkyl having 1 to 12 carbon atoms, or a cycloalkyl having 3 to 16 carbon atoms, $X^1$ and $X^2$ each independently represent >O, >N—R, or >C(—R)$_2$, R in the moiety >N—R represents an aryl having 6 to 10 carbon atoms, optionally substituted by an alkyl having 1 to 4 carbon atoms or a cycloalkyl having 5 to 10 carbon atoms, an alkyl having 1 to 4 carbon atoms, or a cycloalkyl having 5 to 10 carbon atoms, R in the moiety >C(—R)$_2$ represents a hydrogen atom, an aryl having 6 to 10 carbon atoms, optionally substituted by an alkyl having 1 to 4 carbon atoms or a cycloalkyl having 5 to 10 carbon atoms, an alkyl having 1 to 4 carbon atoms, or a cycloalkyl having 5 to 10 carbon atoms, and at least one hydrogen atom in the compound represented by formula (2) may be substituted by a deuterium atom, cyano, or a halogen atom.

Item 6.

The organic electroluminescent element according to item 3, in which in the above formula (2), $R^1$ to $R^{11}$ each independently represent a hydrogen atom, an aryl having 6 to 16 carbon atoms, optionally substituted by an alkyl having 1 to 4 carbon atoms or a cycloalkyl having 5 to 10 carbon atoms, a heteroaryl having 2 to 20 carbon atoms, optionally substituted by an alkyl having 1 to 4 carbon atoms or a cycloalkyl having 5 to 10 carbon atoms, a diarylamino (the aryl is an aryl having 6 to 10 carbon atoms, optionally substituted by an alkyl having 1 to 4 carbon atoms or a cycloalkyl having 5 to 10 carbon atoms), a diarylboryl (the aryl is an aryl having 6 to 10 carbon atoms, optionally substituted by an alkyl having 1 to 4 carbon atoms or a cycloalkyl having 5 to 10 carbon atoms), an alkyl having 1 to 12 carbon atoms, or a cycloalkyl having 3 to 16 carbon atoms, $X^1$ and $X^2$ each independently represent >O or >N—R, R in the moiety >N—R represents an aryl having 6 to 10 carbon atoms, optionally substituted by an alkyl having 1 to 4 carbon atoms or a cycloalkyl having 5 to 10 carbon atoms, an alkyl having 1 to 4 carbon atoms, or a cycloalkyl having 5 to 10 carbon atoms, and at least one hydrogen atom in the compound represented by formula (2) may be substituted by a deuterium atom, cyano, or a halogen atom.

Item 7.

The organic electroluminescent element according to any one of items 1 to 6, in which the polycyclic aromatic compound is represented by any one of the following structural formulas.

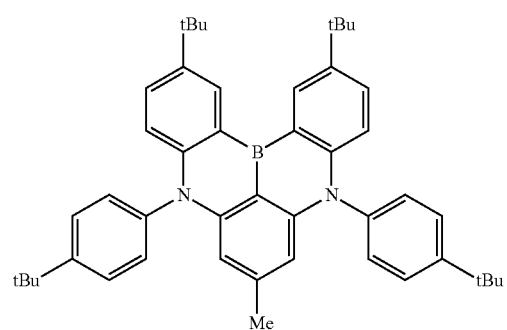
(1-41)

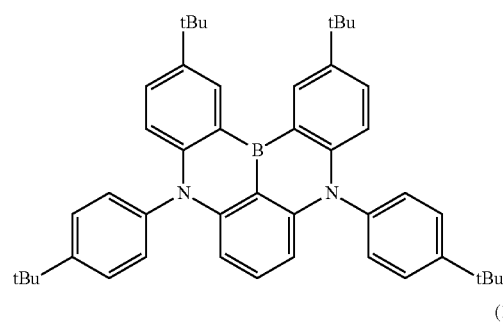
(1-31)

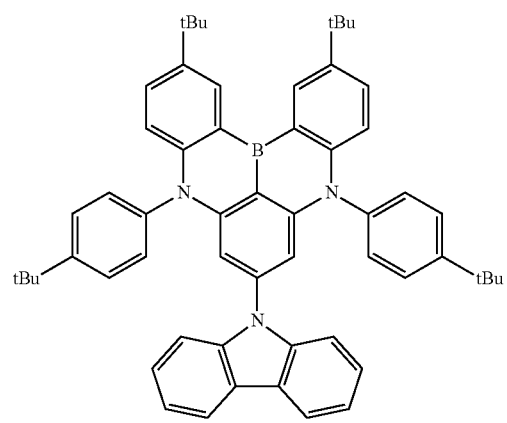
(1-53)

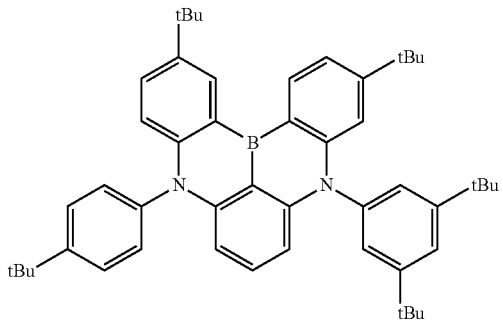
(1-37)

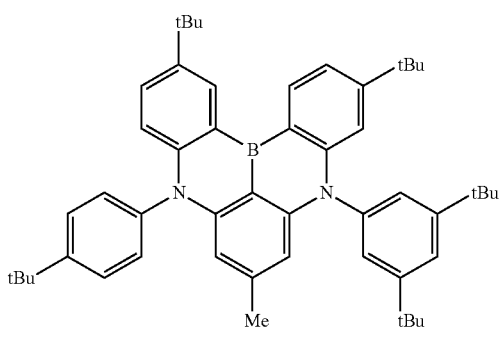
(1-46)

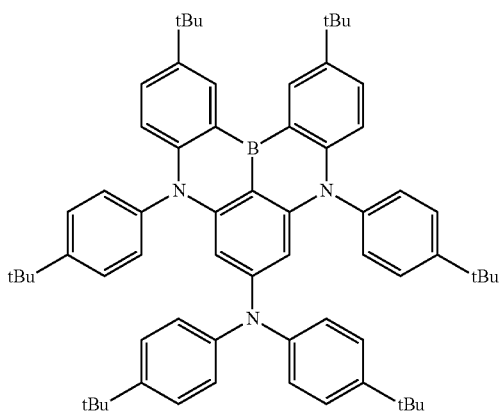
(1-50)

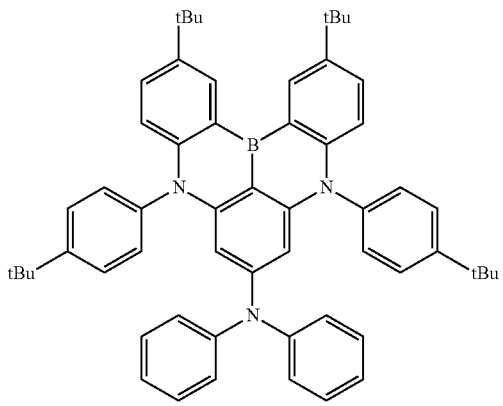
(1-49)

In the above structural formulas, Me represents a methyl group, and tBu represents a tertiary butyl group.

Item 8.

The organic electroluminescent element according to any one of items 1 to 7, in which
in the following formula (3),

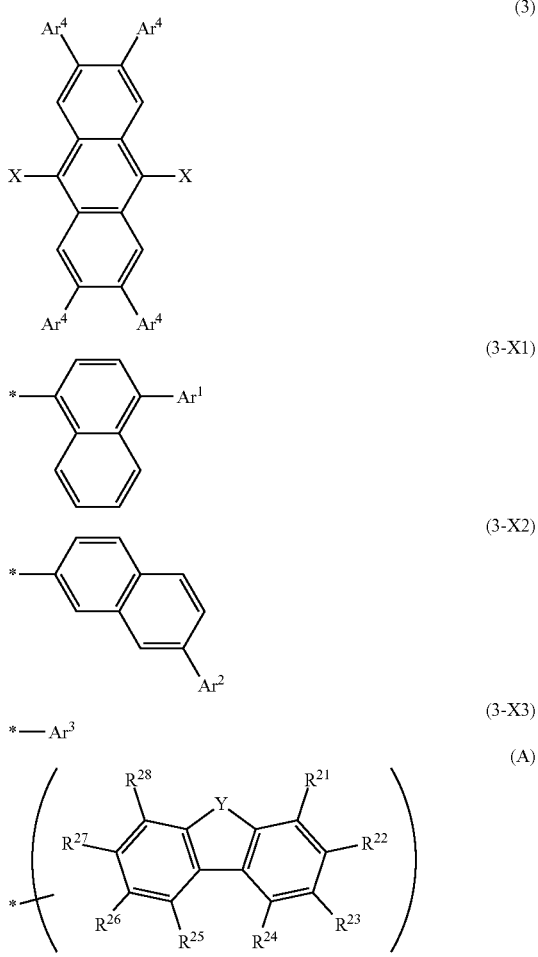

X's each independently represent a group represented by the above formula (3-X1), (3-X2), or (3-X3), a naphthylene moiety in formula (3-X1) or (3-X2) may be fused with one benzene ring, the group represented by formula (3-X1), (3-X2), or (3-X3) is bonded to an anthracene ring of formula (3) at a symbol *, $Ar^1$, $Ar^2$, and $Ar^3$ each independently represent a hydrogen atom (except for $Ar^3$), phenyl, biphenylyl, terphenylyl, quaterphenylyl, naphthyl, phenanthryl, fluorenyl, benzofluorenyl, chrysenyl, triphenylenyl, pyrenyl, or a group represented by the above formula (A), and at least one hydrogen atom in $Ar^3$ may be further substituted by phenyl, biphenylyl, terphenylyl, naphthyl, phenanthryl, fluorenyl, chrysenyl, triphenylenyl, pyrenyl, or a group represented by the above formula (A), $Ar^4$'s each independently represent a hydrogen atom, phenyl, biphenylyl, terphenylyl, naphthyl, or a silyl substituted by an alkyl having 1 to 4 carbon atoms and/or a cycloalkyl having 5 to 10 carbon atoms, at least one hydrogen atom in the compound represented by formula (3) may be substituted by a halogen atom, cyano, a deuterium atom, or a group represented by the above formula (A), in the above formula (A), Y represents —O—, —S—, or >N—$R^{29}$, $R^{21}$ to $R^{28}$ each independently represent a hydrogen atom, an optionally substituted alkyl, an optionally substituted cycloalkyl, an optionally substituted aryl, an optionally substituted heteroaryl, an optionally substituted alkoxy, an optionally substituted aryloxy, an optionally substituted arylthio, a trialkylsilyl, a tricycloalkylsilyl, a dialkylcycloalkylsilyl, an alkyldicycloalkylsilyl, an optionally substituted amino, a halogen atom, hydroxy, or cyano, adjacent groups out of $R^{21}$ to $R^{28}$ may be bonded to each other to form a hydrocarbon ring, an aryl ring, or a heteroaryl ring, $R^{29}$ represents a hydrogen atom or an optionally substituted aryl, the group represented by formula (A) is bonded to a naphthalene ring of formula (3-X1) or (3-X2), a single bond of formula (3-X3), or $Ar^3$ of formula (3-X3) at the symbol *, or at least one hydrogen atom in the compound represented by formula (3) is substituted by the group represented by formula (A), and the group represented by formula (A) is bonded thereto at any position in the structure of formula (A).

Item 9.

The organic electroluminescent element according to any one of items 1 to 7, in which
in the following formula (3),

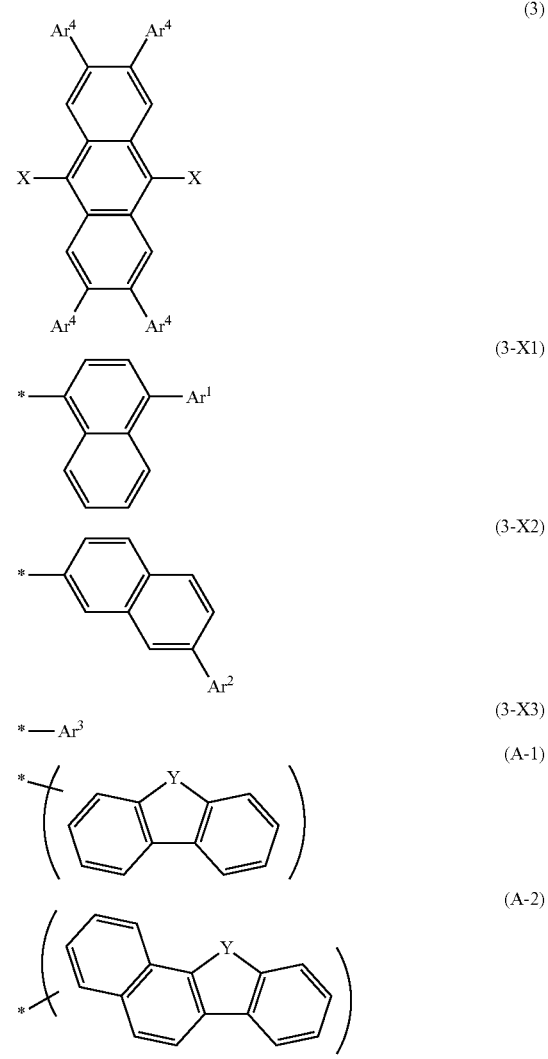

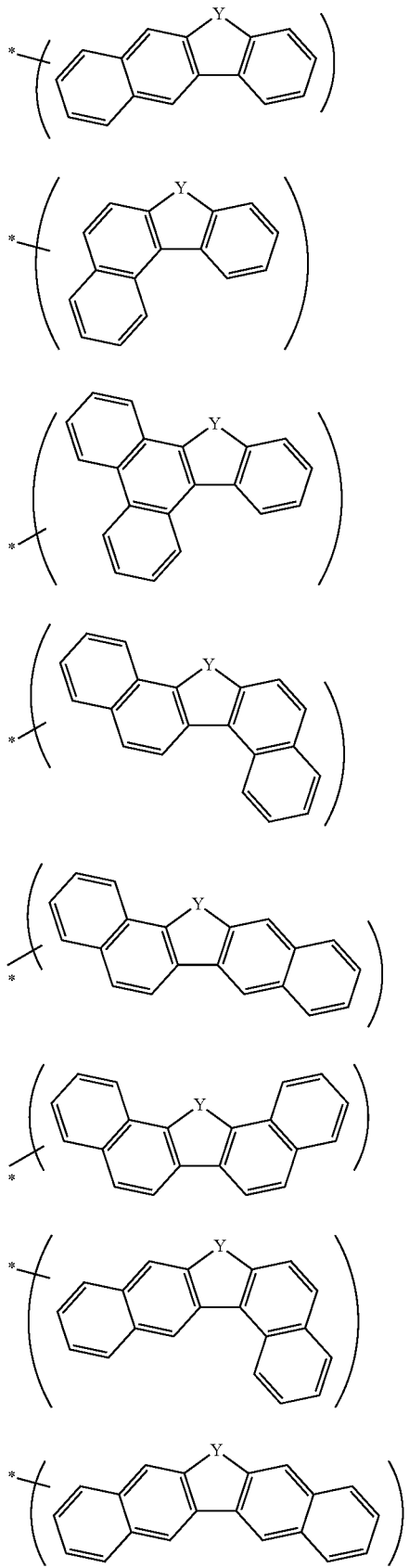

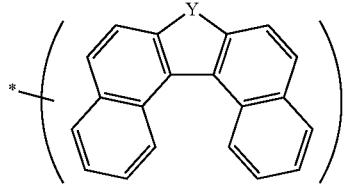

X's each independently represent a group represented by the above formula (3-X1), (3-X2), or (3-X3), the group represented by formula (3-X1), (3-X2), or (3-X3) is bonded to an anthracene ring of formula (3) at a symbol *, $Ar^1$, $Ar^2$, and $Ar^3$ each independently represent a hydrogen atom (except for $Ar^3$), phenyl, biphenylyl, terphenylyl, naphthyl, phenanthryl, fluorenyl, chrysenyl, triphenylenyl, pyrenyl, or a group represented by any one of the above formulas (A-1) to (A-11), and at least one hydrogen atom in $Ar^3$ may be further substituted by phenyl, biphenylyl, terphenylyl, naphthyl, phenanthryl, fluorenyl, chrysenyl, triphenylenyl, pyrenyl, or a group represented by any one of the above formulas (A-1) to (A-11), $Ar^4$'s each independently represent a hydrogen atom, phenyl, or naphthyl, at least one hydrogen atom in the compound represented by formula (3) may be substituted by a halogen atom, cyano, or a deuterium atom, and in the above formulas (A-1) to (A-11), Y represents —O—, —S—, or >N—$R^{29}$, $R^{29}$ represents a hydrogen atom or an aryl, at least one hydrogen atom in groups represented by formulas (A-1) to (A-11) may be substituted by an alkyl, a cycloalkyl, an aryl, a heteroaryl, an alkoxy, an aryloxy, an arylthio, a trialkylsilyl, a tricycloalkylsilyl, a dialkylcycloalkylsilyl, an alkyldicycloalkylsilyl, a diaryl substituted amino, a diheteroaryl substituted amino, an aryl heteroaryl substituted amino, a halogen atom, hydroxy, or cyano, and each of the groups represented by formulas (A-1) to (A-11) is bonded to a naphthalene ring of formula (3-X1) or (3-X2), a single bond of formula (3-X3), or $Ar^3$ of formula (3-X3) at the symbol * and bonded thereto at any position in structures of formulas (A-1) to (A-11).

Item 10.

The organic electroluminescent element according to item 9, in which in the above formula (3), X's each independently represent a group represented by the above formula (3-X1), (3-X2), or (3-X3), the group represented by formula (3-X1), (3-X2), or (3-X3) is bonded to an anthracene ring of formula (3) at a symbol *, $Ar^1$, $Ar^2$, and $Ar^3$ each independently represent a hydrogen atom (except for $Ar^3$), phenyl, biphenylyl, terphenylyl, naphthyl, phenanthryl, fluorenyl, or a group represented by any one of the above formulas (A-1) to (A-4), and at least one hydrogen atom in $Ar^3$ may be further substituted by a phenyl, a naphthyl, a phenanthryl, a fluorenyl, or a group represented by any one of the above formulas (A-1) to (A-4), $Ar^4$'s each independently represent a hydrogen atom, a phenyl, or a naphthyl, and at least one hydrogen atom in the compound represented by formula (3) may be substituted by a halogen atom, cyano, or a deuterium atom.

Item 11.

The organic electroluminescent element according to any one of items 1 to 7, in which the anthracene-based compound is represented by any one of the following structural formulas.

(3-199)

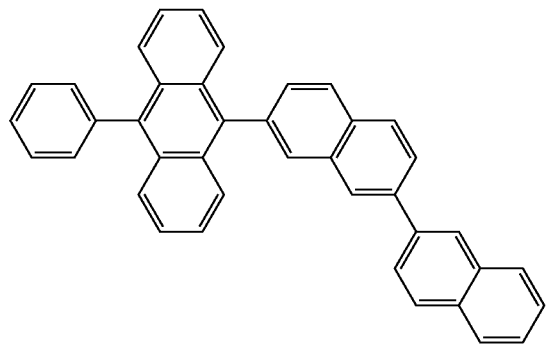

(3-192)

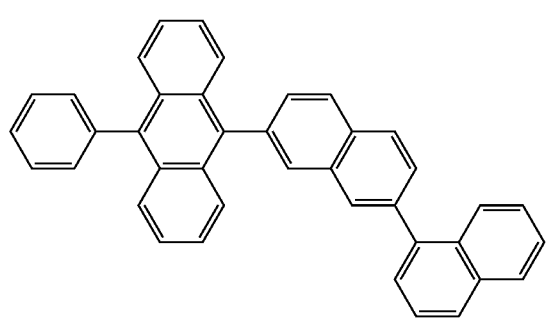

(3-222)

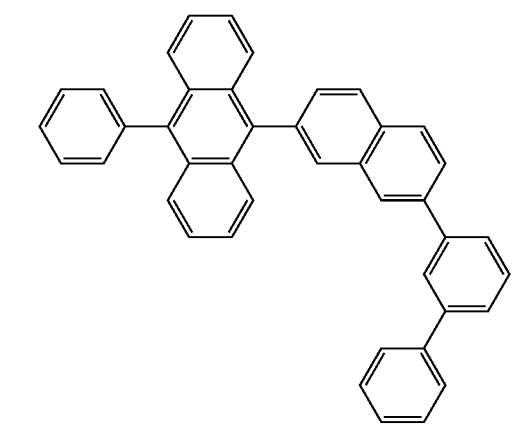

(3-221)

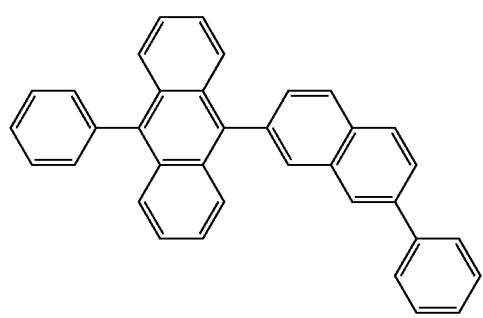

(3-195)

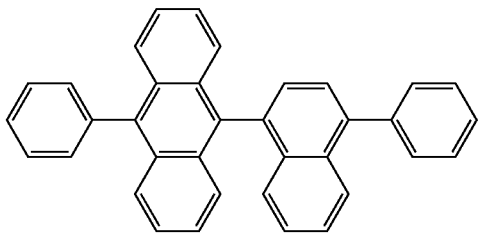

(3-134-O)

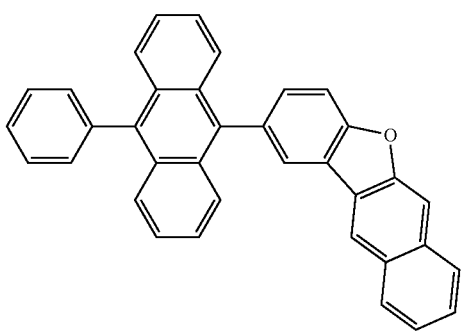

Item 12.

The organic electroluminescent element according to any one of items 1 to 11, in which, in the light emitting layer, the concentration of the polycyclic aromatic compound or a multimer thereof decreases from the positive electrode layer or a layer on the positive electrode side to the negative electrode layer or a layer on the negative electrode side, which sandwich the light emitting layer.

Item 13.

The organic electroluminescent element according to any one of items 1 to 11, in which the light emitting layer includes a plurality of layers, and the concentration of the polycyclic aromatic compound or a multimer thereof included in each of the layers decreases from the positive electrode layer or a layer on the positive electrode side to the negative electrode layer or a layer on the negative electrode side, which sandwich the light emitting layer.

Item 14.

The organic electroluminescent element according to any one of items 1 to 11, in which the light emitting layer includes a first light emitting layer and a second light emitting layer, the first light emitting layer and the second light emitting layer are disposed in this order from the positive electrode layer or a layer on the positive electrode side to the negative electrode layer or a layer on the negative electrode side, which sandwich the light emitting layer, and the concentration of the polycyclic aromatic compound or a multimer thereof included in the second light emitting layer is lower than the concentration of the polycyclic aromatic compound or a multimer thereof included in the first light emitting layer.

Item 15.

The organic electroluminescent element according to any one of items 1 to 14, further including an electron transport layer and/or an electron injection layer disposed between the negative electrode layer and the light emitting layer, wherein at least one of the electron transport layer and the electron injection layer includes at least one selected from the group consisting of a borane derivative, a pyridine derivative, a fluoranthene derivative, a BO-based derivative, an anthracene derivative, a benzofluorene derivative, a phosphine oxide derivative, a pyrimidine derivative, a carbazole derivative, a triazine derivative, a benzimidazole derivative, a phenanthroline derivative, and a quinolinol-based metal complex.

Item 16.

The organic electroluminescent element according to item 15, in which the electron transport layer and/or the electron injection layer further include/includes at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

Item 17.

A display apparatus or a lighting apparatus including the organic electroluminescent element according to any one of items 1 to 16.

Advantageous Effects of Invention

According to a preferable embodiment of the present invention, in an organic EL element, by constituting a light emitting layer with an anthracene-based compound (host material) and a polycyclic aromatic compound (dopant material) and changing the doping concentration of a dopant in the light emitting layer, either element efficiency or element lifetime, particularly preferably both element efficiency and element lifetime can be improved.

BRIEF DESCRIPTION OF DRAWINGS

The FIGURE is a schematic cross-sectional view illustrating an organic EL element according to the present embodiment.

DESCRIPTION OF EMBODIMENTS

1. Characteristic Light Emitting Layer in Organic EL Element

An embodiment of the present invention provides an organic EL element including: a pair of electrode layers composed of a positive electrode layer and a negative electrode layer; and a light emitting layer disposed between the pair of electrode layers, in which the light emitting layer includes a polycyclic aromatic compound represented by the above general formula (1) or a multimer (dopant material) of a polycyclic aromatic compound having a plurality of structures each represented by the above general formula (1) and an anthracene-based compound (host material) represented by the above general formula (3), and in the light emitting layer, the concentration of the polycyclic aromatic compound or a multimer thereof (dopant material) changes from the positive electrode layer sandwiching the light emitting layer or a layer on the positive electrode side to the negative electrode layer or a layer on the negative electrode side.

In the light emitting layer, the concentration of the polycyclic aromatic compound or a multimer (dopant material) thereof only needs to be changed from the positive electrode layer or a layer on the positive electrode side to the negative electrode layer or a layer on the negative electrode side, which sandwich the light emitting layer. Examples of an inclusion form (a concentration gradient, layer formation, or the like) in the light emitting layer include:

(1) a form in which the concentration of the polycyclic aromatic compound in the light emitting layer continuously changes from the positive electrode layer or a layer on the positive electrode side to the negative electrode layer or a layer on the negative electrode side, which sandwich the light emitting layer;

(1-1) a form in which the concentration of the polycyclic aromatic compound in the light emitting layer continuously decreases from the positive electrode layer or a layer on the positive electrode side to the negative electrode layer or a layer on the negative electrode side, which sandwich the light emitting layer;

(1-2) a form in which the concentration of the polycyclic aromatic compound in the light emitting layer continuously increases from the positive electrode layer or a layer on the positive electrode side to the negative electrode layer or a layer on the negative electrode side, which sandwich the light emitting layer;

(1-3) a form in which the concentration of the polycyclic aromatic compound in the light emitting layer continuously increases and then continuously decreases from the positive electrode layer or a layer on the positive electrode side to the negative electrode layer or a layer on the negative electrode side, which sandwich the light emitting layer;

(1-4) a form in which the concentration of the polycyclic aromatic compound in the light emitting layer continuously decreases and then continuously increases from the positive electrode layer or a layer on the positive electrode side to the negative electrode layer or a layer on the negative electrode side, which sandwich the light emitting layer;

(2) a form in which the light emitting layer includes a plurality of layers, and the concentration of the polycyclic aromatic compound included in each of the layers changes from the positive electrode layer or a layer on the positive electrode side to the negative electrode layer or a layer on the negative electrode side, which sandwich the light emitting layer;

(2-1) a form in which the light emitting layer includes a plurality of layers, and the concentration of the polycyclic aromatic compound included in each of the layers decreases from the positive electrode layer or a layer on the positive electrode side to the negative electrode layer or a layer on the negative electrode side, which sandwich the light emitting layer;

(2-2) a form in which the light emitting layer includes a plurality of layers, and the concentration of the polycyclic aromatic compound included in each of the layers increases from the positive electrode layer or a layer on the positive electrode side to the negative electrode layer or a layer on the negative electrode side, which sandwich the light emitting layer;

(2-3) a form in which the light emitting layer includes a plurality of layers, and the concentration of the polycyclic aromatic compound included in each of the layers increases and then decreases from the positive electrode layer or a layer on the positive electrode side to the negative electrode layer or a layer on the negative electrode side, which sandwich the light emitting layer;

(2-4) a form in which the light emitting layer includes a plurality of layers, and the concentration of the polycyclic aromatic compound included in each of the layers decreases and then increases from the positive electrode layer or a layer on the positive electrode side to the negative electrode layer or a layer on the negative electrode side, which sandwich the light emitting layer;

(3) a form in which the light emitting layer includes a first light emitting layer and a second light emitting layer, the first light emitting layer and the second light emitting layer are disposed in this order from the positive electrode layer or a layer on the positive electrode side to the negative electrode layer or a layer on the negative electrode side, which sandwich the light emitting layer, and the concentration of the polycyclic aromatic compound included in the first light emitting layer is different from the concentration of the polycyclic aromatic compound included in the second light emitting layer;

(3-1) a form in which the light emitting layer includes a first light emitting layer and a second light emitting layer, the first light emitting layer and the second light emitting layer are disposed in this order from the positive electrode layer or a layer on the positive electrode side to the negative electrode layer or a layer on the negative electrode side, which sandwich the light emitting layer, and the concentration of the polycyclic aromatic compound included in the second light emitting layer is lower than the concentration of the polycyclic aromatic compound included in the first light emitting layer; and (3-2) a form in which the light emitting layer includes a first light emitting layer and a second light emitting layer, the first light emitting layer and the second light emitting layer are disposed in this order from the positive electrode layer or a layer on the positive electrode side to the negative electrode layer or a layer on the negative electrode side, which sandwich the light emitting layer, and the concentration of the polycyclic aromatic compound included in the second light emitting layer is higher than the concentration of the polycyclic aromatic compound included in the first light emitting layer.

A concentration gradient of the continuous change in concentration is not particularly limited, and the change may occur stepwise instead of occurring continuously.

A minimum configuration of the organic EL element includes the positive electrode layer, the light emitting layer, and the negative electrode layer. In this case, the positive electrode layer and the negative electrode layer sandwich the light emitting layer. In a case where another layer such as a hole injection layer, a hole transport layer, a hole blocking layer, an electron transport layer, or an electron injection layer is present between the positive electrode layer and the light emitting layer or between the negative electrode layer and the light emitting layer, these layers sandwich the light emitting layer.

The reference of the amount of use of the dopant is preferably from 0.001 to 50% by weight, more preferably from 0.05 to 20% by weight, still more preferably from 0.1 to 10% by weight, particularly preferably from 1 to 5% by weight, and most preferably from 1 to 3% by weight with respect to the total amount of a material for a light emitting layer. Therefore, the gradient of a change in concentration is in the range of the amount of use, for example, 5% by weight (or 3% by weight or the like) in the first light emitting layer and 1% by weight in the second light emitting layer. In a case where the concentration is changed in a single layer, for example, the concentration is continuously from 5% by weight (or 3% by weight or the like) to 1% by weight from one layer to another layer, sandwiching the light emitting layer.

1-1. Polycyclic Aromatic Compound Represented by Formula (1) and Multimer Thereof The polycyclic aromatic compound and a multimer thereof which are essential components as a dopant material in the present invention are a polycyclic aromatic compound represented by the following general formula (1) and a multimer of the polycyclic aromatic compound having a plurality of structures each represented by general formula (1). The polycyclic aromatic compound and a multimer thereof are preferably a polycyclic aromatic compound represented by the following general formula (2) and a multimer of the polycyclic aromatic compound having a plurality of structures each represented by the following general formula (2). Incidentally, in formula (1), "B" as the central atom means a boron atom, and each of "A", "C", and "B" in a ring is a symbol indicating a cyclic structure indicated by a ring. The other symbols are the same as the above definitions.

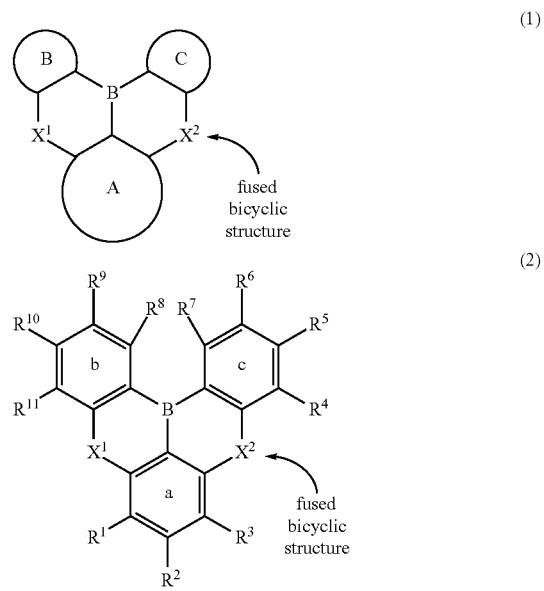

Ring A, ring B, and ring C in general formula (1) each independently represent an aryl ring or a heteroaryl ring, and at least one hydrogen atom in these rings may be substituted by a substituent. This substituent is preferably a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino (an amino group having an aryl and a heteroaryl), a substituted or unsubstituted diarylboryl (the two aryls may be bonded to each other via a single bond or a linking group), a substituted or unsubstituted alkyl, a substituted or unsubstituted cycloalkyl, a substituted or unsubstituted alkoxy, or a substituted or unsubstituted aryloxy. In a case where these groups have substituents, examples of the substituents include an aryl, a heteroaryl, an alkyl, and a cycloalkyl. The aryl ring or the heteroaryl ring preferably has a 5-membered ring or 6-membered ring sharing a bond with a fused bicyclic structure at the center of general formula (1) constituted by "B", "$X^1$", and "$X^2$".

Here, the "fused bicyclic structure" means a structure in which two saturated hydrocarbon rings including "B", "$X^1$", and "$X^2$" and indicated at the center of general formula (1) are fused. The "6-membered ring sharing a bond with a fused bicyclic structure" means, for example, ring a (benzene ring (6-membered ring)) fused to the fused bicyclic structure as represented by the above general formula (2). The phrase "aryl ring or heteroaryl ring (which is ring A) has this 6-membered ring" means that the ring A is formed only from this 6-membered ring, or other rings and the like are further fused to this 6-membered ring so as to include this 6-membered ring to form the ring A. In other words, the "aryl ring or heteroaryl ring (which is ring A) having a 6-membered ring" as used herein means that the 6-membered ring constituting the entirety or a part of the ring A is fused to the fused bicyclic structure. The same description applies to the "ring B (ring b)", "ring C (ring c)", and the "5-membered ring".

The ring A (or ring B or ring C) in general formula (1) corresponds to ring a and its substituents $R^1$ to $R^3$ in general formula (2) (or ring b and its substituents $R^8$ to $R^1$, or ring c and its substituents $R^4$ to $R^7$). That is, general formula (2) corresponds to a structure in which "rings A to C each having a 6-membered ring" have been selected as the rings A to C of general formula (1). For this meaning, the rings of general formula (2) are represented by small letters a to c.

In general formula (2), adjacent groups among the substituents $R^1$ to $R^{11}$ of ring a, ring b, and ring c may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, a diarylboryl (the two aryls may be bonded to each other via a single bond or a linking group), an alkyl, a cycloalkyl, an alkoxy, or an aryloxy, and at least one hydrogen atom in these may be substituted by an aryl, a heteroaryl, an alkyl, or a cycloalkyl. Therefore, in the compound represented by general formula (2), a ring structure constituting the compound changes as represented by the following formulas (2-1) and (2-2) according to a mutual bonding form of substituents in ring a, ring b, and ring c. Ring A', ring B', and ring C' in each formula correspond to ring A, ring B, and ring C in general formula (1), respectively. The definitions of $R^1$ to $R^{11}$, a, b, c, $X^1$, and $X^2$ in each formula are the same as the definitions in general formula (2).

Ring A', ring B', and, ring C' in the above formulas (2-1) and (2-2) each represent, to be described in connection with general formula (2), an aryl ring or a heteroaryl ring formed by bonding adjacent groups among the substituents $R^1$ to $R^{11}$ together with ring a, ring b, and ring c, respectively (may also be referred to as a fused ring formed by fusing another ring structure to the ring a, ring b, or ring c). Incidentally, although not indicated in the formula, there is also a compound in which all of ring a, ring b, and ring c have been changed to ring A', ring B' and ring C'. As apparent from the above formulas (2-1) and (2-2), for example, $R^8$ of ring b and $R^7$ of ring c, $R^{11}$ of ring b and $R^1$ of ring a, $R^4$ of ring c and $R^3$ of ring a, and the like do not correspond to "adjacent groups", and these groups are not bonded to each other. That is, the term "adjacent groups" means adjacent groups on the same ring.

A compound represented by the above formula (2-1) or (2-2) corresponds to, for example, a compound represented by any one of formulas (1-67) to (1-74) and (1-76) to (1-83) listed as specific compounds described below. That is, for example, the compound represented by formula (2-1) or (2-2) is a compound having ring A' (or ring B' or ring C') formed by fusing a benzene ring, an indole ring, a pyrrole ring, a benzofuran ring or a benzothiophene ring to a benzene ring which is ring a (or ring b or ring c), and the fused ring A' (or fused ring B' or fused ring C') that has been formed is a naphthalene ring, a carbazole ring, an indole ring, a dibenzofuran ring, or a dibenzothiophene ring.

$X^1$ and $X^2$ in general formula (1) each independently represent >O, >N—R, >C(—R)$_2$, >S, or >Se, R in the moiety >N—R represents an optionally substituted aryl, an optionally substituted heteroaryl, an optionally substituted alkyl, or an optionally substituted cycloalkyl, R in the moiety >C(—R)$_2$ represents a hydrogen atom, an optionally substituted aryl, an optionally substituted alkyl, or an optionally substituted cycloalkyl, R in the moiety >N—R and/or R in the moiety >C(—R)$_2$ may be bonded to the ring A, ring B, and/or ring C via a linking group or a single bond, and the linking group is preferably —O—, —S—, or —C(—R)$_2$—. Incidentally, R in the moiety "—C(—R)$_2$—" represents a hydrogen atom, an alkyl, or a cycloalkyl. This description also applies to $X^1$ and $X^2$ in general formula (2).

Here, the provision that "R in the moiety >N—R and/or R in the moiety >C(—R)$_2$ is bonded to the ring A, ring B, and/or ring C via a linking group or a single bond" in general formula (1) corresponds to the provision that R in the moiety >N—R and/or R in the moiety >C(—R)$_2$ is bonded to the ring a, ring b, and/or ring c via —O—, —S—, —C(—R)$_2$—, or a single bond" in general formula (2)

This provision can be expressed by a compound having a ring structure represented by the following formula (2-3-1), in which $X^1$ or $X^2$ is incorporated into the fused ring B' or C'. That is, for example, the compound is a compound having ring B' (or ring C') formed by fusing another ring to a benzene ring which is ring b (or ring c) in general formula (2) so as to incorporate $X^1$ (or $X^2$). The formed fused ring B' (or fused ring C') is, for example, a phenoxazine ring, a phenothiazine ring, or an acridine ring.

The above provision can also be expressed by a compound having a ring structure in which $X^1$ and/or $X^2$ are/is incorporated into the fused ring A', represented by the following formula (2-3-2) or (2-3-3). That is, for example, the compound is a compound having ring A' formed by fusing another ring to a benzene ring which is ring a in general formula (2) so as to incorporate $X^1$ (and/or $X^2$) The formed fused ring A' is, for example, a phenoxazine ring, a phenothiazine ring, or an acridine ring.

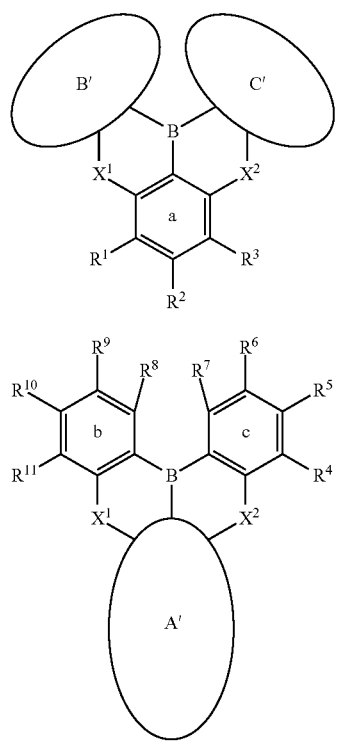

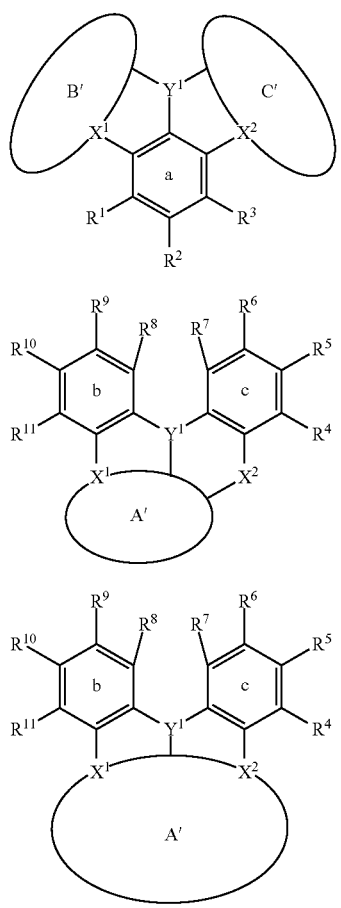

(2-3-1)

(2-3-2)

(2-3-3)

The "aryl ring" as ring A, ring B, or ring C in general formula (1) is, for example, an aryl ring having 6 to 30 carbon atoms, and the aryl ring is preferably an aryl ring having 6 to 16 carbon atoms, more preferably an aryl ring having 6 to 12 carbon atoms, and particularly preferably an aryl ring having 6 to 10 carbon atoms. Incidentally, this "aryl ring" corresponds to the "aryl ring formed by bonding adjacent groups among $R^1$ to $R^{11}$ together with ring a, ring b, or ring c" defined by general formula (2). Ring a (or ring b or ring c) is already constituted by a benzene ring having 6 carbon atoms, and therefore the carbon number of 9 in total of a fused ring formed by fusing a 5-membered ring to this benzene ring becomes a lower limit of the carbon number.

Specific examples of the "aryl ring" include: a benzene ring which is a monocyclic system; a biphenyl ring which is a bicyclic system; a naphthalene ring which is a fused bicyclic system; a terphenyl ring (m-terphenyl, o-terphenyl, or p-terphenyl) which is a tricyclic system; an acenaphthylene ring, a fluorene ring, a phenalene ring, and a phenanthrene ring which are fused tricyclic systems; a triphenylene ring, a pyrene ring, and a naphthacene ring which are fused tetracyclic systems; and a perylene ring and a pentacene ring which are fused pentacyclic systems.

The "heteroaryl ring" as ring A, ring B, or ring C in general formula (1) is, for example, a heteroaryl ring having 2 to 30 carbon atoms, and the heteroaryl ring is preferably a heteroaryl ring having 2 to 25 carbon atoms, more preferably a heteroaryl ring having 2 to 20 carbon atoms, still more preferably a heteroaryl ring having 2 to 15 carbon atoms, and particularly preferably a heteroaryl ring having 2 to 10 carbon atoms. Examples of the "heteroaryl ring" include a heterocyclic ring containing 1 to 5 heteroatoms selected from an oxygen atom, a sulfur atom, and a nitrogen atom in addition to a carbon atom as a ring-constituting atom. Incidentally, this "heteroaryl ring" corresponds to the "heteroaryl ring formed by bonding adjacent groups among $R^1$ to $R^{11}$ together with ring a, ring b, or ring c" defined by general formula (2). Ring a (or ring b or ring c) is already constituted by a benzene ring having 6 carbon atoms, and therefore the carbon number of 6 in total of a fused ring formed by fusing a 5-membered ring to this benzene ring becomes a lower limit of the carbon number.

Specific examples of the "heteroaryl ring" include a pyrrole ring, an oxazole ring, an isoxazole ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, an indolizine ring, a furan ring, a benzofuran ring, an isobenzofuran ring, a dibenzofuran ring, a thiophene ring, a benzothiophene ring, a dibenzothiophene ring, a furazane ring, an oxadiazole ring, and a thianthrene ring.

At least one hydrogen atom in the above "aryl ring" or "heteroaryl ring" may be substituted by a substituted or unsubstituted "aryl", a substituted or unsubstituted "heteroaryl", a substituted or unsubstituted "diarylamino", a substituted or unsubstituted "diheteroarylamino", a substituted or unsubstituted "arylheteroarylamino", a substituted or unsubstituted diarylboryl (the two aryls may be bonded to each other via a single bond or a linking group), a substituted or unsubstituted "alkyl", a substituted or unsubstituted "cycloalkyl", a substituted or unsubstituted "alkoxy", or a substituted or unsubstituted "aryloxy", which is a primary substituent. Examples of the aryl of the "aryl", "heteroary," and "diarylamino", the heteroaryl of the "diheteroarylamino", the aryl and the heteroaryl of the "arylheteroarylamino", the aryl of the "diarylboryl", and the aryl of the "aryloxy" as primary substituents include a monovalent group of the "aryl ring" or "heteroaryl ring" described above.

The "alkyl" as a primary substituent may be either linear or branched, and examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 or 4 carbon atoms) is particularly preferable.

Specific examples of the alkyl include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Examples of the "cycloalkyl" as a primary substituent include a cycloalkyl having 3 to 24 carbon atoms, a cycloalkyl having 3 to 20 carbon atoms, a cycloalkyl having 3 to 16 carbon atoms, a cycloalkyl having 3 to 14 carbon atoms, a cycloalkyl having 5 to 10 carbon atoms, a cycloalkyl having 5 to 8 carbon atoms, a cycloalkyl having 5 or 6 carbon atoms, and a cycloalkyl having 5 carbon atoms.

Specific examples of the cycloalkyl include cyclopropyl, cyclobutyl, cyclopentyl, cyclohexyl, cycloheptyl, cyclooctyl, cyclononyl, cyclodecyl, alkyl (especially methyl) substituents thereof having 1 to 4 carbon atoms, norbornenyl, bicyclo[1.0.1]butyl, bicyclo[1.1.1]pentyl, bicyclo[2.0.1]pentyl, bicyclo[1.2.1]hexyl, bicyclo[3.0.1]hexyl, bicyclo[2.1.2]heptyl, bicyclo[2.2.2]octyl, adamantyl, diamantyl, decahydronaphthalenyl, and decahydroazulenyl.

Examples of the "alkoxy" as a primary substituent include a linear alkoxy having 1 to 24 carbon atoms and a branched alkoxy having 3 to 24 carbon atoms. An alkoxy having 1 to 18 carbon atoms (branched alkoxy having 3 to 18 carbon atoms) is preferable, an alkoxy having 1 to 12 carbon atoms (branched alkoxy having 3 to 12 carbon atoms) is more preferable, an alkoxy having 1 to 6 carbon atoms (branched alkoxy having 3 to 6 carbon atoms) is still more preferable, and an alkoxy having 1 to 4 carbon atoms (branched alkoxy having 3 or 4 carbon atoms) is particularly preferable.

Specific examples of the alkoxy include methoxy, ethoxy, propoxy, isopropoxy, butoxy, isobutoxy, s-butoxy, t-butoxy, pentyloxy, hexyloxy, heptyloxy, and octyloxy.

As the "aryl" in the "diarylboryl" as a primary substituent, the above description on the aryl can be cited. The two aryls may be bonded to each other via a single bond or a linking group (for example, >C(—R)$_2$, >O, >S, or >N—R). Here, R in each of the moiety >C(—R)$_2$ and the moiety >N—R is an aryl, a heteroaryl, a diarylamino, an alkyl, a cycloalkyl, an alkoxy, or an aryloxy (these are primary substituents). The primary substituent may be further substituted by an aryl, a heteroaryl, an alkyl, or a cycloalkyl (these are secondary substituents). As specific examples of these groups, the above description on the aryl, the heteroaryl, the diarylamino, the alkyl, the cycloalkyl, the alkoxy, or the aryloxy as a primary substituent can be cited.

Specifically, the group can adjust an emission wavelength by steric hindrance, an electron donating property, and an electron withdrawing property of the structure of a primary substituent, and is preferably a group represented by any one of the following structural formulas, more preferably methyl, t-butyl, phenyl, o-tolyl, p-tolyl, 2,4-xylyl, 2,5-xylyl, 2,6-xylyl, 2,4,6-mesityl, diphenylamino, di-p-tolylamino, bis(p-(t-butyl) phenyl) amino, carbazolyl, 3,6-dimethylcarbazolyl, 3,6-di-t-butylcarbazolyl, or phenoxy, and more preferably methyl, t-butyl, phenyl, o-tolyl, 2,6-xylyl, 2,4,6-mesityl, diphenylamino, di-p-tolylamino, bis(p-(t-butyl) phenyl) amino, carbazolyl, 3,6-dimethylcarbazolyl, or 3,6-di-t-butylcarbazolyl. Larger steric hindrance is more preferable for selective synthesis from a viewpoint of easiness of synthesis. Specifically, t-butyl, o-tolyl, p-tolyl, 2,4-xylyl, 2,5-xylyl, 2,6-xylyl, 2,4,6-mesityl, di-p-tolylamino, bis(p-(t-butyl) phenyl) amino, 3,6-dimethylcarbazolyl, and 3,6-di-t-butylcarbazolyl are preferable.

In the following structural formulae, "Me" represents methyl, and "tBu" represents t-butyl.

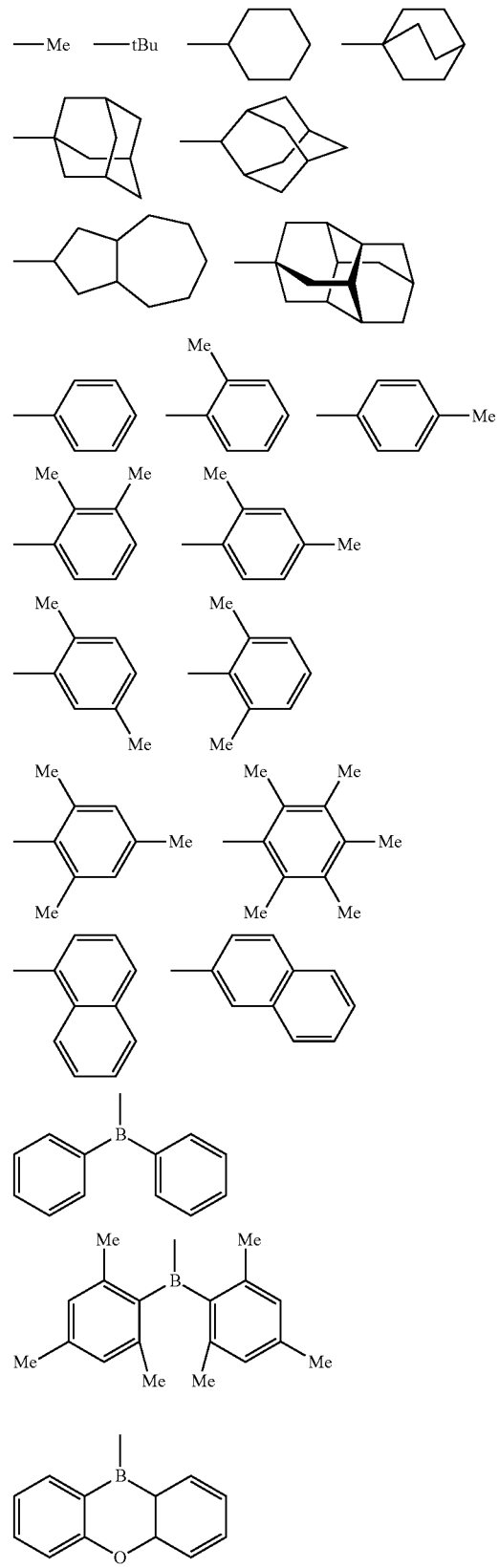

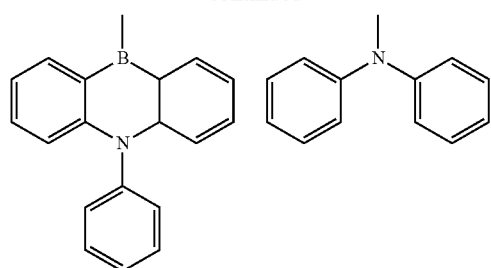
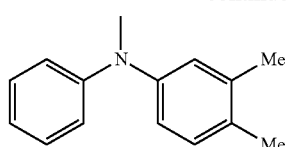
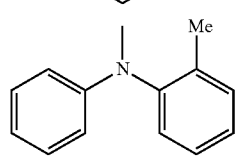
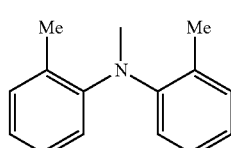
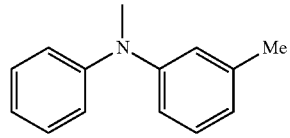
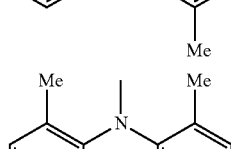
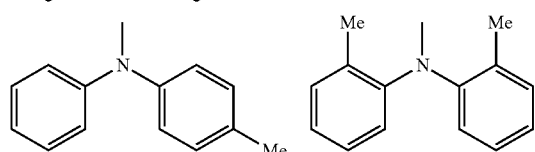
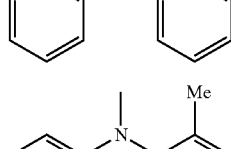
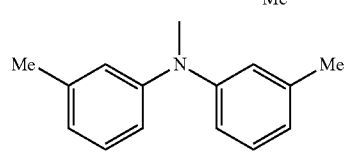
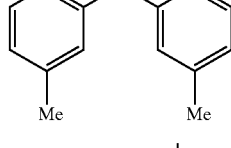
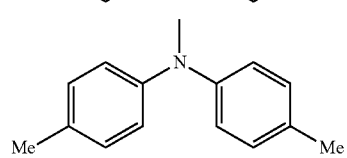
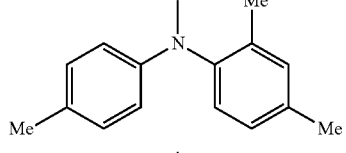
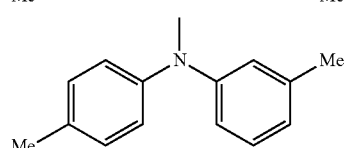
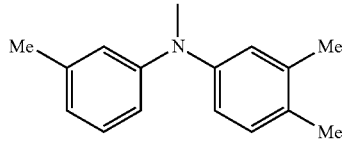
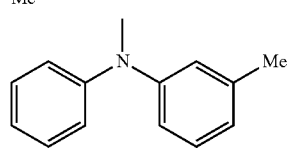
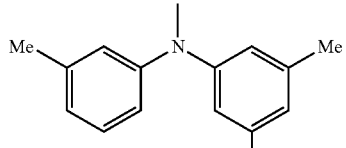
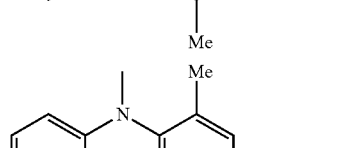
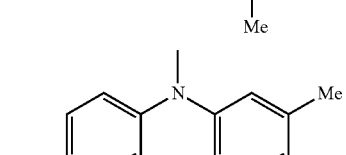
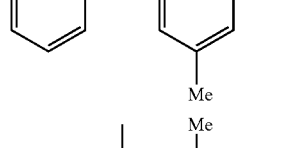
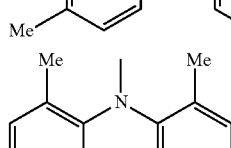
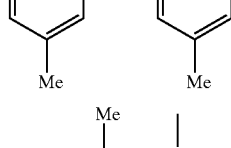
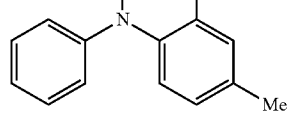
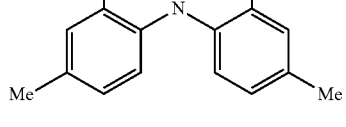

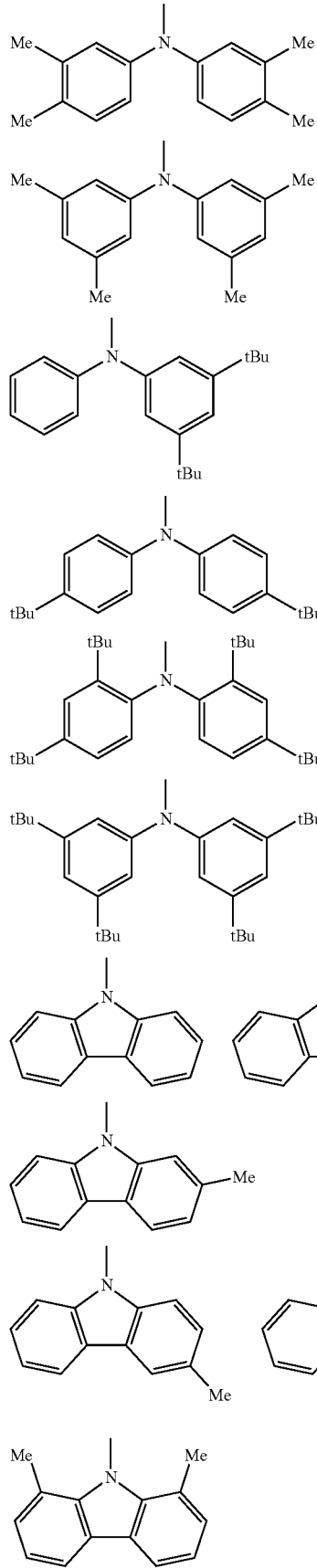
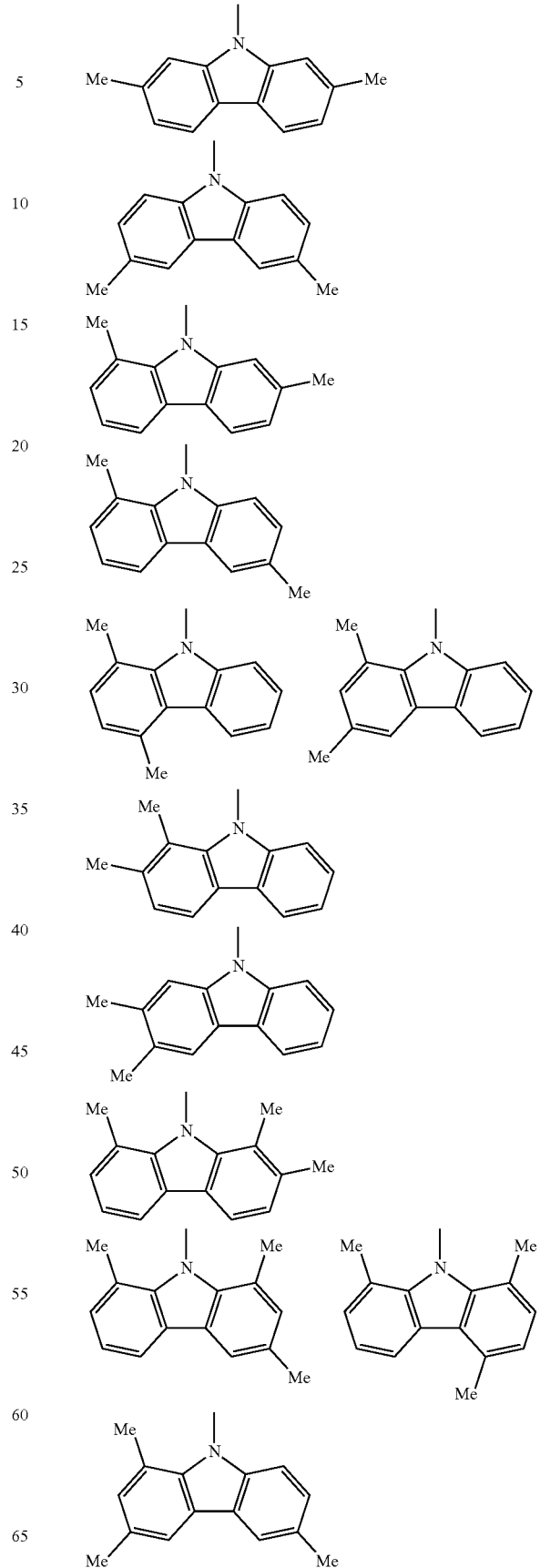

-continued
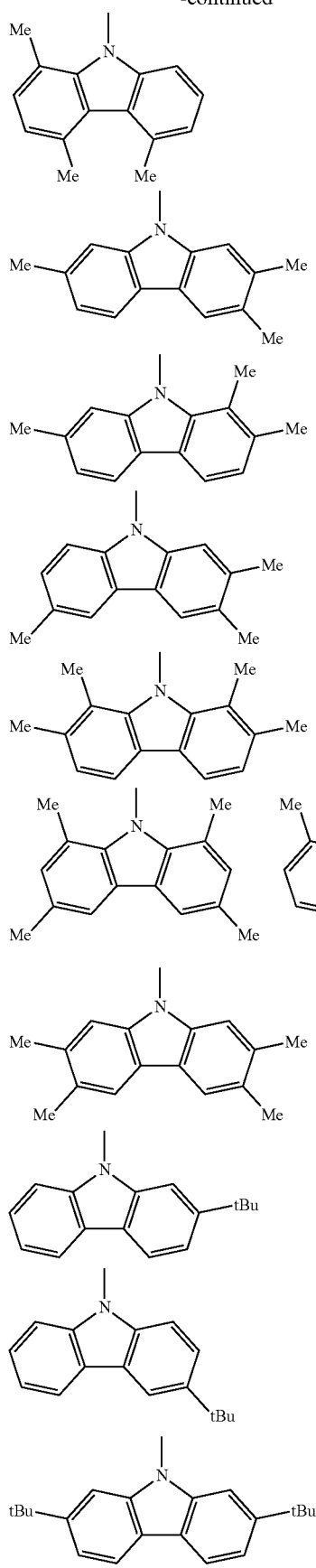
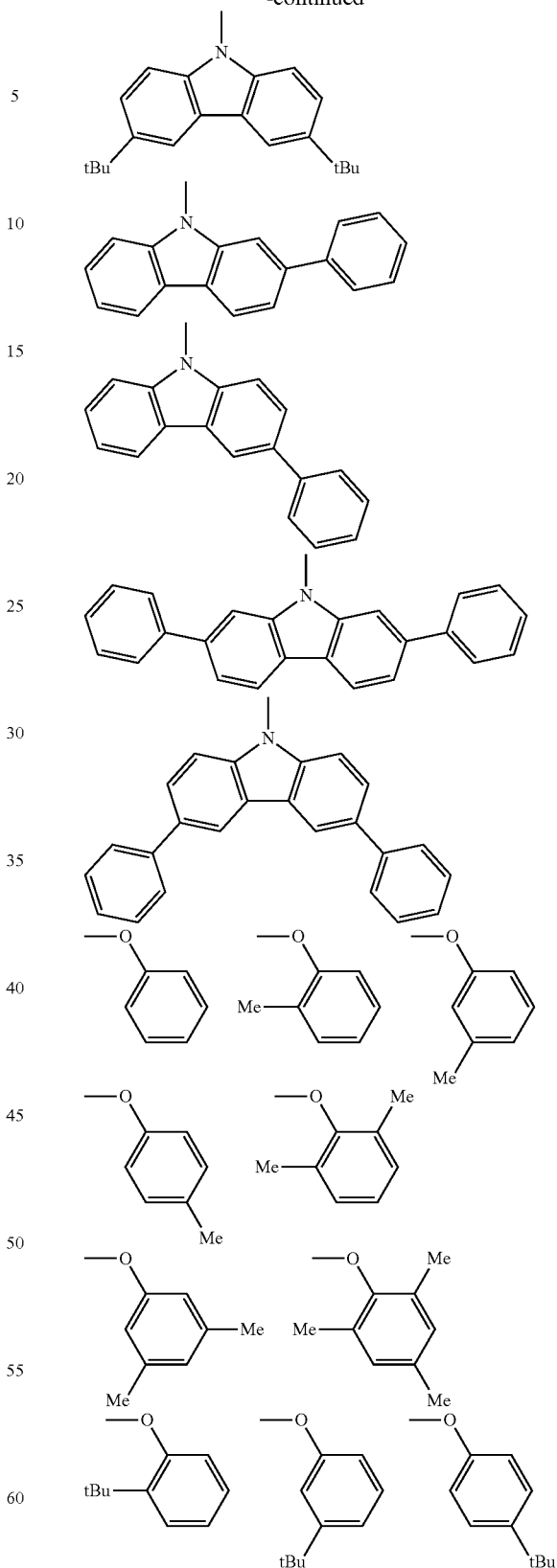
At least one hydrogen atom in the substituted or unsubstituted aryl, the substituted or unsubstituted heteroaryl, the substituted or unsubstituted diarylamino, the substituted or unsubstituted diheteroarylamino, the substituted or unsubstituted arylheteroarylamino, the substituted or unsubstituted diarylboryl (the two aryls may be bonded to each other via a single bond or a linking group), the substituted or unsubstituted alkyl, the substituted or unsubstituted cycloalkyl, the substituted or unsubstituted alkoxy, or the substituted or unsubstituted aryloxy as a primary substituent may be substituted by a secondary substituent as described to be substituted or unsubstituted. Examples of this secondary substituent include an aryl, a heteroaryl, an alkyl, and a cycloalkyl. As specific examples thereof, the above description on the monovalent group of the "aryl ring" or "heteroaryl ring" and the "alkyl" or the "cycloalkyl" as a primary substituent can be referred to. The aryl or the heteroaryl as a secondary substituent includes a structure in which at least one hydrogen atom in the aryl or the heteroaryl is substituted by an aryl such as phenyl (specific examples are the groups described above), an alkyl such as methyl (specific examples are the groups described above), or a cycloalkyl such as cyclohexyl (specific examples are the groups described above). For example, when the secondary substituent is a carbazolyl group, a carbazolyl group in which at least one hydrogen atom at the 9-position is substituted by an aryl such as phenyl, an alkyl such as methyl, or a cycloalkyl such as cyclohexyl is also included in the heteroaryl as the secondary substituent.

Examples of the aryl, the heteroaryl, the aryl of the diarylamino, the heteroaryl of the diheteroarylamino, the aryl and the heteroaryl of the arylheteroarylamino, the aryl of the diarylboryl, or the aryl of the aryloxy in $R^1$ to $R^{11}$ in general formula (2) include the monovalent groups of the "aryl ring" or the "heteroaryl ring" described in general formula (1). As the alkyl, the cycloalkyl, or the alkoxy in $R^1$ to $R^{11}$, the description on the "alkyl", the "cycloalkyl", or the "alkoxy" as a primary substituent in the above description of general formula (1) can be referred to. The same also applies to an aryl, a heteroaryl, an alkyl, or a cycloalkyl as a substituent on these groups. The same also applies to a heteroaryl, a diarylamino, a diheteroarylamino, an arylheteroarylamino, a diarylboryl, an alkyl, a cycloalkyl, an alkoxy, or an aryloxy as a substituent on these groups in a case of forming an aryl ring or a heteroaryl ring by bonding adjacent groups among $R^1$ to $R^{11}$ together with ring a, ring b, or ring c, and an aryl, a heteroaryl, an alkyl, or a cycloalkyl as a further substituent.

R in the moiety >N—R in $X^1$ and $X^2$ in general formula (1) represents an aryl, a heteroaryl, an alkyl, or a cycloalkyl which may be substituted by the secondary substituent described above, and at least one hydrogen atom in the aryl or the heteroaryl may be substituted by, for example, an alkyl or a cycloalkyl. Examples of this aryl, heteroaryl, alkyl, and cycloalkyl include the groups described above. Particularly, an aryl having 6 to 10 carbon atoms (for example, phenyl or naphthyl), a heteroaryl having 2 to 15 carbon atoms (for example, carbazolyl), an alkyl having 1 to 4 carbon atoms (for example, methyl or ethyl), and a cycloalkyl having 5 to 10 carbon atoms (preferably, cyclohexyl or adamantyl) are preferable. This description also applies to $X^1$ and $X^2$ in general formula (2).

R in the moiety >C(—R)$_2$ in $X^1$ and $X^2$ in general formula (1) represents an aryl, an alkyl, or a cycloalkyl which may be substituted by the secondary substituent described above, and at least one hydrogen atom in the aryl may be substituted by, for example, an alkyl or a cycloalkyl. Examples of this aryl, alkyl, and cycloalkyl include the groups described above. Particularly, an aryl having 6 to 10 carbon atoms (for example, phenyl or naphthyl), an alkyl having 1 to 4 carbon atoms (for example, methyl or ethyl), and a cycloalkyl having 5 to 10 carbon atoms (preferably, cyclohexyl or adamantyl) are preferable. This description also applies to $X^1$ and $X^2$ in general formula (2).

R in "—C(—R)$_2$—" which is a linking group in general formula (1) represents a hydrogen atom, an alkyl, or a cycloalkyl, and examples of this alkyl and cycloalkyl include the groups described above. Particularly, an alkyl having 1 to 4 carbon atoms (for example, methyl or ethyl), and a cycloalkyl having 5 to 10 carbon atoms (preferably, cyclohexyl or adamantyl) are preferable. This description also applies to "—C(—R)$_2$—" which is a linking group in general formula (2).

The invention of the present application is a multimer of a polycyclic aromatic compound having a plurality of unit structures each represented by general formula (1), and preferably a multimer of a polycyclic aromatic compound having a plurality of unit structures each represented by general formula (2). The multimer is preferably a dimer to a hexamer, more preferably a dimer to a trimer, and particularly preferably a dimer. The multimer may be in a form having a plurality of the unit structures described above in one compound, and for example, the multimer may be in a form in which the plurality of unit structures is bonded via a linking group such as a single bond, an alkylene group having 1 to 3 carbon atoms, a phenylene group, or a naphthylene group. In addition, the multimer may be in a form in which the plurality of unit structures is bonded such that any ring (ring A, ring B, ring C, ring a, ring b, or ring c) contained in the unit structures is shared by the plurality of unit structures, or may be in a form in which the plurality of unit structures is bonded such that any rings contained in the unit structures (ring A, ring B, ring C, ring a, ring b, or ring c) are fused.

Examples of such a multimer include multimer compounds represented by the following formulas (2-4), (2-4-1), (2-4-2), (2-5-1) to (2-5-4), and (2-6). To be described in connection with general formula (2), the multimer compound represented by the following formula (2-4) includes a plurality of unit structures each represented by general formula (2) in one compound so as to share a benzene ring as ring a. To be described in connection with general formula (2), the multimer compound represented by the following formula (2-4-1) includes two unit structures each represented by general formula (2) in one compound so as to share a benzene ring as ring a. To be described in connection with general formula (2), the multimer compound represented by the following formula (2-4-2) includes three unit structures each represented by general formula (2) in one compound so as to share a benzene ring as ring a. To be described in connection with general formula (2), each of the multimer compounds represented by the following formulas (2-5-1) to (2-5-4) includes a plurality of unit structures each represented by general formula (2) in one compound so as to share a benzene ring as ring b (or ring c). To be described in connection with general formula (2), for example, the multimer compound represented by the following formula (2-6) includes a plurality of unit structures each represented by general formula (2) in one compound such that a benzene ring as ring b (or ring a or ring c) of a certain unit structure and a benzene ring as ring b (or ring a or ring c) of a certain unit structure are fused.

(2-4)
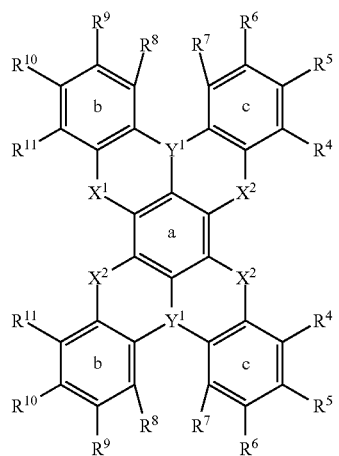
(2-4-1)
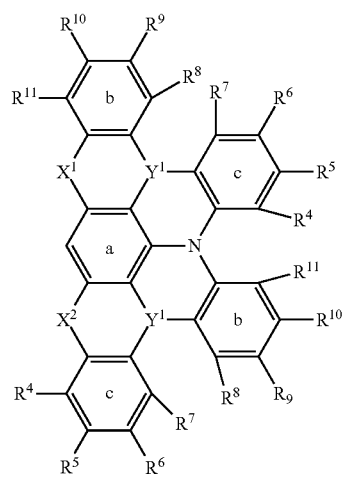
(2-4-2)
(2-5-1)
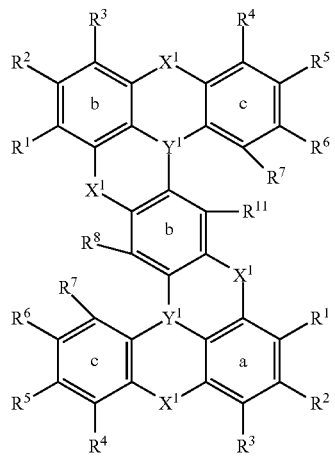
(2-5-2)
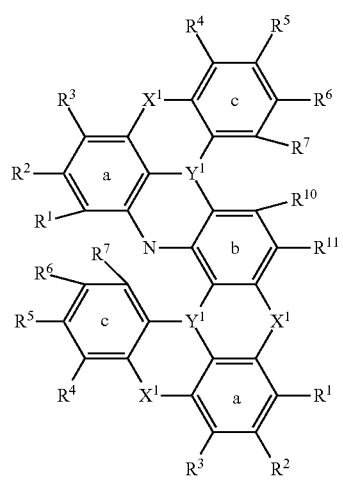
(2-5-3)
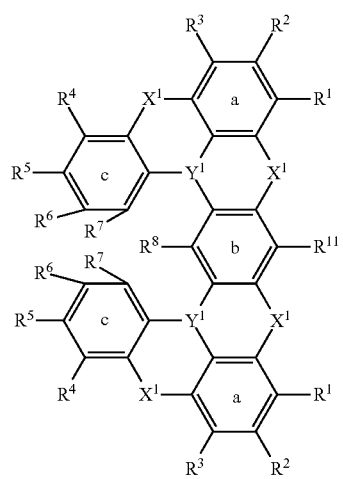

-continued

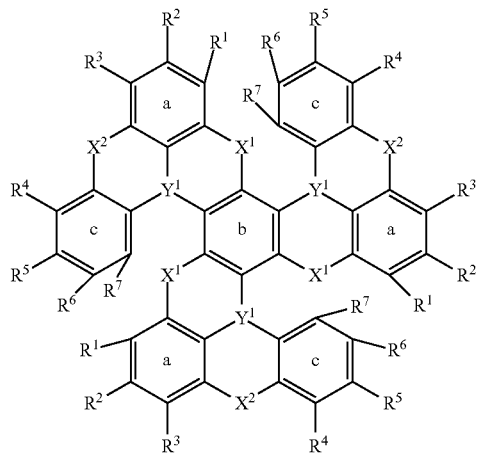
(2-5-4)

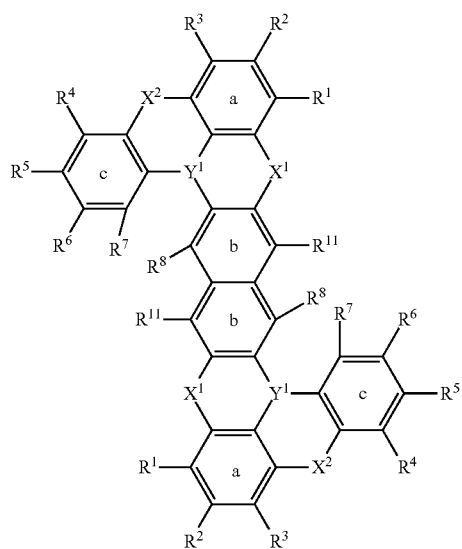
(2-6)

The multimer compound may be a multimer in which a multimer form represented by formula (2-4), (2-4-1) or (2-4-2) and a multimer form represented by any one of formula (2-5-1) to (2-5-4) or (2-6) are combined, may be a multimer in which a multimer form represented by any one of formula (2-5-1) to (2-5-4) and a multimer form represented by formula (2-6) are combined, or may be a multimer in which a multimer form represented by formula (2-4), (2-4-1) or (2-4-2), a multimer form represented by any one of formulas (2-5-1) to (2-5-4), and a multimer form represented by formula (2-6) are combined.

All or some of the hydrogen atoms in the chemical structures of the polycyclic aromatic compound represented by general formula (1) or (2) and a multimer thereof may be deuterium atoms, cyanos, or halogen atoms. For example, in formula (1), a hydrogen atom in the ring A, ring B, ring C (ring A to ring C are aryl rings or heteroaryl rings), substituents on the ring A to ring C, and R (=alkyl, cycloalkyl, or aryl) when $X^1$ and $X^2$ each represent >N—R or >C(—R)$_2$ may be substituted by a deuterium atom, cyano, or a halogen atom. Among these forms, a form in which all or some of the hydrogen atoms in the aryl or heteroaryl are substituted by deuterium atoms, cyanos, or hydrogen atoms may be mentioned. The halogen is fluorine, chlorine, bromine, or iodine, preferably fluorine, chlorine, or bromine, and more preferably fluorine or chlorine.

More specific examples of the polycyclic aromatic compound represented by formula (1) include compounds represented by the following structural formulas. Incidentally, in the following structural formulas, "Me" represents a methyl group, "tBu" represents a tertiary butyl group, "iPr" represents an isopropyl group, and "Ph" represents a phenyl group.

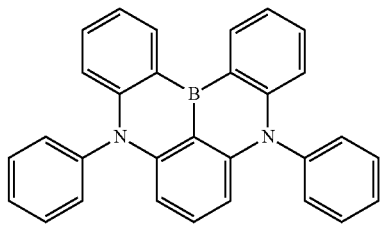
(1-1)

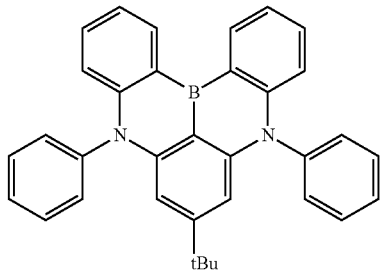
(1-2)

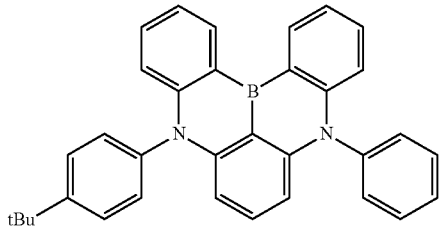
(1-3)

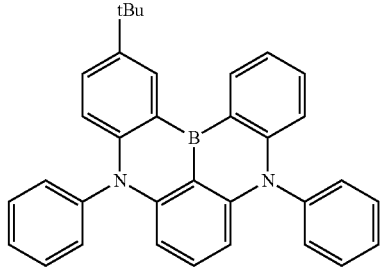
(1-4)

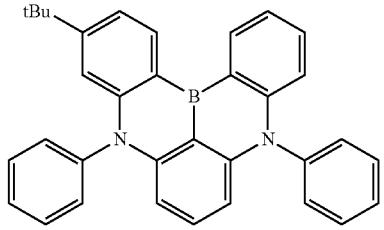
(1-5)

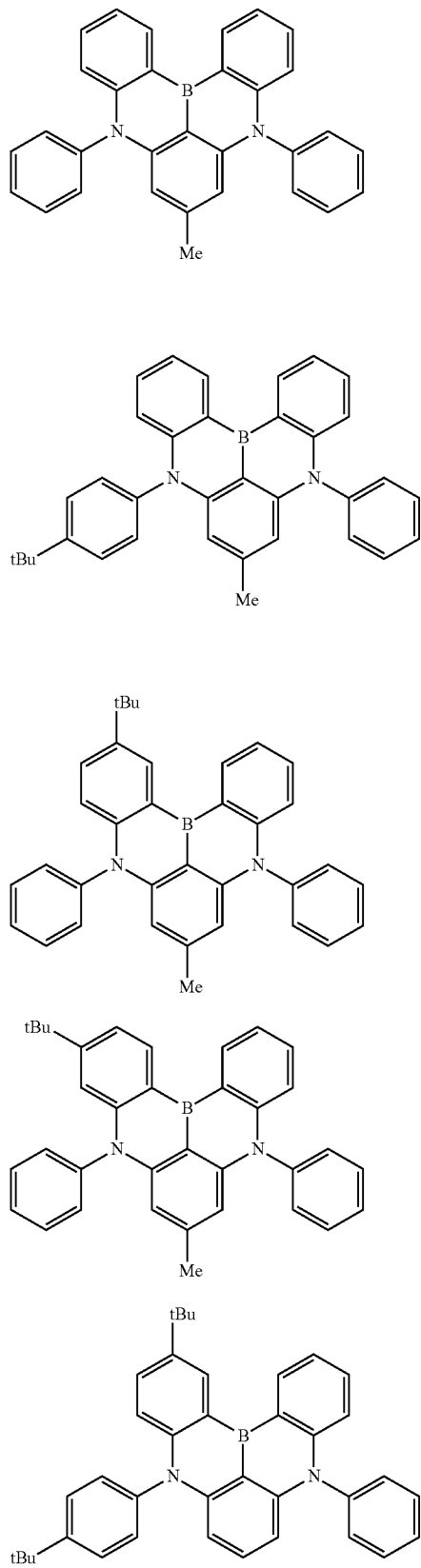
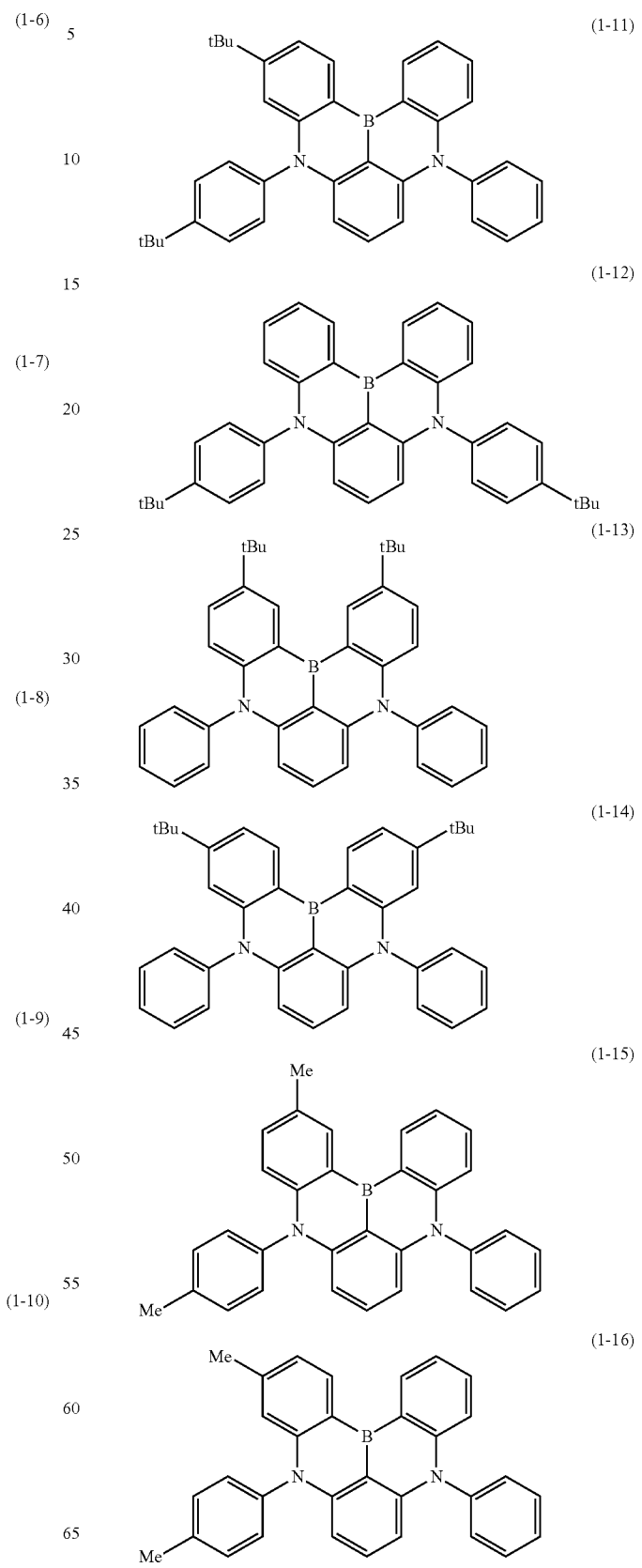

(1-17)
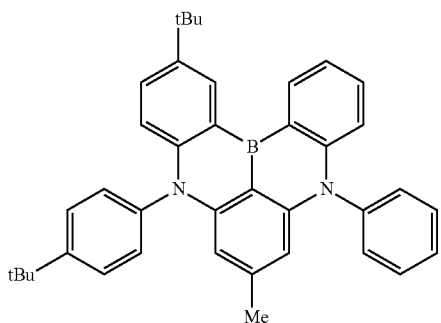
(1-18)
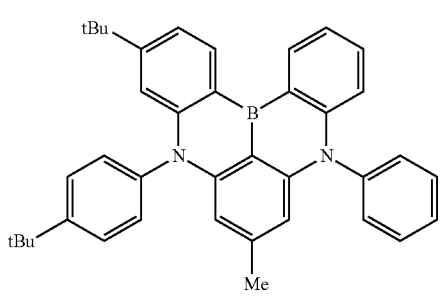
(1-19)
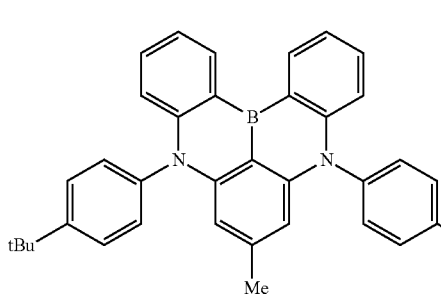
(1-20)
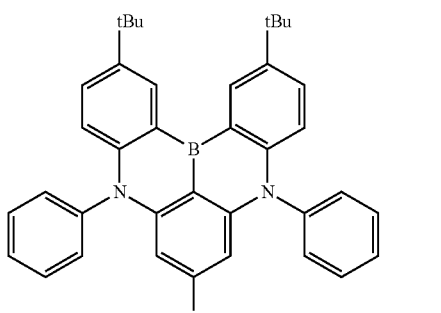
(1-21)
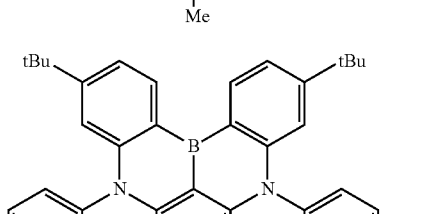
(1-22)
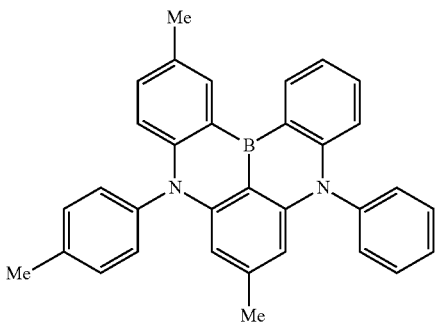
(1-23)
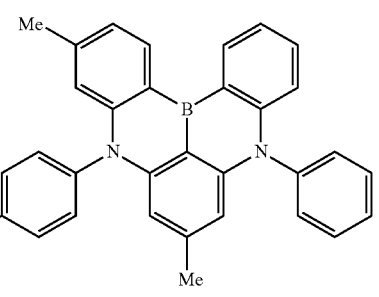
(1-24)
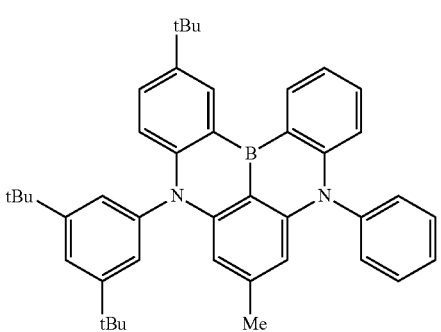
(1-25)
(1-26)
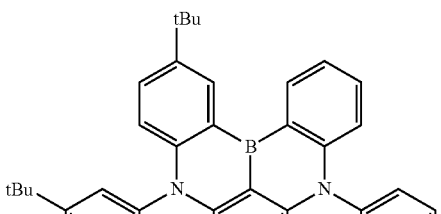

(1-27)
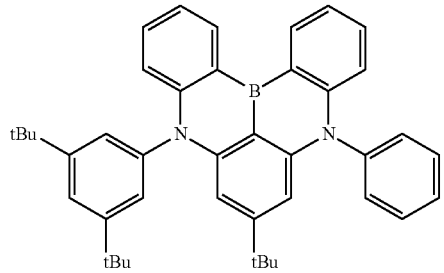
(1-28)
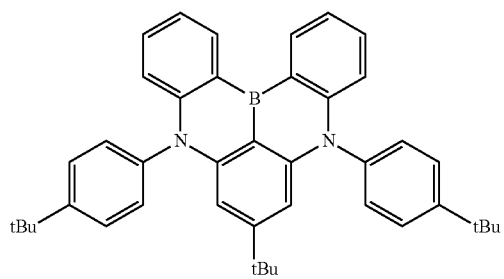
(1-29)
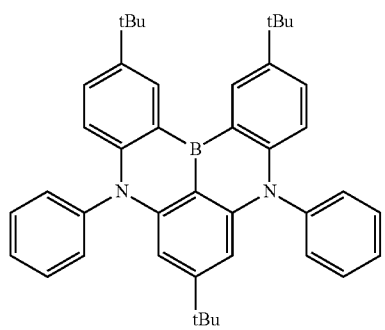
(1-30)
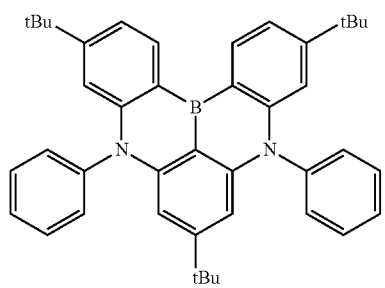
(1-31)
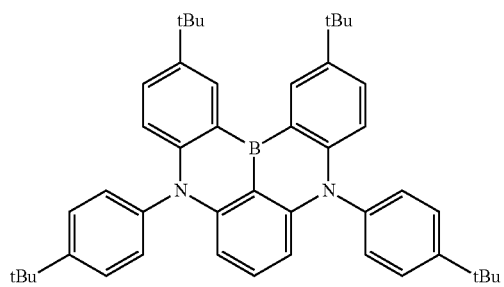
(1-32)
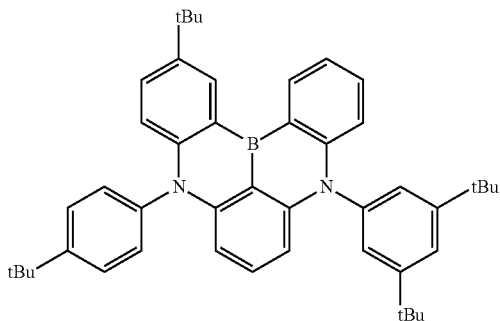
(1-33)
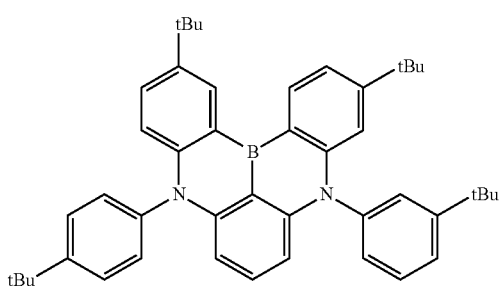
(1-34)
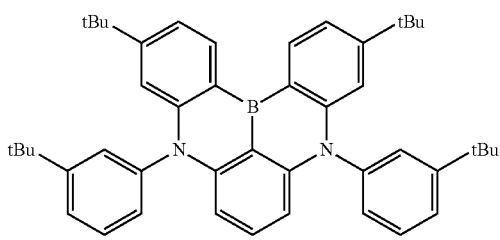
(1-35)
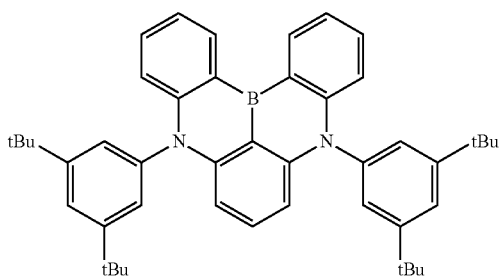
(1-36)
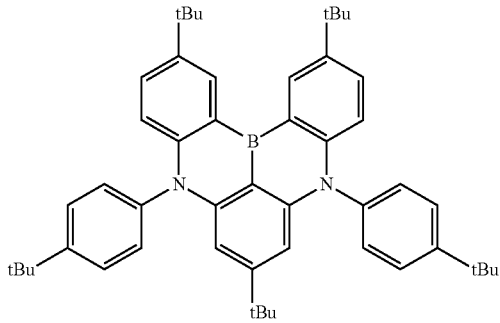

(1-37)
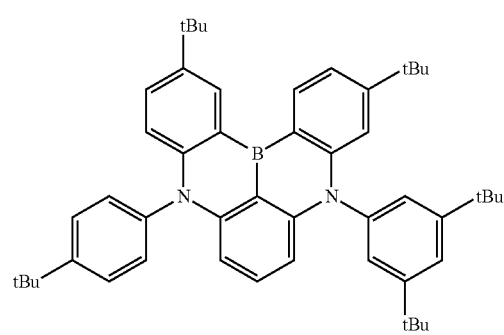
(1-38)
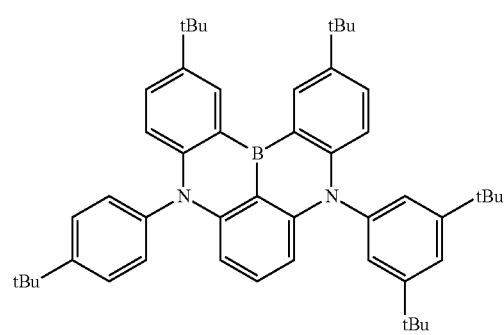
(1-39)
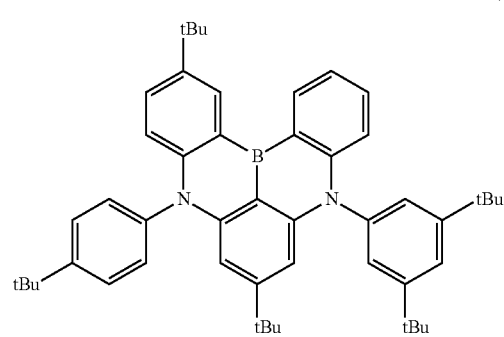
(1-40)
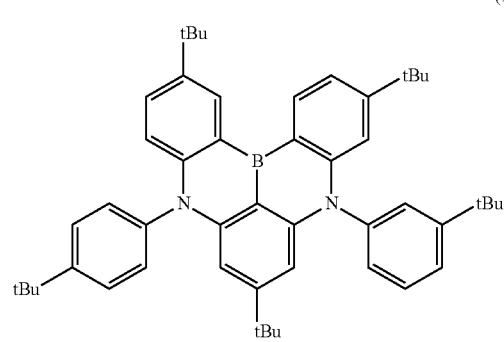
(1-41)
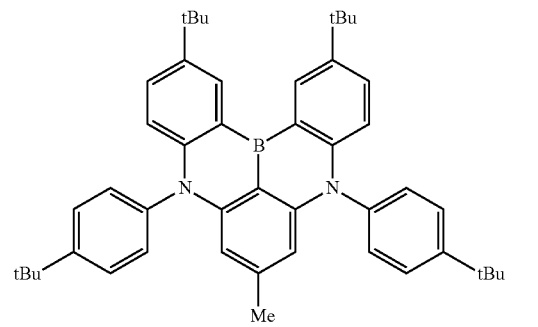
(1-42)
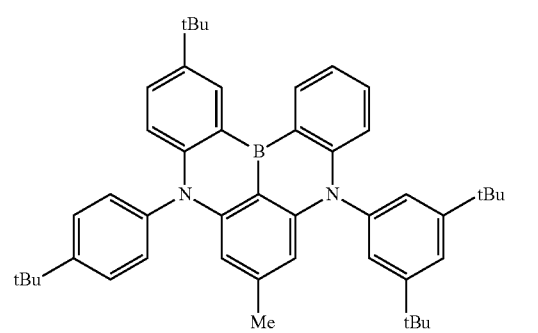
(1-43)
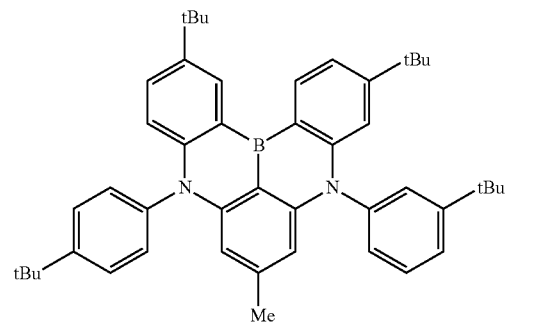
(1-44)
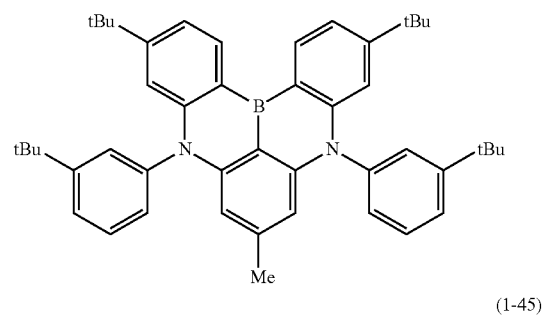
(1-45)
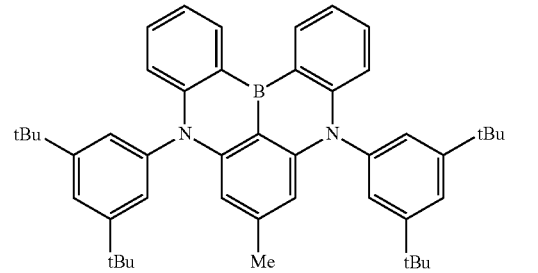

-continued
(1-46)
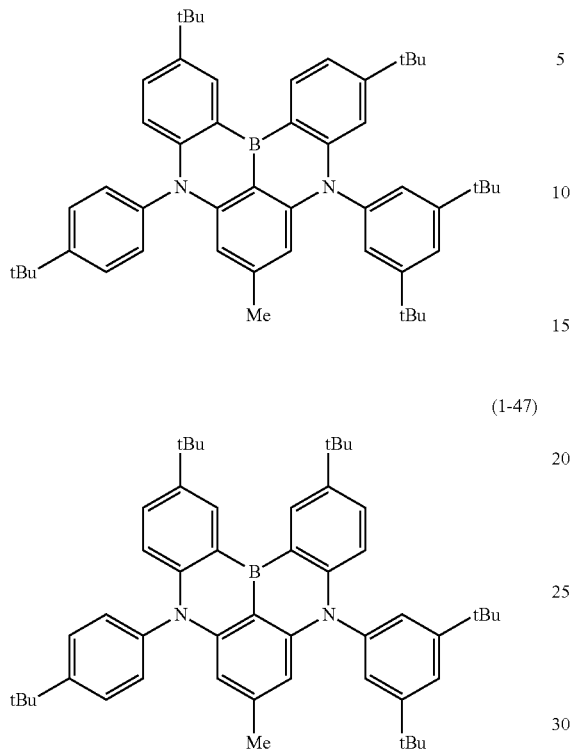
(1-50)
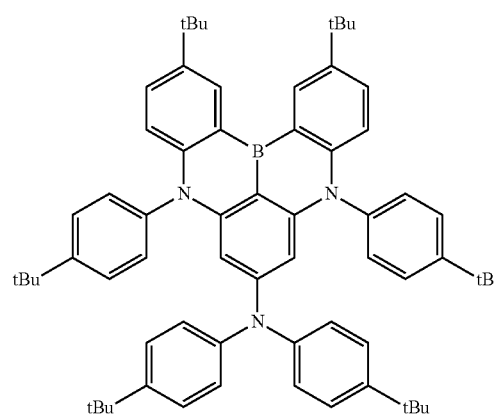
(1-47)
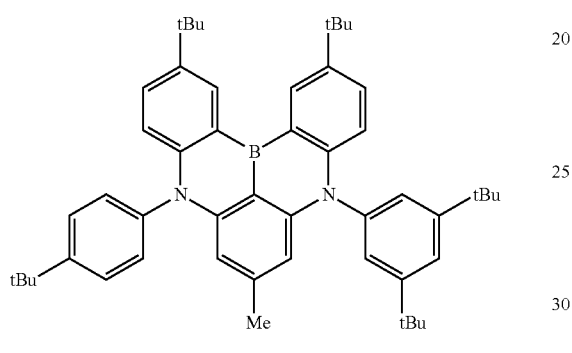
(1-51)
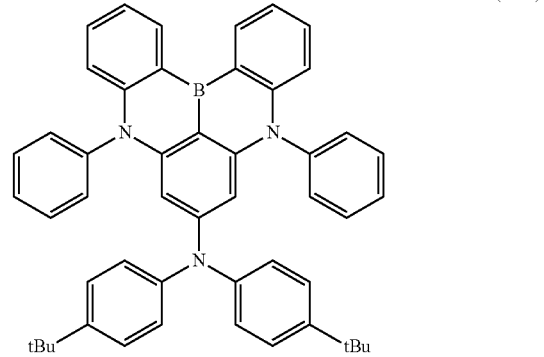
(1-48)
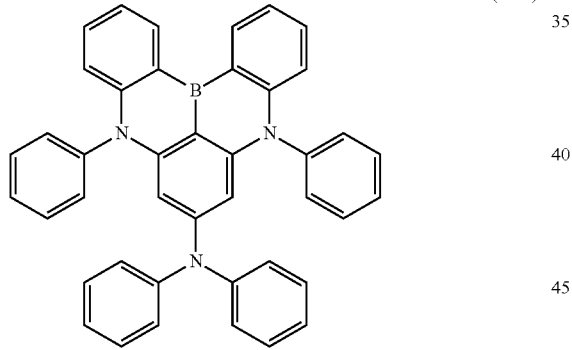
(1-52)
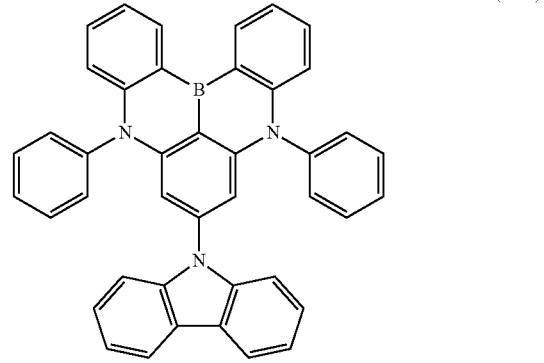
(1-49)
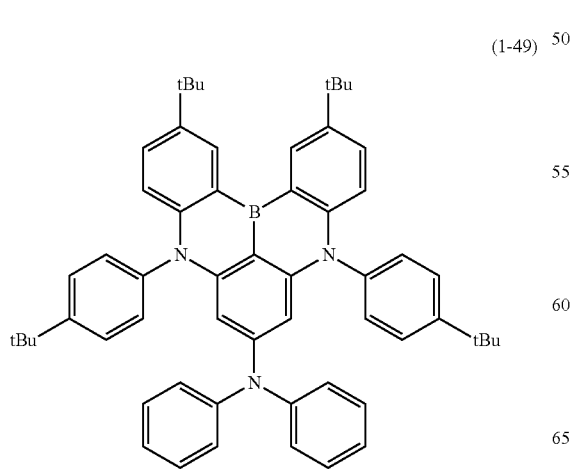
(1-53)
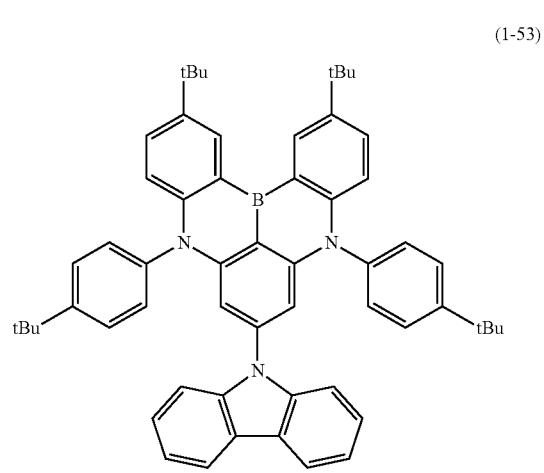

(1-54)
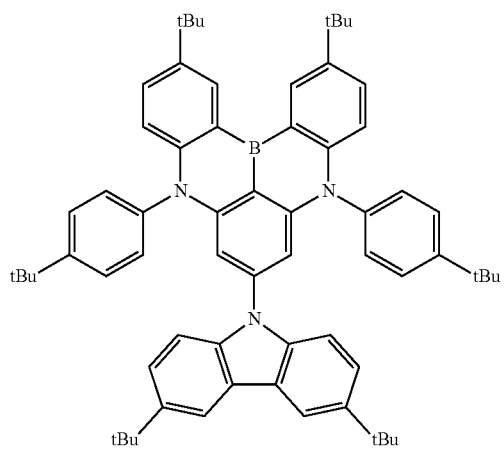
(1-55)
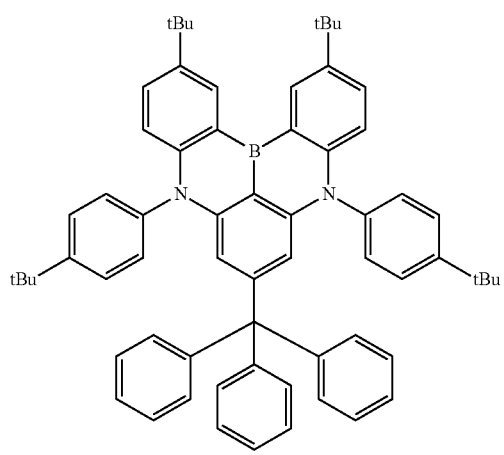
(1-56)
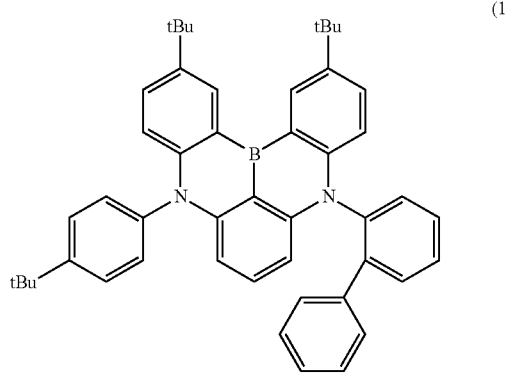
(1-57)
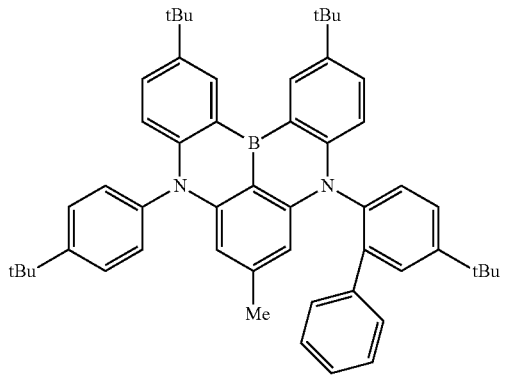
(1-58)
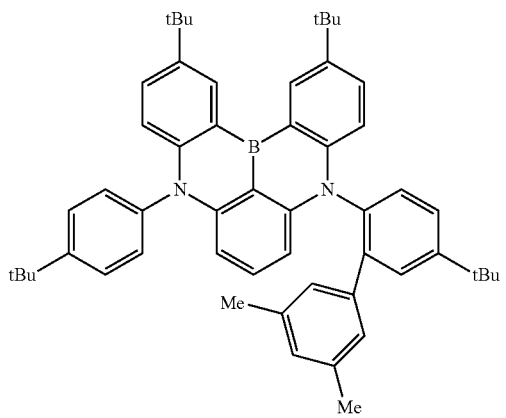
(1-59)
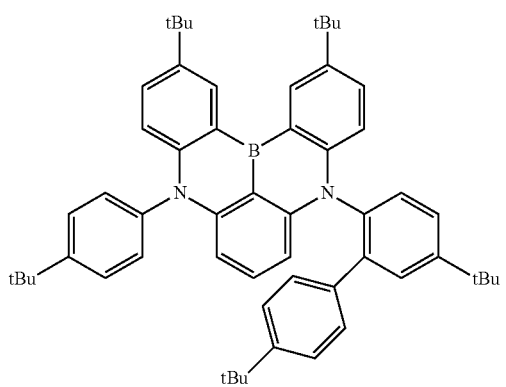
(1-60)
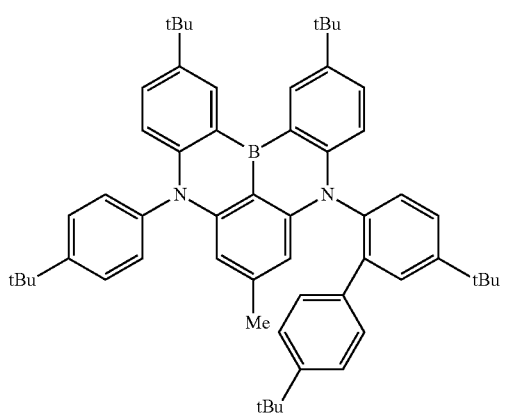

(1-61)
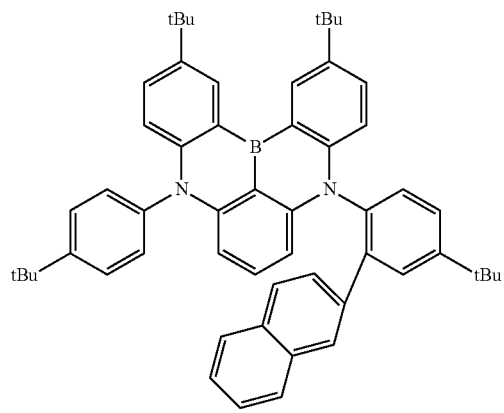
(1-62)
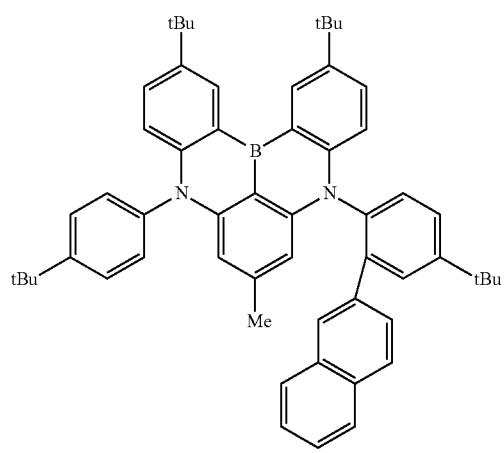
(1-63)
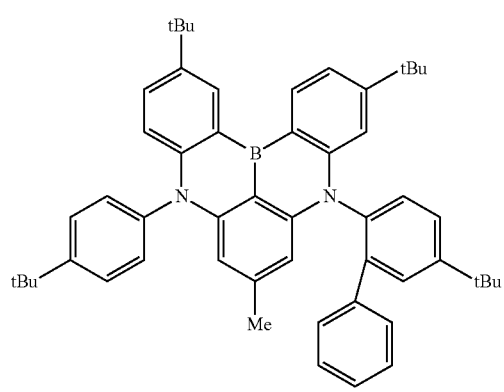
(1-64)
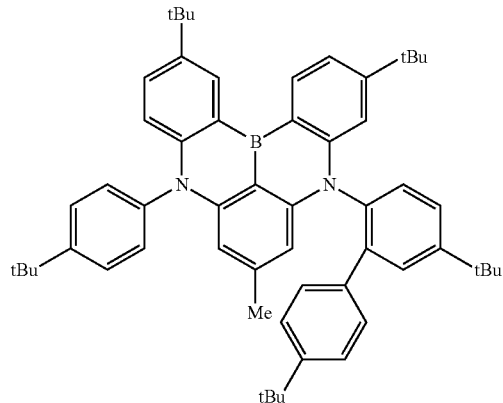
(1-65)
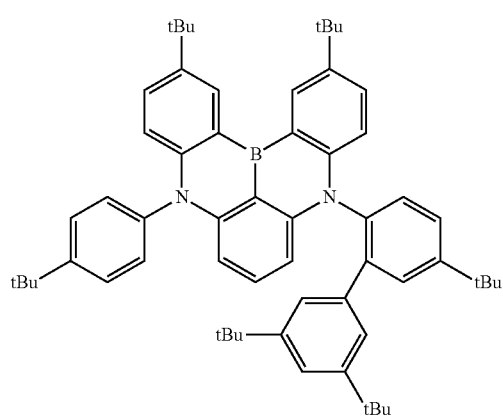
(1-66)
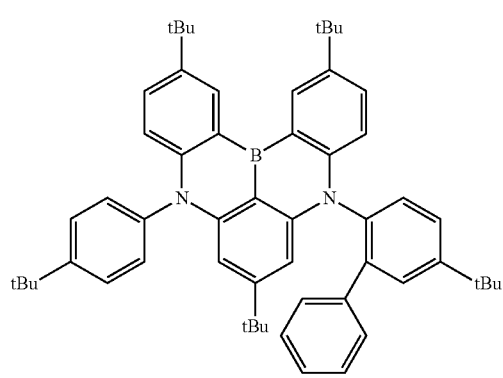
(1-67)
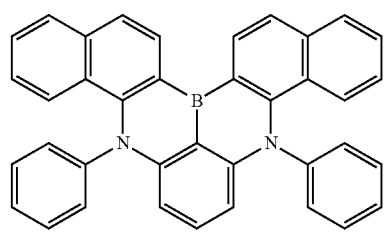

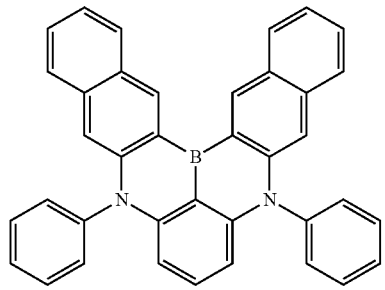
(1-68)
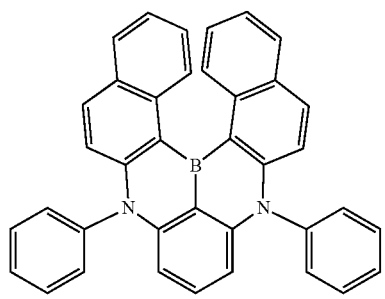
(1-69)
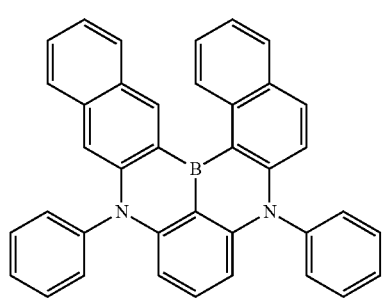
(1-70)
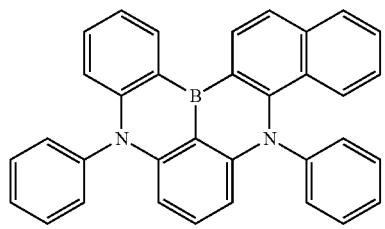
(1-71)
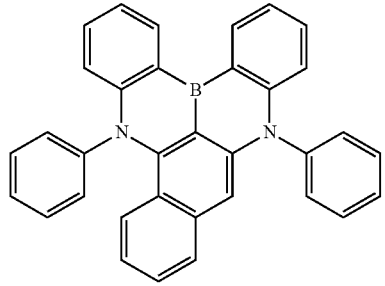
(1-72)
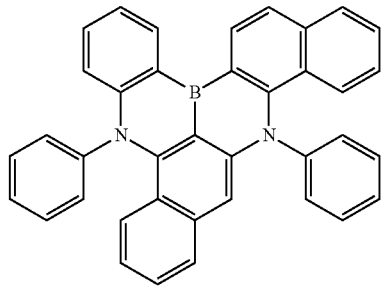
(1-73)
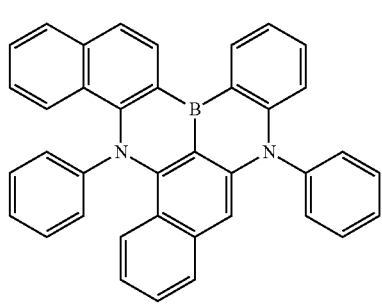
(1-74)
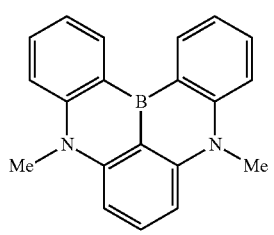
(1-75)
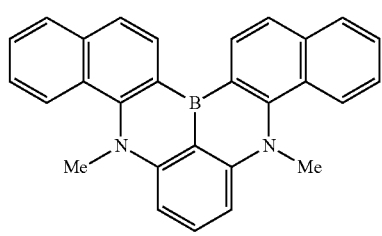
(1-76)
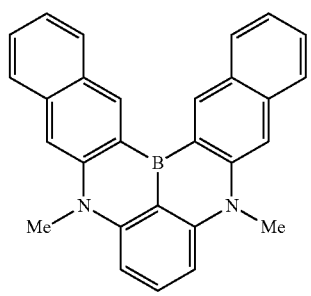
(1-77)

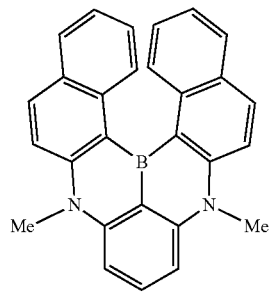 (1-78)
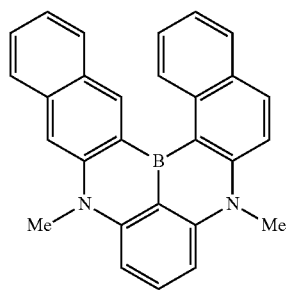 (1-79)
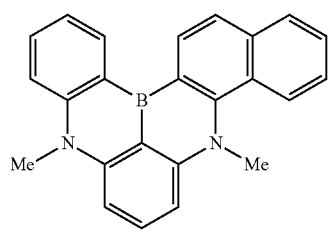 (1-80)
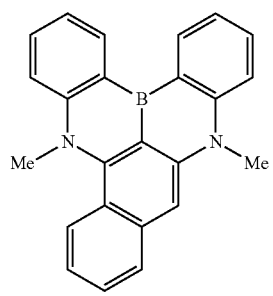 (1-81)
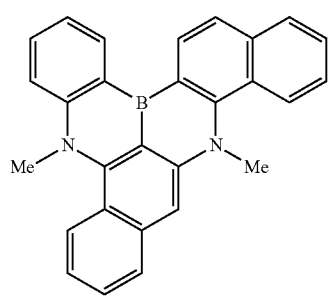 (1-82)
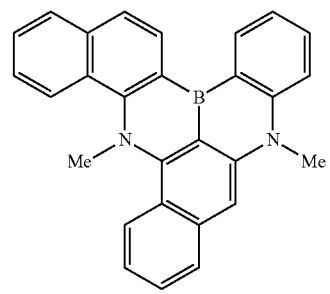 (1-83)
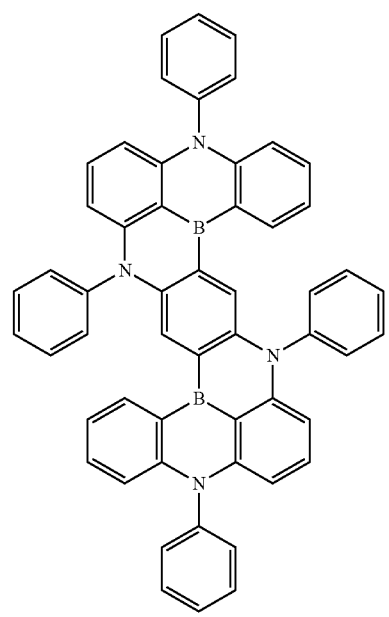 (1-84)
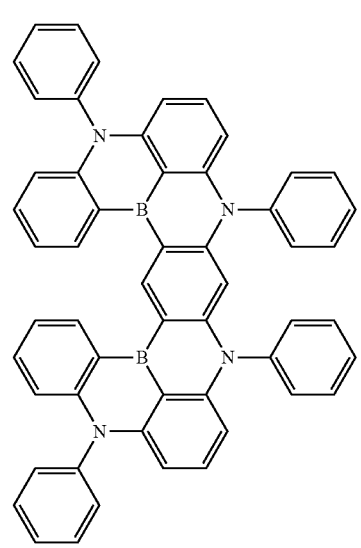 (1-85)

(1-86)
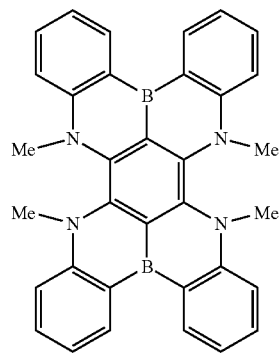
(1-87)
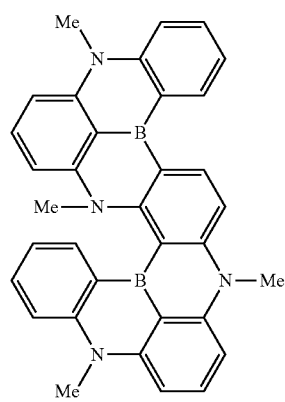
(1-88)
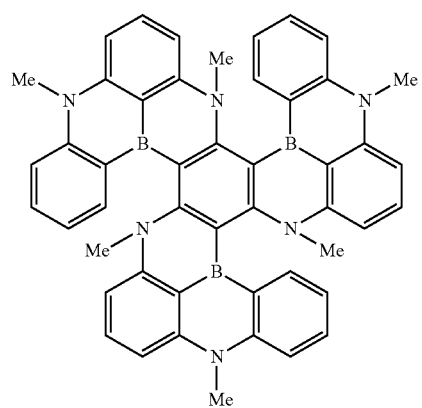
(1-89)
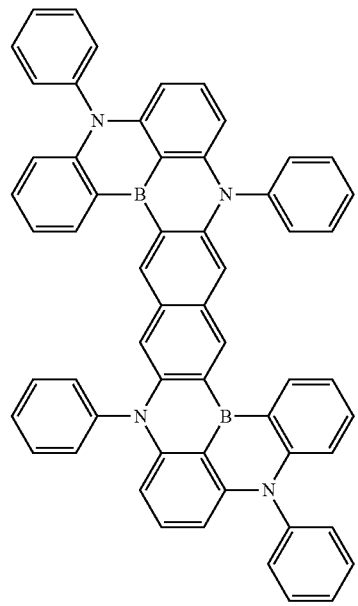
(1-90)
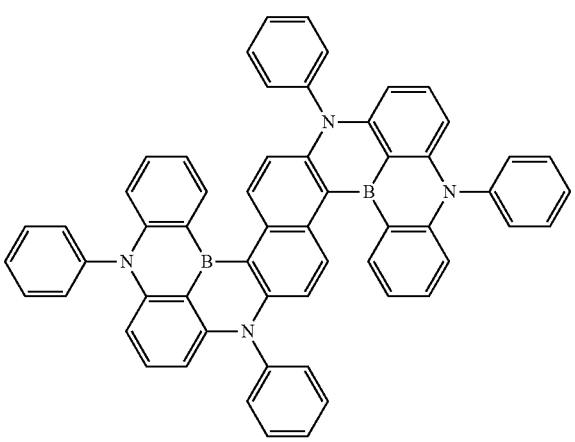

(1-91)
(1-92)
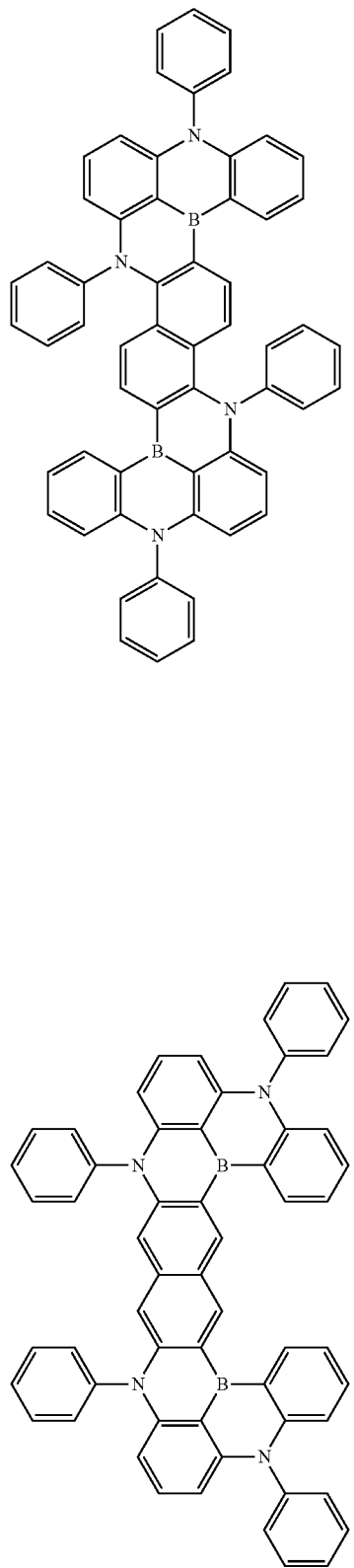
(1-93)
(1-94)
(1-95)
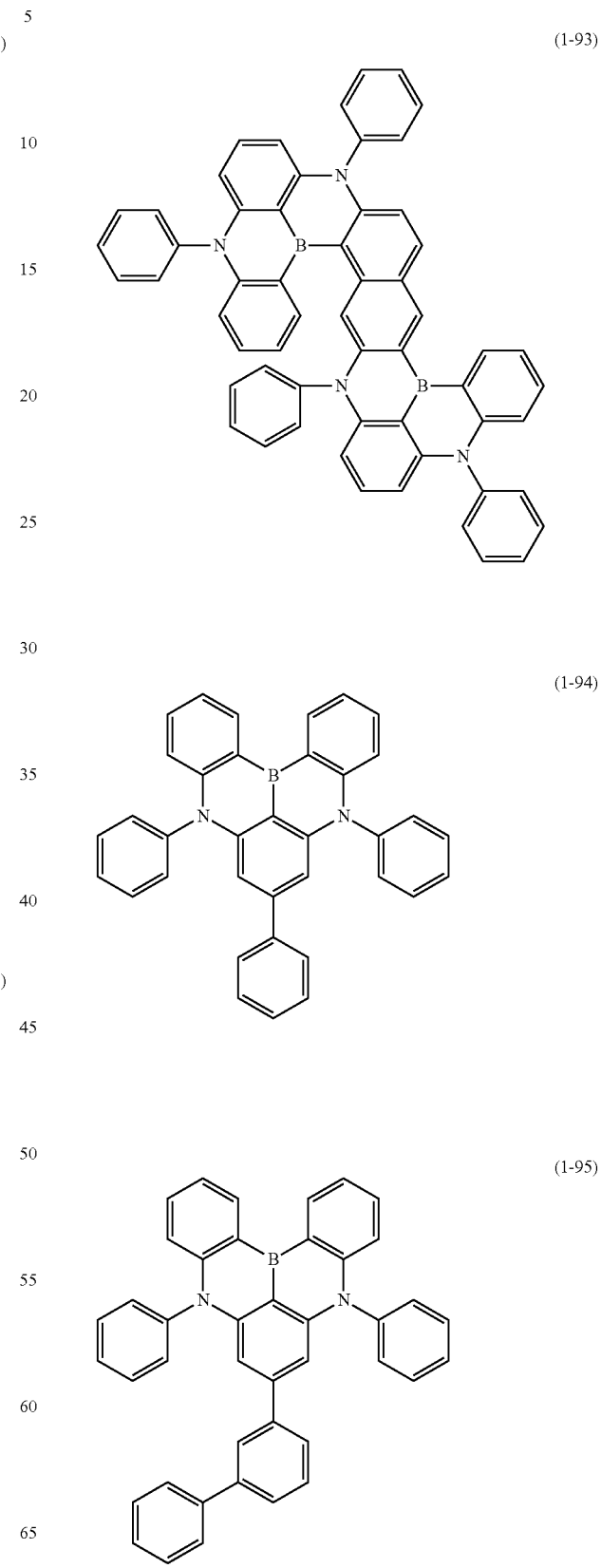

(1-96)
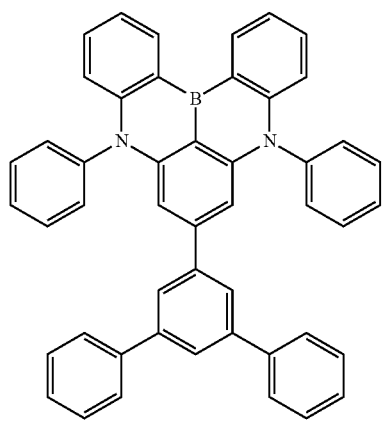
(1-97)
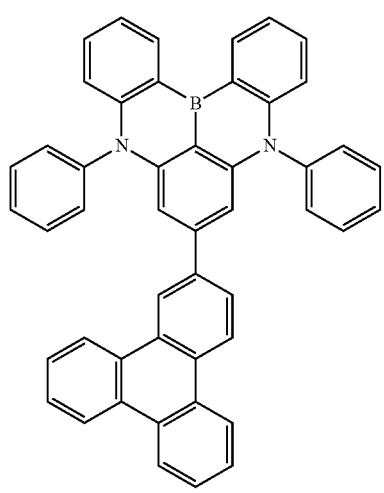
(1-98)
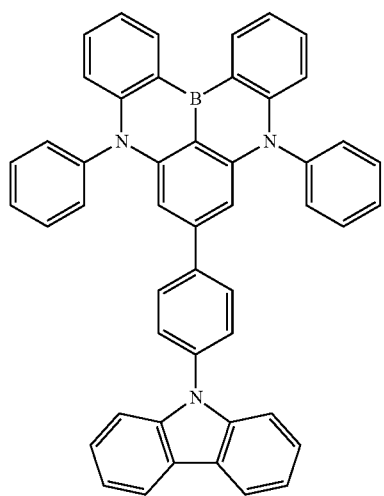
(1-99)
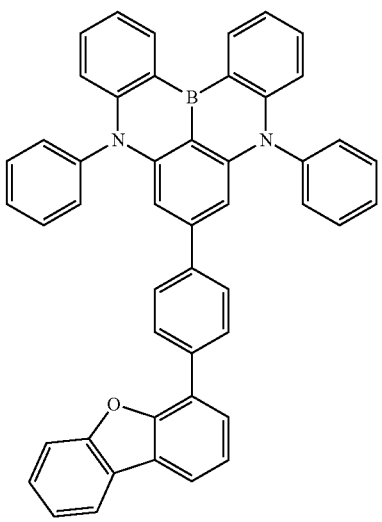
(1-100)
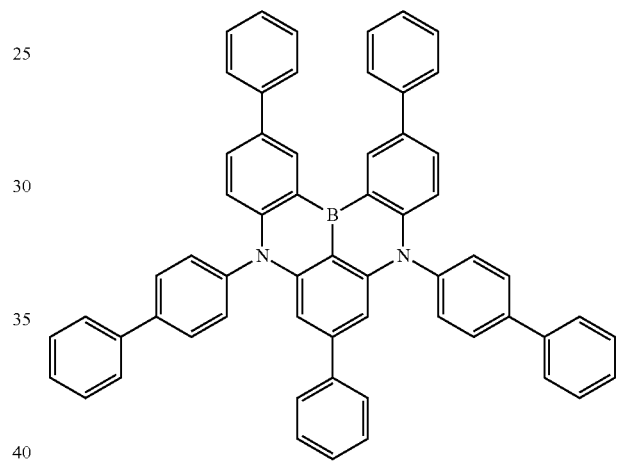
(1-101)
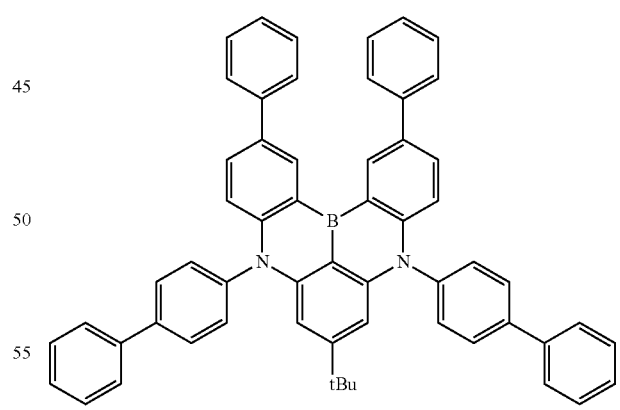
(1-102)
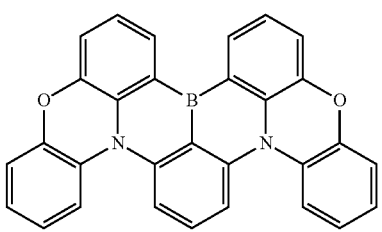

(1-103)
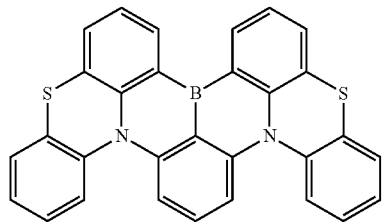
(1-104)
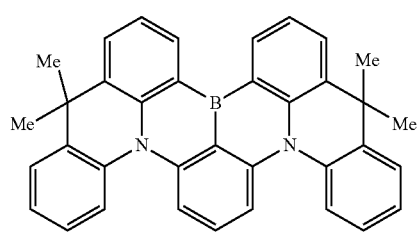
(1-105)
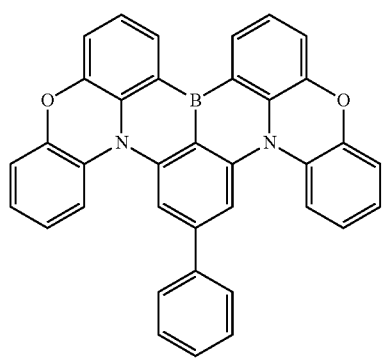
(1-106)
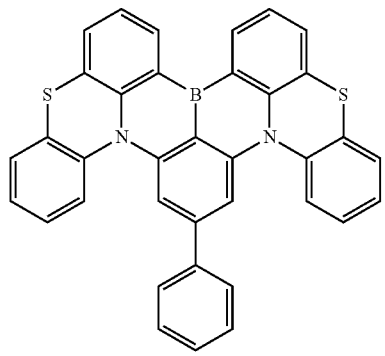
(1-107)
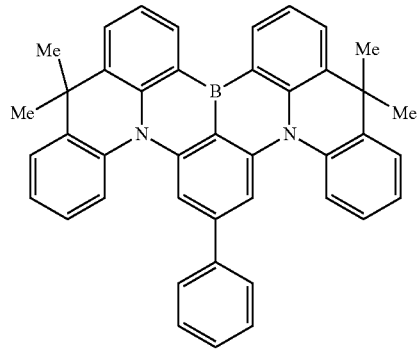
(1-108)
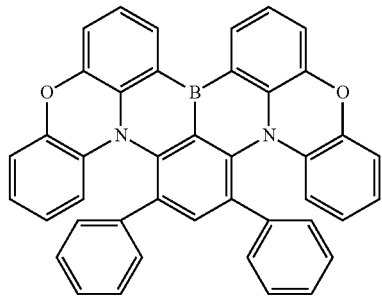
(1-109)
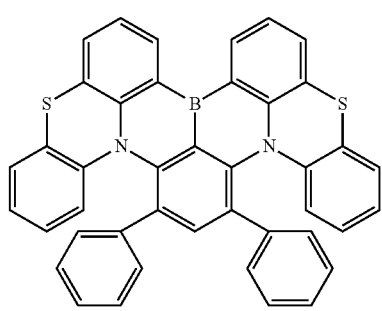
(1-110)
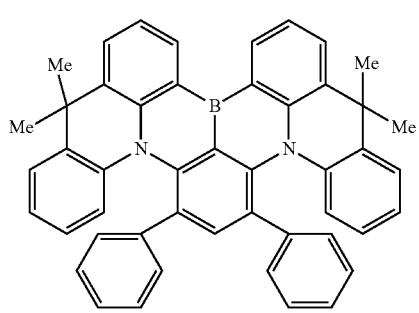
(1-111)
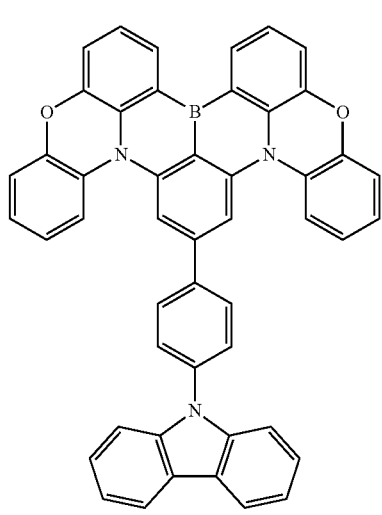

(1-112)
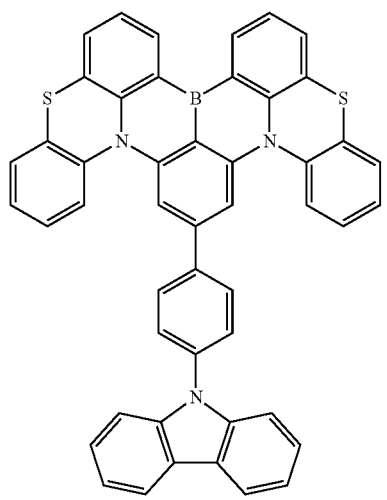
(1-113)
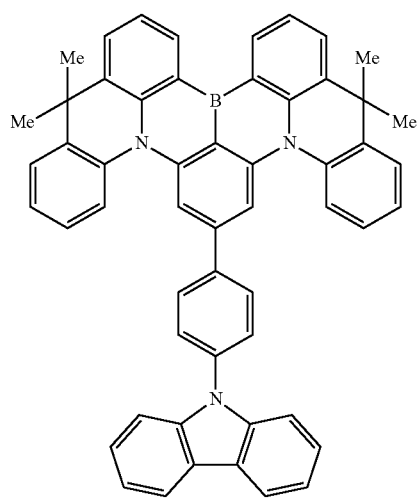
(1-114)
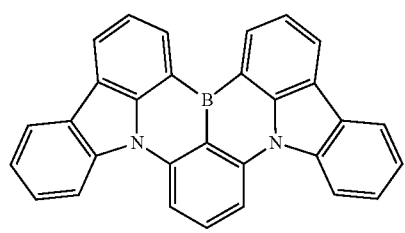
(1-115)
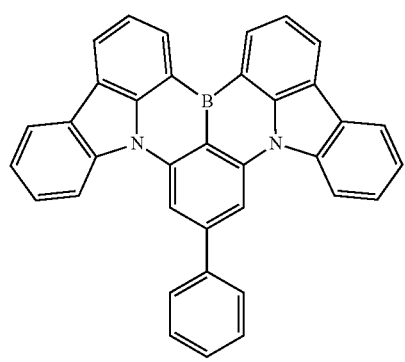
(1-116)
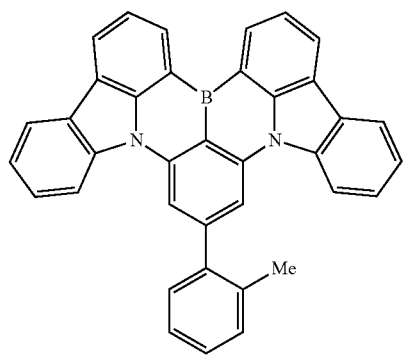
(1-117)
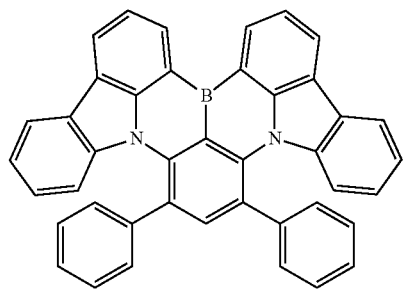
(1-118)
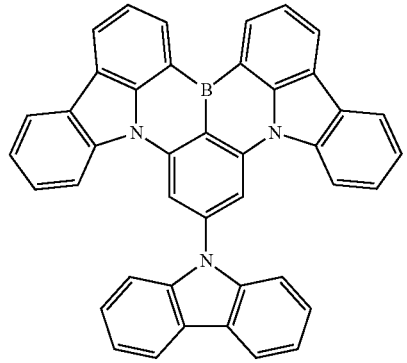
(1-119)
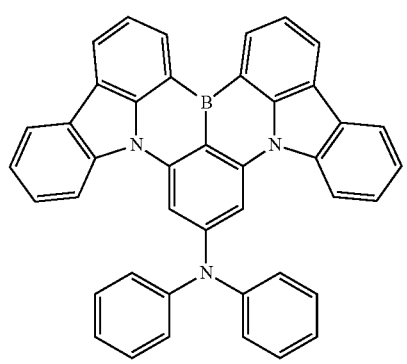

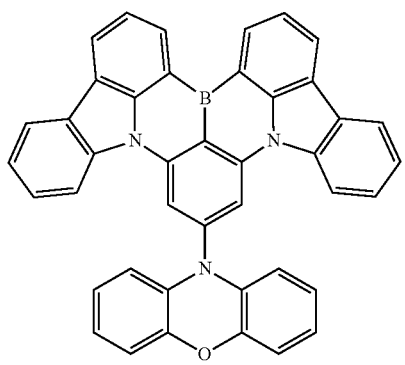
(1-120)
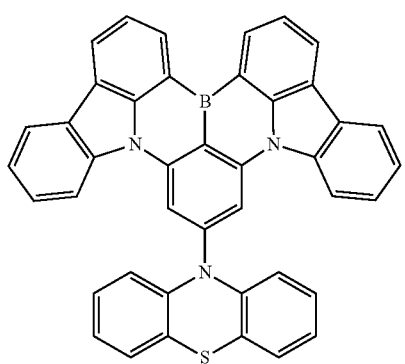
(1-121)
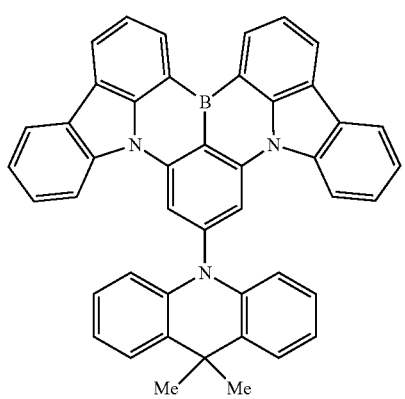
(1-122)
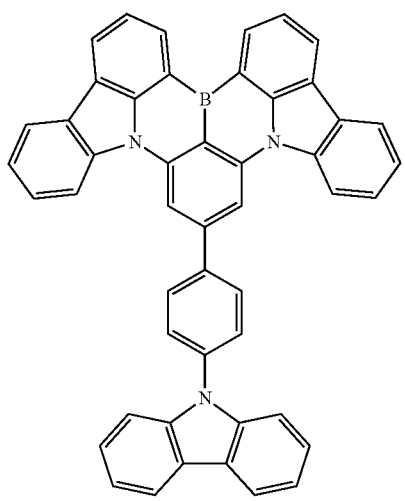
(1-123)
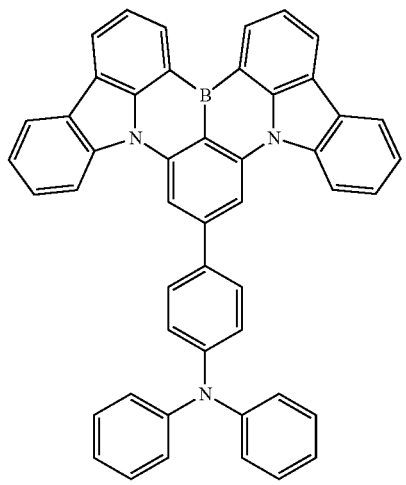
(1-124)
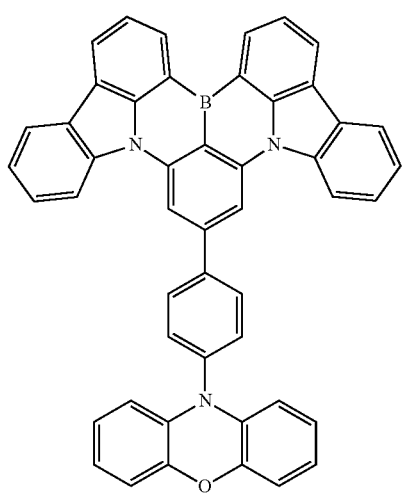
(1-125)
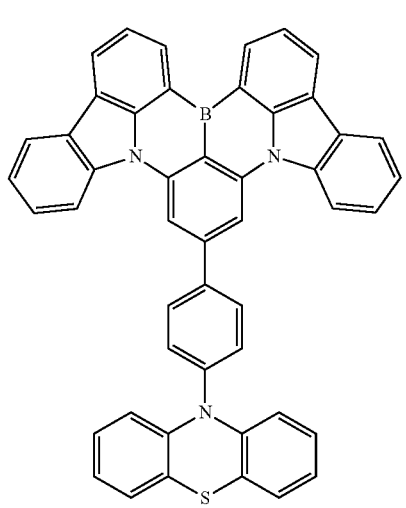
(1-126)

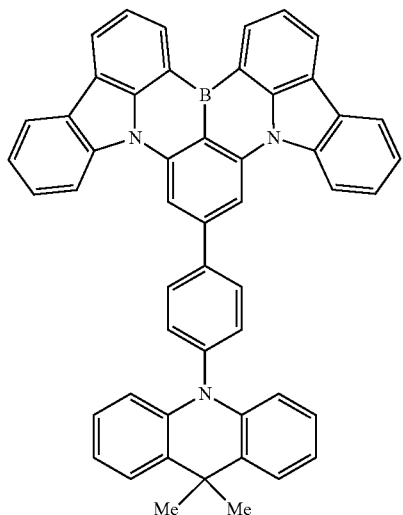
(1-127)
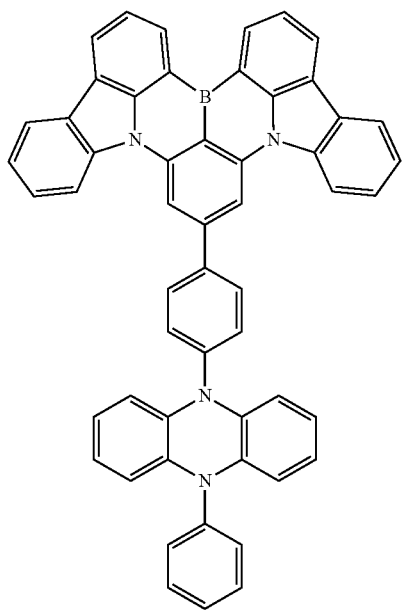
(1-128)
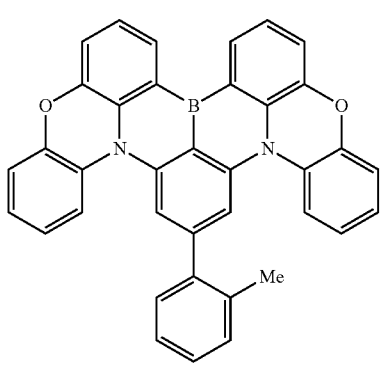
(1-129)
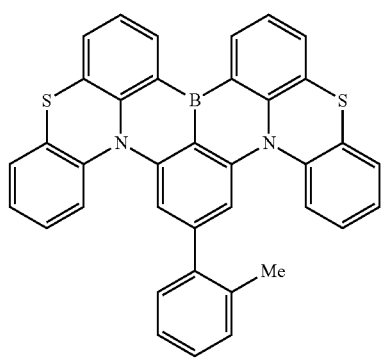
(1-130)
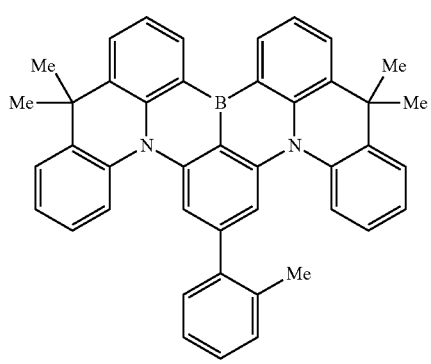
(1-131)
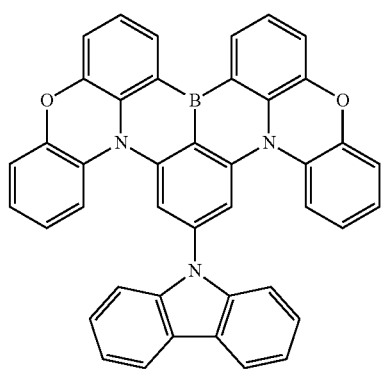
(1-132)
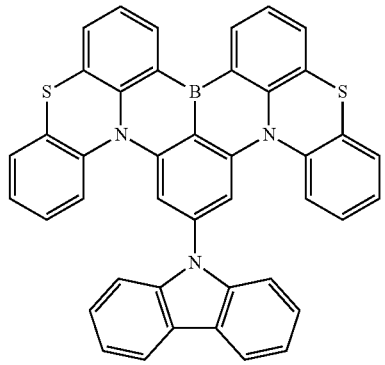
(1-133)

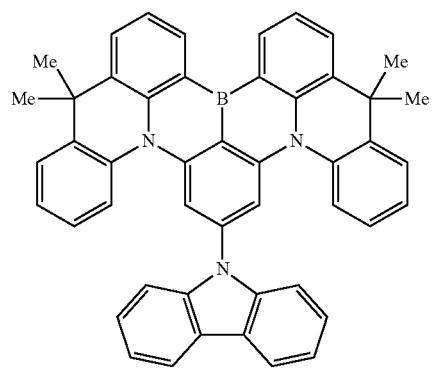 (1-134)
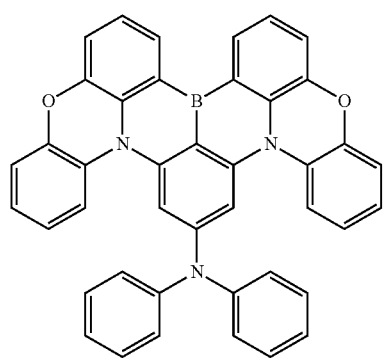 (1-135)
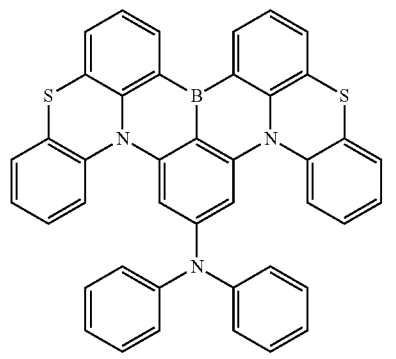 (1-136)
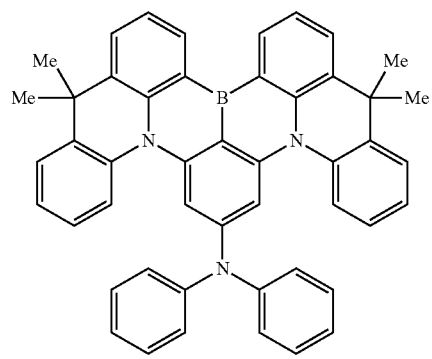 (1-137)
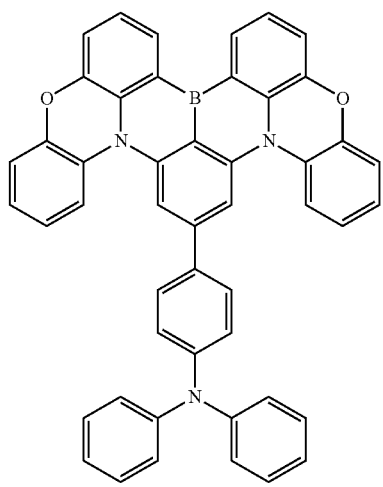 (1-138)
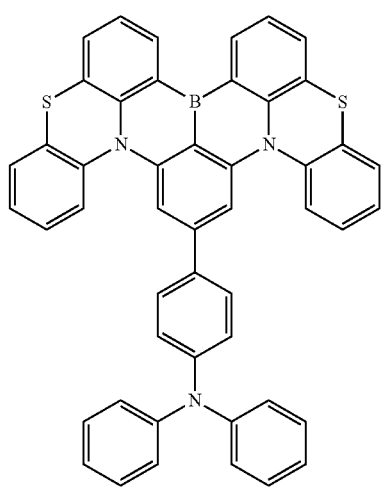 (1-139)
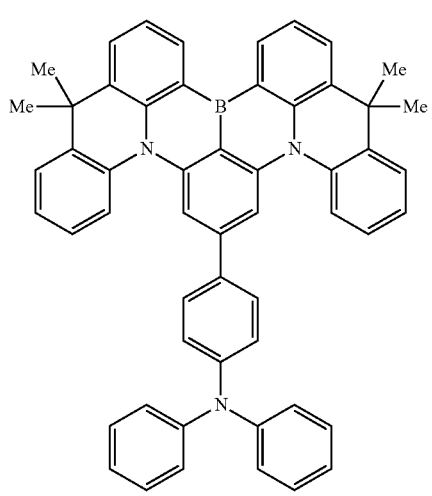 (1-140)

(1-141)
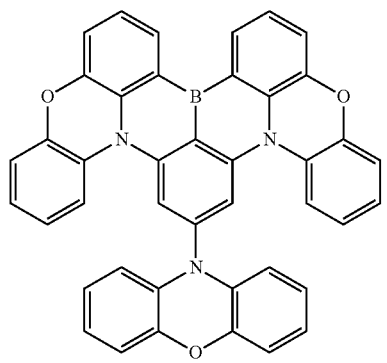
(1-142)
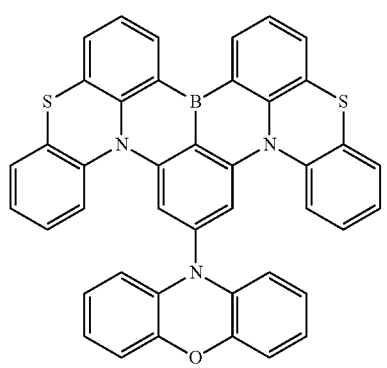
(1-143)
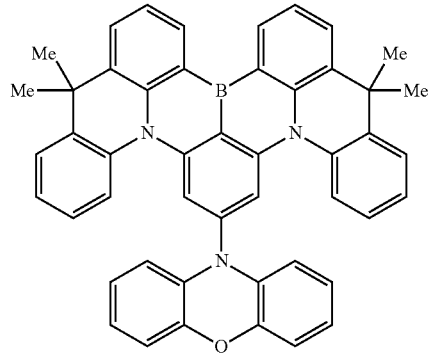
(1-144)
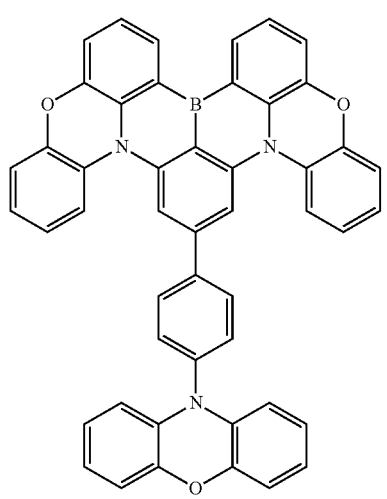
(1-145)
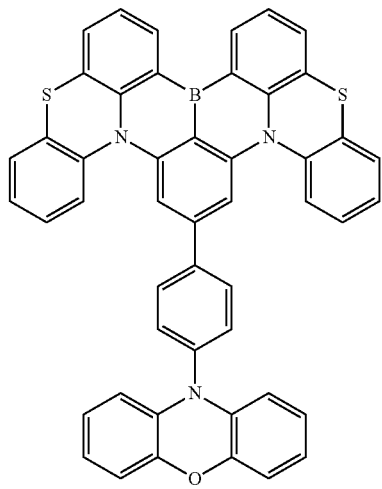
(1-146)
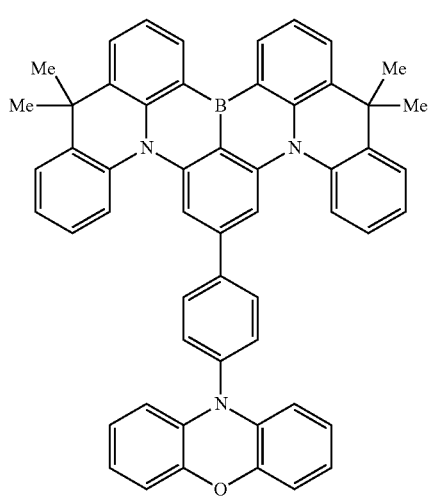
(1-147)
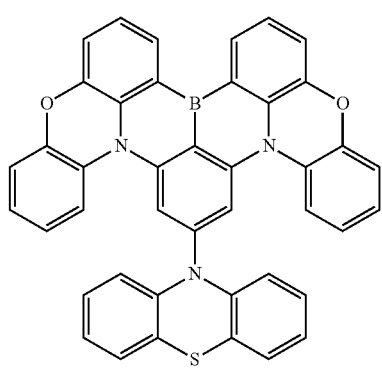

(1-148)
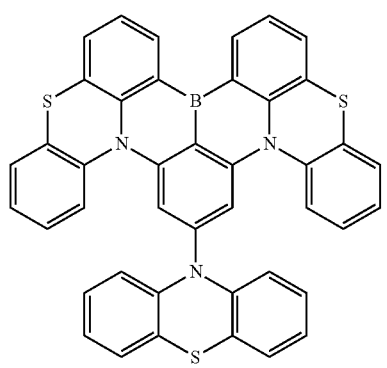
(1-149)
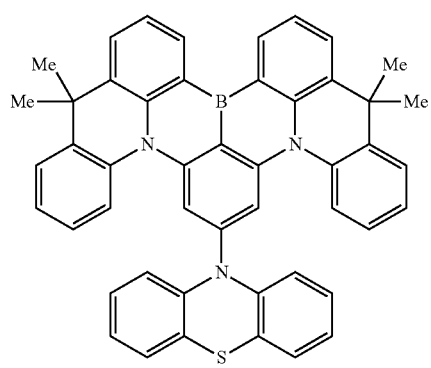
(1-150)
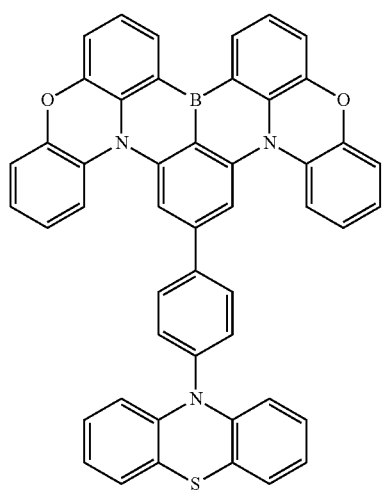
(1-151)
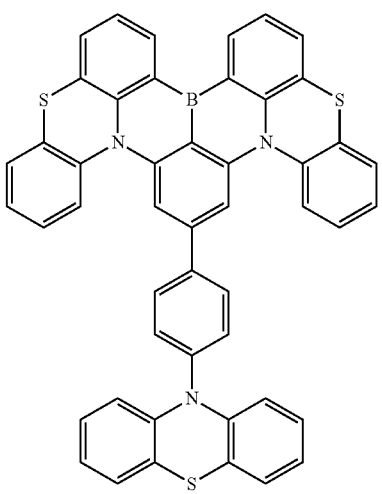
(1-152)
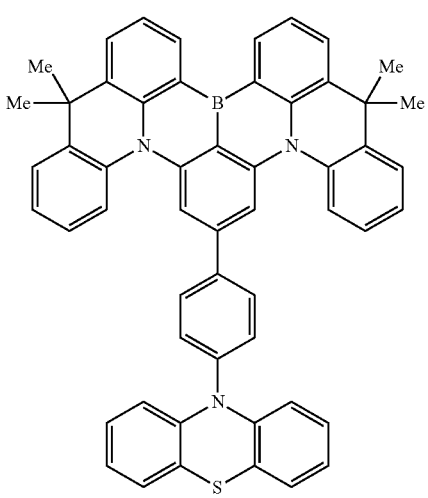
(1-153)
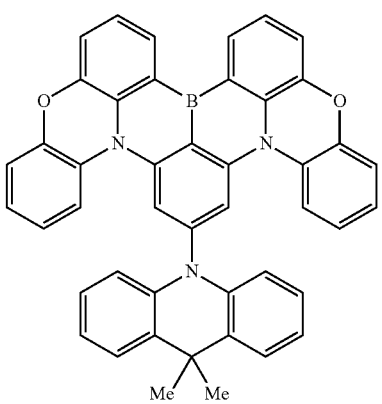

(1-154)
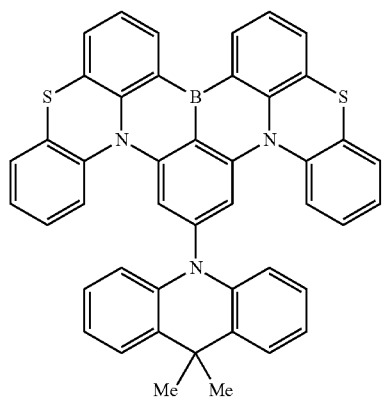
(1-155)
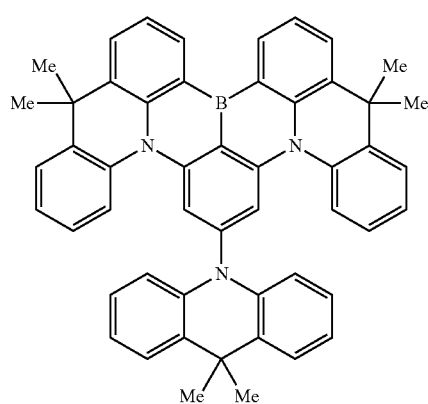
(1-156)
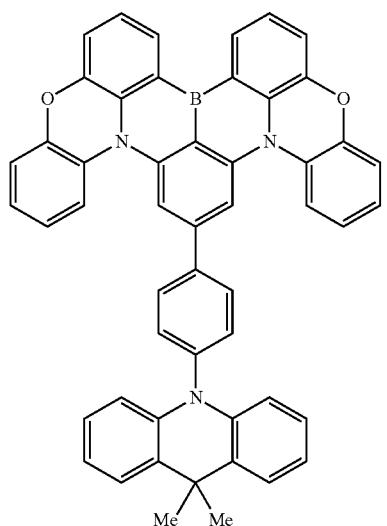
(1-157)
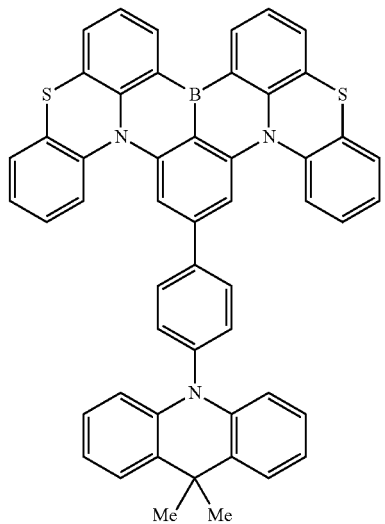
(1-158)
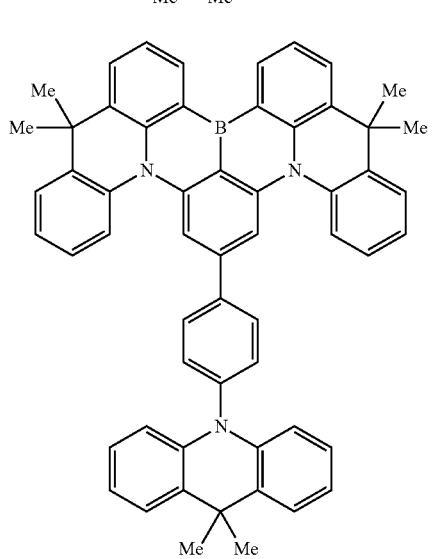
(1-159)
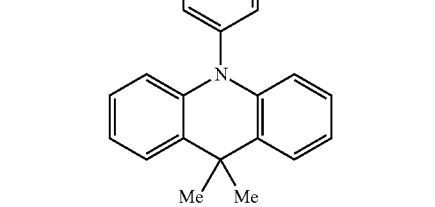
(1-160)
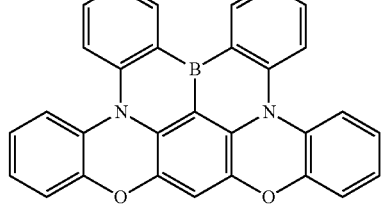

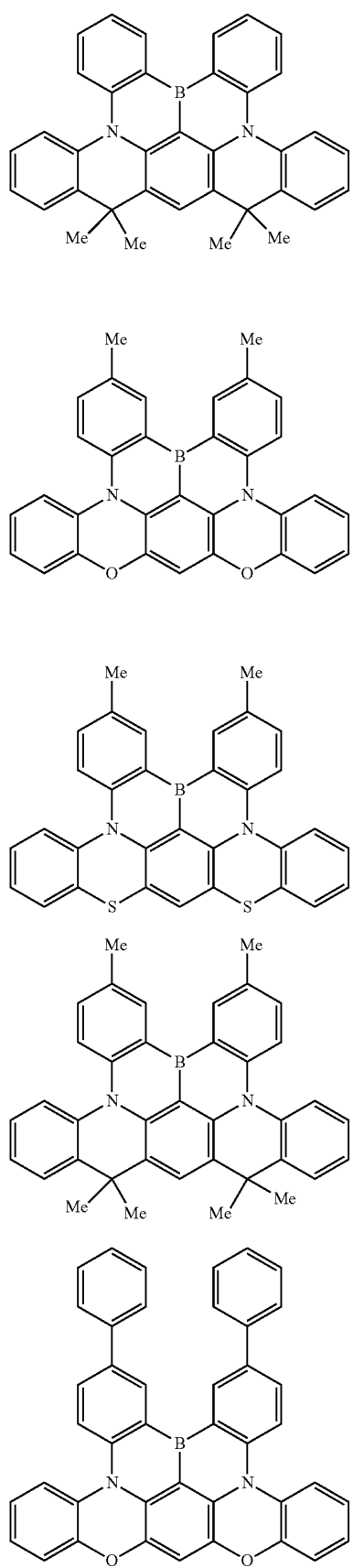
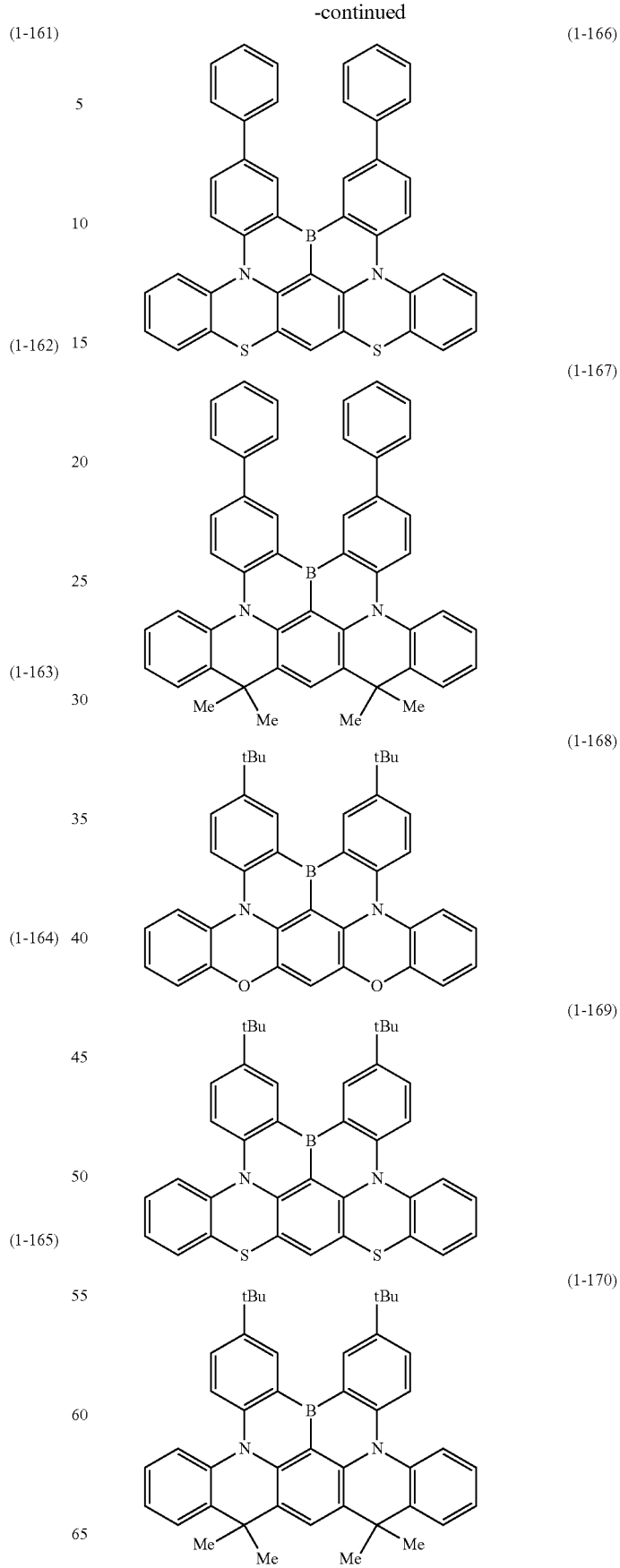

(1-171)
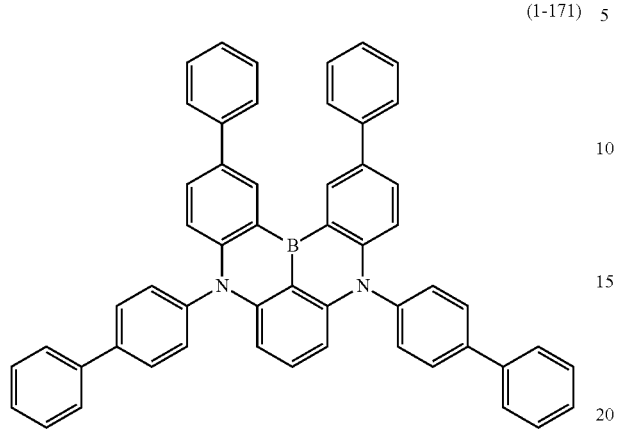
(1-175)
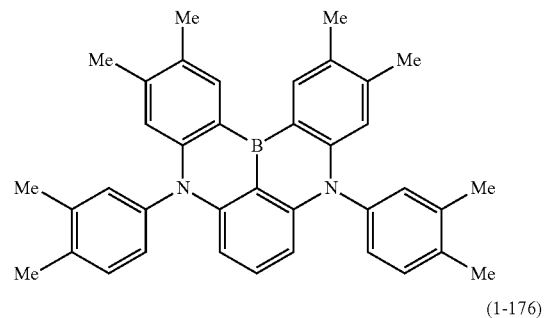
(1-172)
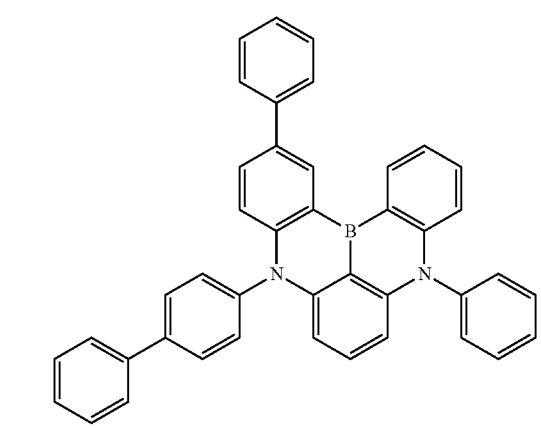
(1-176)
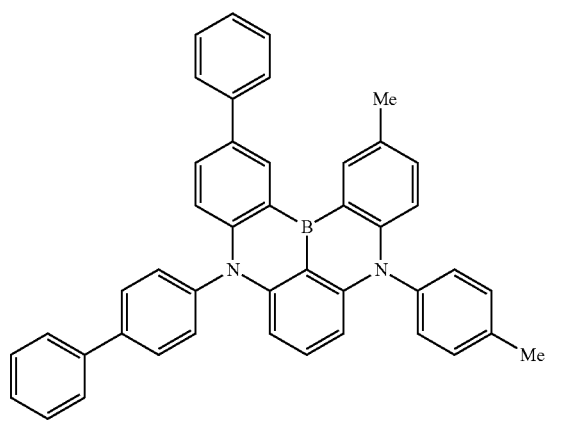
(1-173)
(1-177)
(1-174)
(1-178)
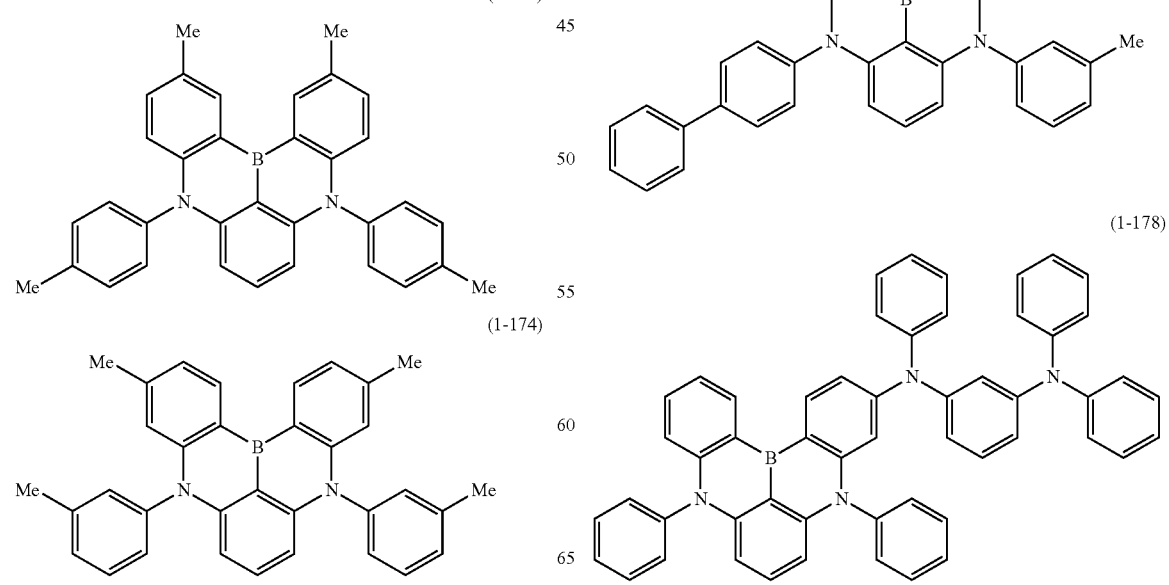

(1-179)
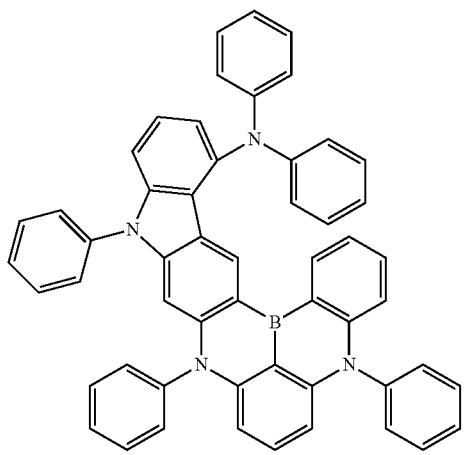
(1-180)
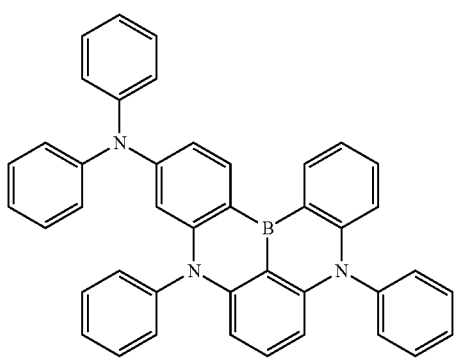
(1-181)
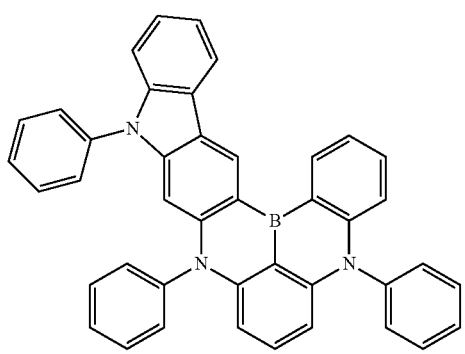
(1-182)
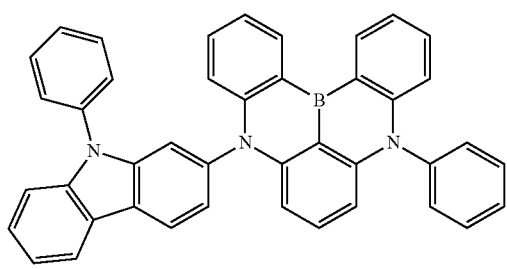
(1-183)
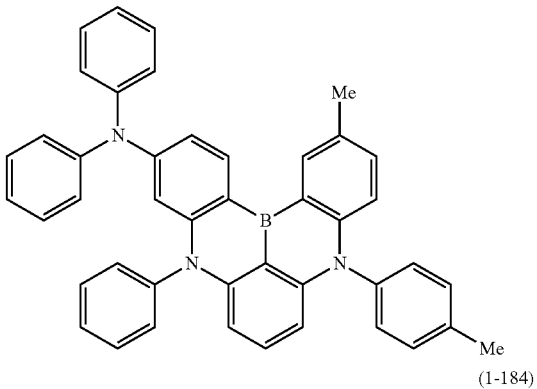
(1-184)
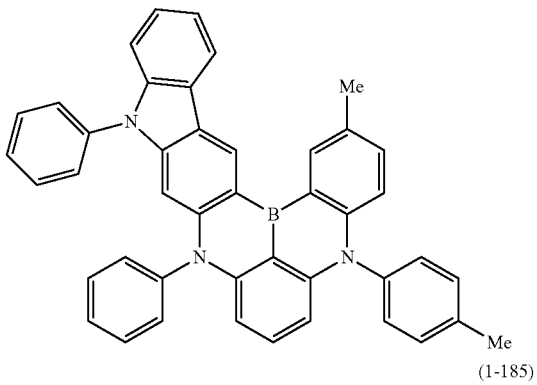
(1-185)
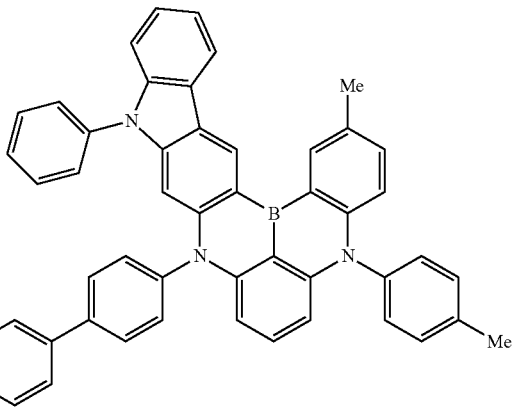
(1-186)
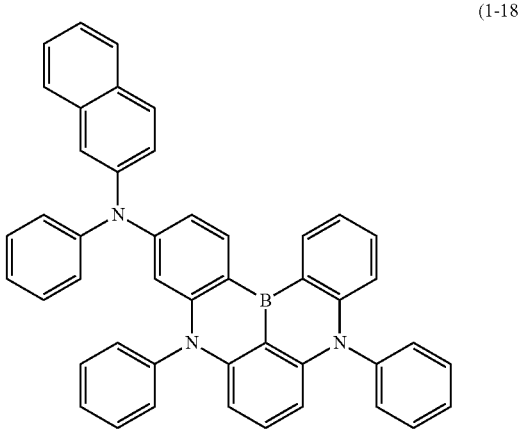

-continued
(1-187)
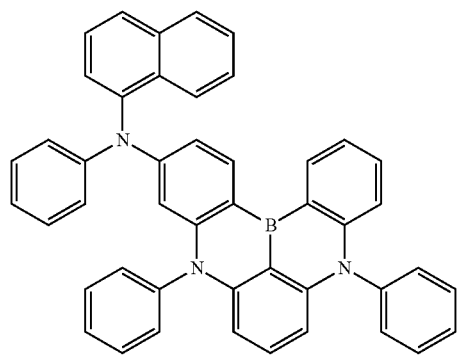
(1-188)
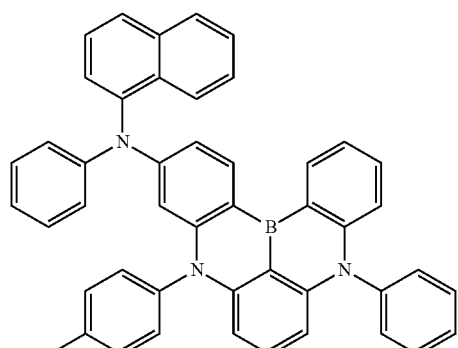
(1-189)
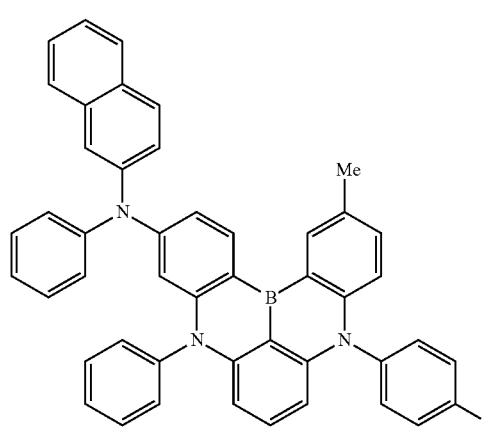
(1-190)
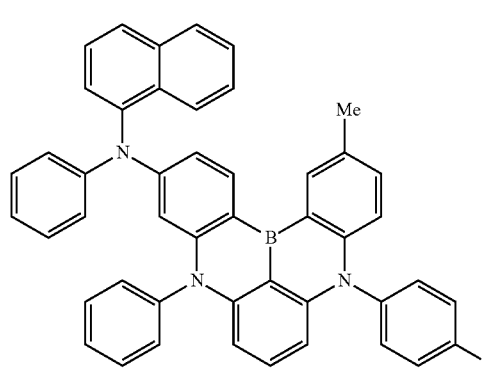
-continued
(1-191)
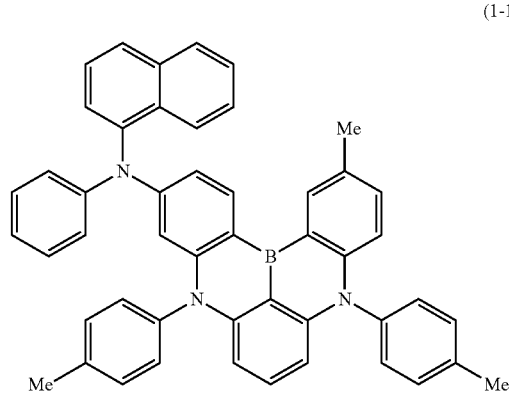
(1-192)
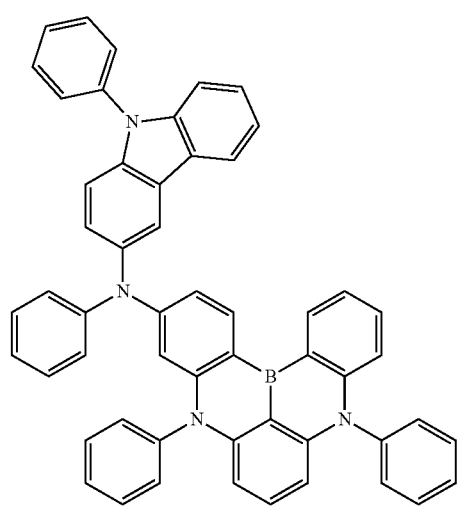
(1-193)
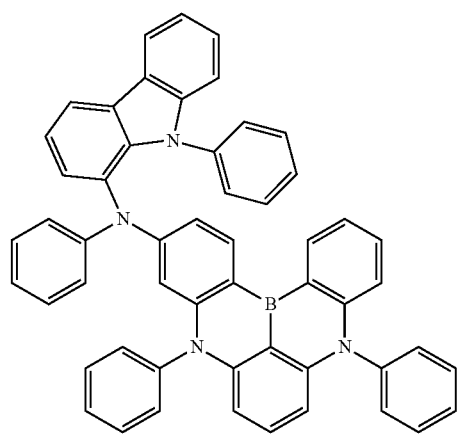

(1-194)
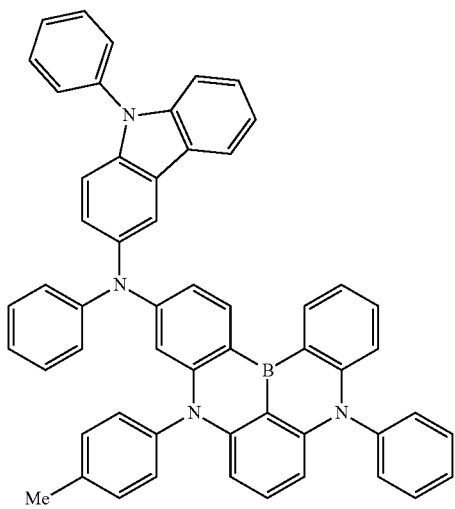
(1-195)
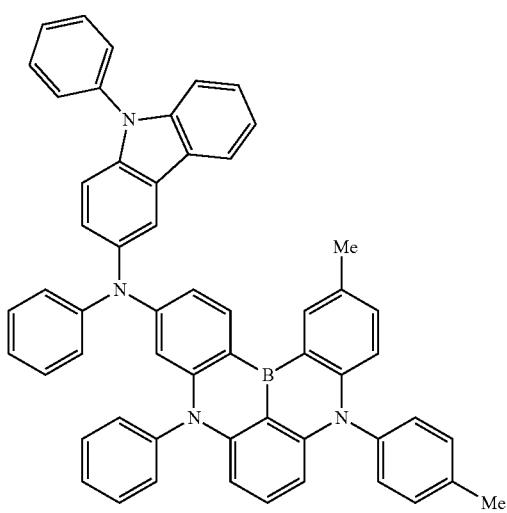
(1-196)
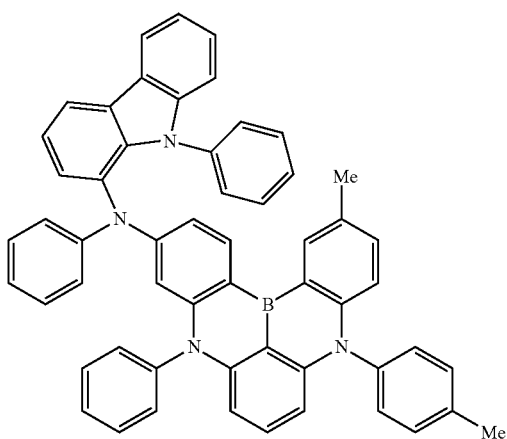
(1-197)
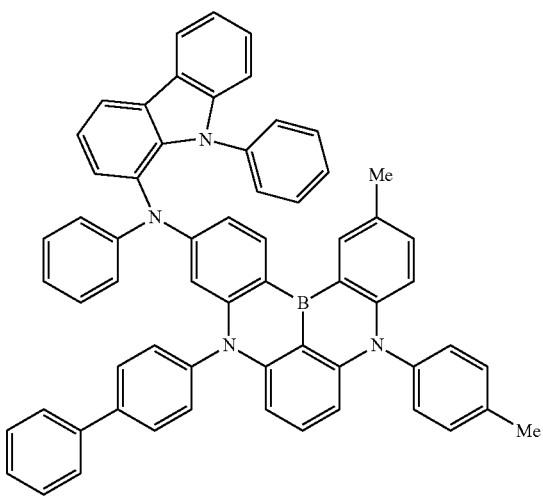
(1-198)
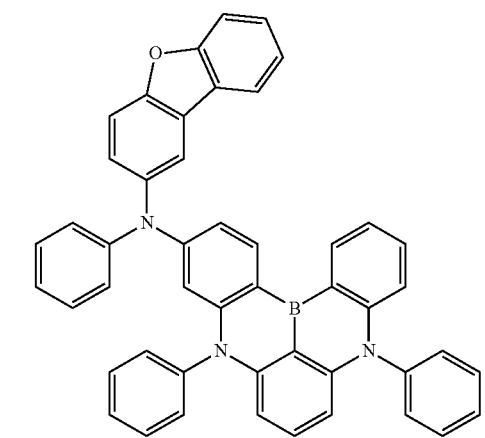
(1-199)
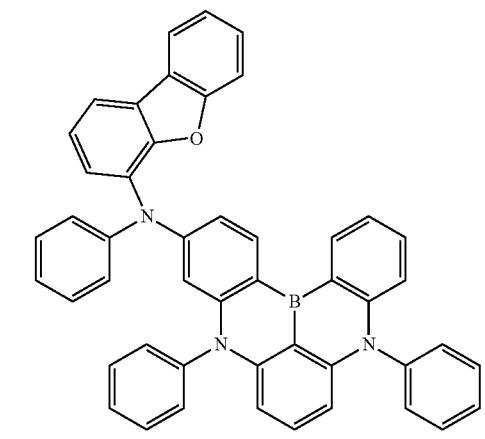

(1-200) 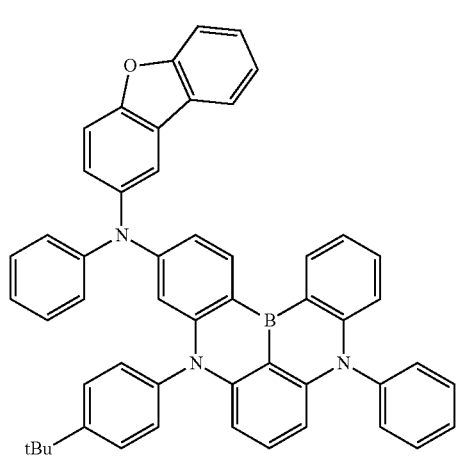
(1-201) 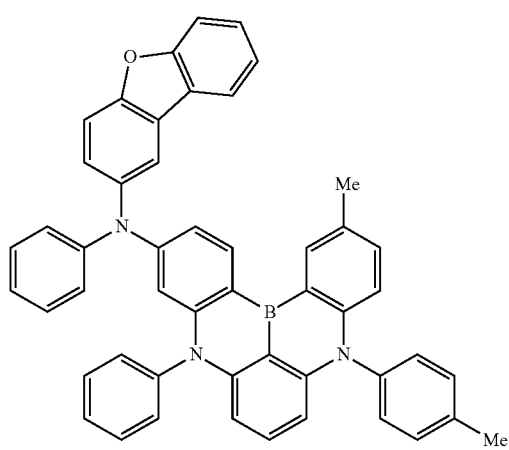
(1-202) 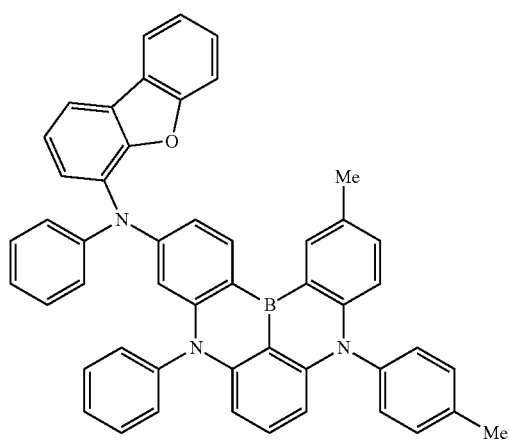
(1-203) 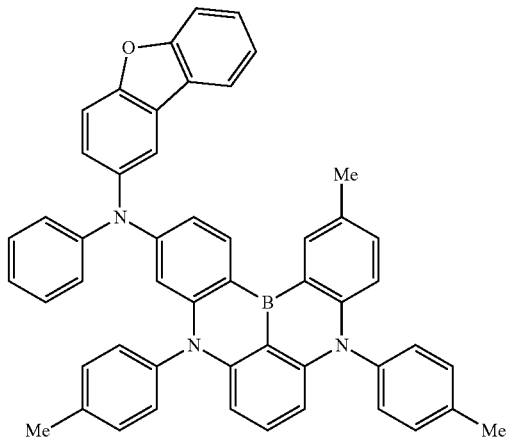
(1-204) 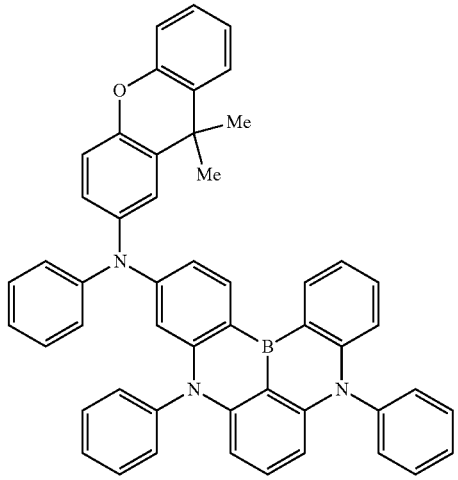
(1-205) 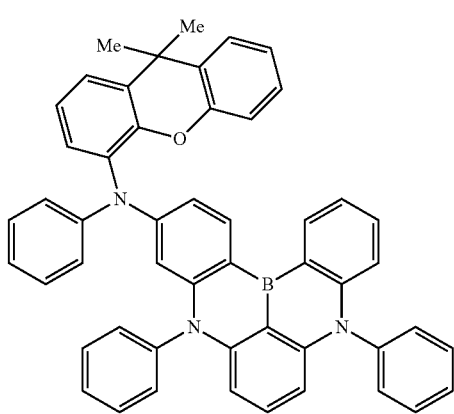

(1-206)
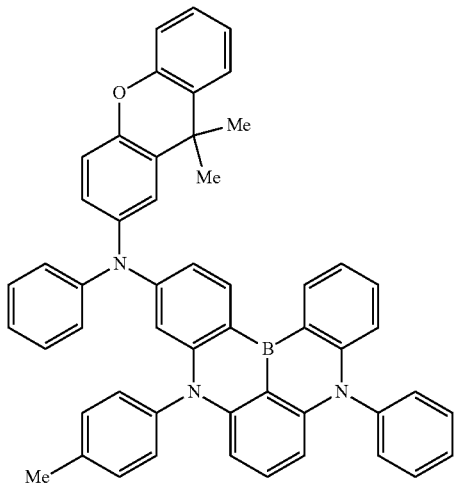
(1-207)
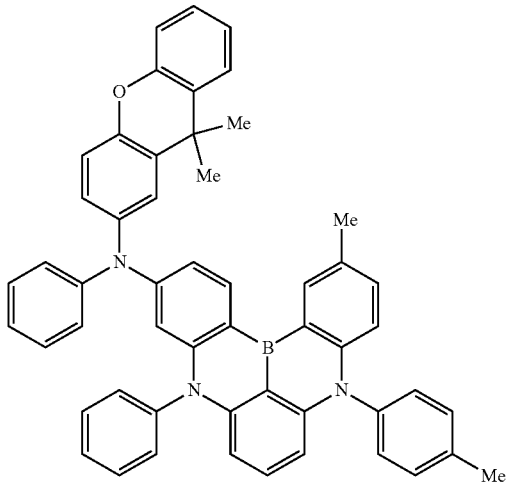
(1-208)
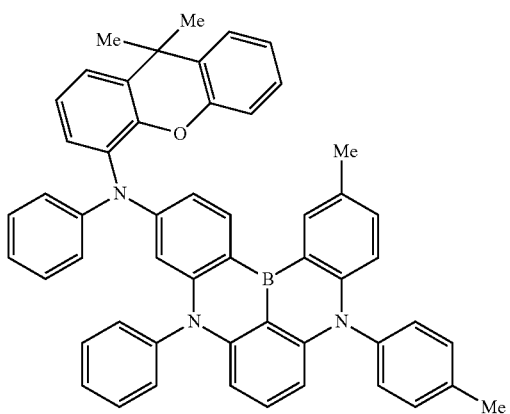
(1-209)
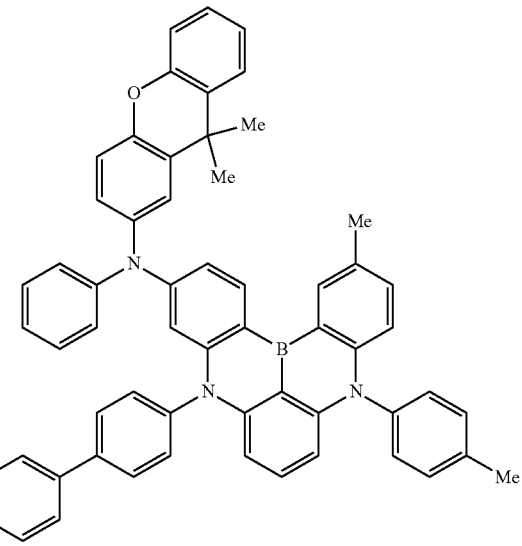
(1-210)
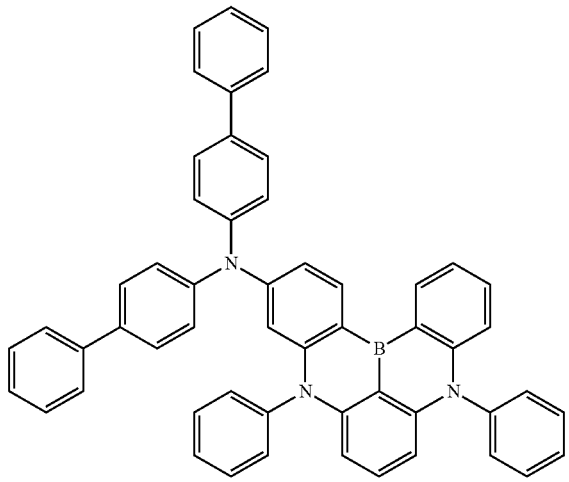
(1-211)
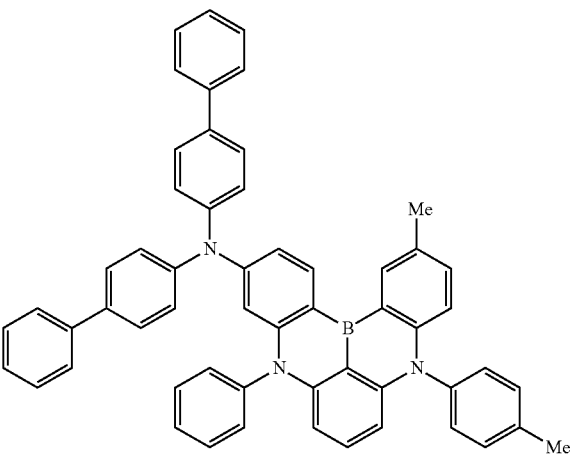

(1-212)
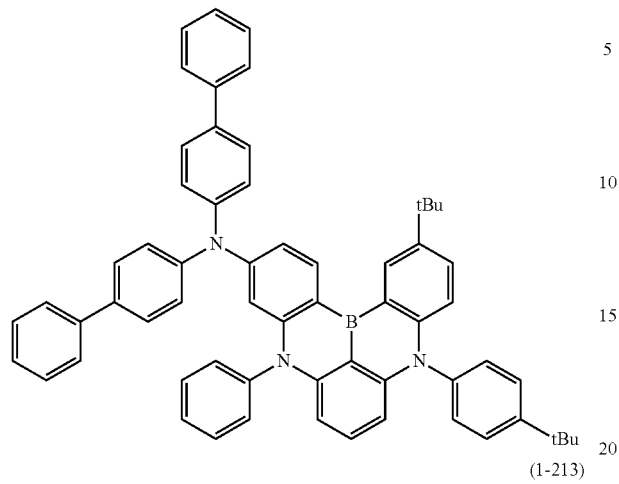
(1-213)
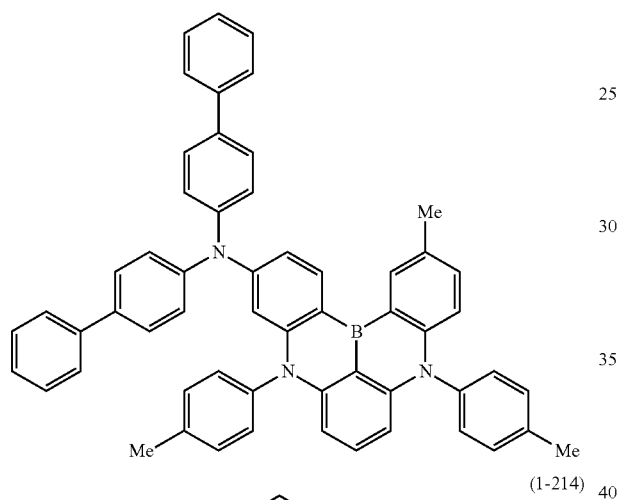
(1-214)
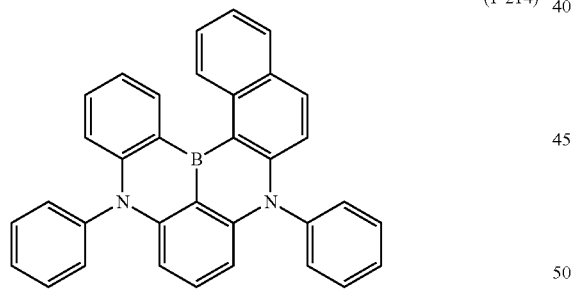
(1-215)
(1-216)
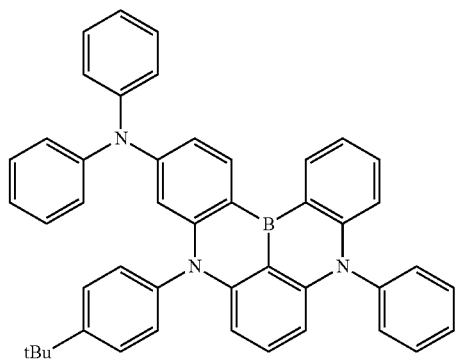
(1-217)
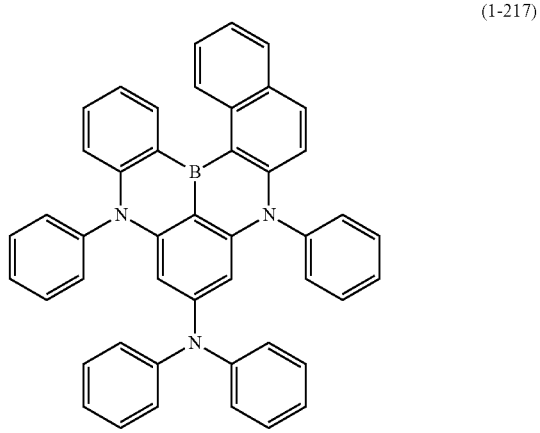
(1-218)
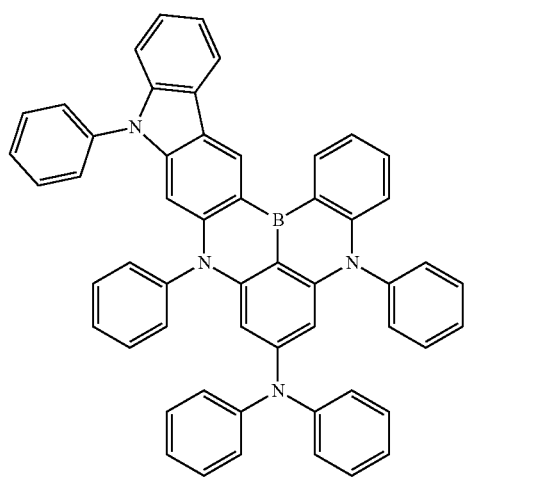

(1-219)
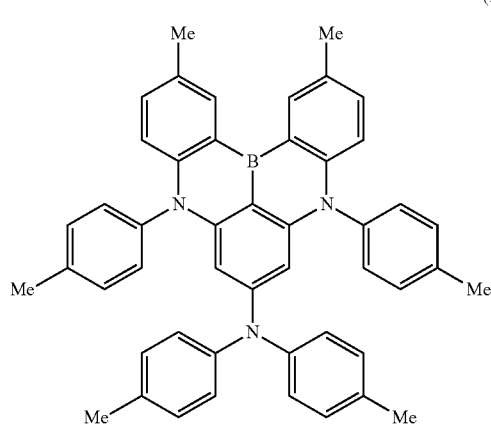
(1-220)
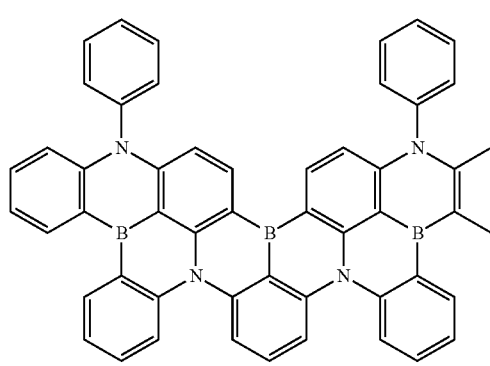
(1-221)
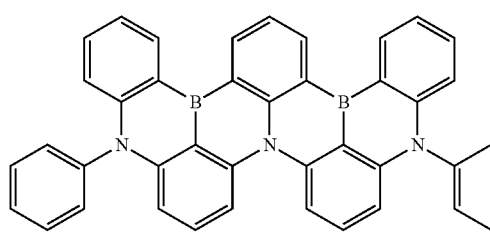
(1-222)
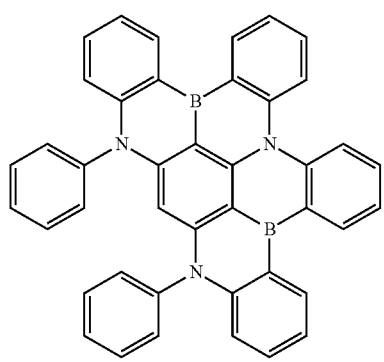
(1-223)
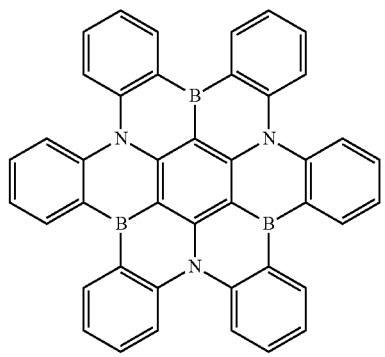
(1-224)
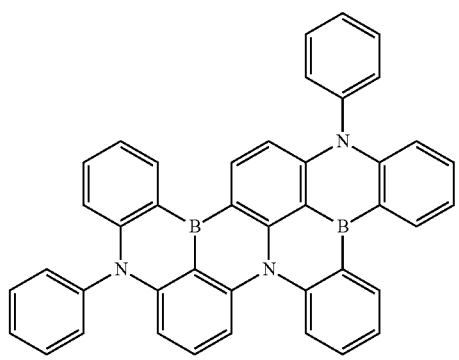
(1-230)
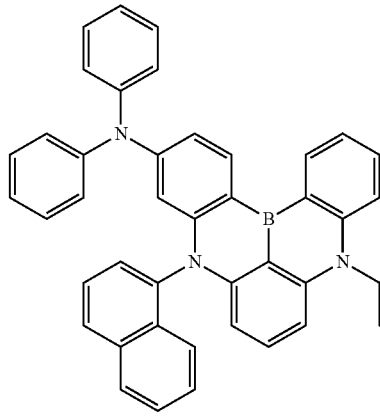
(1-231)
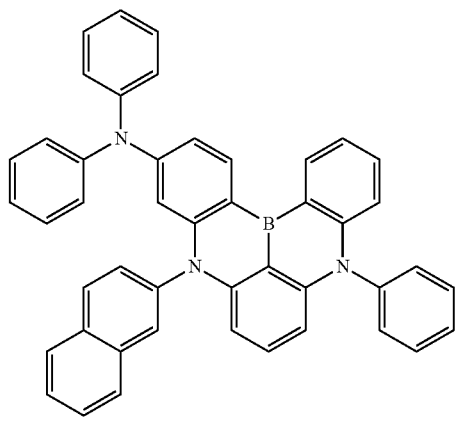

-continued
(1-232)
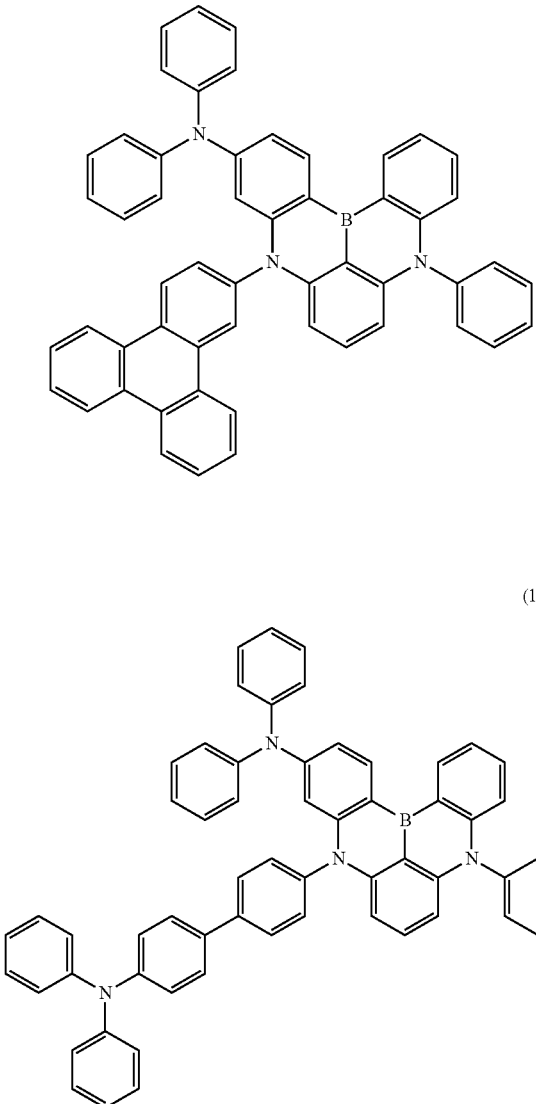
(1-233)
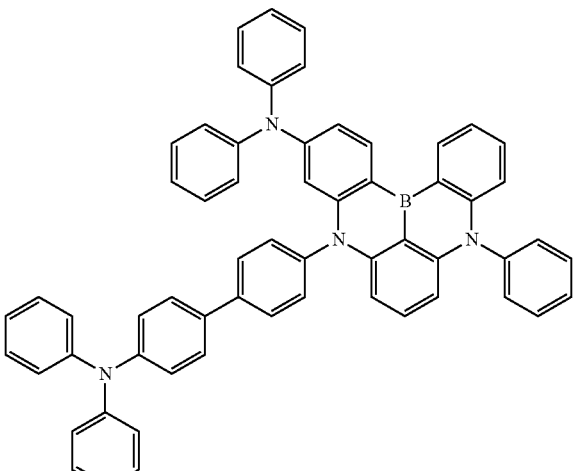
(1-234)
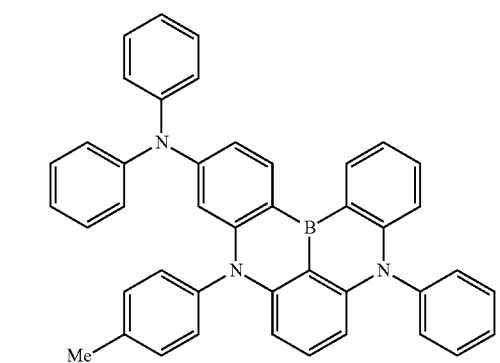
-continued
(1-235)
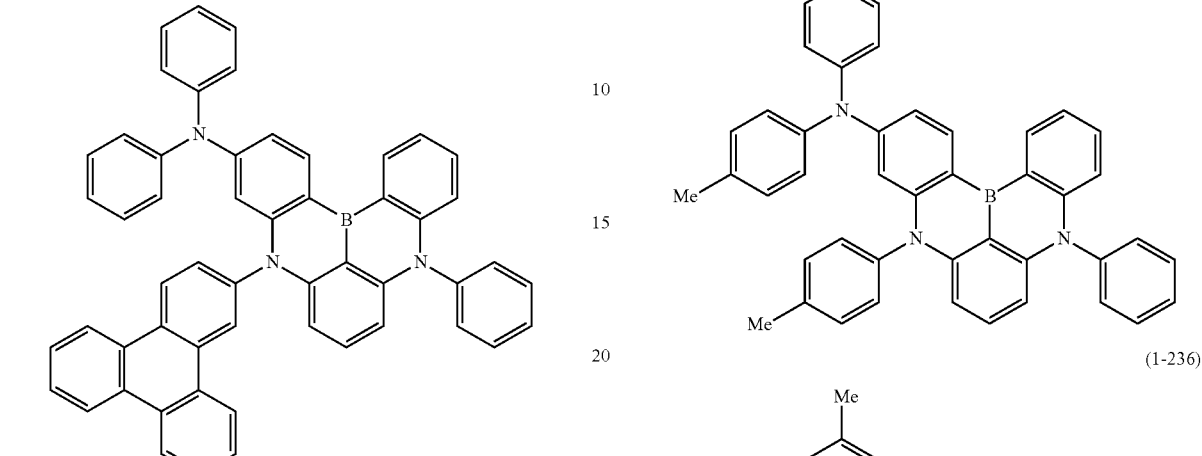
(1-236)
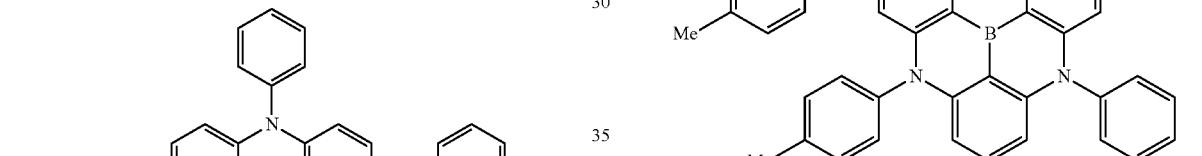
(1-237)
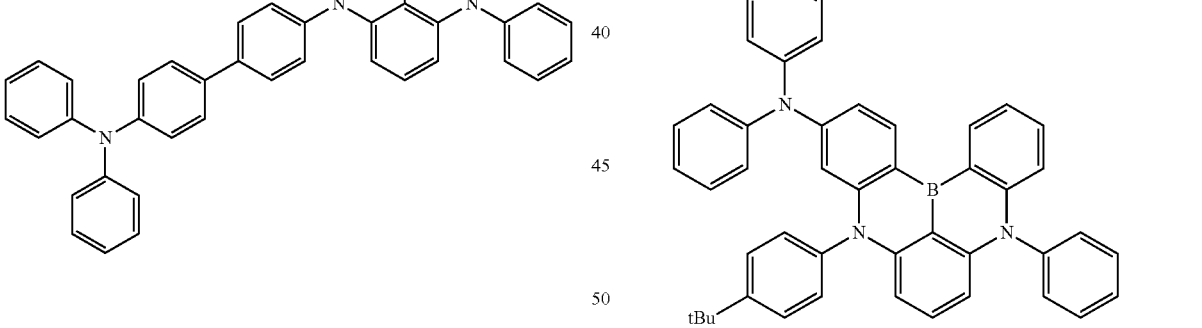
(1-238)
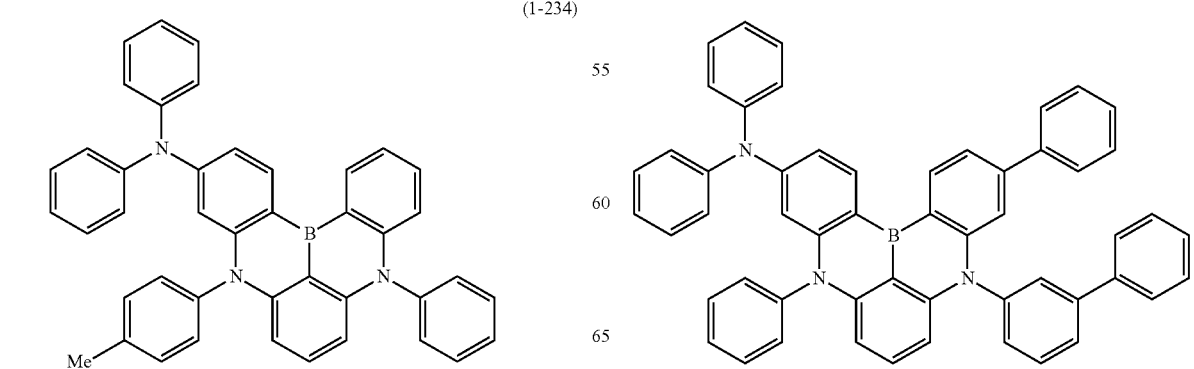

(1-239)
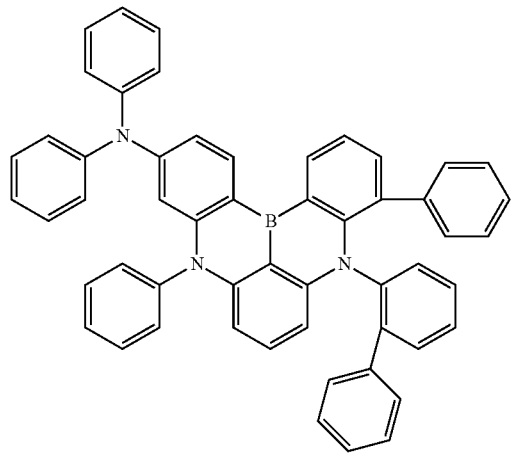
(1-240)
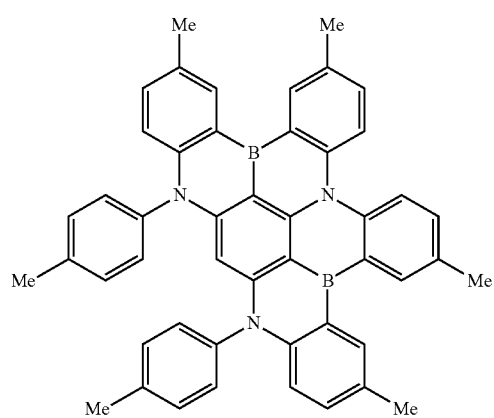
(1-250)
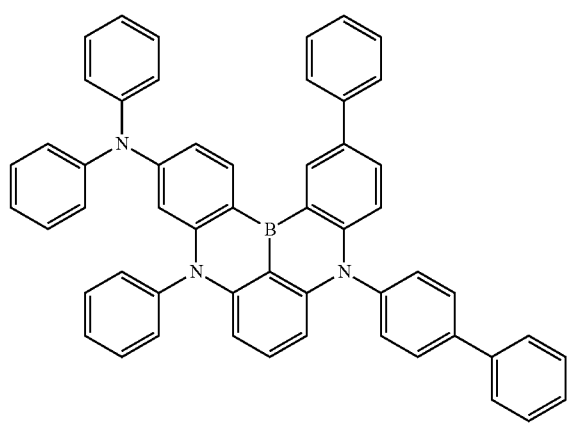
(1-251)
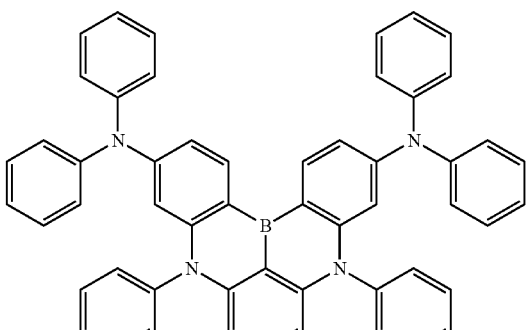
(1-252)
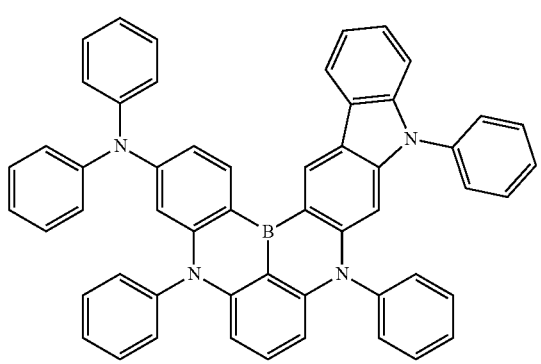
(1-253)
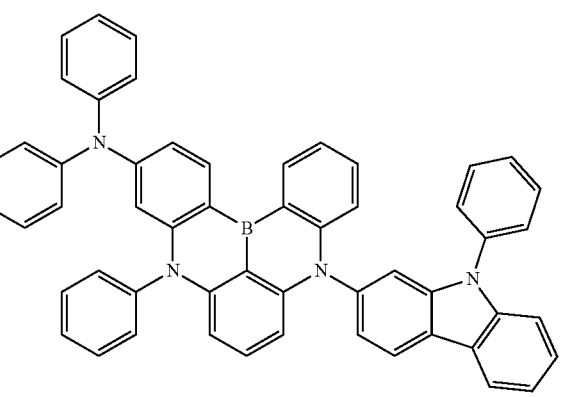
(1-254)
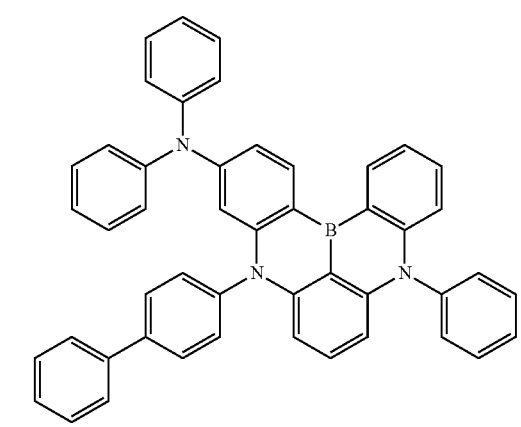

(1-255)
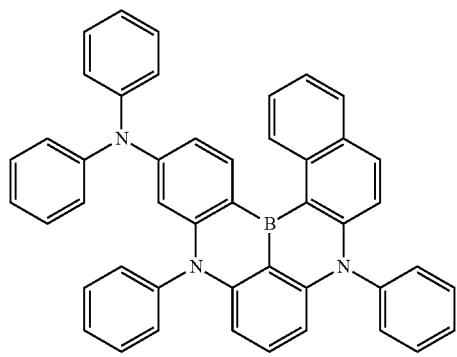
(1-256)
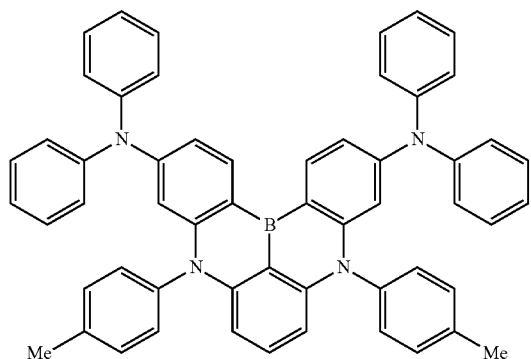
(1-257)
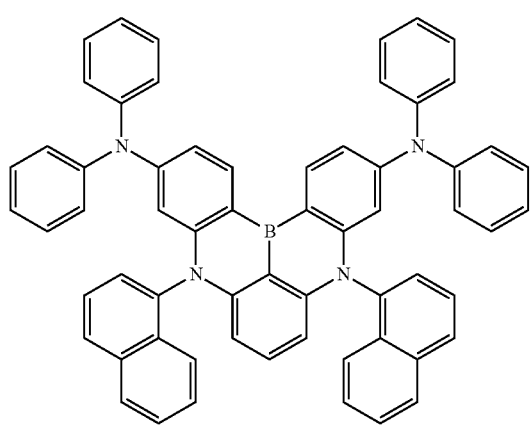
(1-258)
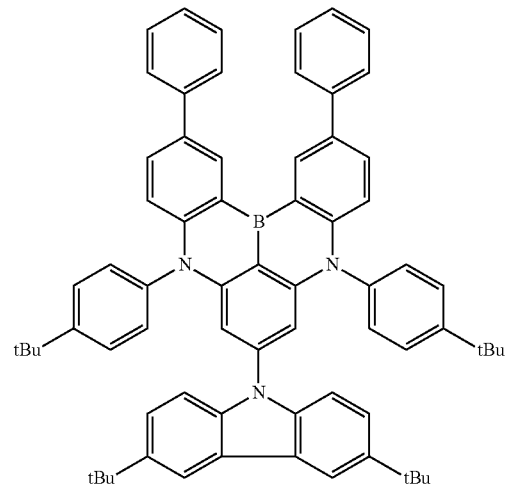
(1-270)
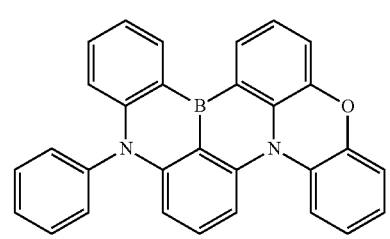
(1-271)
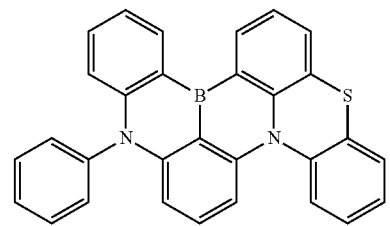
(1-272)
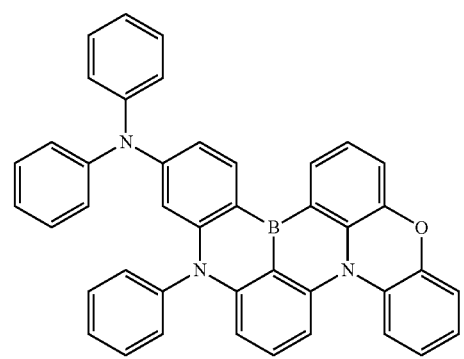

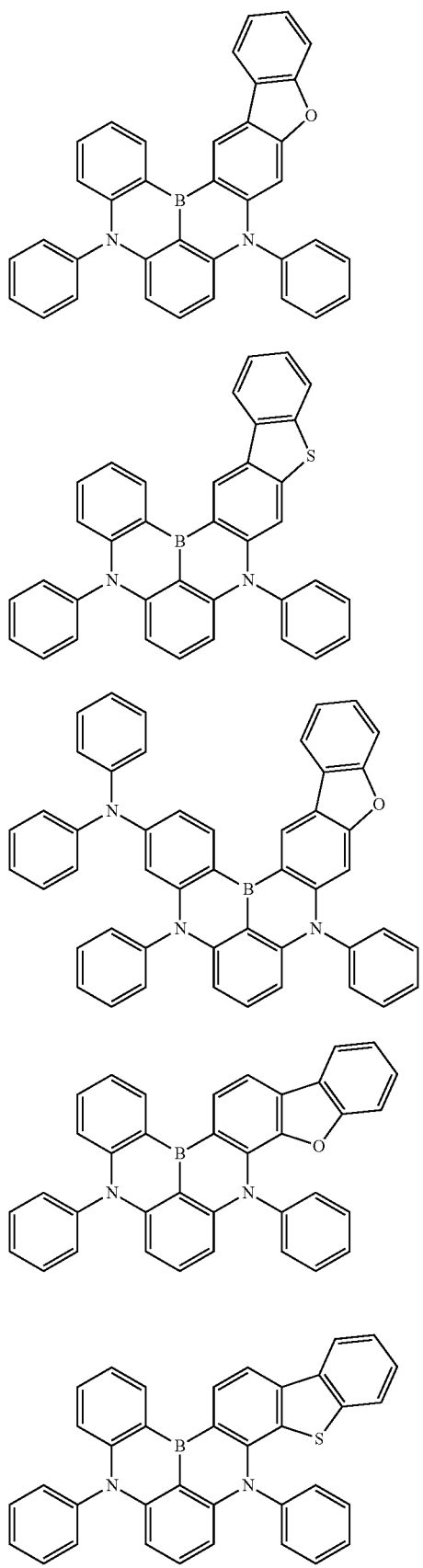
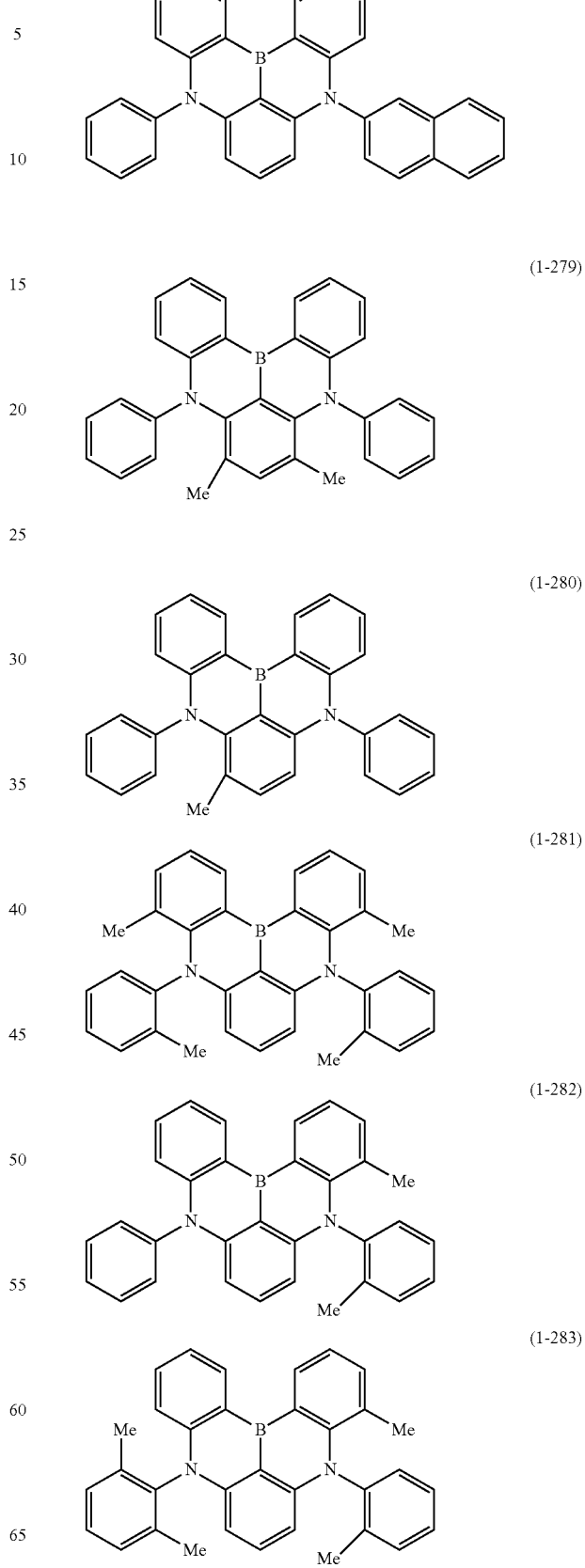

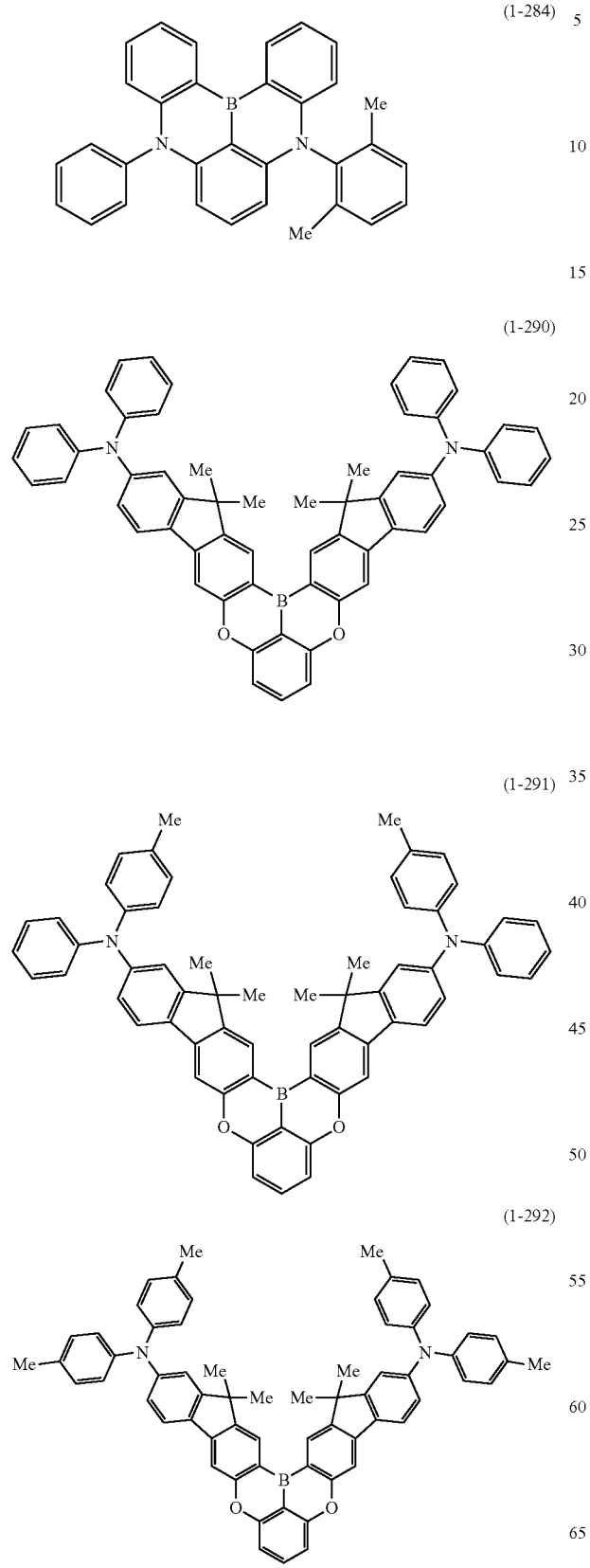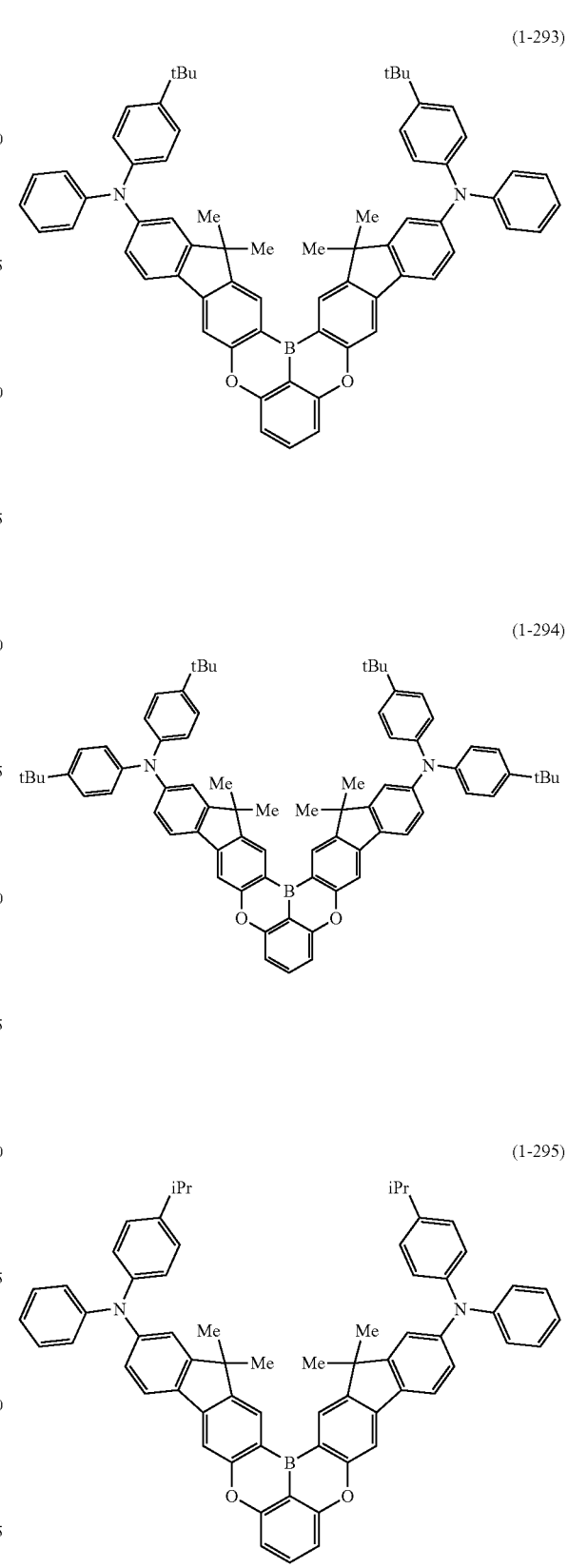

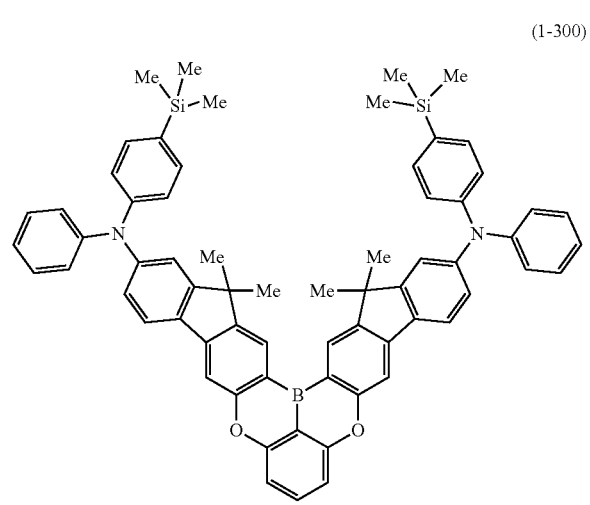
(1-300)
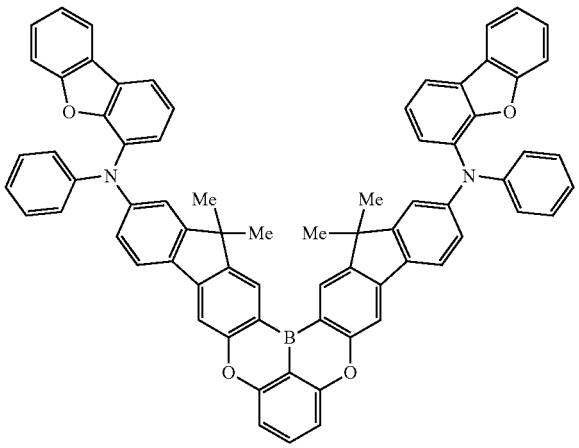
(1-303)
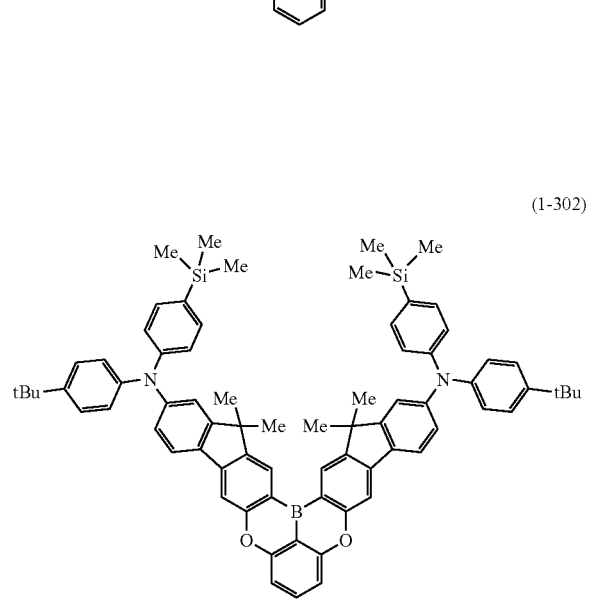
(1-301)
(1-302)
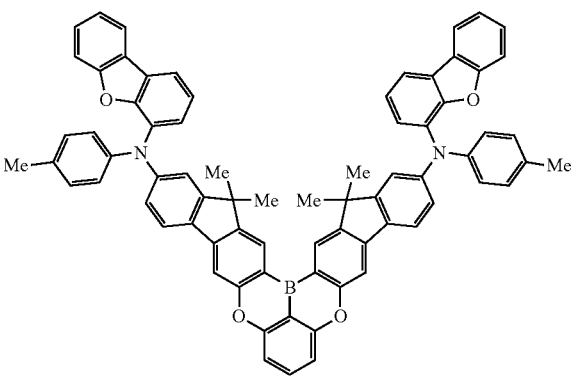
(1-304)
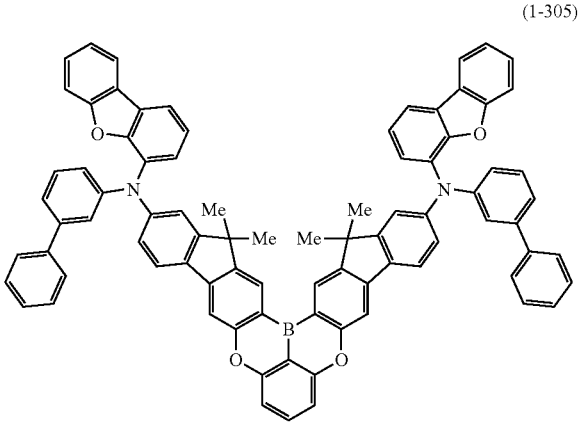
(1-305)

(1-310)
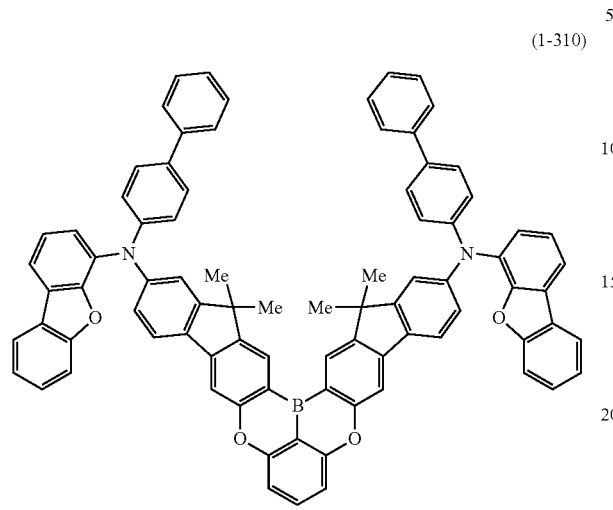
(1-313)
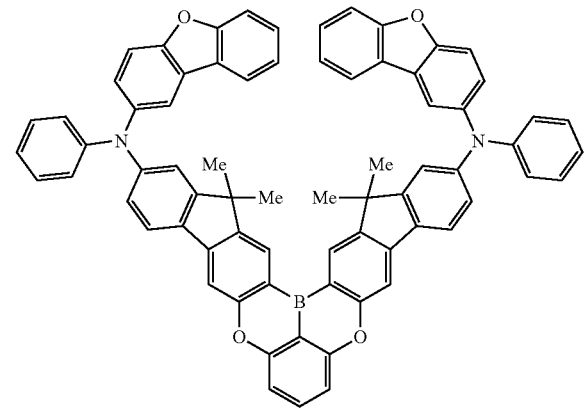
(1-311)
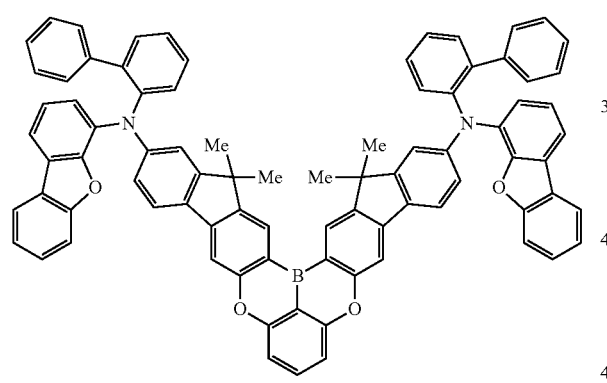
(1-314)
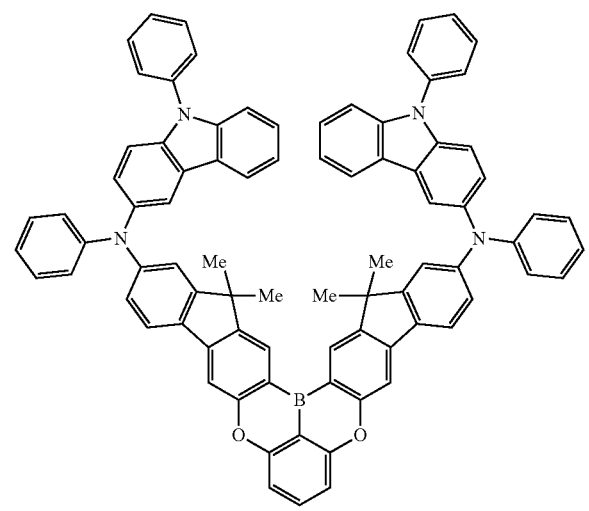
(1-312)
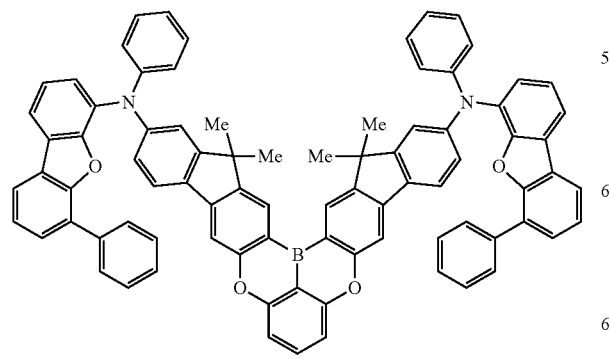
(1-315)
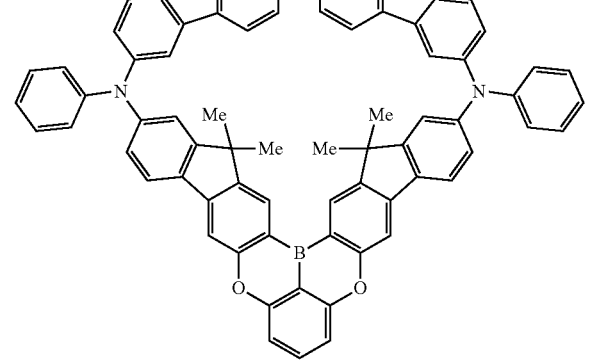

(1-320)
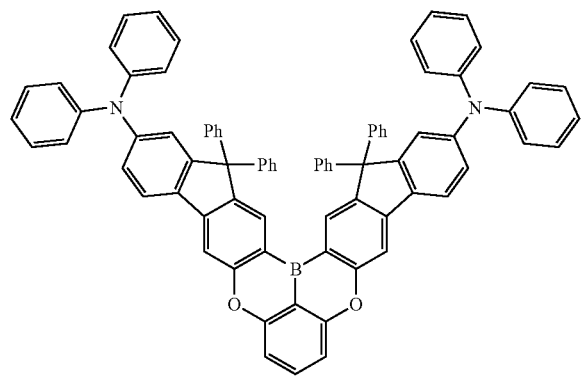
(1-321)
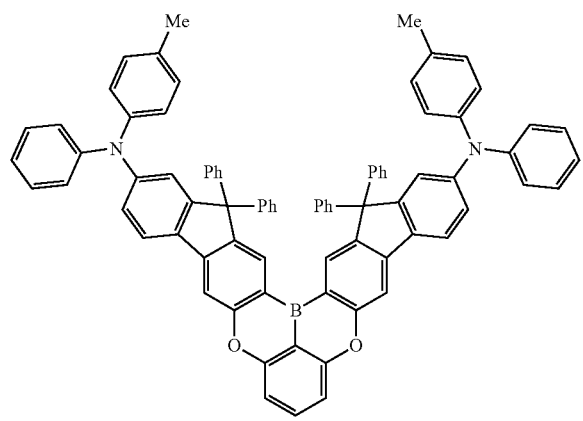
(1-322)
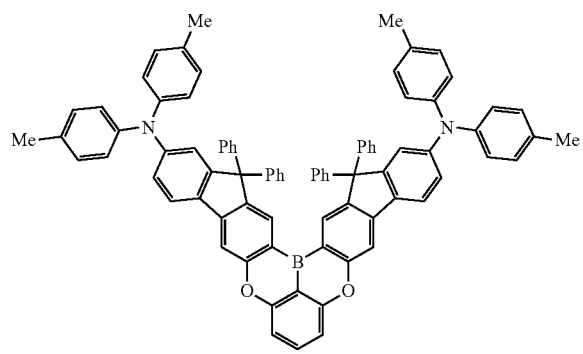
(1-323)
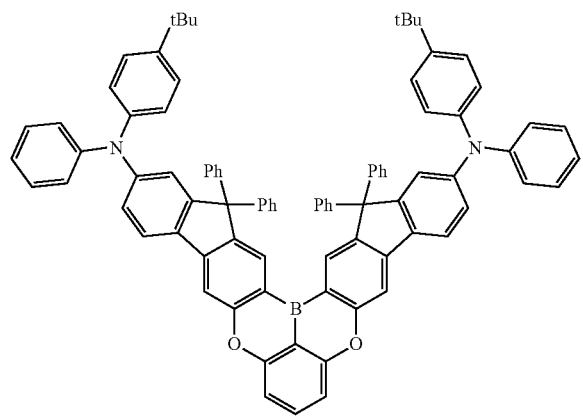
(1-324)
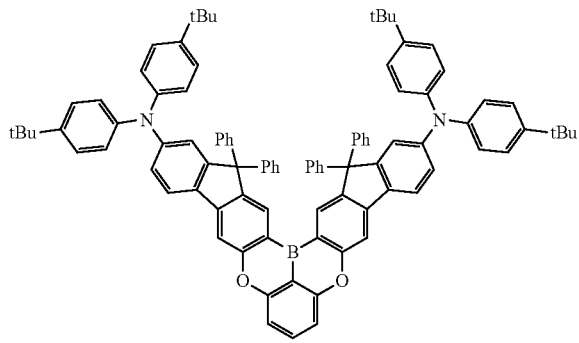
(1-325)
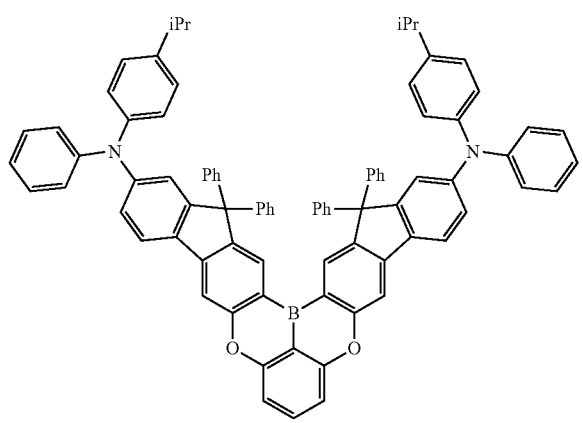
(1-330)
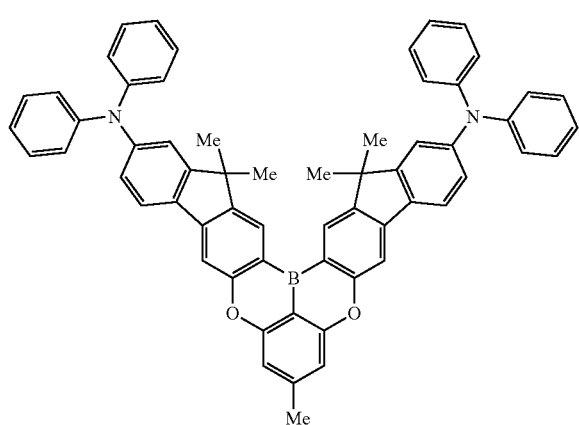
(1-331)
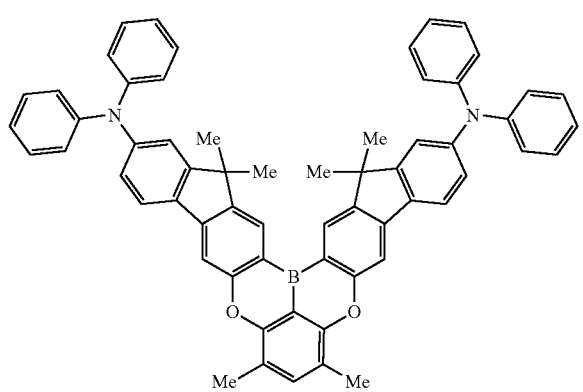

(1-332)
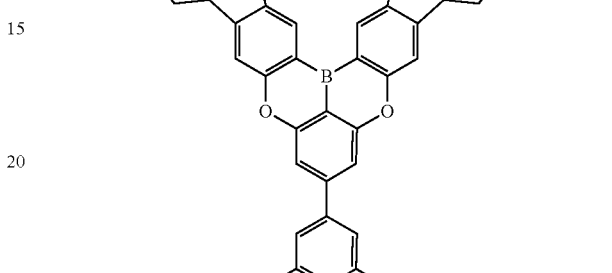
(1-333)
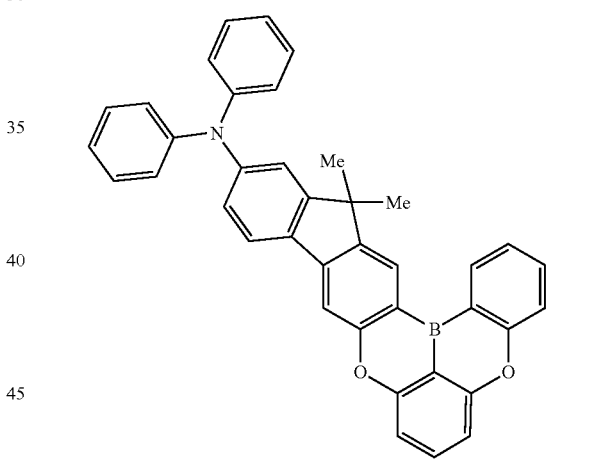
(1-334)
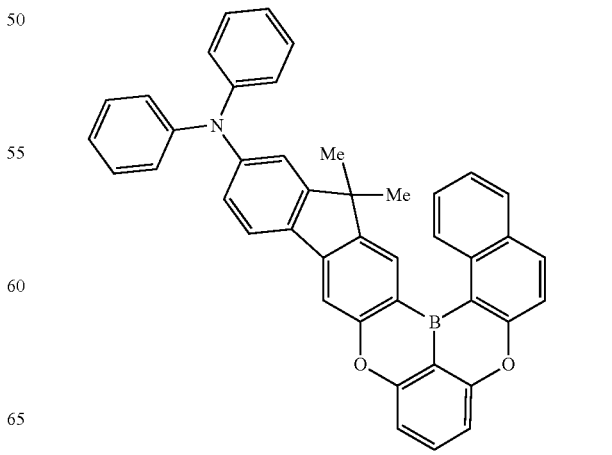
(1-335)
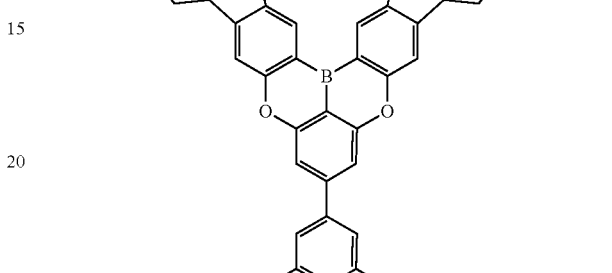
(1-340)
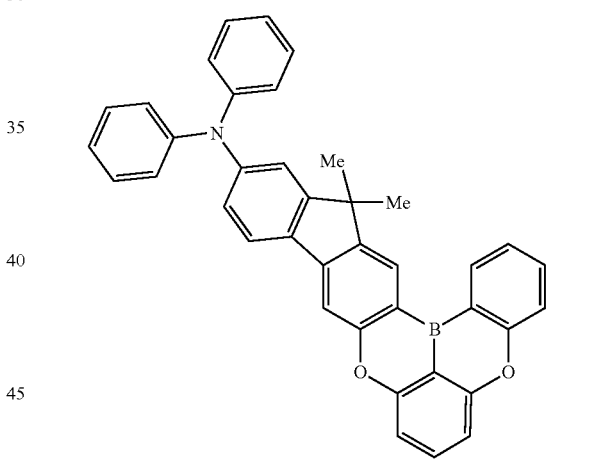
(1-341)
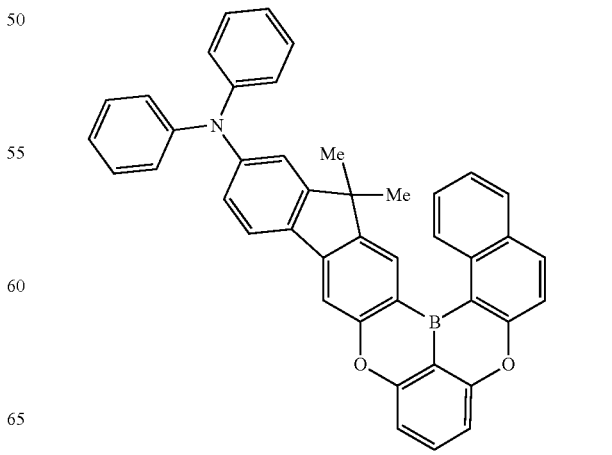

(1-342)
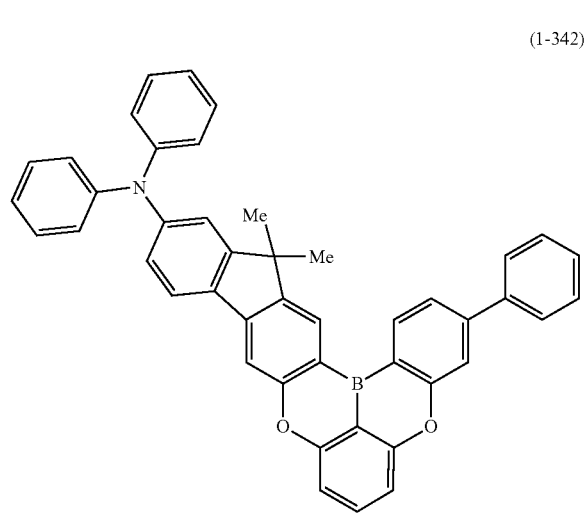
(1-343)
(1-344)
(1-345)
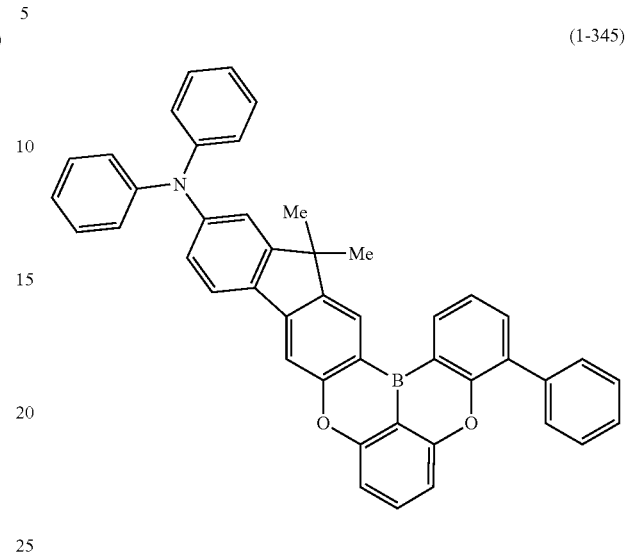
(1-346)
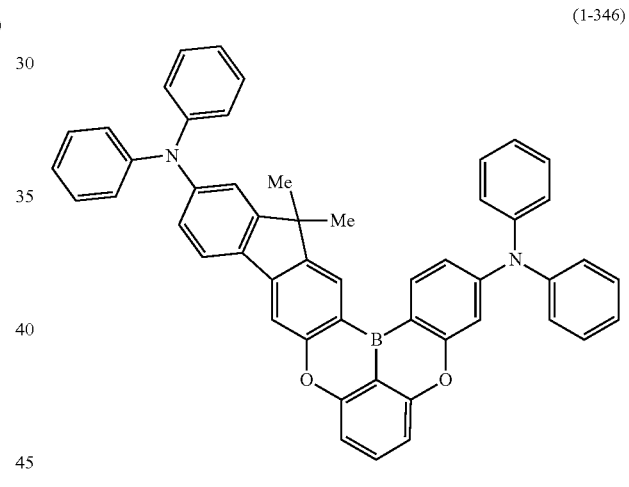
(1-347)
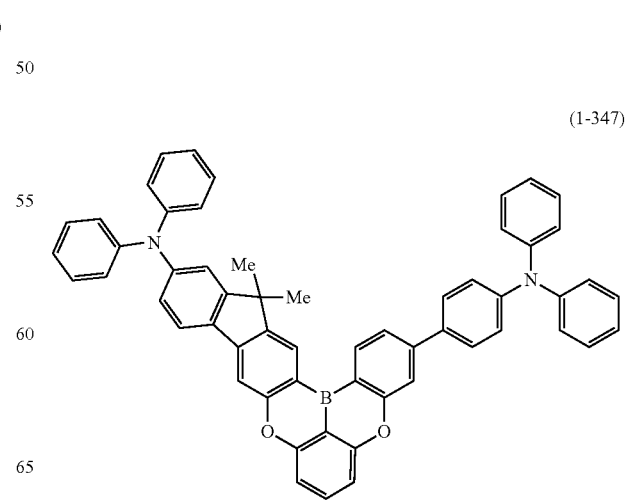

-continued
(1-350)
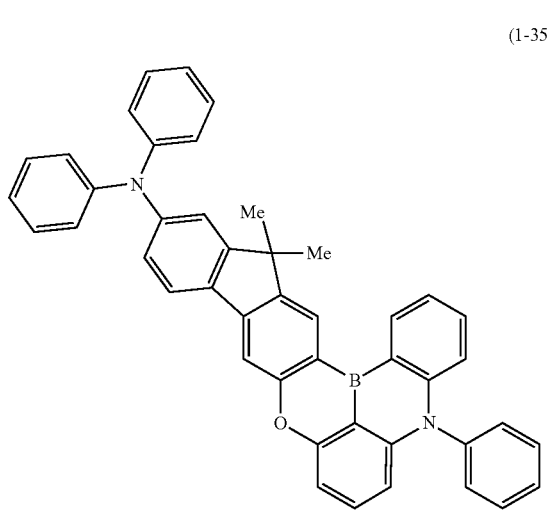
(1-351)
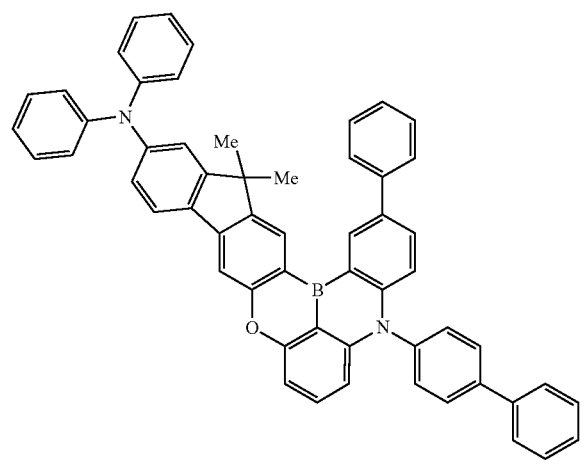
(1-352)
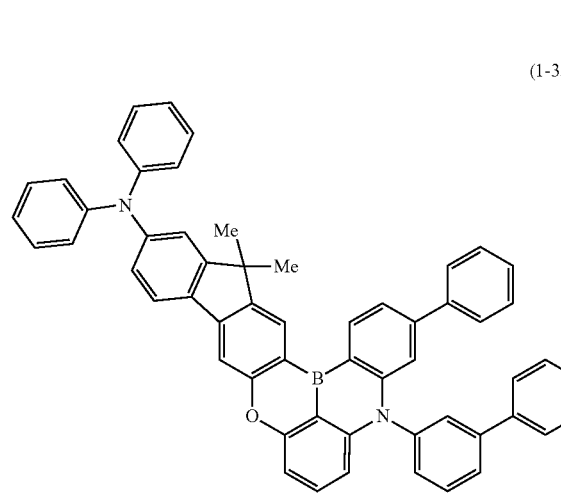
-continued
(1-353)
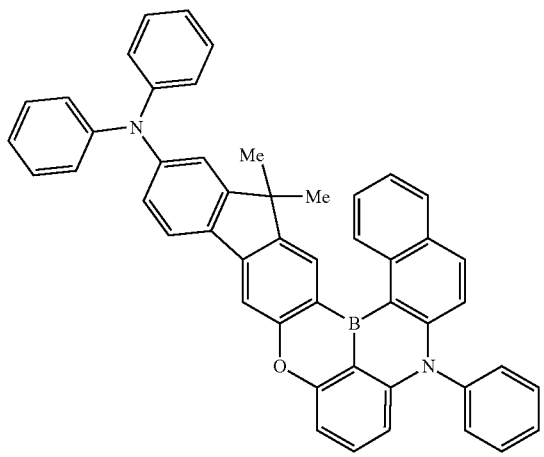
(1-354)
(1-355)
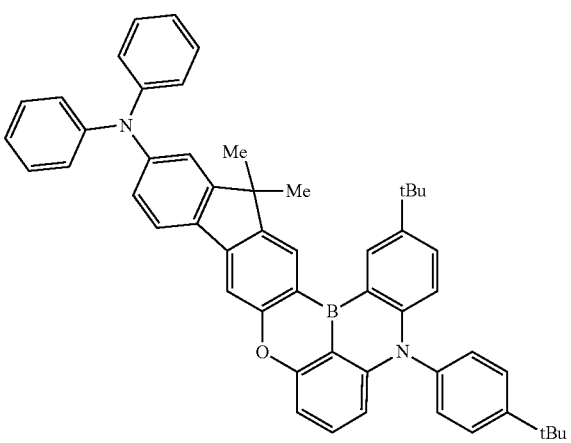

(1-360)
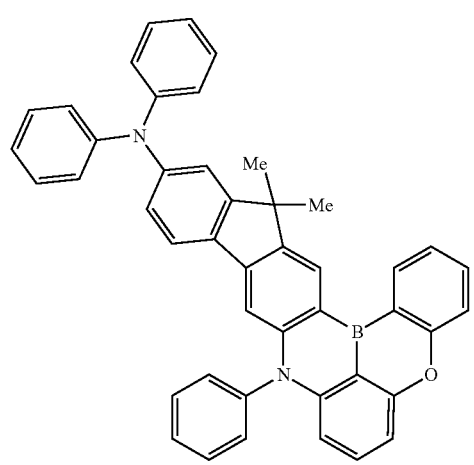
(1-363)
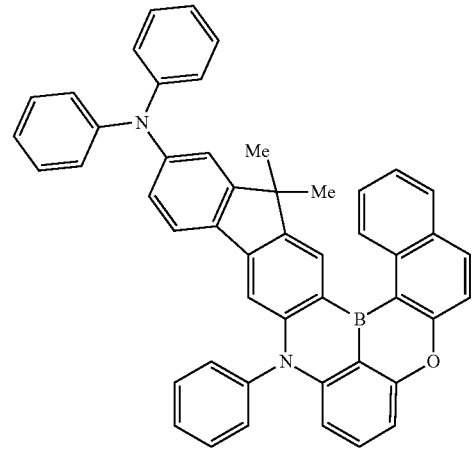
(1-361)
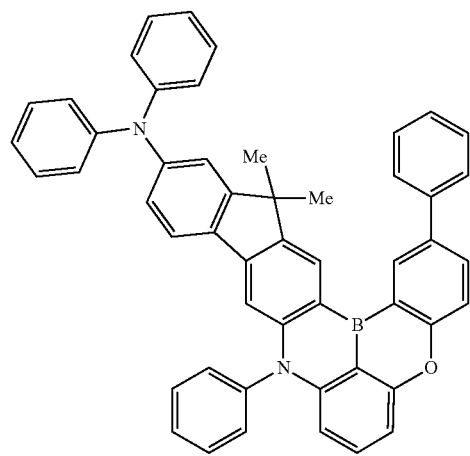
(1-364)
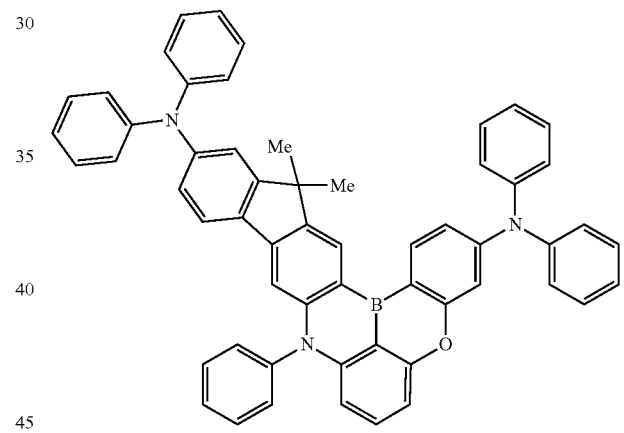
(1-362)
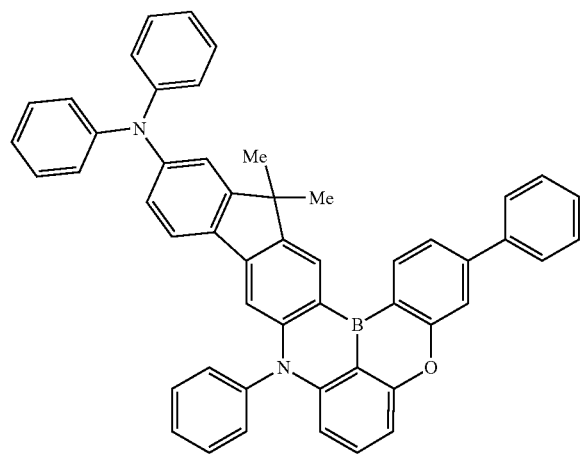
(1-365)
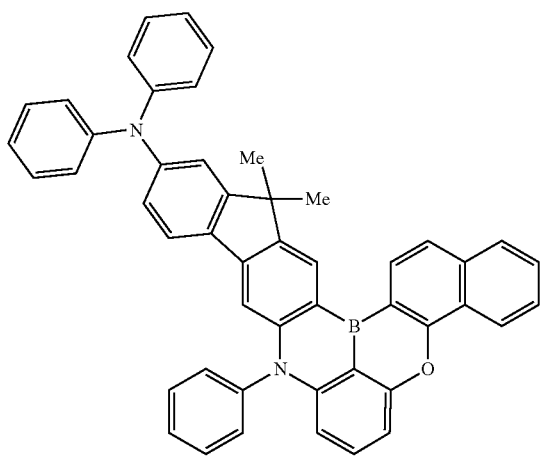

-continued
(1-370)
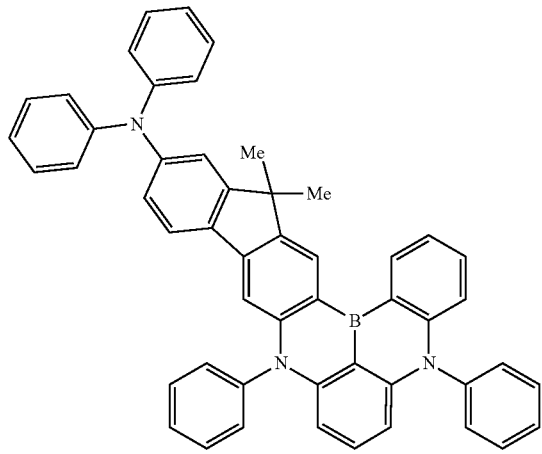
(1-371)
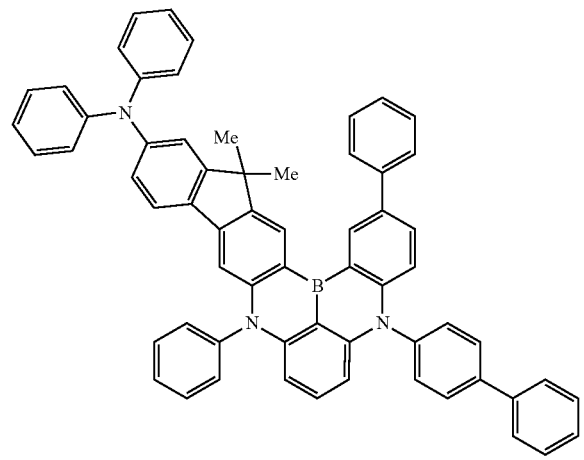
(1-372)
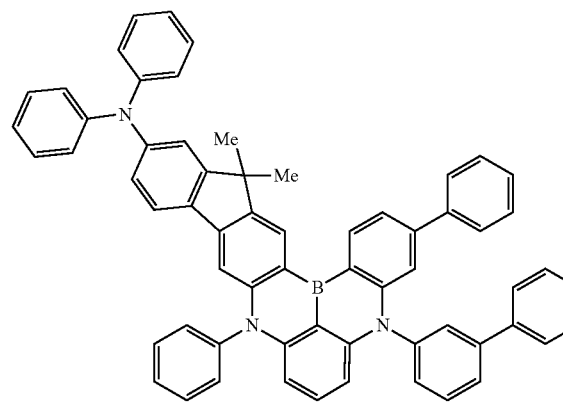
-continued
(1-373)
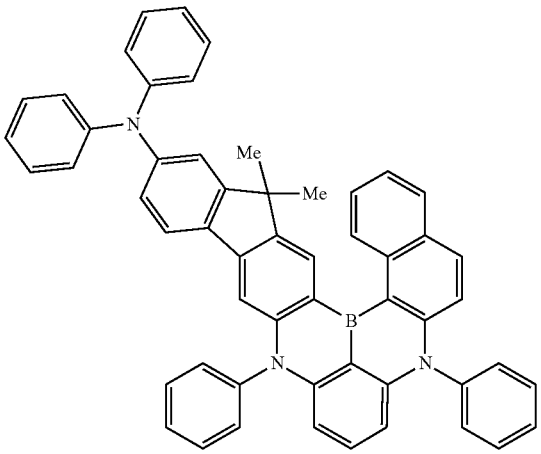
(1-374)
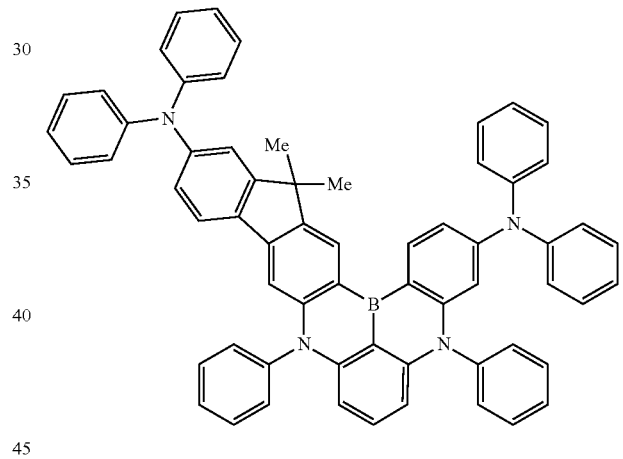
(1-375)
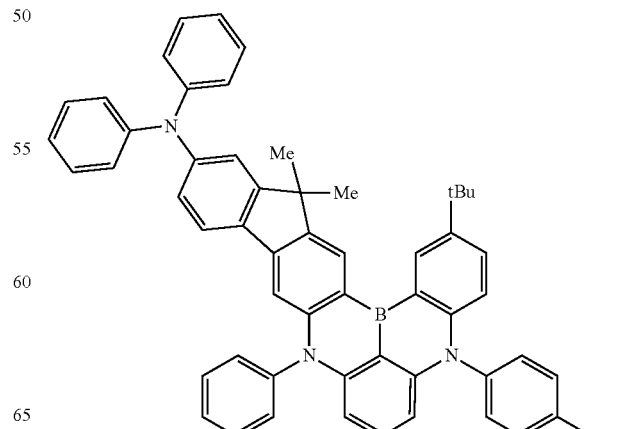

(1-376)

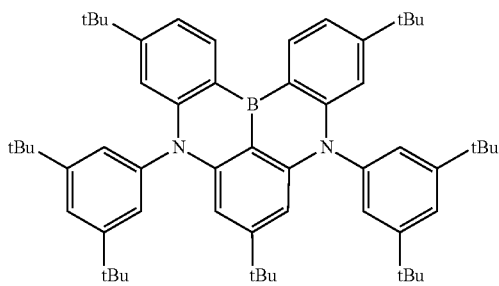

(1-377)

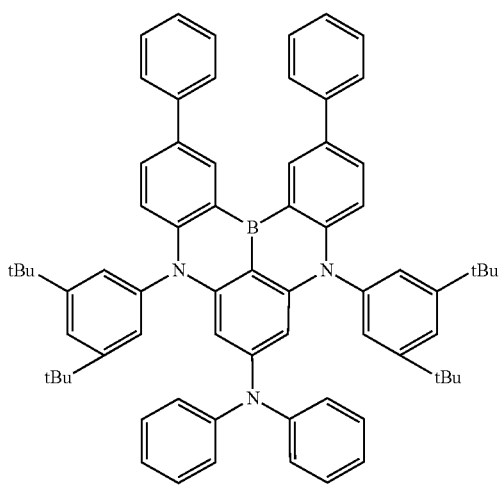

1-2. Method for Manufacturing Polycyclic Aromatic Compound Represented by Formula (1) and Multimer Thereof A polycyclic aromatic compound represented by general formula (1) and a multimer thereof can be synthesized, for example, by applying a method disclosed in WO 2015/102118 A. That is, as in the following scheme, an intermediate in which ring A (ring a), ring B (ring b), and ring C (ring c) are linked via $X^1$ or $X^2$ is synthesized, and the intermediate is cyclized by a tandem hetero Friedel-Crafts reaction (continuous aromatic electrophilic substitution reaction). Thus, a desired polycyclic aromatic compound and a multimer thereof can be synthesized. In the following scheme, X represents a halogen atom or a hydrogen atom, and the definitions of the other symbols are the same as the definitions described above

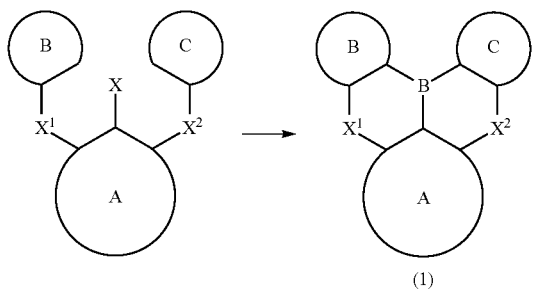

(1)

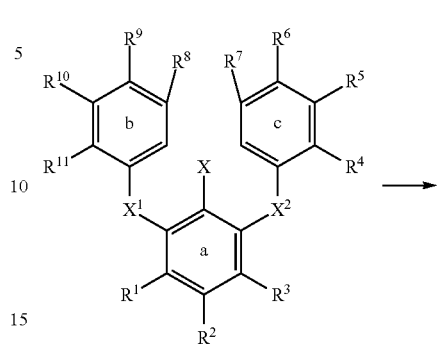

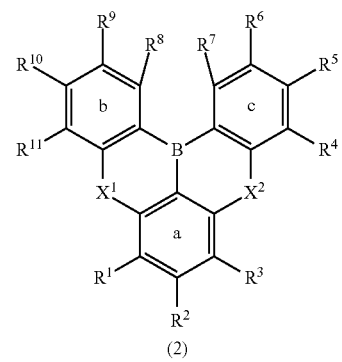

(2)

The intermediate before cyclization in the above scheme can be similarly synthesized by a method disclosed in WO 2015/102118 A or the like. That is, an intermediate having a desired substituent can be synthesized by appropriately combining a Buchwald-Hartwig reaction, a Suzuki coupling reaction, an etherification reaction using a nucleophilic substitution reaction or an Ullmann reaction, and the like.

The cyclization by a tandem hetero Friedel-Crafts reaction illustrated in the above scheme is a reaction to introduce a B (boron) atom to bond A ring (a ring), B ring (b ring), and C ring (c ring). First, a hydrogen atom between $X^1$ and $X^2$ is ortho-metalated with n-butyllithium, sec-butyllithium, t-butyllithium, or the like. Subsequently, boron trichloride, boron tribromide, or the like is added thereto to perform lithium-boron metal exchange, and then a Brønsted base such as N,N-diisopropylethylamine is added thereto to induce a Tandem Bora-Friedel-Crafts reaction. Thus, a desired product can be obtained. Here, a Lewis acid such as aluminum trichloride may also be added in order to accelerate the reaction.

In addition to the method for introducing a lithium atom into a desired position by orthometalation, a lithium atom can be introduced into a desired position by introducing a bromine atom or the like into a position into which it is desired to introduce a lithium atom and performing halogen-metal exchange.

1-3. Anthracene-Based Compound Represented by Formula (3)

The anthracene-based compound which is an essential component as a host material in the present invention has the following structure.

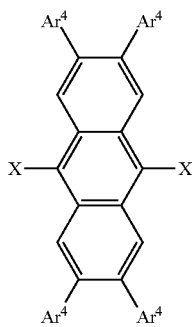
(3)

In formula (3),

X's and Ar⁴'s each independently represent a hydrogen atom, an optionally substituted aryl, an optionally substituted heteroaryl, an optionally substituted diarylamino, an optionally substituted diheteroarylamino, an optionally substituted arylheteroarylamino, an optionally substituted alkyl, an optionally substituted cycloalkyl, an optionally substituted alkenyl, an optionally substituted alkoxy, an optionally substituted aryloxy, an optionally substituted arylthio, or an optionally substituted silyl, and not all X's and Ar⁴'s represent hydrogen atoms simultaneously, and at least one hydrogen atom in the compound represented by formula (3) may be substituted by a halogen atom, cyano, a deuterium atom, or an optionally substituted heteroaryl.

The above aryl, heteroaryl, diarylamino, diheteroarylamino, arylheteroarylamino, alkyl, cycloalkyl, alkenyl, alkoxy, aryloxy, arylthio, and silyl are described in detail in the following preferable embodiment. Examples of a substituent on these groups include an aryl, a heteroaryl, a diarylamino, a diheteroarylamino, an arylheteroarylamino, an alkyl, a cycloalkyl, an alkenyl, an alkoxy, an aryloxy, an arylthio, and a silyl, and these are also described in detail in the following preferable embodiment.

A preferable embodiment of the anthracene-based compound will be described below. The definitions of symbols in the following structures are the same as the above definitions.

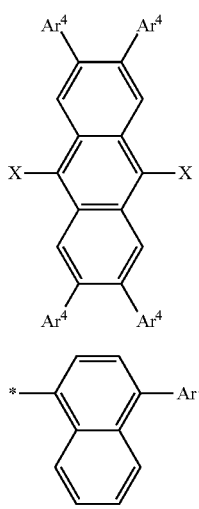
(3)

(3-X1)

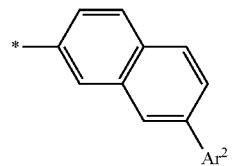
(3-X2)

*—Ar³ (3-X3)

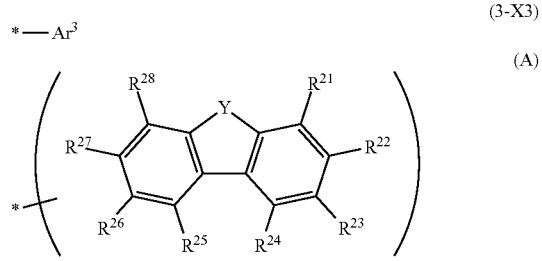
(A)

In formula (3), X's each independently represent a group represented by the above formula (3-X1), (3-X2), or (3-X3), and the group represented by the formula (3-X1), (3-X2), or (3-X3) is bonded to the anthracene ring of formula (3) at the symbol *. Preferably, two X's do not simultaneously represent the group represented by formula (3-X3). More preferably, two X's do not simultaneously represent the group represented by formula (3-X2).

A naphthylene moiety in formula (3-X1) or (3-X2) may be fused with one benzene ring. A structure fused in this way is as follows.

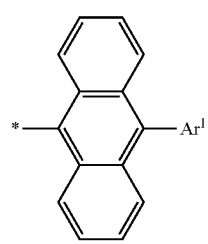
(3-X1-1)

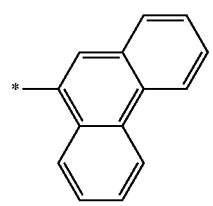
(3-X1-2)

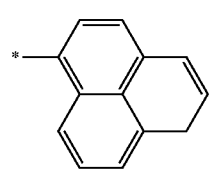
(3-X1-3)

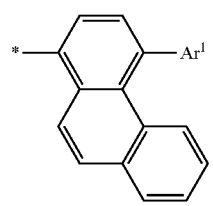
(3-X1-4)

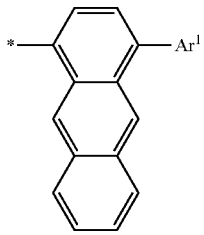
(3-X1-5)

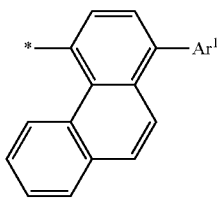
(3-X1-6)

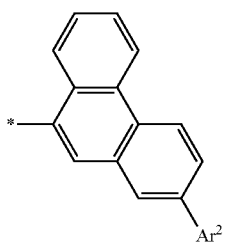
(3-X2-1)

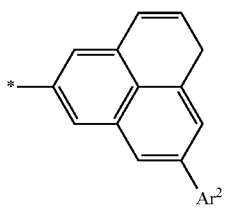
(3-X2-2)

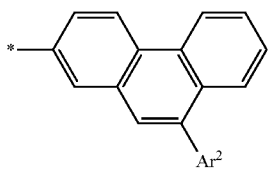
(3-X2-3)

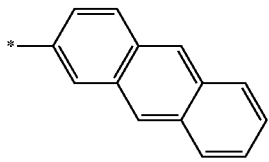
(3-X2-4)

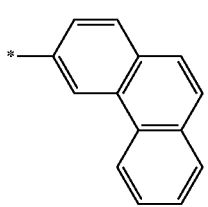
(3-X2-5)

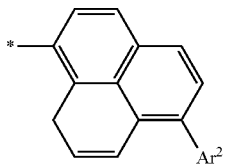
(3-X2-6)

$Ar^1$ and $Ar^2$ each independently represent a hydrogen atom, phenyl, biphenylyl, terphenylyl, quaterphenylyl, naphthyl, phenanthryl, fluorenyl, benzofluorenyl, chrysenyl, triphenylenyl, pyrenyl, or a group represented by the above formula (A) (including a carbazolyl group, a benzocarbazolyl group, and a phenyl-substituted carbazolyl group). Incidentally, in a case where $Ar^1$ or $Ar^2$ is a group represented by formula (A), the group represented by formula (A) is bonded to a naphthalene ring in formula (3-X1) or (3-X2) at the symbol *.

$Ar^3$ represents phenyl, biphenylyl, terphenylyl, quaterphenylyl, naphthyl, phenanthryl, fluorenyl, benzofluorenyl, chrysenyl, triphenylenyl, pyrenyl, or a group represented by the above formula (A) (including a carbazolyl group, a benzocarbazolyl group, and a phenyl-substituted carbazolyl group). Incidentally, in a case where $Ar^3$ is a group represented by formula (A), the group represented by formula (A) is bonded to a single bond represented by the straight line in formula (3-X3) at the symbol *. That is, the anthracene ring of formula (3) and the group represented by formula (A) are directly bonded to each other.

$Ar^3$ may have a substituent, and at least one hydrogen atom in $Ar^3$ may be further substituted by phenyl, biphenylyl, terphenylyl, naphthyl, phenanthryl, fluorenyl, chrysenyl, triphenylenyl, pyrenyl, or a group represented by the above formula (A) (including a carbazolyl group and a phenyl-substituted carbazolyl group). Incidentally, in a case where the substituent included in $Ar^3$ is a group represented by formula (A), the group represented by formula (A) is bonded to $Ar^3$ in formula (3-X3) at the symbol *.

$Ar^4$'s each independently represent a hydrogen atom, phenyl, biphenylyl, terphenylyl, naphthyl, or a silyl substituted by an alkyl having 1 to 4 carbon atoms (methyl, ethyl, t-butyl, and the like) and/or a cycloalkyl having 5 to 10 carbon atoms.

Examples of the alkyl having 1 to 4 carbon atoms, by which a silyl is substituted, include methyl, ethyl, propyl, i-propyl, butyl, sec-butyl, t-butyl, and cyclobutyl, and three hydrogen atoms in the silyl are each independently substituted by these alkyls.

Specific examples of the "silyl substituted by an alkyl having 1 to 4 carbon atoms" include a trimethylsilyl, a triethylsilyl, a tripropylsilyl, a tri-i-propylsilyl, a tributylsilyl, a tri sec-butylsilyl, a tri-t-butylsilyl, an ethyl dimethylsilyl, a propyldimethylsilyl, an i-propyldimethylsilyl, a butyldimethylsilyl, a sec-butyldimethylsilyl, a t-butyldimethylsilyl, a methyldiethylsilyl, a propyldiethylsilyl, an i-propyldiethylsilyl, a butyldiethylsilyl, a sec-butyl diethylsilyl, a t-butyldiethylsilyl, a methyldipropylsilyl, an ethyldipropylsilyl, a butyldipropylsilyl, a sec-butyldipropylsilyl, a t-butyldipropylsilyl, a methyl di-i-propylsilyl, an ethyl di-i-propylsilyl, a butyl di-i-propylsilyl, a sec-butyl di-i-propylsilyl, and a t-butyl di-i-propylsilyl.

Examples of the cycloalkyl having 5 to 10 carbon atoms, by which a silyl is substituted, include cyclopentyl, cyclohexyl, cycloheptyl, cyclooctyl, cyclononyl, cyclodecyl, norbornenyl, bicyclo[1.1.1]pentyl, bicyclo[2.0.1]pentyl, bicyclo[1.2.1]hexyl, bicyclo[3.0.1]hexyl, bicyclo[2.1.2]heptyl, bicyclo[2.2.2]octyl, adamantyl, decahydronaphthalenyl, and decahydroazulenyl. Three hydrogen atoms in the silyl are each independently substituted by these cycloalkyls.

Specific examples of the "silyl substituted by a cycloalkyl having 5 to 10 carbon atoms" include tricyclopentylsilyl and tricyclohexylsilyl.

Examples of the silyl substituted include a dialkylcycloalkylsilyl substituted by two alkyls and one cycloalkyl and an alkyldicycloalkylsilyl substituted by one alkyl and two cycloalkyls. Specific examples of the alkyl and cycloalkyl for substitution include the groups described above.

A hydrogen atom in a chemical structure of the anthracene-based compound represented by general formula (3) may be substituted by a group represented by the above formula (A). In a case where the hydrogen atom is substituted by the group represented by formula (A), the group represented by formula (A) is substituted by at least one hydrogen atom in the compound represented by formula (3) at the symbol *.

The group represented by formula (A) is one of substituents that can be possessed by an anthracene-based compound represented by formula (3).

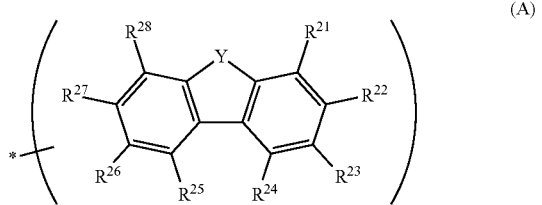

(A)

In the above formula (A), Y represents —O—, —S—, or >N—$R^{29}$, $R^{21}$ to $R^{28}$ each independently represent a hydrogen atom, an optionally substituted alkyl, an optionally substituted cycloalkyl, an optionally substituted aryl, an optionally substituted heteroaryl, an optionally substituted alkoxy, an optionally substituted aryloxy, an optionally substituted arylthio, a trialkylsilyl, a tricycloalkylsilyl, a dialkylcycloalkylsilyl, an alkyldicycloalkylsilyl, an optionally substituted amino, a halogen atom, hydroxy, or cyano, adjacent groups among $R^{21}$ to $R^{28}$ may be bonded to each other to form a hydrocarbon ring, an aryl ring, or a heteroaryl ring, and $R^{29}$ represents a hydrogen atom or an optionally substituted aryl.

The "alkyl" as the "optionally substituted alkyl" in $R^{21}$ to $R^{28}$ may be either linear or branched, and examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 or 4 carbon atoms) is particularly preferable.

Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Examples of the "cycloalkyl" as the "optionally substituted cycloalkyl" in $R^{21}$ to $R^{28}$ include a cycloalkyl having 3 to 24 carbon atoms, a cycloalkyl having 3 to 20 carbon atoms, a cycloalkyl having 3 to 16 carbon atoms, a cycloalkyl having 3 to 14 carbon atoms, a cycloalkyl having 5 to 10 carbon atoms, a cycloalkyl having 5 to 8 carbon atoms, a cycloalkyl having 5 or 6 carbon atoms, and a cycloalkyl having 5 carbon atoms.

Specific examples of the "cycloalkyl" include cyclopropyl, cyclobutyl, cyclopentyl, cyclohexyl, cycloheptyl, cyclooctyl, cyclononyl, cyclodecyl, alkyl (especially methyl) substituents thereof having 1 to 4 carbon atoms, norbornenyl, bicyclo[1.0.1]butyl, bicyclo[1.1.1]pentyl, bicyclo[2.0.1]pentyl, bicyclo[1.2.1]hexyl, bicyclo[3.0.1]hexyl, bicyclo[2.1.2]heptyl, bicyclo[2.2.2]octyl, adamantyl, diamantyl, decahydronaphthalenyl, and decahydroazulenyl.

Examples of the "aryl" as the "optionally substituted aryl" in $R^{21}$ to $R^{28}$ include an aryl having 6 to 30 carbon atoms. An aryl having 6 to 16 carbon atoms is preferable, an aryl having 6 to 12 carbon atoms is more preferable, and an aryl having 6 to 10 carbon atoms is particularly preferable.

Specific examples of the "aryl" include phenyl which is a monocyclic system; biphenylyl which is a bicyclic system; naphthyl which is a fused bicyclic system; terphenylyl (m-terphenylyl, o-terphenylyl, or p-terphenylyl) which is a tricyclic system; acenaphthylenyl, fluorenyl, phenalenyl, and phenanthrenyl which are fused tricyclic systems; triphenylenyl, pyrenyl, and naphthacenyl which are fused tetracyclic systems; and perylenyl and pentacenyl which are fused pentacyclic systems.

Examples of the "heteroaryl" as the "optionally substituted heteroaryl" in $R^{21}$ to $R^{28}$ include a heteroaryl having 2 to 30 carbon atoms. A heteroaryl having 2 to 25 carbon atoms is preferable, a heteroaryl having 2 to 20 carbon atoms is more preferable, a heteroaryl having 2 to 15 carbon atoms is still more preferable, and a heteroaryl having 2 to 10 carbon atoms is particularly preferable. In addition, examples of the heteroaryl include a heterocyclic ring containing 1 to 5 heteroatoms, selected from an oxygen atom, a sulfur atom, and a nitrogen atom in addition to a carbon atom as a ring-constituting atom.

Specific examples of the "heteroaryl" include a pyrrolyl, an oxazolyl, an isoxazolyl, a thiazolyl, an isothiazolyl, an imidazolyl, an oxadiazolyl, a thiadiazolyl, a triazolyl, a tetrazolyl, a pyrazolyl, a pyridyl, a pyrimidinyl, a pyridazinyl, a pyrazinyl, a triazinyl, an indolyl, an isoindolyl, a 1H-indazolyl, a benzoimidazolyl, a benzoxazolyl, a benzothiazolyl, a 1H-benzotriazolyl, a quinolyl, an isoquinolyl, a cinnolyl, a quinazolyl, a quinoxalinyl, a phthalazinyl, a naphthyridinyl, a purinyl, a pteridinyl, a carbazolyl, an acridinyl, a phenoxathiinyl, a phenoxazinyl, a phenothiazinyl, a phenazinyl, an indolizinyl, a furyl, a benzofuranyl, an isobenzofuranyl, a dibenzofuranyl, a thienyl, a benzo[b]thienyl, a dibenzothienyl, a furazanyl, an oxadiazolyl, a thianthrenyl, a naphthobenzofuranyl, and a naphthobenzothienyl.

Examples of the "alkoxy" as the "optionally substituted alkoxy" in $R^{21}$ to $R^{28}$ include a linear alkoxy having 1 to 24 carbon atoms and a branched alkoxy having 3 to 24 carbon atoms. An alkoxy having 1 to 18 carbon atoms (branched alkoxy having 3 to 18 carbon atoms) is preferable, an alkoxy having 1 to 12 carbon atoms (branched alkoxy having 3 to 12 carbon atoms) is more preferable, an alkoxy having 1 to 6 carbon atoms (branched alkoxy having 3 to 6 carbon atoms) is still more preferable, and an alkoxy having 1 to 4 carbon atoms (branched alkoxy having 3 or 4 carbon atoms) is particularly preferable.

Specific examples of the "alkoxy" include methoxy, ethoxy, propoxy, isopropoxy, butoxy, isobutoxy, s-butoxy, t-butoxy, pentyloxy, hexyloxy, heptyloxy, and octyloxy.

Examples of the "aryloxy" as the "optionally substituted aryloxy" in $R^{21}$ to $R^{28}$ include a group in which a hydrogen atom of an —OH group is substituted by an aryl. For this aryl, the groups described as the above "aryl" in $R^{21}$ to $R^{28}$ can be cited.

Examples of the "arylthio" as the "optionally substituted arylthio" in $R^{21}$ to $R^{28}$ include a group in which a hydrogen atom of an —SH group is substituted by an aryl. For this aryl, the groups described as the above "aryl" in $R^{21}$ to $R^{28}$ can be cited.

Examples of the "trialkylsilyl" in $R^{21}$ to $R^{28}$ include a group in which three hydrogen atoms in a silyl group are each independently substituted by an alkyl. For this alkyl, the groups described as the above "alkyl" in $R^{21}$ to $R^{28}$ can be cited. A preferable alkyl for substitution is an alkyl having 1 to 4 carbon atoms, and specific examples thereof include methyl, ethyl, propyl, i-propyl, butyl, sec-butyl, t-butyl, and cyclobutyl.

Specific examples of the "trialkylsilyl" include a trimethylsilyl, a triethylsilyl, a tripropylsilyl, a tri-i-propylsilyl, a tributylsilyl, a tri sec-butylsilyl, a tri-t-butylsilyl, an ethyl dimethylsilyl, a propyldimethylsilyl, an i-propyldimethylsilyl, a butyldimethylsilyl, a sec-butyldimethylsilyl, a t-butyldimethylsilyl, a methyldiethylsilyl, a propyldiethylsilyl, an i-propyldiethylsilyl, a butyldiethylsilyl, a sec-butyl diethylsilyl, a t-butyldiethylsilyl, a methyldipropylsilyl, an ethyldipropylsilyl, a butyldipropylsilyl, a sec-butyldipropylsilyl, a t-butyldipropylsilyl, a methyl di-i-propylsilyl, an ethyl di-i-propylsilyl, a butyl di-i-propylsilyl, a sec-butyl di-i-propylsilyl, and a t-butyl di-i-propylsilyl.

Examples of the "tricycloalkylsilyl" in $R^{21}$ to $R^{28}$ include a group in which three hydrogen atoms in a silyl group are each independently substituted by a cycloalkyl. For this cycloalkyl, the groups described as the above "cycloalkyl" in $R^{21}$ to $R^{28}$ can be cited. A preferable cycloalkyl for substitution is a cycloalkyl having 5 to 10 carbon atoms. Specific examples thereof include cyclopentyl, cyclohexyl, cycloheptyl, cyclooctyl, cyclononyl, cyclodecyl, norbornenyl, bicyclo[1.1.1]pentyl, bicyclo[2.0.1]pentyl, bicyclo[1.2.1]hexyl, bicyclo[3.0.1]hexyl, bicyclo[2.1.2]heptyl, bicyclo[2.2.2]octyl, adamantyl, decahydronaphthalenyl, and decahydroazulenyl.

Specific examples of the "tricycloalkylsilyl" include tricyclopentylsilyl and tricyclohexylsilyl.

Specific examples of the dialkylcycloalkylsilyl substituted by two alkyls and one cycloalkyl and the alkyldicycloalkylsilyl substituted by one alkyl and two cycloalkyls include a silyl substituted by a group selected from the specific alkyls and cycloalkyls described above.

Examples of the "substituted amino" as the "optionally substituted amino" in $R^{21}$ to $R^{28}$ include an amino group in which two hydrogen atoms are substituted by an aryl or a heteroaryl. An amino in which two hydrogen atoms are substituted by aryls is a diaryl-substituted amino, an amino in which two hydrogen atoms are substituted by heteroaryls is a diheteroaryl-substituted amino, and an amino in which two hydrogen atoms are substituted by an aryl and a heteroaryl is an arylheteroaryl-substituted amino. For the aryl and heteroaryl, the groups described as the above "aryl" and "heteroaryl" in $R^{21}$ to $R^{28}$ can be cited.

Specific examples of the "substituted amino" include diphenylamino, dinaphthylamino, phenylnaphthylamino, dipyridylamino, phenylpyridylamino, and naphthylpyridylamino.

Examples of the "halogen atom" in $R^{21}$ to $R^{28}$ include a fluorine atom, a chlorine atom, a bromine atom, and an iodine atom.

Some of the groups described as $R^{21}$ to $R^{28}$ may be substituted as described above, and examples of the substituent in this case include an alkyl, a cycloalkyl, an aryl, and a heteroaryl. For the alkyl, cycloalkyl, aryl, or heteroaryl, the groups described as the above "alkyl", "cycloalkyl", "aryl", or "heteroaryl" in $R^{21}$ to $R^{28}$ can be cited.

$R^{29}$ in the moiety ">N—$R^{29}$" as Y is a hydrogen atom or an optionally substituted aryl. For the aryl, the groups described as the above "aryl" in $R^{21}$ to $R^{28}$ can be cited. As the substituent, the groups described as the substituent for $R^{21}$ to $R^{28}$ can be cited.

Adjacent groups among $R^{21}$ to $R^{28}$ may be bonded to each other to form a hydrocarbon ring, an aryl ring, or a heteroaryl ring. Examples of a case of not forming a ring include a group represented by the following formula (A-1). Examples of a case of forming a ring include groups represented by the following formulas (A-2) to (A-14). Note that at least one hydrogen atom in a group represented by any one of formulas (A-1) to (A-14) may be substituted by an alkyl, a cycloalkyl, an aryl, a heteroaryl, an alkoxy, an aryloxy, an arylthio, a trialkylsilyl, a tricycloalkylsilyl, a dialkylcycloalkylsilyl, an alkyldicycloalkylsilyl, a diaryl-substituted amino, a diheteroaryl-substituted amino, an arylheteroaryl-substituted amino, a halogen atom, hydroxy, or cyano. For these, the above description of the groups in $R^{21}$ to $R^{28}$ can be cited.

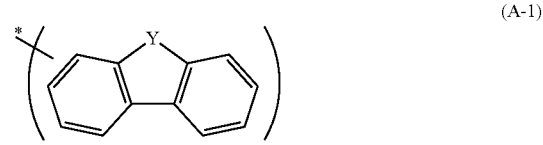

(A-1)

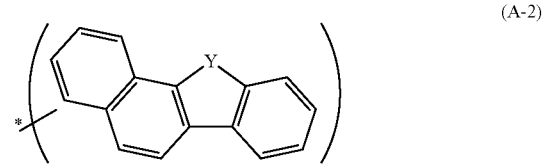

(A-2)

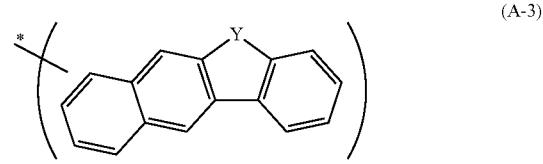

(A-3)

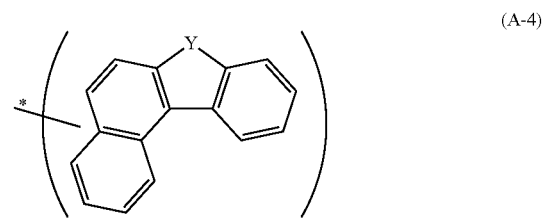

(A-4)

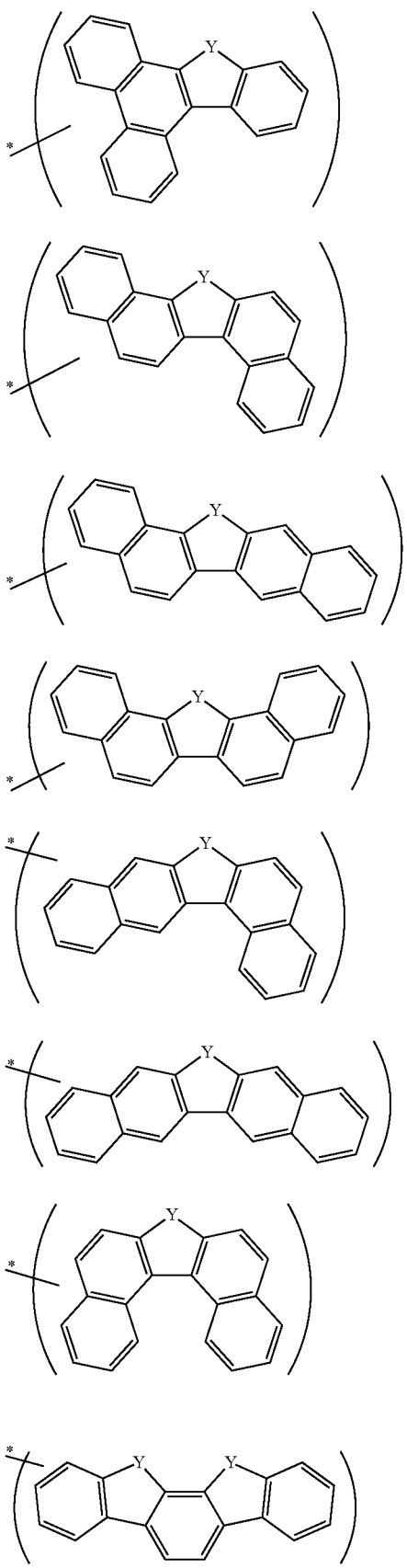

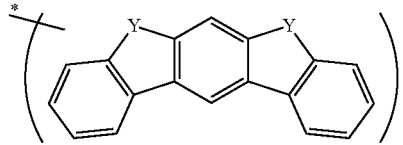

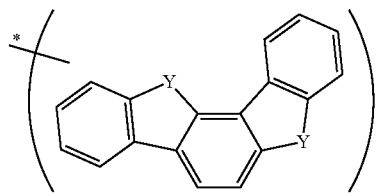

Examples of the ring formed by bonding adjacent groups to each other include a cyclohexane ring in a case of a hydrocarbon ring. Examples of the aryl ring and heteroaryl ring include ring structures described in the above "aryl" and "heteroaryl" in $R^{21}$ to $R^{28}$, and these rings are formed so as to be fused with one or two benzene rings in the above formula (A-1).

Examples of the group represented by formula (A) include a group represented by any one of the above formulas (A-1) to (A-14). A group represented by any one of the above formulas (A-1) to (A-5) and (A-12) to (A-14) is preferable, a group represented by any one of the above formulas (A-1) to (A-4) is more preferable, a group represented by any one of the above formulas (A-1), (A-3), and (A-4) is still more preferable, and a group represented by the above formula (A-1) is particularly preferable.

As described above, at the symbol * in formula (A), the group represented by formula (A) is bonded to a naphthalene ring in formula (3-X1) or (3-X2), a single bond in formula (3-X3), or $Ar^3$ in formula (3-X3), and at least one hydrogen atom in a compound represented by formula (3) is substituted by the group represented by formula (A). Among these bonding forms, a form in which the group represented by formula (A) is bonded to a naphthalene ring in formula (3-X1) or (3-X2), a single bond in formula (3-X3), and/or $Ar^3$ in formula (3-X3) is preferable.

A position at which a naphthalene ring in formula (3-X1) or (3-X2), a single bond in formula (3-X3), or $Ar^3$ in formula (3-X3) is bonded to the group represented by formula (A) in the structure of the group represented by formula (A), and a position at which at least one hydrogen atom in a compound represented by formula (3) is substituted by the group represented by formula (A) in the structure of the group represented by formula (A) may be any position in the structure of formula (A). For example, bonding can be made at any one of the two benzene rings in the structure of formula (A), at any ring formed by bonding adjacent groups among $R^{21}$ to $R^{28}$ in the structure of formula (A), or at any position in $R^{29}$ in the moiety ">N—$R^{29}$" as Y in the structure of formula (A).

Examples of the group represented by formula (A) include the following groups. Y and the * in the formula have the same definitions as above.

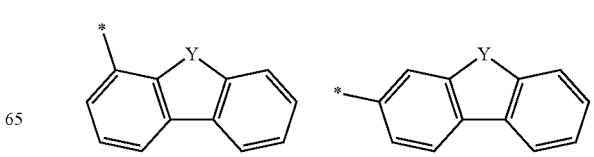

-continued

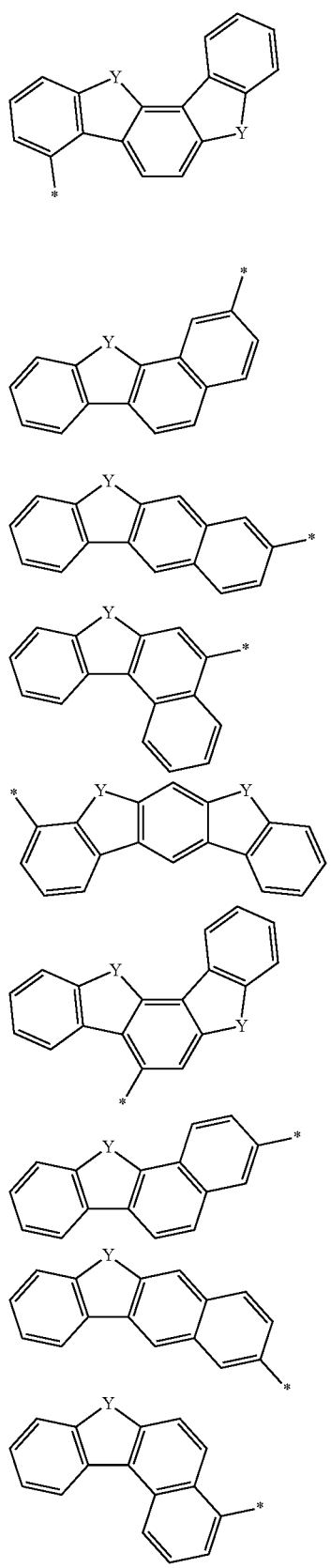
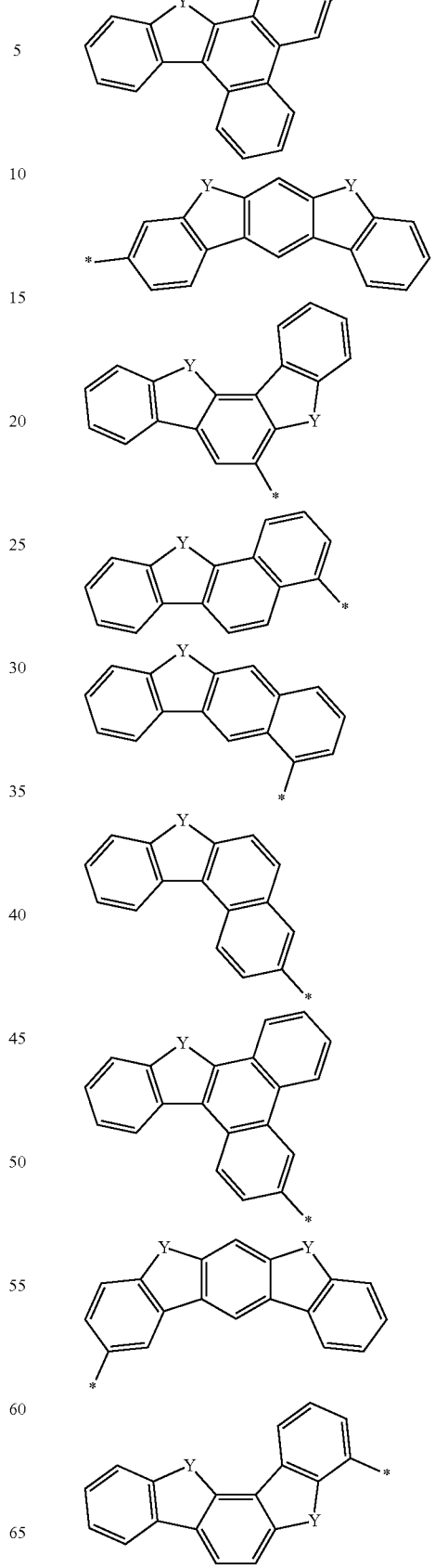

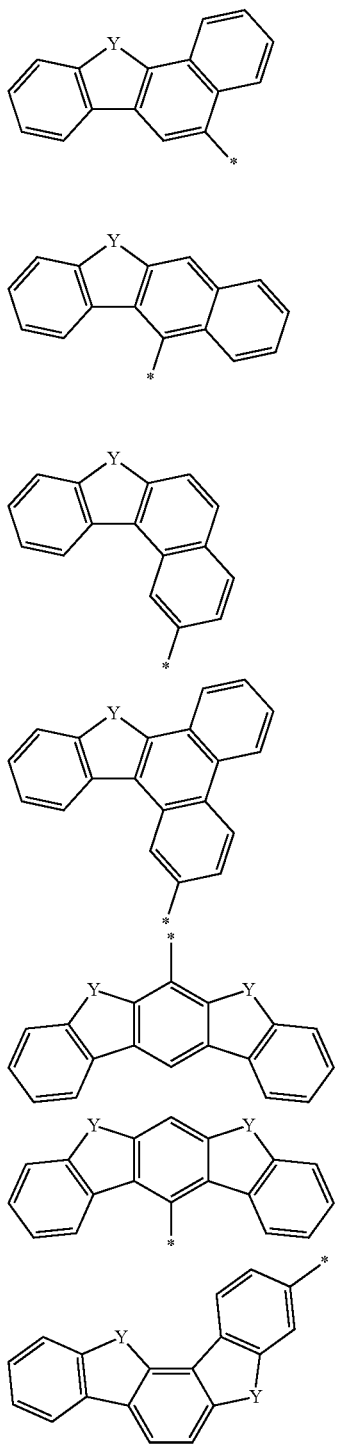
All or some of the hydrogen atoms in the chemical structure of an anthracene-based compound represented by general formula (3) may be halogen atoms, cyanos, or deuterium atoms.
Specific examples of the anthracene-based compound include compounds represented by the following formulas (3-101) to (3-127).
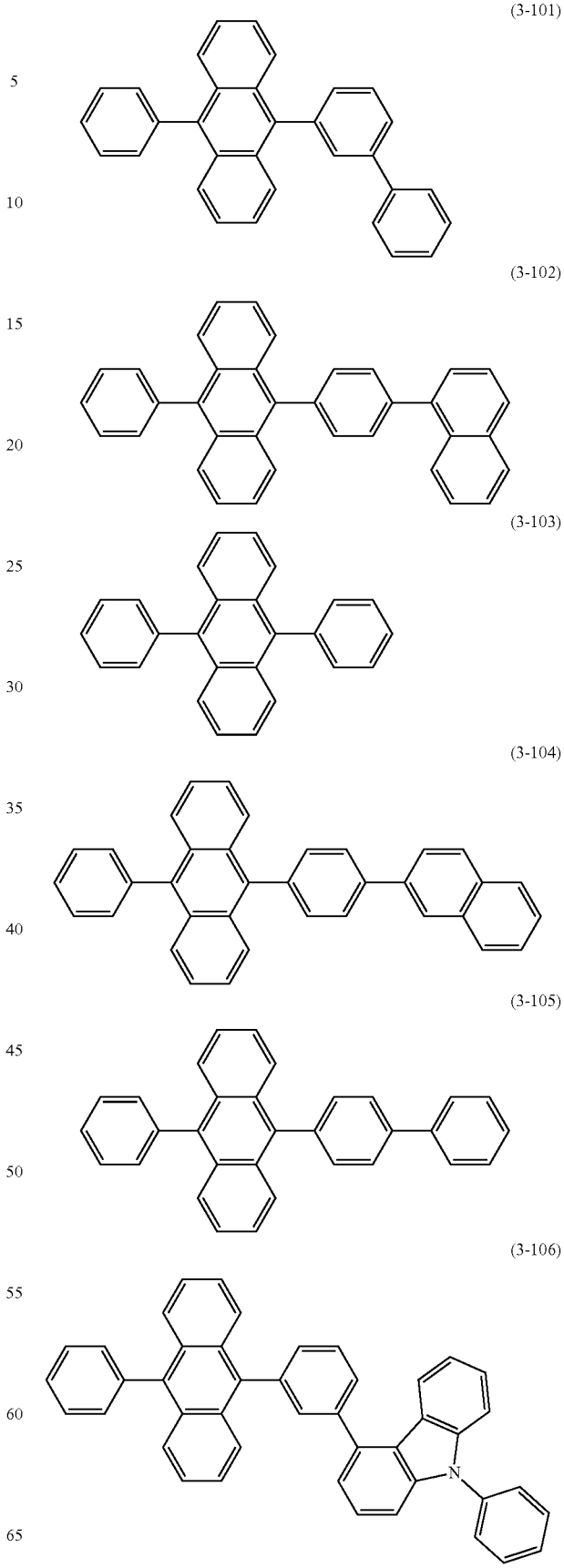

-continued
(3-107)
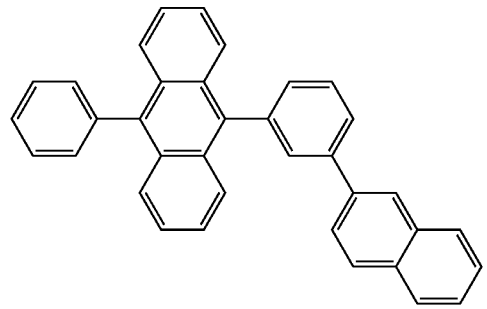
(3-108)
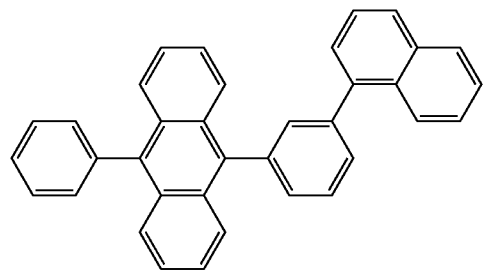
(3-111)
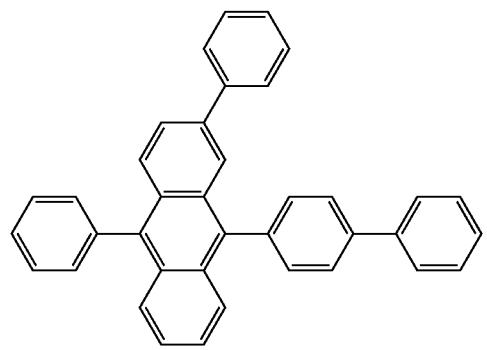
(3-112)
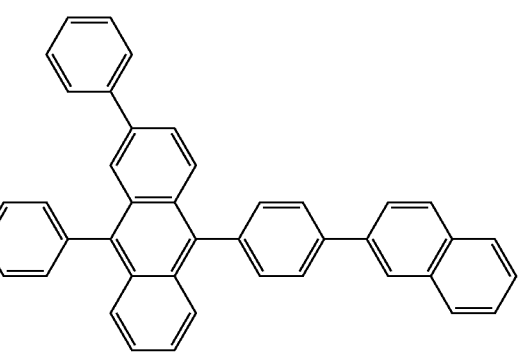
-continued
(3-113)
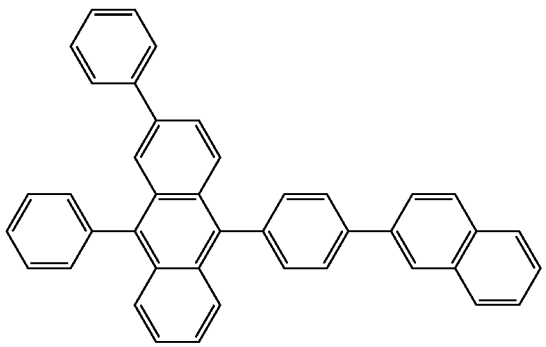
(3-114)
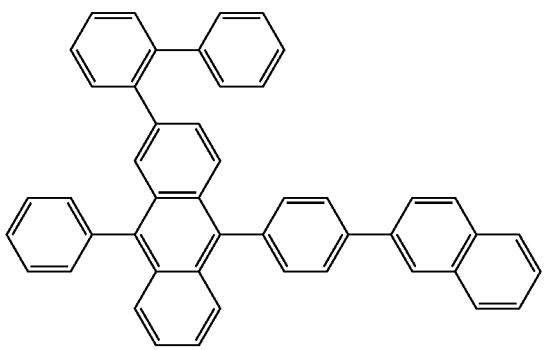
(3-115)
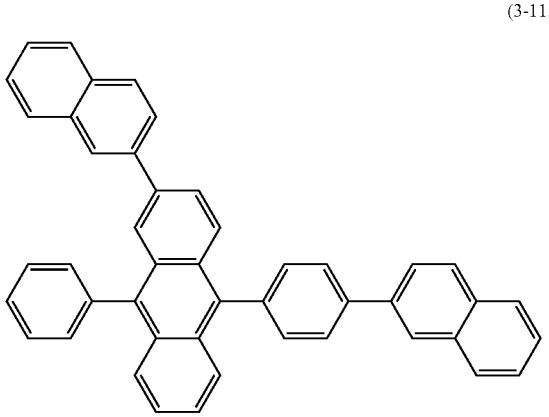
(3-116)
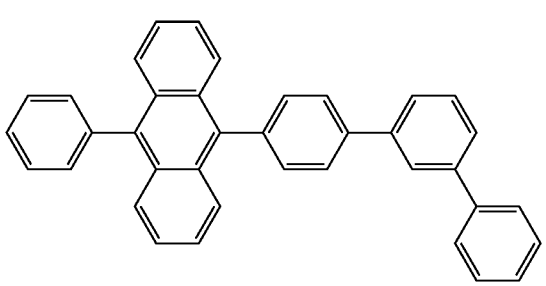

(3-117)
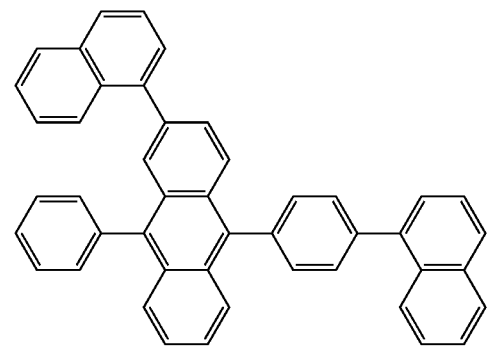

(3-118)
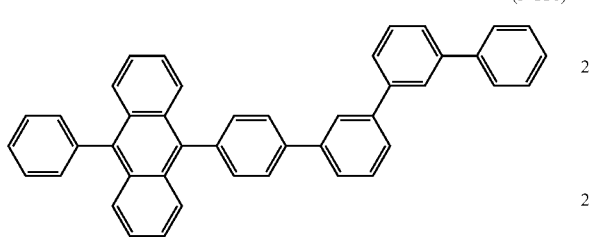

(3-119)
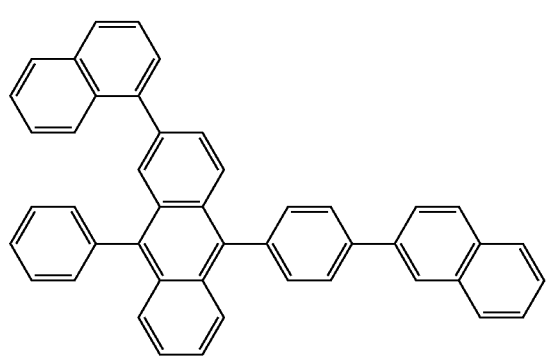

(3-121)
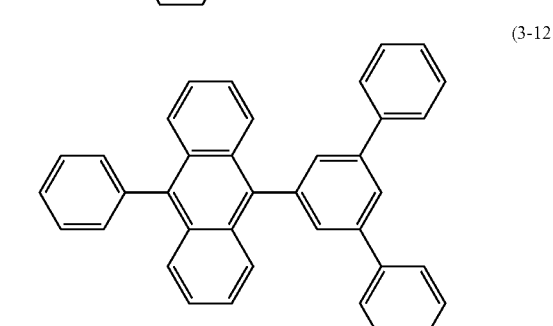

(3-122)
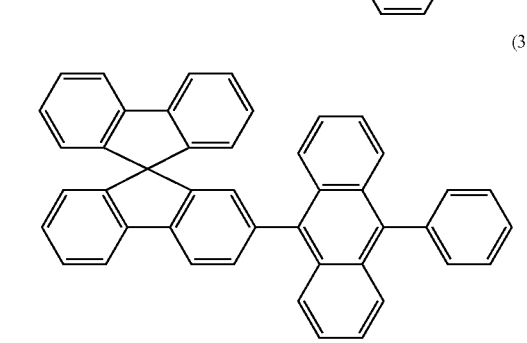

(3-123)
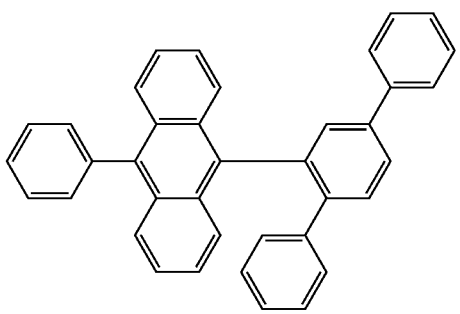

(3-124)
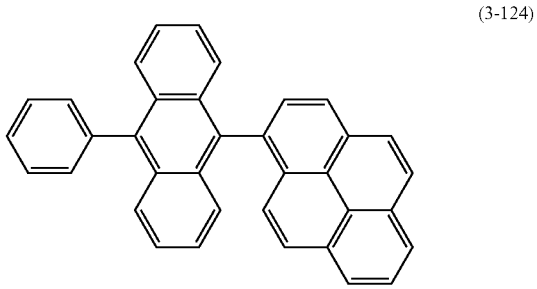

(3-125)
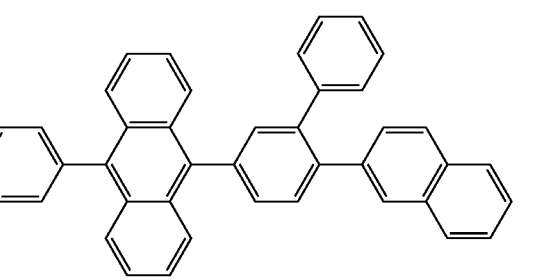

(3-126)
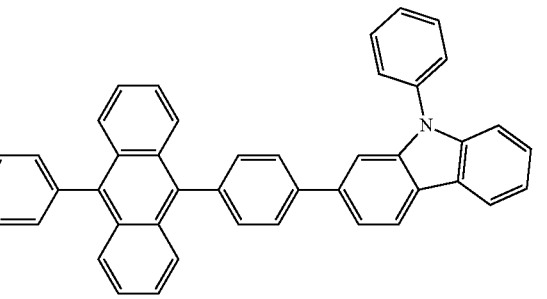

(3-127)
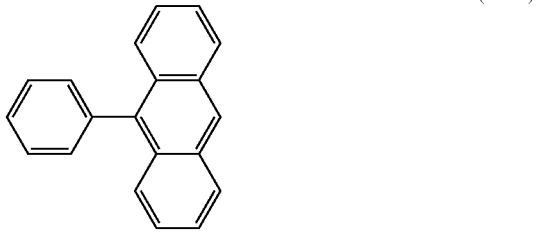

Other specific examples of the anthracene-based compound include compounds represented by the following formulas (3-131-Y) to (3-179-Y), compounds represented by the following formulas (3-180-Y) to (3-182-Y), and a compound represented by the following formula (3-183-N). Y in the formulas may be any one of —O—, —S—, and >N—R$^{29}$ (R$^{29}$ is as defined above), and R$^{29}$ is, for example, a phenyl group. Regarding a formula number, for example, when Y represents O, formula (3-131-Y) is expressed by formula (3-131-O), when Y represents —S—, formula (3-131-Y) is expressed by formula (3-131-S), and when Y represents >N—R$^{29}$, formula (3-131-Y) is expressed by formula (3-131-N).
(3-131-Y)
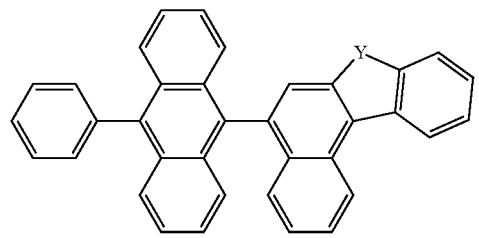
(3-132-Y)
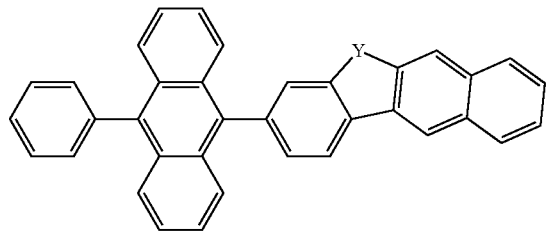
(3-133-Y)
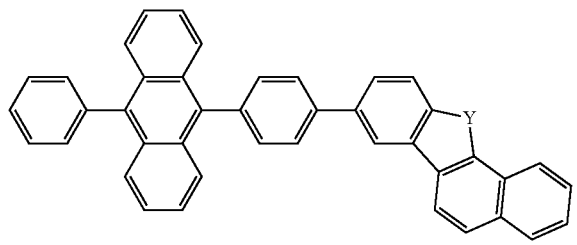
(3-134-Y)
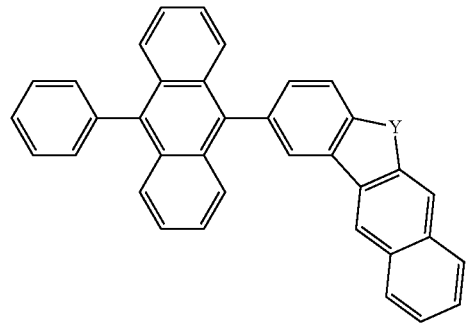
(3-135-Y)
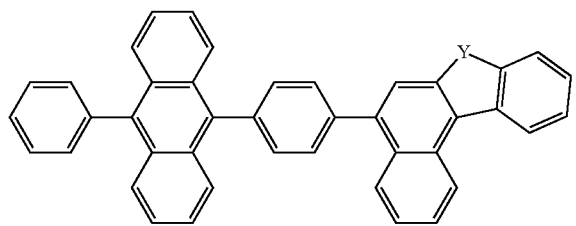
-continued
(3-136-Y)
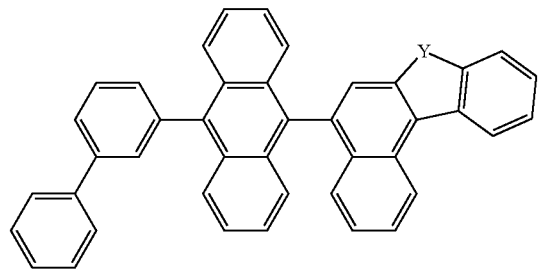
(3-137-Y)
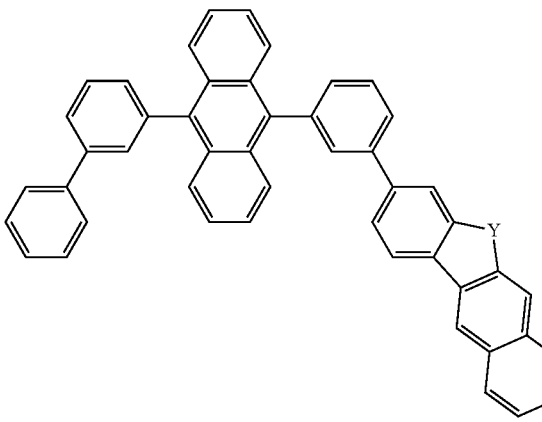
(3-138-Y)
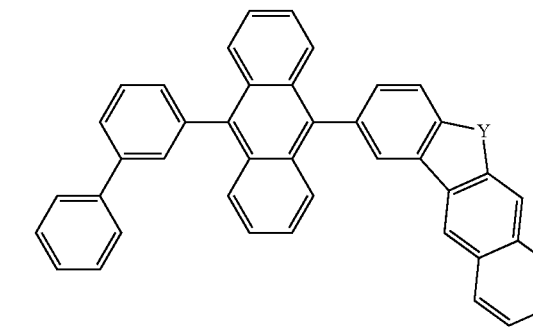
(3-139-Y)
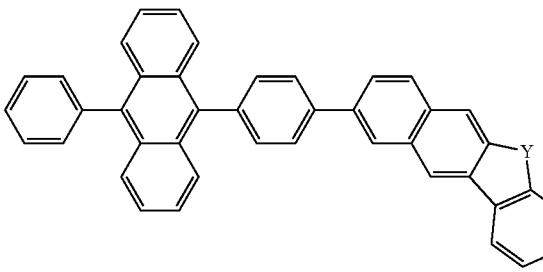

(3-140-Y)
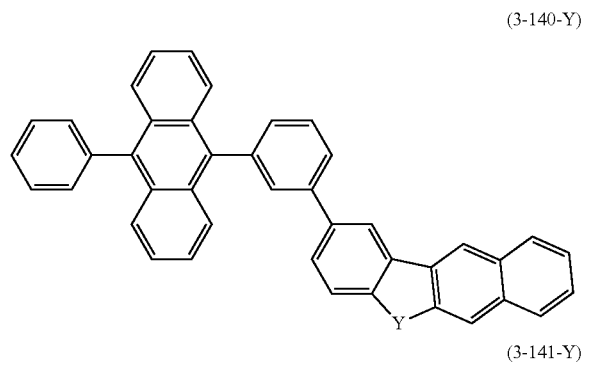
(3-141-Y)
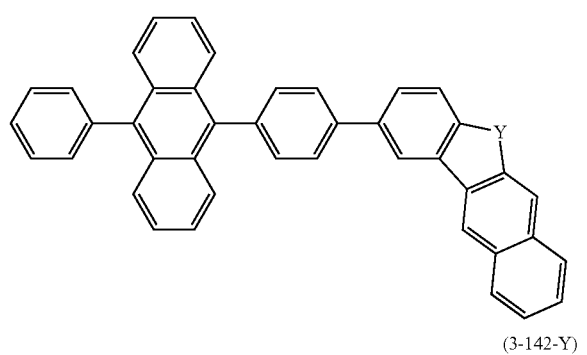
(3-142-Y)
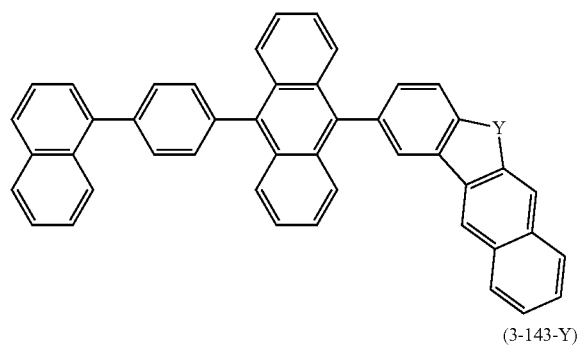
(3-143-Y)
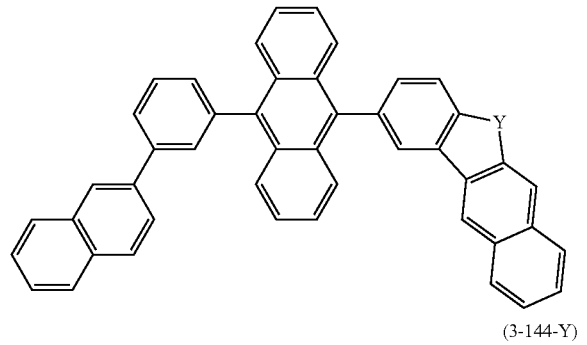
(3-144-Y)
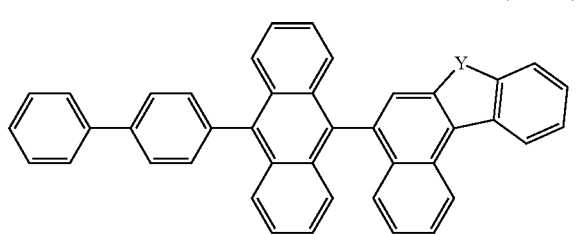
(3-145-Y)
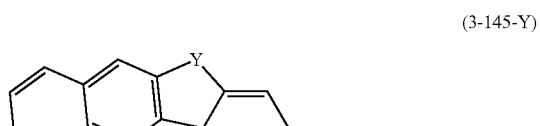
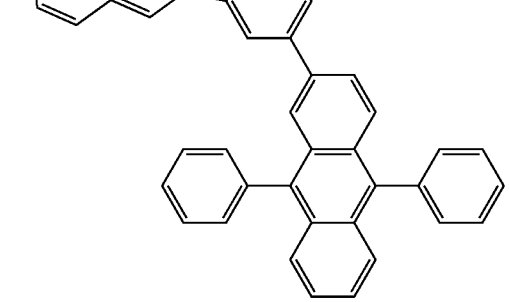
(3-146-Y)
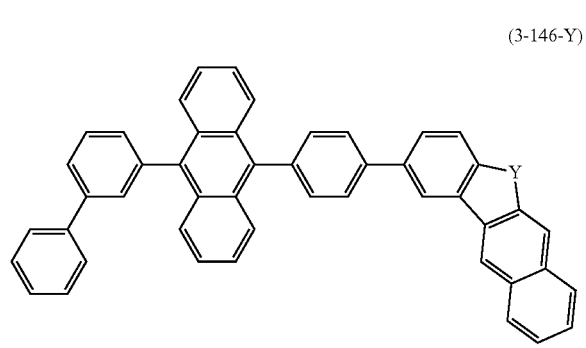
(3-147-Y)
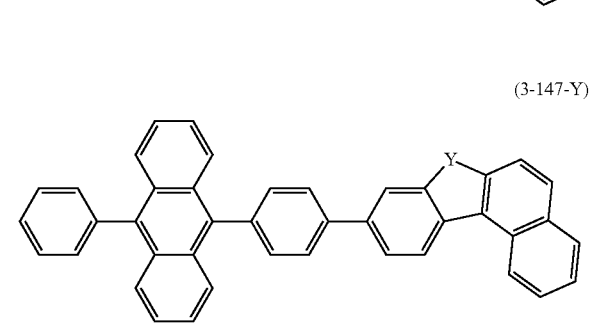
(3-148-Y)
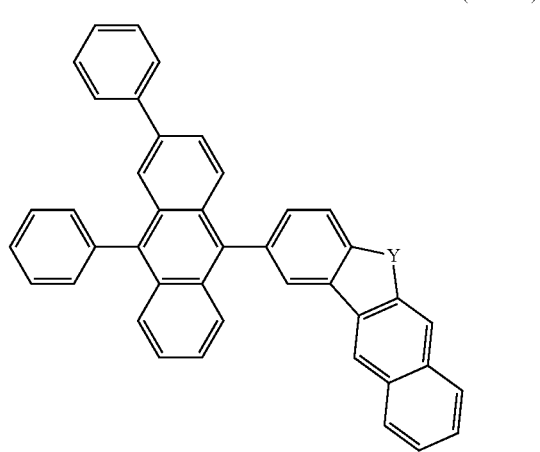

-continued
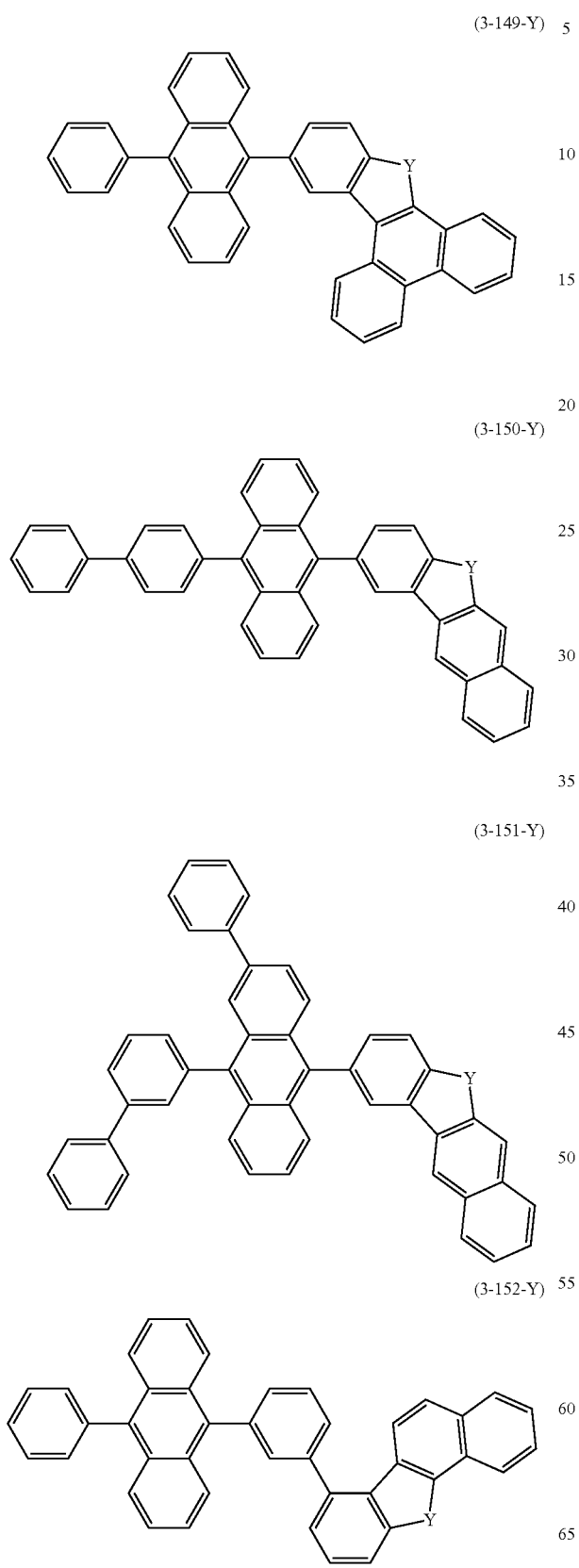
(3-149-Y)
(3-150-Y)
(3-151-Y)
(3-152-Y)
-continued
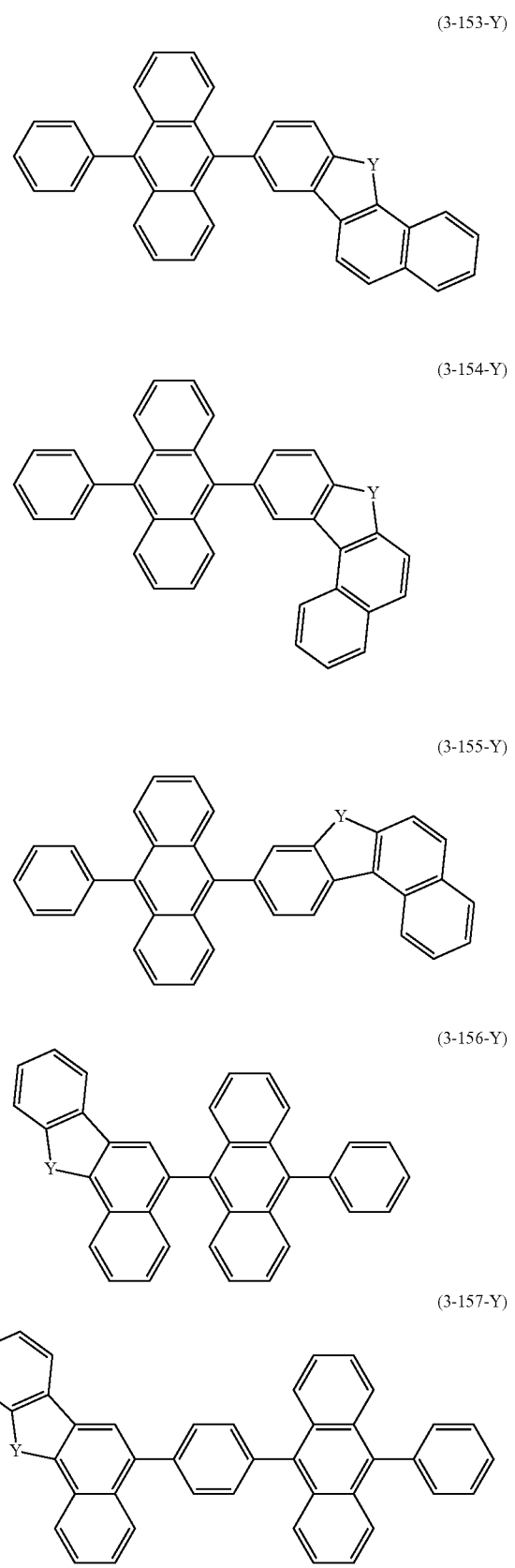
(3-153-Y)
(3-154-Y)
(3-155-Y)
(3-156-Y)
(3-157-Y)

(3-158-Y)
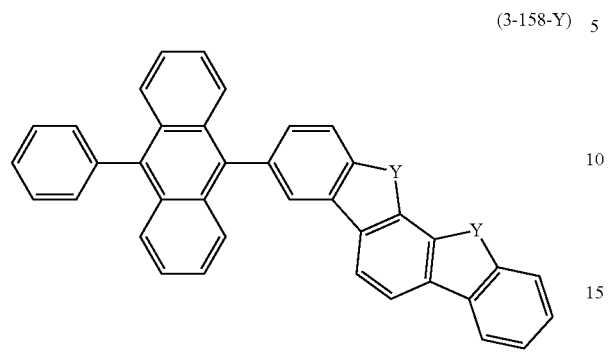
(3-159-Y)
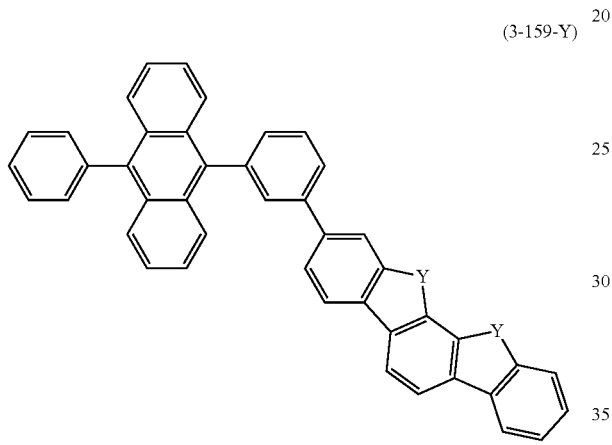
(3-160-Y)
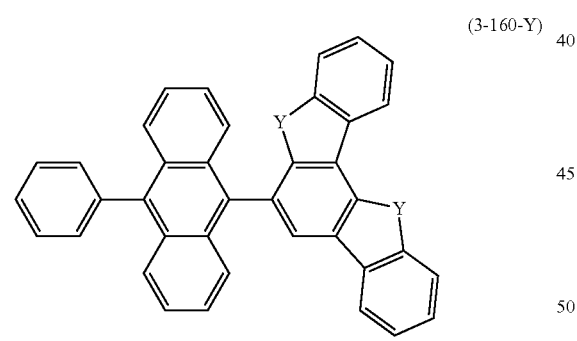
(3-161-Y)
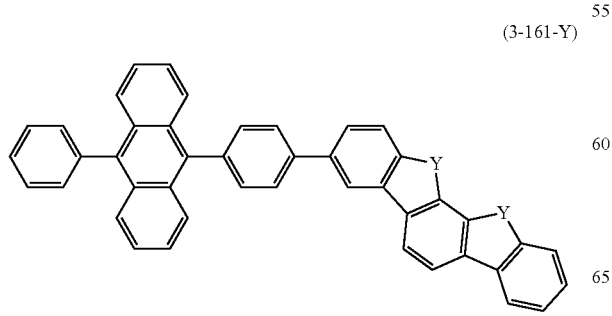
(3-162-Y)
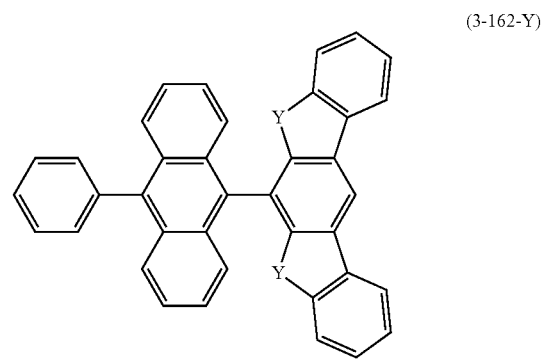
(3-163-Y)
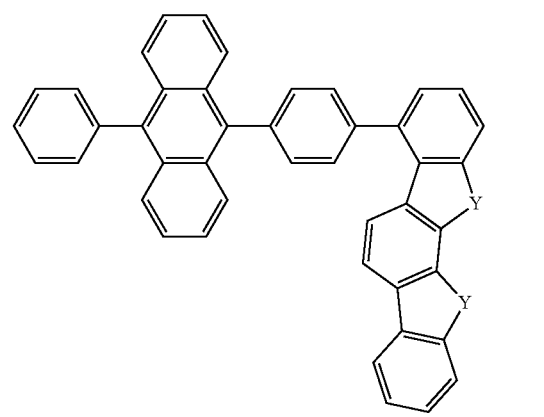
(3-164-Y)
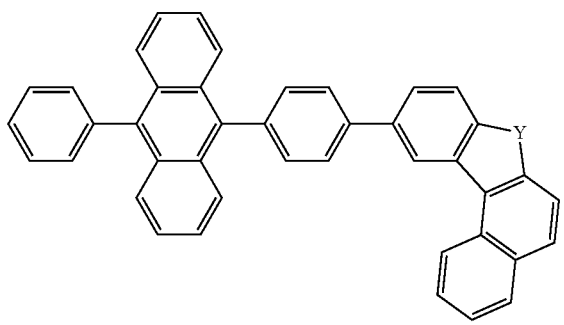
(3-165-Y)
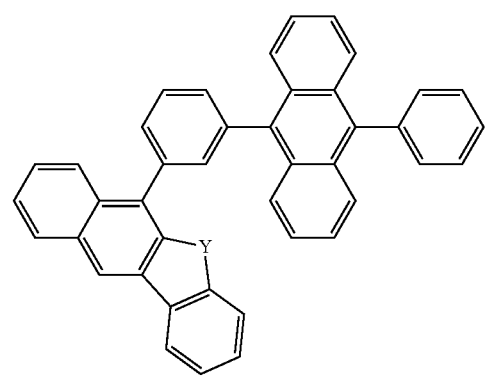

(3-166-Y)
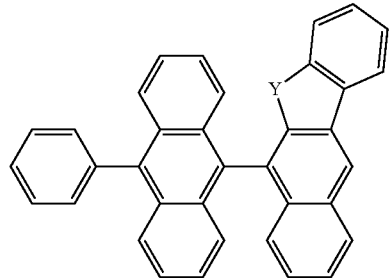
(3-167-Y)
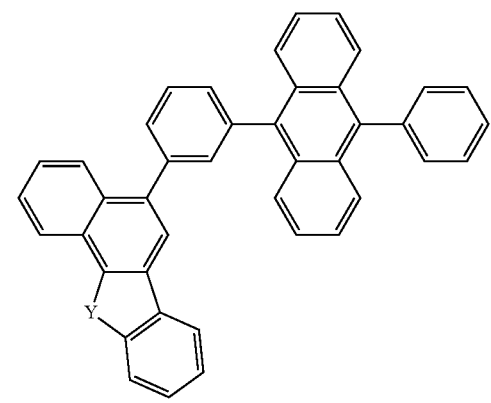
(3-168-Y)
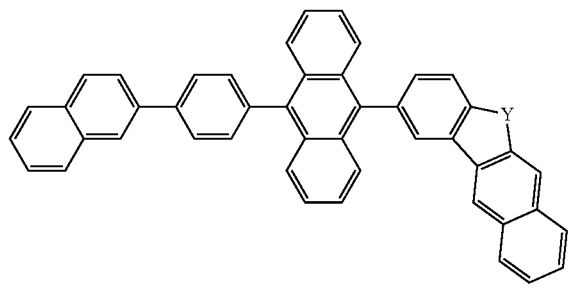
(3-169-Y)
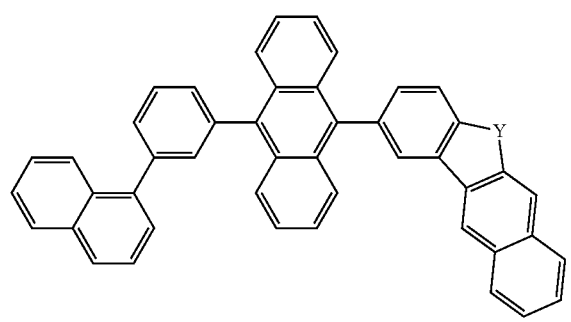
(3-170-Y)
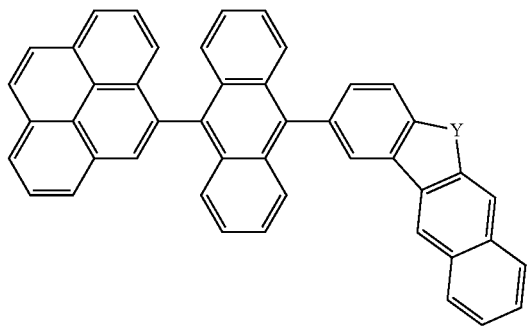
(3-171-Y)
(3-172-Y)
(3-173-Y)
(3-174-Y)
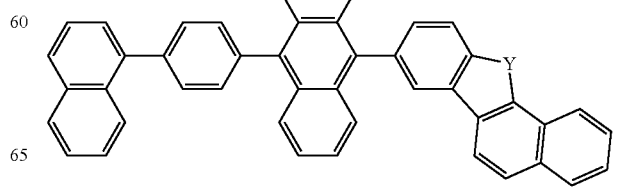

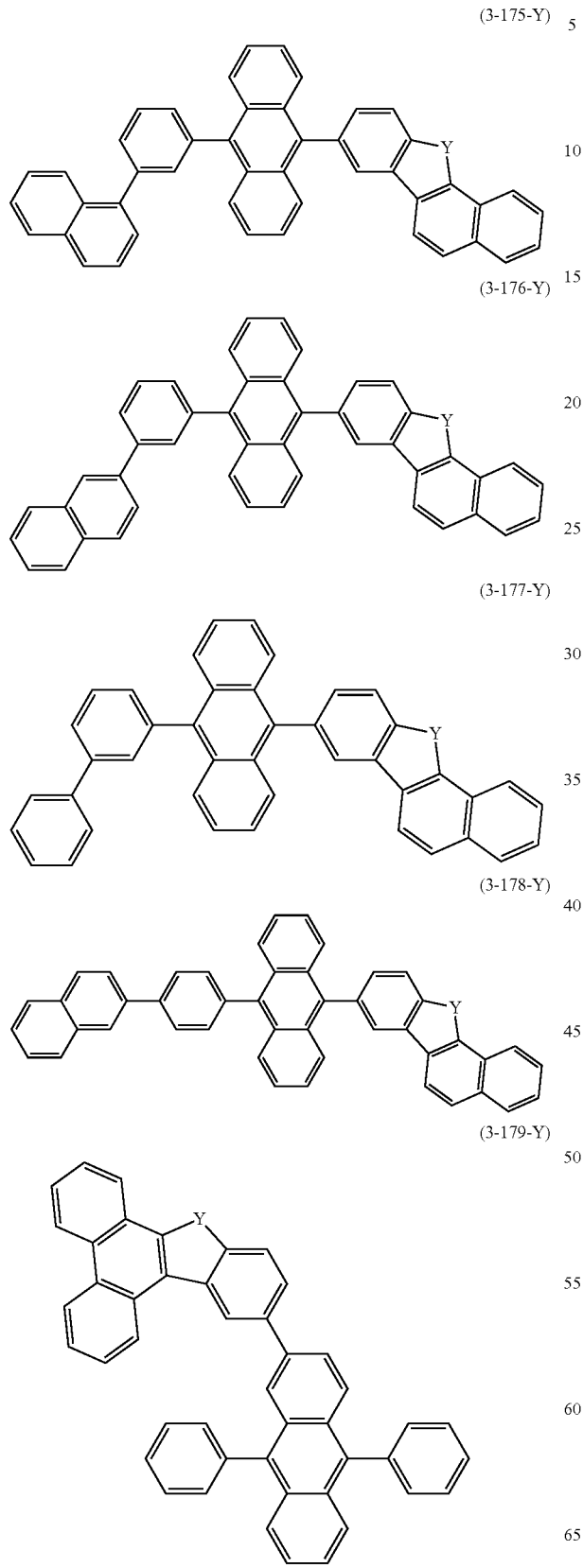
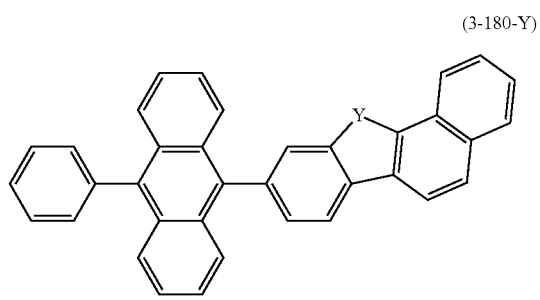
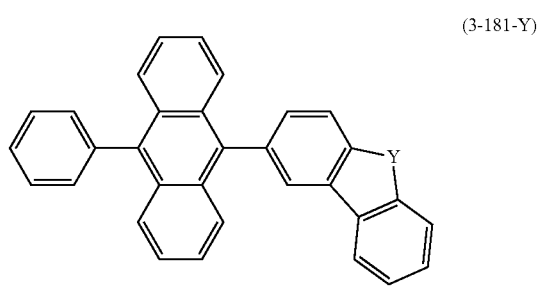
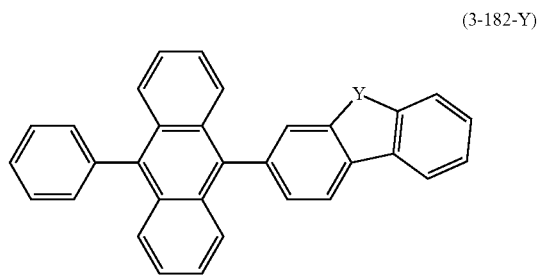
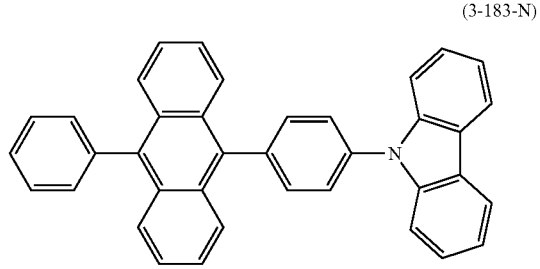
Specific examples of the anthracene-based compound include compounds represented by the following formulas (3-191) to (3-222).
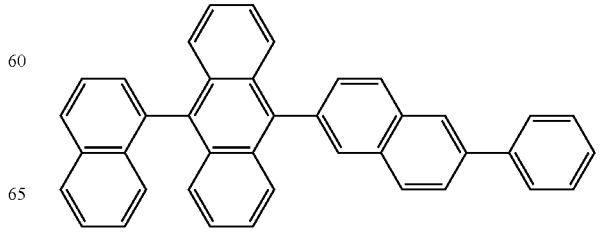

(3-192)
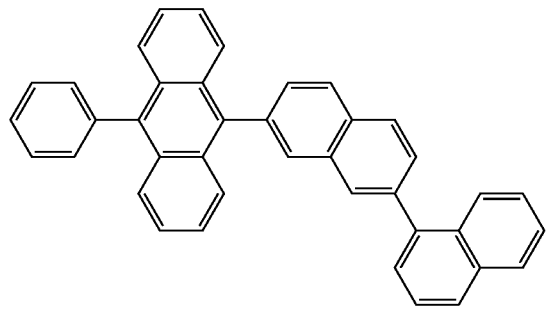
(3-193)
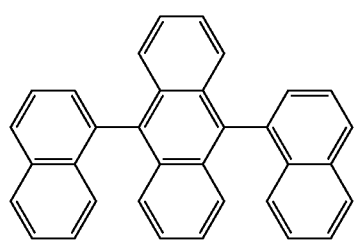
(3-194)
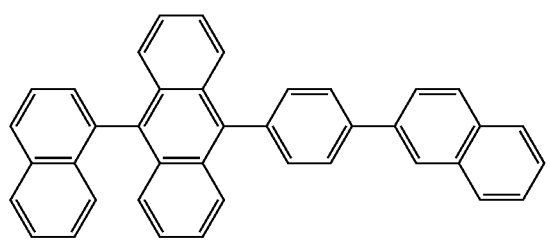
(3-195)
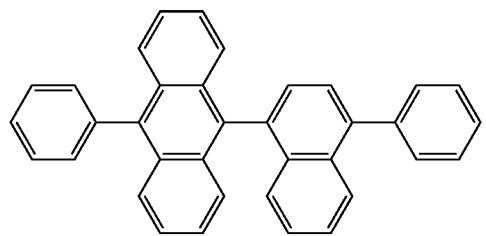
(3-196)
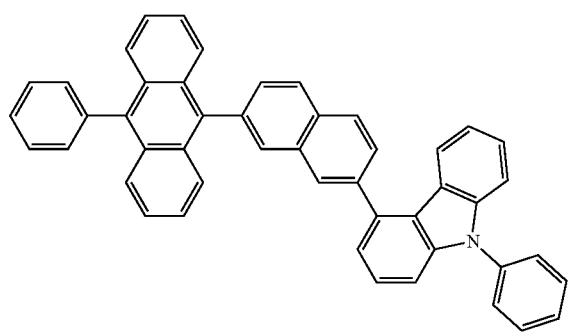
(3-197)
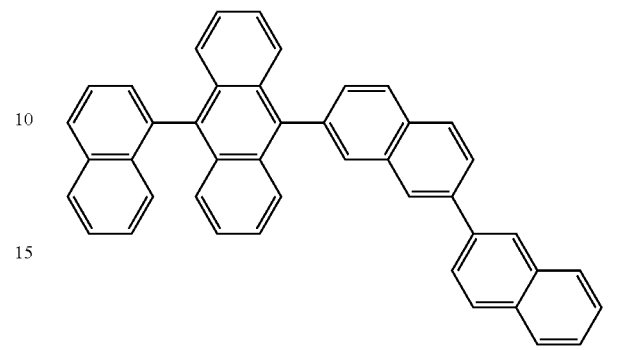
(3-198)
(3-199)
(3-201)
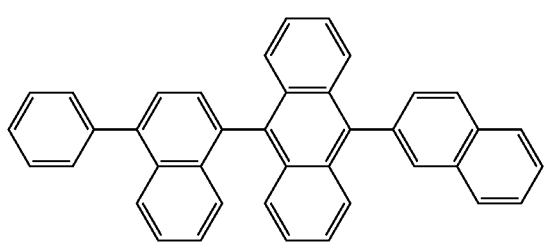

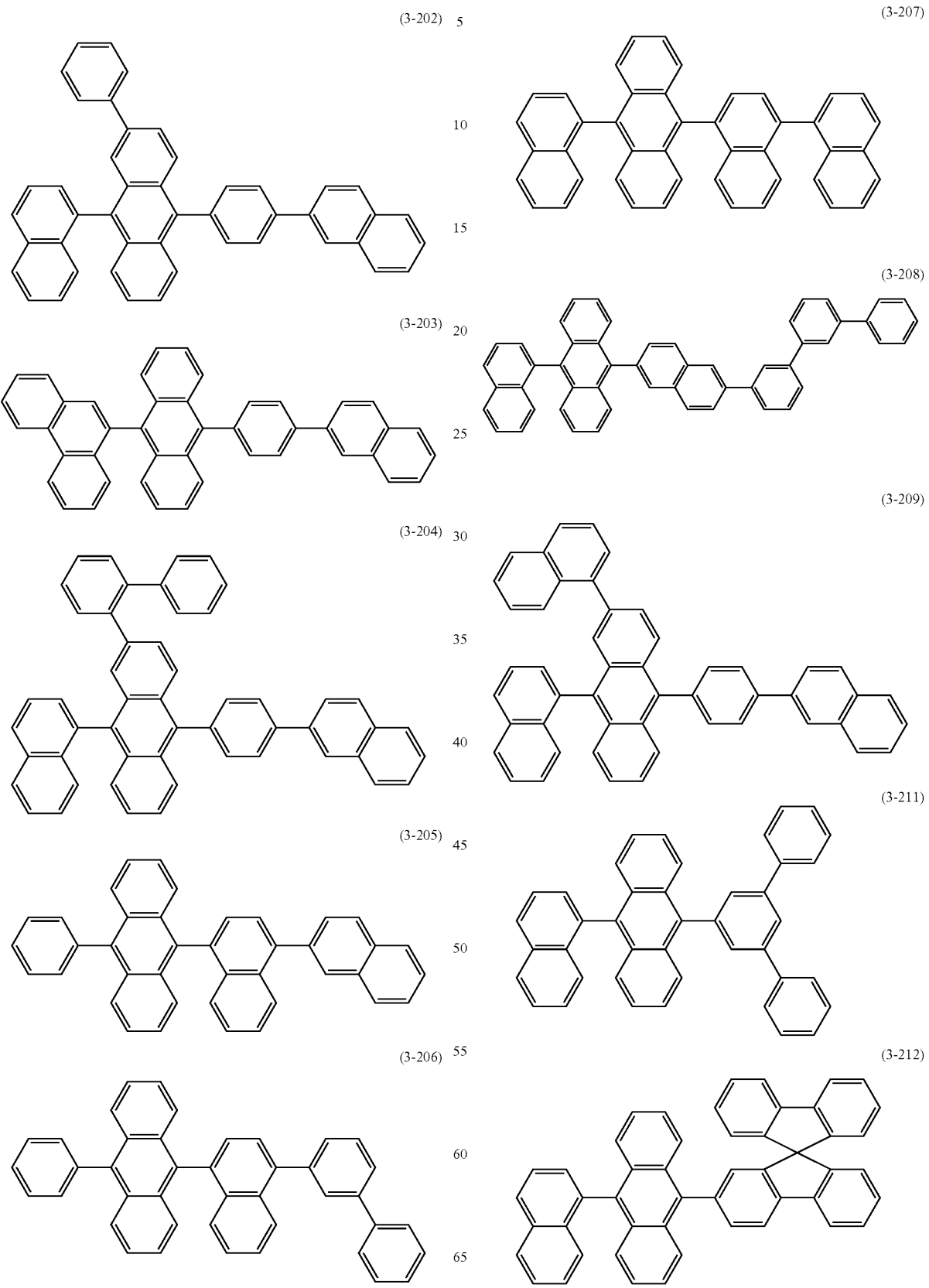

(3-213)
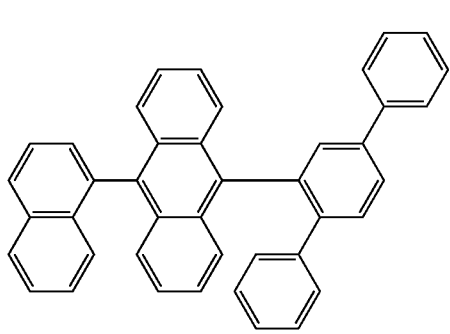

(3-214)
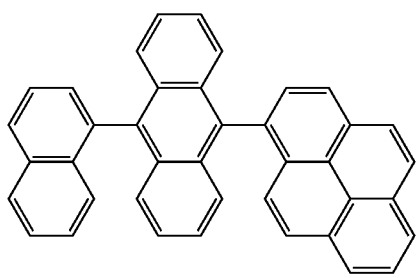

(3-215)
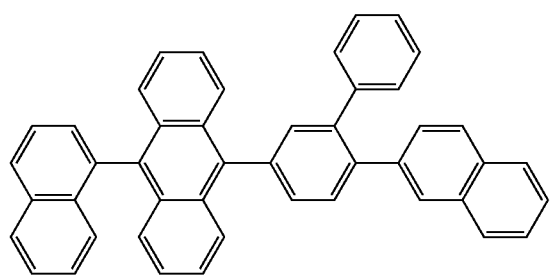

(3-216)
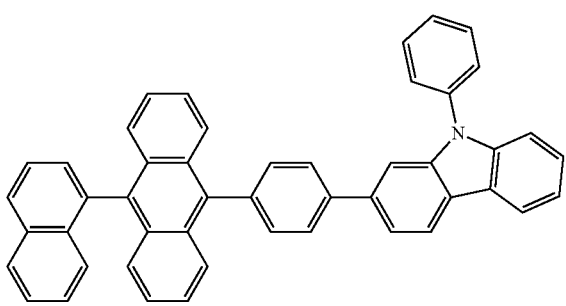

(3-221)
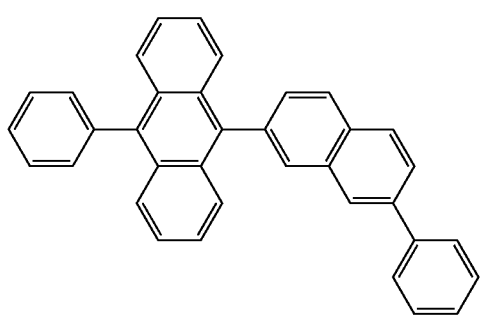

(3-222)
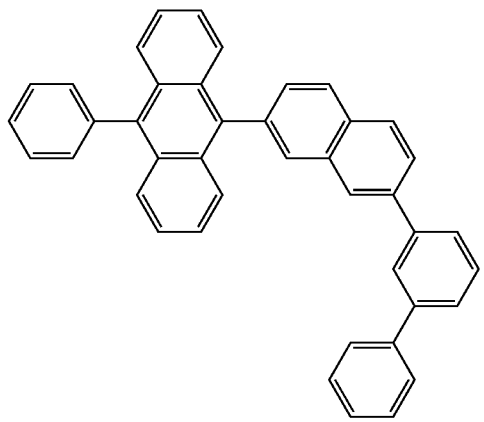

1-4. Method for Manufacturing Anthracene-Based Compound Represented by Formula (3)

The anthracene-based compound represented by formula (3) can be manufactured by using a compound having a reactive group at a desired position of an anthracene skeleton and a compound having a reactive group in a partial structure such as X, $Ar^4$, or the structure represented by formula (A) as starting raw materials and applying Suzuki coupling, Negishi coupling, or another well-known coupling reaction. Examples of the reactive group of these reactive compounds include a halogen atom and boronic acid. As a specific manufacturing method, for example, the synthesis method in paragraphs [0089] to [0175] of WO 2014/141725 A can be referred to.

2. Organic electroluminescent element

Hereinafter, an organic EL element according to the present embodiment will be described in detail based on the drawings. The FIGURE is a schematic cross-sectional view illustrating the organic EL element according to the present embodiment.

<Structure of Organic EL Element>

An organic EL element 100 illustrated in the FIGURE includes a substrate 101, a positive electrode 102 provided on the substrate 101, a hole injection layer 103 provided on the positive electrode 102, a hole transport layer 104 provided on the hole injection layer 103, a light emitting layer 105 provided on the hole transport layer 104, an electron transport layer 106 provided on the light emitting layer 105, an electron injection layer 107 provided on the electron transport layer 106, and a negative electrode 108 provided on the electron injection layer 107.

Incidentally, the organic EL element 100 may be configured, by reversing the manufacturing order, to include, for example, the substrate 101, the negative electrode 108 provided on the substrate 101, the electron injection layer 107 provided on the negative electrode 108, the electron transport layer 106 provided on the electron injection layer 107, the light emitting layer 105 provided on the electron transport layer 106, the hole transport layer 104 provided on the light emitting layer 105, the hole injection layer 103 provided on the hole transport layer 104, and the positive electrode 102 provided on the hole injection layer 103.

Not all of the above layers are essential. The configuration includes the positive electrode 102, the light emitting layer 105, and the negative electrode 108 as a minimum constituent unit, while the hole injection layer 103, the hole transport layer 104, the electron transport layer 106, and the electron injection layer 107 are optionally provided. Each of the above layers may be formed of a single layer or a plurality of layers.

A form of layers constituting the organic EL element may be, in addition to the above structure form of "substrate/positive electrode/hole injection layer/hole transport layer/light emitting layer/electron transport layer/electron injection layer/negative electrode", a structure form of "substrate/positive electrode/hole transport layer/light emitting layer/electron transport layer/electron injection layer/negative electrode", "substrate/positive electrode/hole injection layer/light emitting layer/electron transport layer/electron injection layer/negative electrode", "substrate/positive electrode/hole injection layer/hole transport layer/light emitting layer/electron injection layer/negative electrode", "substrate/positive electrode/hole injection layer/hole transport layer/light emitting layer/electron transport layer/negative electrode", "substrate/positive electrode/light emitting layer/electron transport layer/electron injection layer/negative electrode", "substrate/positive electrode/hole transport layer/light emitting layer/electron injection layer/negative electrode", "substrate/positive electrode/hole transport layer/light emitting layer/electron transport layer/negative electrode", "substrate/positive electrode/hole injection layer/light emitting layer/electron injection layer/negative electrode", "substrate/positive electrode/hole injection layer/light emitting layer/electron transport layer/negative electrode", "substrate/positive electrode/light emitting layer/electron transport layer/negative electrode", or "substrate/positive electrode/light emitting layer/electron injection layer/negative electrode".

<Substrate in Organic EL Element>

The substrate 101 serves as a support of the organic EL element 100, and usually, quartz, glass, metals, plastics, and the like are used therefor. The substrate 101 is formed into a plate shape, a film shape, or a sheet shape according to a purpose, and for example, a glass plate, a metal plate, a metal foil, a plastic film, and a plastic sheet are used. Among these examples, a glass plate and a plate made of a transparent synthetic resin such as polyester, polymethacrylate, polycarbonate, or polysulfone are preferable. For a glass substrate, soda lime glass, alkali-free glass, and the like are used. The thickness is only required to be a thickness sufficient for maintaining mechanical strength. Therefore, the thickness is only required to be 0.2 mm or more, for example. The upper limit value of the thickness is, for example, 2 mm or less, and preferably 1 mm or less. Regarding a material of glass, glass having fewer ions eluted from the glass is desirable, and therefore alkali-free glass is preferable. However, soda lime glass which has been subjected to barrier coating with $SiO_2$ or the like is also commercially available, and therefore this soda lime glass can be used. Furthermore, the substrate 101 may be provided with a gas barrier film such as a dense silicon oxide film on at least one surface in order to increase a gas barrier property. Particularly in a case of using a plate, a film, or a sheet made of a synthetic resin having a low gas barrier property as the substrate 101, a gas barrier film is preferably provided.

<Positive Electrode in Organic EL Element>

The positive electrode 102 plays a role of injecting a hole into the light emitting layer 105. Incidentally, in a case where the hole injection layer 103 and/or the hole transport layer 104 are/is provided between the positive electrode 102 and the light emitting layer 105, a hole is injected into the light emitting layer 105 through these layers.

Examples of a material to form the positive electrode 102 include an inorganic compound and an organic compound. Examples of the inorganic compound include a metal (aluminum, gold, silver, nickel, palladium, chromium, and the like), a metal oxide (indium oxide, tin oxide, indium-tin oxide (ITO), indium-zinc oxide (IZO), and the like), a metal halide (copper iodide and the like), copper sulfide, carbon black, ITO glass, and Nesa glass. Examples of the organic compound include an electrically conductive polymer such as polythiophene such as poly(3-methylthiophene), polypyrrole, or polyaniline. In addition to these compounds, a material can be appropriately selected for use from materials used as a positive electrode of an organic EL element.

A resistance of a transparent electrode is not limited as long as a sufficient current can be supplied to light emission of a luminescent element. However, low resistance is desirable from a viewpoint of consumption power of the luminescent element. For example, an ITO substrate having a resistance of 300Ω/□ or less functions as an element electrode. However, a substrate having a resistance of about 10Ω/□ can be also supplied at present, and therefore it is particularly desirable to use a low resistance product having a resistance of, for example, 100 to 5Ω/□, preferably 50 to 5Ω/□. The thickness of an ITO can be arbitrarily selected according to a resistance value, but an ITO having a thickness of 50 to 300 nm is often used.

<Hole Injection Layer and Hole Transport Layer in Organic EL Element>

The hole injection layer 103 plays a role of efficiently injecting a hole that migrates from the positive electrode 102 into the light emitting layer 105 or the hole transport layer 104. The hole transport layer 104 plays a role of efficiently transporting a hole injected from the positive electrode 102 or a hole injected from the positive electrode 102 through the hole injection layer 103 to the light emitting layer 105. The hole injection layer 103 and the hole transport layer 104 are each formed by laminating and mixing one or more kinds of hole injection/transport materials, or by a mixture of a hole injection/transport material and a polymer binder. Furthermore, a layer may be formed by adding an inorganic salt such as iron(III) chloride to the hole injection/transport materials.

A hole injecting/transporting substance needs to efficiently inject/transport a hole from a positive electrode between electrodes to which an electric field is applied, and preferably has high hole injection efficiency and transports an injected hole efficiently. For this purpose, a substance which has low ionization potential, large hole mobility, and excellent stability, and in which impurities that serve as traps are not easily generated at the time of manufacturing and at the time of use, is preferable.

As a material to form the hole injection layer 103 and the hole transport layer 104, any material can be selected for use from among compounds that have been conventionally used as charge transporting materials for holes, p-type semiconductors, and known materials used in a hole injection layer and a hole transport layer of an organic EL element. Specific examples thereof include a heterocyclic compound including a carbazole derivative (N-phenylcarbazole, polyvinylcarbazole, and the like), a biscarbazole derivative such as bis(N-arylcarbazole) or bis(N-alkylcarbazole), a triarylamine derivative (a polymer having an aromatic tertiary amino in a main chain or a side chain, 1,1-bis(4-di-p-tolylaminophenyl)cyclohexane, N,N'-diphenyl-N,N'-di(3-methylphenyl)-4,4'-diaminobiphenyl, N,N'-diphenyl-N,N'-dinaphthyl-4,4'-diaminobiphenyl, N,N'-diphenyl-N,N'-di(3-methylphenyl)-4,4'-diphenyl-1,1'-diamine, N,N'- dinaphthyl-N,N'-diphenyl-4,4'-diphenyl-1,1'-diamine, $N^4,N^{4'}$-diphenyl-$N^4,N^{4'}$-bis(9-phenyl-9H-carbazol-3-yl)-[1,1'-biphenyl]-4,4'-diamine, $N^4,N^4,N^{4'},N^{4'}$-tetra[1,1'-biphenyl]-4-yl)-[1,1'-biphenyl]-4,4'-diamine, a triphenylamine derivative such as 4,4',4''-tris(3-methylphenyl(phenyl) amino)triphenylamine, a starburst amine derivative, and the like), a stilbene derivative, a phthalocyanine derivative (non-metal, copper phthalocyanine, and the like), a pyrazoline derivative, a hydrazone-based compound, a benzofuran derivative, a thiophene derivative, an oxadiazole derivative, a quinoxaline derivative (for example, 1,4,5,8,9,12-hexaazatriphenylene-2,3,6,7,10,11-hexacarbonitrile, and the like), and a porphyrin derivative, and a polysilane. Among the polymer-based materials, a polycarbonate, a styrene derivative, a polyvinylcarbazole, a polysilane, and the like having the above monomers in side chains are preferable. However, there is no particular limitation as long as a compound can form a thin film required for manufacturing a luminescent element, can inject a hole from a positive electrode, and can further transport a hole.

Furthermore, it is also known that electroconductivity of an organic semiconductor is strongly affected by doping into the organic semiconductor. Such an organic semiconductor matrix substance is formed of a compound having a good electron-donating property, or a compound having a good electron-accepting property. For doping with an electron-donating substance, a strong electron acceptor such as tetracyanoquinonedimethane (TCNQ) or 2,3,5,6-tetrafluorotetracyano-1,4-benzoquinonedimethane (F4TCNQ) is known (see, for example, "M. Pfeiffer, A. Beyer, T. Fritz, K. Leo, Appl. Phys. Lett., 73(22), 3202-3204 (1998)" and "J. Blochwitz, M. Pheiffer, T. Fritz, K. Leo, Appl. Phys. Lett., 73(6), 729-731 (1998)"). These compounds generate a so-called hole by an electron transfer process in an electron-donating type base substance (hole transporting substance). Electroconductivity of the base substance depends on the number and mobility of the holes fairly significantly. Known examples of a matrix substance having hole transporting characteristics include benzidine derivatives (TPD and the like), starburst amine derivatives (TDATA and the like), and particular metal phthalocyanines (particularly, zinc phthalocyanine (ZnPc) and the like) (JP 2005-167175 A).

<Light Emitting Layer in Organic EL Element>

The light emitting layer 105 emits light by recombining a hole injected from the positive electrode 102 and an electron injected from the negative electrode 108 between electrodes to which an electric field is applied. A material to form the light emitting layer 105 is only required to be a compound which is excited by recombination between a hole and an electron and emits light (luminescent compound), and is preferably a compound which can form a stable thin film shape, and exhibits strong light emission (fluorescence) efficiency in a solid state. The light emitting layer in the present invention includes the polycyclic aromatic compound represented by the above general formula (1) or a multimer thereof and the anthracene-based compound represented by the above general formula (3). In the light emitting layer, the concentration of the polycyclic aromatic compound or a multimer thereof changes from the positive electrode layer or a layer on the positive electrode side to the negative electrode layer or a layer on the negative electrode side, which sandwich the light emitting layer. Details of these have been described above, and general description of the light emitting layer will be given below.

The light emitting layer may be formed of a single layer or a plurality of layers, and each layer is formed of a material for a light emitting layer (a host material and a dopant material). The dopant material may be included in the host material wholly or partially. Regarding a doping method, doping can be performed by a co-deposition method with a host material, or alternatively, a dopant material may be mixed in advance with a host material, and then vapor deposition may be performed simultaneously.

The amount of use of the host material depends on the kind of the host material, and may be determined according to a characteristic of the host material. The reference of the amount of use of the host material is preferably from 50 to 99.999% by weight, more preferably from 80 to 99.95% by weight, and still more preferably from 90 to 99.9% by weight with respect to the total amount of a material for a light emitting layer.

The amount of use of the dopant material depends on the kind of the dopant material, and only needs to be determined according to a characteristic of the dopant material. The reference of the amount of use of the dopant is preferably from 0.001 to 50% by weight, more preferably from 0.05 to 20% by weight, still more preferably from 0.1 to 10% by weight, particularly preferably from 1 to 5% by weight, and most preferably from 1 to 3% by weight with respect to the total amount of a material for a light emitting layer. The amount of use within the above range is preferable, for example, from a viewpoint of being able to prevent a concentration quenching phenomenon.

<Electron Injection Layer and Electron Transport Layer in Organic EL Element>

The electron injection layer 107 plays a role of efficiently injecting an electron migrating from the negative electrode 108 into the light emitting layer 105 or the electron transport layer 106. The electron transport layer 106 plays a role of efficiently transporting an electron injected from the negative electrode 108, or an electron injected from the negative electrode 108 through the electron injection layer 107 to the light emitting layer 105. The electron transport layer 106 and the electron injection layer 107 are each formed by laminating and mixing one or more kinds of electron transport/injection materials, or by a mixture of an electron transport/injection material and a polymeric binder.

An electron injection/transport layer is a layer that manages injection of an electron from a negative electrode and transport of an electron, and is preferably a layer that has high electron injection efficiency and can efficiently transport an injected electron. For this purpose, a substance which has high electron affinity, large electron mobility, and excellent stability, and in which impurities that serve as traps are not easily generated at the time of manufacturing and at the time of use, is preferable. However, when a transport balance between a hole and an electron is considered, in a case where the electron injection/transport layer mainly plays a role of efficiently preventing a hole coming from a positive electrode from flowing toward a negative electrode side without being recombined, even if electron transporting ability is not so high, an effect of enhancing light emission efficiency is equal to that of a material having high electron transporting ability. Therefore, the electron injection/transport layer according to the present embodiment may also include a function of a layer that can efficiently prevent migration of a hole.

A material (electron transport material) for forming the electron transport layer 106 or the electron injection layer 107 can be arbitrarily selected for use from compounds conventionally used as electron transfer compounds in a photoconductive material, and known compounds that are used in an electron injection layer and an electron transport layer of an organic EL element.

The material used in the electron transport layer or the electron injection layer preferably contains at least one selected from a compound formed from an aromatic ring or a heteroaromatic ring constituted by one or more kinds of atoms selected from a carbon atom, a hydrogen atom, an oxygen atom, a sulfur atom, a silicon atom, and a phosphorus atom, a pyrrole derivative and a fused ring derivative thereof, and a metal complex containing electron-accepting nitrogen. Specific examples of the material include a fused ring-based aromatic ring derivative of naphthalene, anthracene, or the like, a styryl-based aromatic ring derivative represented by 4,4'-bis(diphenylethenyl)biphenyl, a perinone derivative, a coumarin derivative, a naphthalimide derivative, a quinone derivative such as anthraquinone or diphenoquinone, a phosphorus oxide derivative, a carbazole derivative, and an indole derivative. Examples of the metal complex having an electron-accepting nitrogen atom include a hydroxyazole complex such as a hydroxyphenyloxazole complex, an azomethine complex, a tropolone metal complex, a flavonol metal complex, and a benzoquinoline metal complex. These materials are used singly, but may also be used in a mixture with other materials.

Furthermore, specific examples of other electron transfer compounds include a pyridine derivative, a naphthalene derivative, an anthracene derivative, a phenanthroline derivative, a perinone derivative, a coumarin derivative, a naphthalimide derivative, an anthraquinone derivative, a diphenoquinone derivative, a diphenylquinone derivative, a perylene derivative, an oxadiazole derivative (1,3-bis[(4-t-butylphenyl)-1,3,4-oxadiazolyl]phenylene and the like), a thiophene derivative, a triazole derivative (N-naphthyl-2,5-diphenyl-1,3,4-triazole and the like), a thiadiazole derivative, a metal complex of an oxine derivative, a quinolinol-based metal complex, a quinoxaline derivative, a polymer of a quinoxaline derivative, a benzazole compound, a gallium complex, a pyrazole derivative, a perfluorinated phenylene derivative, a triazine derivative, a pyrazine derivative, a benzoquinoline derivative (2,2'-bis(benzo[h]quinolin-2-yl)-9,9'-spirobifluorene and the like), an imidazopyridine derivative, a borane derivative, a benzimidazole derivative (tris(N-phenylbenzimidazol-2-yl)benzene and the like), a benzoxazole derivative, a benzothiazole derivative, a quinoline derivative, an oligopyridine derivative such as terpyridine, a bipyridine derivative, a terpyridine derivative (1,3-bis(4'-(2,2': 6'2"-terpyridinyl))benzene and the like), a naphthyridine derivative (bis(1-naphthyl)-4-(1,8-naphthyridin-2-yl)phenylphosphine oxide and the like), an aldazine derivative, a carbazole derivative, an indole derivative, a phosphorus oxide derivative, and a bisstyryl derivative.

Furthermore, a metal complex having an electron-accepting nitrogen atom can also be used, and examples thereof include a quinolinol-based metal complex, a hydroxyazole complex such as a hydroxyphenyloxazole complex, an azomethine complex, a tropolone-metal complex, a flavonol-metal complex, and a benzoquinoline-metal complex.

The materials described above are used singly, but may also be used in a mixture with other materials.

Among the above materials, a borane derivative, a pyridine derivative, a fluoranthene derivative, a BO-based derivative, an anthracene derivative, a benzofluorene derivative, a phosphine oxide derivative, a pyrimidine derivative, a carbazole derivative, a triazine derivative, a benzimidazole derivative, a phenanthroline derivative, a quinolinol-based metal complex are preferable.

<Borane Derivative>

The borane derivative is, for example, a compound represented by the following general formula (ETM-1), and specifically disclosed in JP 2007-27587 A.

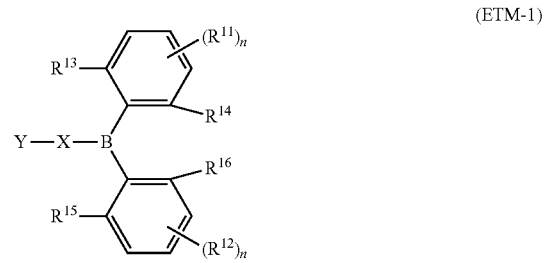

(ETM-1)

In the above formula (ETM-1), $R^{11}$ and $R^{12}$ each independently represent at least one of a hydrogen atom, an alkyl, a cycloalkyl, an optionally substituted aryl, a substituted silyl, an optionally substituted nitrogen-containing heterocyclic ring, and cyano, $R^{13}$ to $R^{16}$ each independently represent an optionally substituted alkyl, an optionally substituted cycloalkyl or an optionally substituted aryl, X represents an optionally substituted arylene, Y represents an optionally substituted aryl having 16 or fewer carbon atoms, a substituted boryl, or an optionally substituted carbazolyl, and n's each independently represent an integer of 0 to 3. Furthermore, examples of a substituent in a case of being "optionally substituted" or "substituted" include an aryl, a heteroaryl, an alkyl, and a cycloalkyl.

Among compounds represented by the above general formula (ETM-1), a compound represented by the following general formula (ETM-1-1) and a compound represented by the following general formula (ETM-1-2) are preferable.

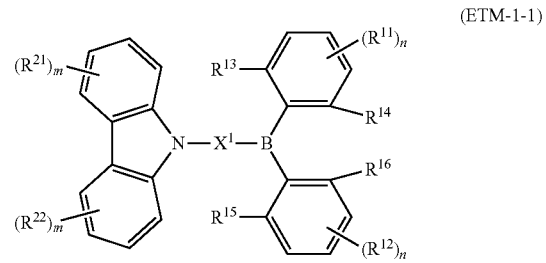

(ETM-1-1)

In formula (ETM-1-1), $R^{11}$ and $R^{12}$ each independently represent at least one of a hydrogen atom, an alkyl, a cycloalkyl, an optionally substituted aryl, a substituted silyl, an optionally substituted nitrogen-containing heterocyclic ring, and cyano, $R^{13}$ to $R^{16}$ each independently represent an optionally substituted alkyl, an optionally substituted cycloalkyl or an optionally substituted aryl, $R^{21}$ and $R^{22}$ each independently represent at least one of a hydrogen atom, an alkyl, a cycloalkyl, an optionally substituted aryl, a substituted silyl, an optionally substituted nitrogen-containing heterocyclic ring, and cyano, $X^1$ represents an optionally substituted arylene having 20 or fewer carbon atoms, n's each independently represent an integer of 0 to 3, and m's each independently represent an integer of 0 to 4. Furthermore, examples of a substituent in a case of being "optionally substituted" or "substituted" include an aryl, a heteroaryl, an alkyl, and a cycloalkyl.

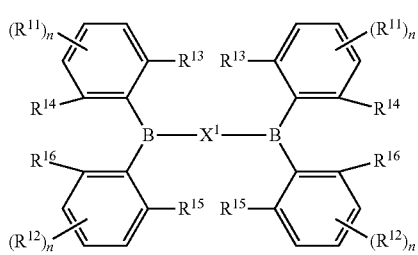
(ETM-1-2)

In formula (ETM-1-2), $R^{11}$ and $R^{12}$ each independently represent at least one of a hydrogen atom, an alkyl, a cycloalkyl, an optionally substituted aryl, a substituted silyl, an optionally substituted nitrogen-containing heterocyclic ring, and cyano, $R^{13}$ to $R^{16}$ each independently represent an optionally substituted alkyl, an optionally substituted cycloalkyl or an optionally substituted aryl, $X^1$ represents an optionally substituted arylene having 20 or fewer carbon atoms, and n's each independently represent an integer of 0 to 3. Furthermore, examples of a substituent in a case of being "optionally substituted" or "substituted" include an aryl, a heteroaryl, an alkyl, and a cycloalkyl.

Specific examples of $X^1$ include divalent groups represented by the following formulas (X-1) to (X-9).

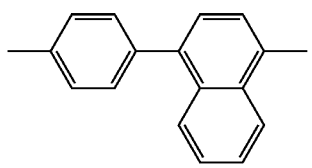
(X-1)

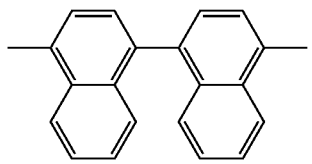
(X-2)

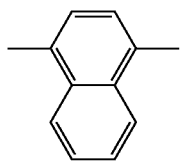
(X-3)

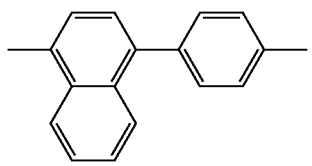
(X-4)

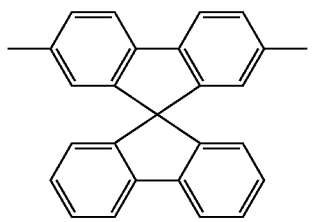
(X-5)

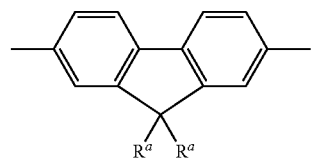
(X-6)

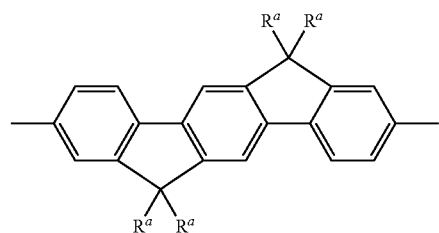
(X-7)

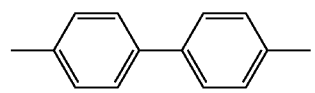
(X-8)

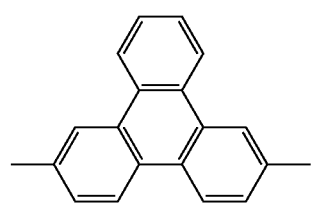
(X-9)

(In each formula, $R^a$'s each independently represent an alkyl group, a cycloalkyl group or an optionally substituted phenyl group.)

Specific examples of this borane derivative include the following compounds.

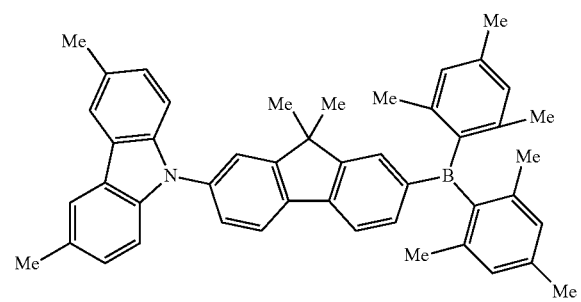 [SMILES: Cc1cc(C)c(B(c2ccc3c(c2)C(C)(C)c2cc(-n4c5ccc(C)cc5c5cc(C)ccc54)ccc2-3)c2c(C)cc(C)cc2C)c(C)c1]

This borane derivative can be manufactured using known raw materials and known synthesis methods.

<Pyridine Derivative>

A pyridine derivative is, for example, a compound represented by the following formula (ETM-2), and preferably a compound represented by formula (ETM-2-1) or (ETM-2-2).

φ ―― (Pyridine-based substituent)$_n$ (ETM-2)

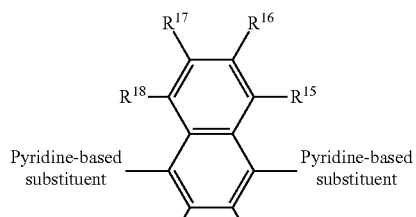 (ETM-2-1)

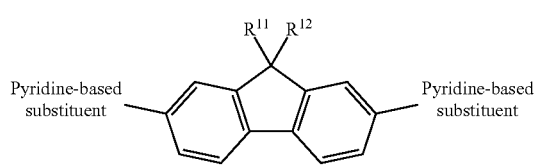 (ETM-2-2)

φ represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4.

In the above formula (ETM-2-1), $R^{11}$ to $R^{18}$ each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms).

In the above formula (ETM-2-2), $R^{11}$ and $R^{12}$ each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms), and $R^{11}$ and $R^{12}$ may be bonded to each other to form a ring.

In each formula, the "pyridine-based substituent" is any one of the following formulas (Py-1) to (Py-15), and the pyridine-based substituents may be each independently substituted by an alkyl having 1 to 4 carbon atoms or a cycloalkyl having 5 to 10 carbon atoms. The pyridine-based substituent may be bonded to φ, an anthracene ring, or a fluorene ring in each formula via a phenylene group or a naphthylene group.

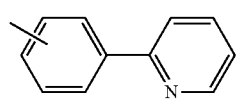 (Py-1)

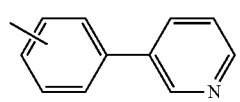 (Py-2)

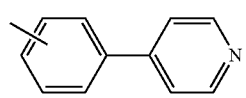 (Py-3)

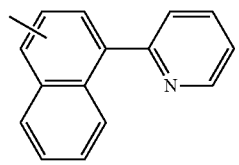 (Py-4)

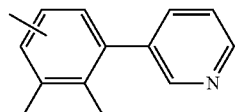 (Py-5)

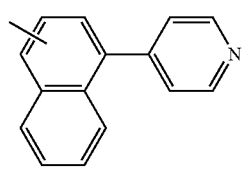 (Py-6)

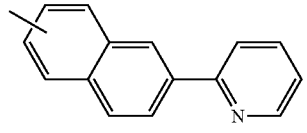 (Py-7)

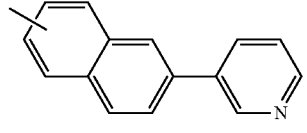 (Py-8)

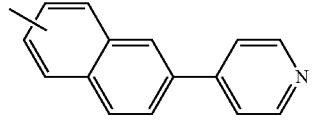 (Py-9)

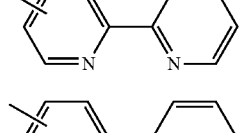 (Py-10)

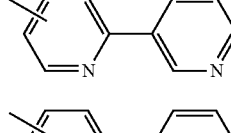 (Py-11)

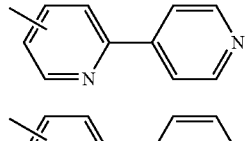 (Py-12)

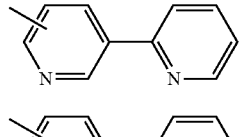 (Py-13)

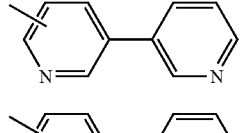 (Py-14)

(Py-15)

The pyridine-based substituent is any one of the above-formulas (Py-1) to (Py-15). However, among these formulas, the pyridine-based substituent is preferably any one of the following formulas (Py-21) to (Py-44).
(Py-21)
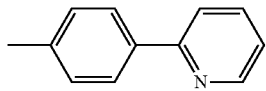
(Py-22)
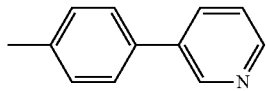
(Py-23)
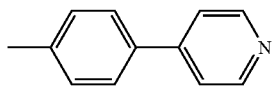
(Py-24)
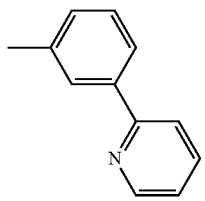
(Py-25)
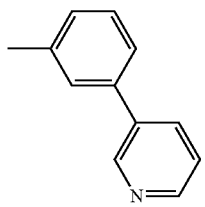
(Py-26)
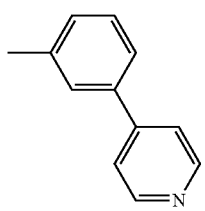
(Py-27)
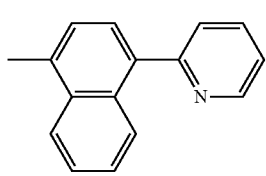
(Py-28)
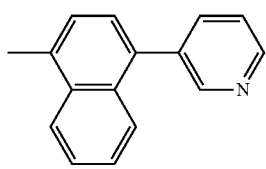
(Py-29)
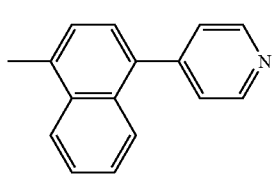
-continued
(Py-30)
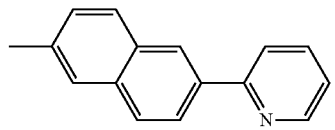
(Py-31)
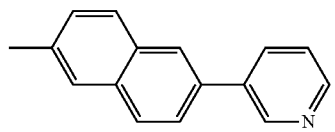
(Py-32)
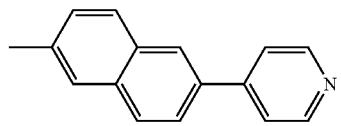
(Py-33)
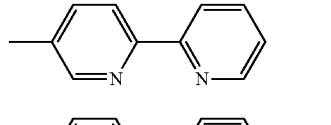
(Py-34)
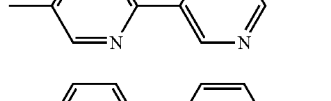
(Py-35)
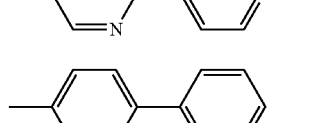
(Py-36)
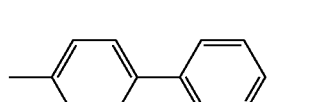
(Py-37)
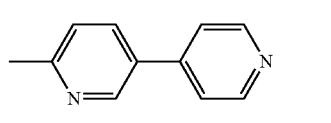
(Py-38)
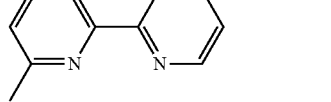
(Py-39)
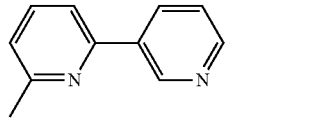
(Py-40)
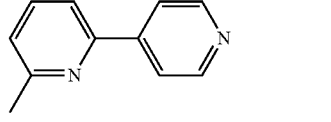
(Py-41)
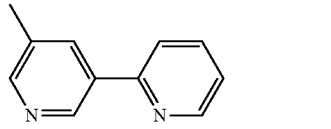
(Py-42)

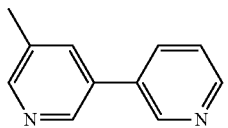
(Py-43)

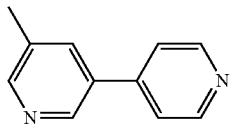
(Py-44)

At least one hydrogen atom in each pyridine derivative may be substituted by a deuterium atom. One of the two "pyridine-based substituents" in the above formulas (ETM-2-1) and (ETM-2-2) may be substituted by an aryl.

The "alkyl" in $R^{11}$ to $R^{18}$ may be either linear or branched, and examples thereof include a linear alkyl having 1 to 24 carbon atoms and a branched alkyl having 3 to 24 carbon atoms. A preferable "alkyl" is an alkyl having 1 to 18 carbon atoms (branched alkyl having 3 to 18 carbon atoms). A more preferable "alkyl" is an alkyl having 1 to 12 carbon atoms (branched alkyl having 3 to 12 carbon atoms). A still more preferable "alkyl" is an alkyl having 1 to 6 carbon atoms (branched alkyl having 3 to 6 carbon atoms). A particularly preferable "alkyl" is an alkyl having 1 to 4 carbon atoms (branched alkyl having 3 or 4 carbon atoms).

Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

As the alkyl having 1 to 4 carbon atoms by which the pyridine-based substituent is substituted, the above description of the alkyl can be cited.

Examples of the "cycloalkyl" in $R^{11}$ to $R^{18}$ include a cycloalkyl having 3 to 12 carbon atoms. A preferable "cycloalkyl" is a cycloalkyl having 3 to 10 carbons. A more preferable "cycloalkyl" is a cycloalkyl having 3 to 8 carbon atoms. A still more preferable "cycloalkyl" is a cycloalkyl having 3 to 6 carbon atoms.

Specific examples of the "cycloalkyl" include cyclopropyl, cyclobutyl, cyclopentyl, cyclohexyl, methylcyclopentyl, cycloheptyl, methylcyclohexyl, cyclooctyl, and dimethylcyclohexyl.

As the cycloalkyl having 5 to 10 carbon atoms by which the pyridine-based substituent is substituted, the above description of the cycloalkyl can be cited.

As the "aryl" in $R^{11}$ to $R^{18}$, a preferable aryl is an aryl having 6 to 30 carbon atoms, a more preferable aryl is an aryl having 6 to 18 carbon atoms, a still more preferable aryl is an aryl having 6 to 14 carbon atoms, and a particularly preferable aryl is an aryl having 6 to 12 carbon atoms.

Specific examples of the "aryl having 6 to 30 carbon atoms" include phenyl which is a monocyclic aryl; (1-, 2-)naphthyl which is a fused bicyclic aryl; acenaphthylene-(1-, 3-, 4-, 5-)yl, a fluorene-(1-, 2-, 3-, 4-, 9-)yl, phenalene-(1-, 2-)yl, and (1-, 2-, 3-, 4-, 9-)phenanthryl which are fused tricyclic aryls; triphenylene-(1-, 2-)yl, pyrene-(1-,2-, 4-)yl, and naphthacene-(1-, 2-, 5-)yl which are fused tetracyclic aryls; and perylene-(1-,2-,3-)yl and pentacene-(1-, 2-, 5-, 6-)yl which are fused pentacyclic aryls.

Preferable examples of the "aryl having 6 to 30 carbon atoms" include a phenyl, a naphthyl, a phenanthryl, a chrysenyl, and a triphenylenyl. More preferable examples thereof include a phenyl, a 1-naphthyl, a 2-naphthyl, and a phenanthryl. Particularly preferable examples thereof include a phenyl, a 1-naphthyl, and a 2-naphthyl.

$R^{11}$ and $R^{12}$ in the above formula (ETM-2-2) may be bonded to each other to form a ring. As a result, cyclobutane, cyclopentane, cyclopentene, cyclopentadiene, cyclohexane, fluorene, indene, or the like may be spiro-bonded to a 5-membered ring of a fluorene skeleton.

Specific examples of this pyridine derivative include the following compounds.

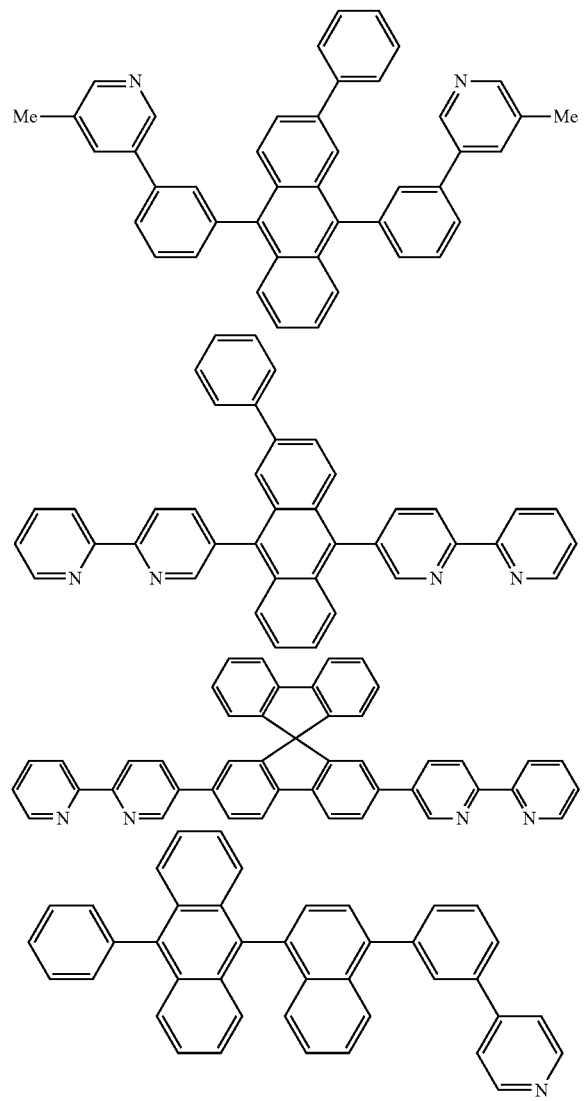

This pyridine derivative can be manufactured using known raw materials and known synthesis methods.

<Fluoranthene Derivative>

The fluoranthene derivative is, for example, a compound represented by the following general formula (ETM-3), and specifically disclosed in WO 2010/134352 A.

(ETM-3)

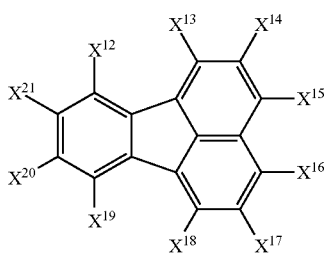

In the above formula (ETM-3), $X^{12}$ to $X^{21}$ each represent a hydrogen atom, a halogen atom, a linear, branched or cyclic alkyl, a linear, branched or cyclic alkoxy, a substituted or unsubstituted aryl, or a substituted or unsubstituted heteroaryl. Examples of a substituent in a case of being substituted include an aryl, a heteroaryl, an alkyl, and a cycloalkyl.

Specific examples of this fluoranthene derivative include the following compounds.

(ETM-3-1)

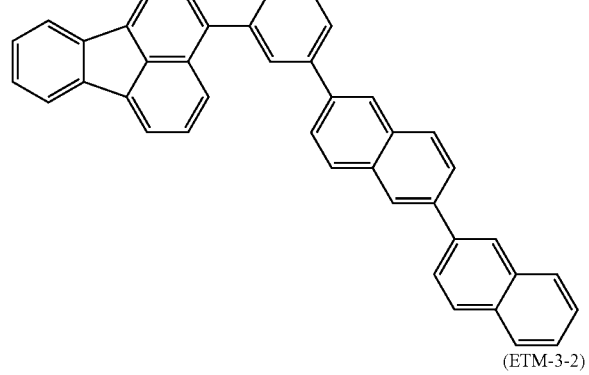

(ETM-3-2)

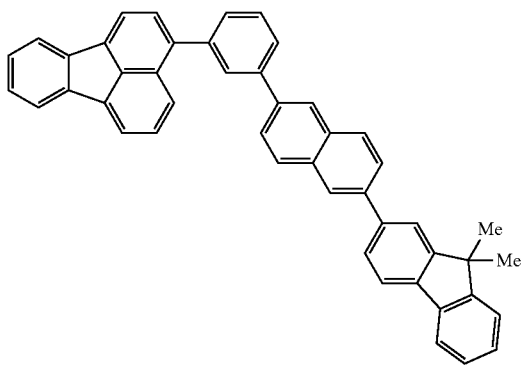

(ETM-3-3)

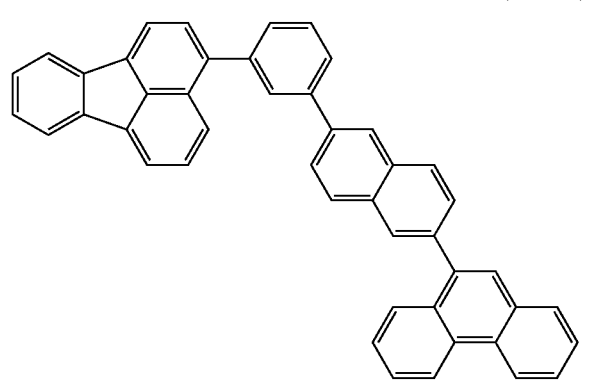

<BO-Based Derivative>

The BO-based derivative is, for example, a polycyclic aromatic compound represented by the following formula (ETM-4) or a multimer of the polycyclic aromatic compound having a plurality of structures each represented by the following formula (ETM-4).

(ETM-4)

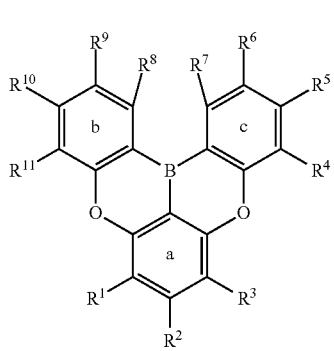

$R^1$ to $R^{11}$ each independently represent a hydrogen atom, an aryl, a heteroaryl, a diarylamino, a diheteroarylamino, an arylheteroarylamino, a diarylboryl (the two aryls may be bonded to each other via a single bond or a linking group), an alkyl, a cycloalkyl, an alkoxy, or an aryloxy, and at least one hydrogen atom in these may be substituted by an aryl, a heteroaryl, an alkyl, or a cycloalkyl, Adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, a diarylboryl (the two aryls may be bonded to each other via a single bond or a linking group), an alkyl, a cycloalkyl, an alkoxy, or an aryloxy, and at least one hydrogen atom in these may be substituted by an aryl, a heteroaryl, an alkyl, or a cycloalkyl.

At least one hydrogen atom in the compound or structure represented by formula (ETM-4) may be substituted by a halogen atom or a deuterium atom.

For description of a substituent in formula (ETM-4), a form of ring formation, and a multimer formed by combining a plurality of structures of formula (ETM-4), the description of the compound represented by the above general formula (1) or (2) and a multimer thereof can be cited.

Specific examples of this BO-based derivative include the following compounds.

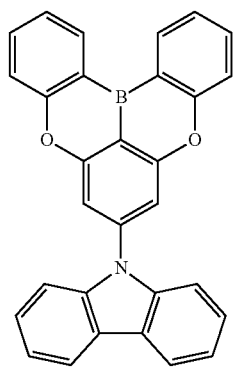 [SMILES: c1ccc2c(c1)Oc1cc(-n3c4ccccc4c4ccccc43)cc3c1B2c1ccccc1O3]

This BO-based derivative can be manufactured using known raw materials and known synthesis methods.

<Anthracene Derivative>

One of the anthracene derivatives is, for example, a compound represented by the following formula (ETM-5-1).

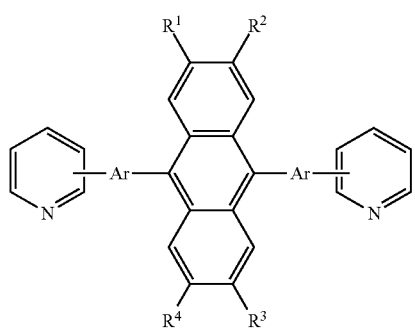

(ETM-5-1)

Ar's each independently represent a divalent benzene or naphthalene, $R^1$ to $R^4$ each independently represent a hydrogen atom, an alkyl having 1 to 6 carbon atoms, a cycloalkyl having 3 to 6 carbon atoms, or an aryl having 6 to 20 carbon atoms.

Ar's can be each independently selected from a divalent benzene and naphthalene appropriately. Two Ar's may be different from or the same as each other, but are preferably the same from a viewpoint of easiness of synthesis of an anthracene derivative. Ar is bonded to pyridine to form "a moiety formed of Ar and pyridine". For example, this moiety is bonded to anthracene as a group represented by any one of the following formulas (Py-1) to (Py-12).

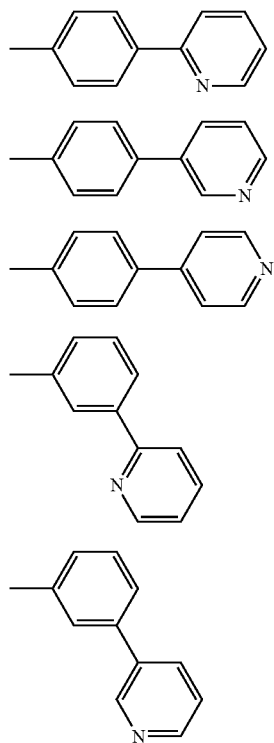

(Py-1)

(Py-2)

(Py-3)

(Py-4)

(Py-5)

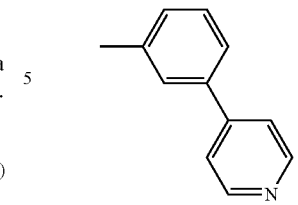

(Py-6)

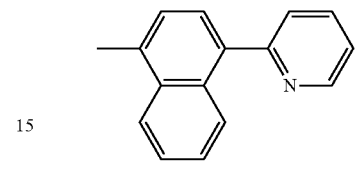

(Py-7)

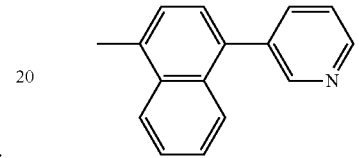

(Py-8)

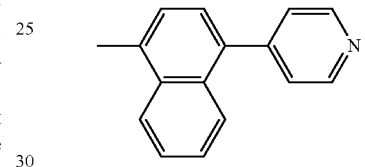

(Py-9)

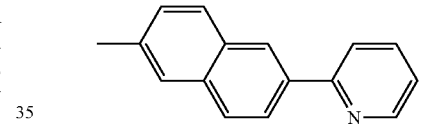

(Py-10)

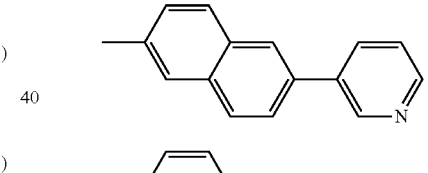

(Py-11)

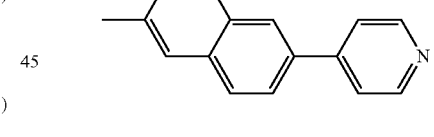

(Py-12)

Among these groups, a group represented by any one of the above formulas (Py-1) to (Py-9) is preferable, and a group represented by any one of the above formulas (Py-1) to (Py-6) is more preferable. Two "moieties formed of Ar and pyridine" bonded to anthracene may have the same structure as or different structures from each other, but preferably have the same structure from a viewpoint of easiness of synthesis of an anthracene derivative. However, two "moieties formed of Ar and pyridine" preferably have the same structure or different structures from a viewpoint of element characteristics.

The alkyl having 1 to 6 carbon atoms in $R^1$ to $R^4$ may be either linear or branched. That is, the alkyl having 1 to 6 carbon atoms is a linear alkyl having 1 to 6 carbon atoms or a branched alkyl having 3 to 6 carbon atoms. More preferably, the alkyl having 1 to 6 carbon atoms is an alkyl having 1 to 4 carbon atoms (branched alkyl having 3 or 4 carbon atoms). Specific examples thereof include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, and 2-ethylbutyl. Methyl, ethyl, n-propyl, isopropyl, n-butyl, isobutyl, s-butyl, and t-butyl are preferable. Methyl, ethyl, and a t-butyl are more preferable.

Specific examples of the cycloalkyl having 3 to 6 carbon atoms in $R^1$ to $R^4$ include a cyclopropyl, a cyclobutyl, a cyclopentyl, a cyclohexyl, a methylcyclopentyl, a cycloheptyl, a methylcyclohexyl, a cyclooctyl, and a dimethylcyclohexyl.

For the aryl having 6 to 20 carbon atoms in $R^1$ to $R^4$, an aryl having 6 to 16 carbon atoms is preferable, an aryl having 6 to 12 carbon atoms is more preferable, and an aryl having 6 to 10 carbon atoms is particularly preferable.

Specific examples of the "aryl having 6 to 20 carbon atoms" include phenyl, (o-, m-, p-) tolyl, (2,3-, 2,4-, 2,5-, 2,6-, 3,4-, 3,5-) xylyl, mesityl (2,4,6-trimethylphenyl), and (o-, m-, p-)cumenyl which are monocyclic aryls; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; anthracene-(1-, 2-, 9-)yl, acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; triphenylene-(1-, 2-)yl, pyrene-(1-, 2-, 4-)yl, and tetracene-(1-, 2-, 5-)yl which are fused tetracyclic aryls; and perylene-(1-, 2-, 3-)yl which is a fused pentacyclic aryl.

The "aryl having 6 to 20 carbon atoms" is preferably a phenyl, a biphenylyl, a terphenylyl, or a naphthyl, more preferably a phenyl, a biphenylyl, a 1-naphthyl, a 2-naphthyl, or an m-terphenyl-5'-yl, still more preferably a phenyl, a biphenylyl, a 1-naphthyl, or a 2-naphthyl, and most preferably a phenyl.

One of the anthracene derivatives is, for example, a compound represented by the following formula (ETM-5-2).

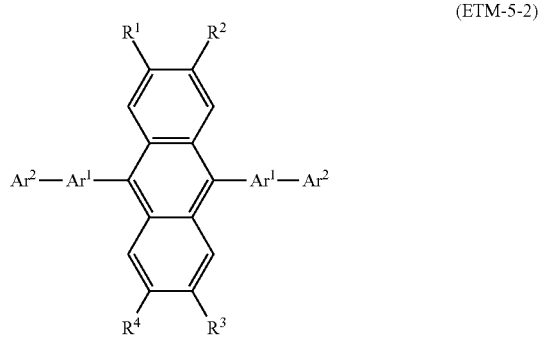

(ETM-5-2)

$Ar^1$'s each independently represent a single bond, a divalent benzene, naphthalene, anthracene, fluorene, or phenalene.

$Ar^2$'s each independently represent an aryl having 6 to 20 carbon atoms. The same description as the "aryl having 6 to 20 carbon atoms" in the above formula (ETM-5-1) can be cited. An aryl having 6 to 16 carbon atoms is preferable, an aryl having 6 to 12 carbon atoms is more preferable, and an aryl having 6 to 10 carbon atoms is particularly preferable. Specific examples thereof include a phenyl, a biphenylyl, a naphthyl, a terphenylyl, an anthracenyl, an acenaphthylenyl, a fluorenyl, a phenalenyl, a phenanthryl, a triphenylenyl, a pyrenyl, a tetracenyl, and a perylenyl.

$R^1$ to $R^4$ each independently represent a hydrogen atom, an alkyl having 1 to 6 carbon atoms, a cycloalkyl having 3 to 6 carbon atoms, or an aryl having 6 to 20 carbon atoms. The same description as in the above formula (ETM-5-1) can be cited.

Specific examples of these anthracene derivatives include the following compounds.

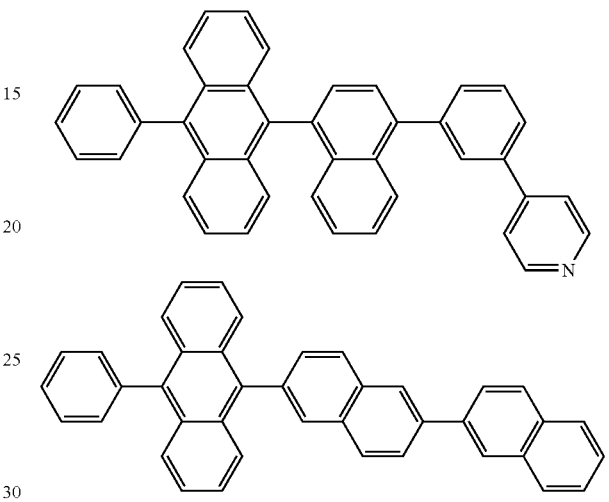

These anthracene derivatives can be manufactured using known raw materials and known synthesis methods.

<Benzofluorene Derivative>

The benzofluorene derivative is, for example, a compound represented by the following formula (ETM-6)

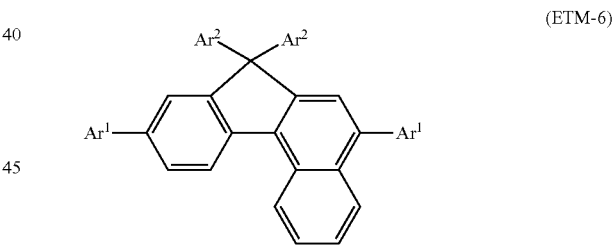

(ETM-6)

$Ar^1$'s each independently represent an aryl having 6 to 20 carbon atoms. The same description as the "aryl having 6 to 20 carbon atoms" in the above formula (ETM-5-1) can be cited. An aryl having 6 to 16 carbon atoms is preferable, an aryl having 6 to 12 carbon atoms is more preferable, and an aryl having 6 to 10 carbon atoms is particularly preferable. Specific examples thereof include a phenyl, a biphenylyl, a naphthyl, a terphenylyl, an anthracenyl, an acenaphthylenyl, a fluorenyl, a phenalenyl, a phenanthryl, a triphenylenyl, a pyrenyl, a tetracenyl, and a perylenyl.

$Ar^2$'s each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms), and two $Ar^2$'s may be bonded to each other to form a ring.

The "alkyl" in $Ar^2$ may be either linear or branched, and examples thereof include a linear alkyl having 1 to 24 carbon atoms and a branched alkyl having 3 to 24 carbon atoms. A preferable "alkyl" is an alkyl having 1 to 18 carbon atoms (branched alkyl having 3 to 18 carbon atoms). A more preferable "alkyl" is an alkyl having 1 to 12 carbon atoms (branched alkyl having 3 to 12 carbon atoms). A still more preferable "alkyl" is an alkyl having 1 to 6 carbon atoms (branched alkyl having 3 to 6 carbon atoms). A particularly preferable "alkyl" is an alkyl having 1 to 4 carbon atoms (branched alkyl having 3 or 4 carbon atoms). Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, and 1-methylhexyl.

Examples of the "cycloalkyl" in $Ar^2$ include a cycloalkyl having 3 to 12 carbon atoms. A preferable "cycloalkyl" is a cycloalkyl having 3 to 10 carbons. A more preferable "cycloalkyl" is a cycloalkyl having 3 to 8 carbon atoms. A still more preferable "cycloalkyl" is a cycloalkyl having 3 to 6 carbon atoms. Specific examples of the "cycloalkyl" include cyclopropyl, cyclobutyl, cyclopentyl, cyclohexyl, methylcyclopentyl, cycloheptyl, methylcyclohexyl, cyclooctyl, and dimethylcyclohexyl.

As the "aryl" in $Ar^2$, a preferable aryl is an aryl having 6 to 30 carbon atoms, a more preferable aryl is an aryl having 6 to 18 carbon atoms, a still more preferable aryl is an aryl having 6 to 14 carbon atoms, and a particularly preferable aryl is an aryl having 6 to 12 carbon atoms.

Specific examples of the "aryl having 6 to 30 carbon atoms" include phenyl, naphthyl, acenaphthylenyl, fluorenyl, phenalenyl, phenanthryl, triphenylenyl, pyrenyl, naphthacenyl, perylenyl, and pentacenyl.

Two $Ar^2$'s may be bonded to each other to form a ring. As a result, cyclobutane, cyclopentane, cyclopentene, cyclopentadiene, cyclohexane, fluorene, indene, or the like may be spiro-bonded to a 5-membered ring of a fluorene skeleton.

Specific examples of this benzofluorene derivative include the following compounds.

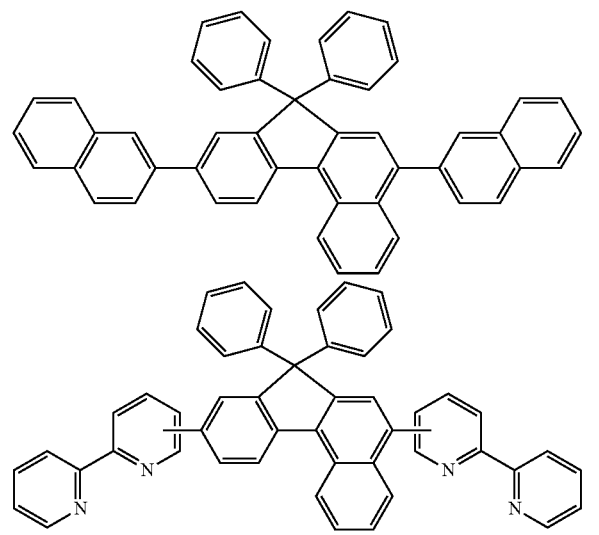

This benzofluorene derivative can be manufactured using known raw materials and known synthesis methods.

<Phosphine Oxide Derivative>

The phosphine oxide derivative is, for example, a compound represented by the following formula (ETM-7-1). Details are also described in WO 2013/079217 A.

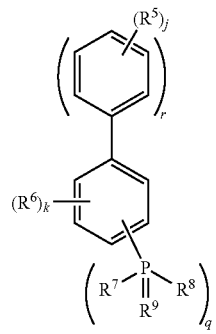

(ETM-7-1)

$R^5$ represents a substituted or unsubstituted alkyl having 1 to 20 carbon atoms, a substituted or unsubstituted cycloalkyl having 3 to 20 carbon atoms, a substituted or unsubstituted aryl having 6 to 20 carbon atoms, or a substituted or unsubstituted heteroaryl having 5 to 20 carbon atoms, $R^6$ represents CN, a substituted or unsubstituted alkyl having 1 to 20 carbon atoms, a substituted or unsubstituted cycloalkyl having 3 to 20 carbon atoms, a substituted or unsubstituted heteroalkyl having 1 to 20 carbon atoms, a substituted or unsubstituted aryl having 6 to 20 carbon atoms, a substituted or unsubstituted heteroaryl having 5 to 20 carbon atoms, a substituted or unsubstituted alkoxy having 1 to 20 carbon atoms, or a substituted or unsubstituted aryloxy having 6 to 20 carbon atoms, $R^7$ and $R^8$ each independently represent a substituted or unsubstituted aryl having 6 to 20 carbon atoms or a substituted or unsubstituted heteroaryl having 5 to 20 carbon atoms, $R^9$ represents an oxygen atom or a sulfur atom, j represents 0 or 1, k represents 0 or 1, r represents an integer of 0 to 4, and q represents an integer of 1 to 3.

Examples of a substituent in a case of being substituted include an aryl, a heteroaryl, an alkyl, and a cycloalkyl.

The phosphine oxide derivative may be, for example, a compound represented by the following formula (ETM-7-2).

$$\left(\begin{array}{c}\phantom{Ar^2-}R^3\\Ar^2-\phantom{R^3}\end{array}Ar^1\right)_n \overset{O}{\underset{\phantom{|}}{\overset{\|}{P}}}(R^1)_{3-n}$$

(ETM-7-2)

$R^1$ to $R^3$ may be the same as or different from each other and are selected from a hydrogen atom, an alkyl group, a cycloalkyl group, an aralkyl group, an alkenyl group, a cycloalkenyl group, an alkynyl group, an alkoxy group, an alkylthio group, a cycloalkylthio group, an aryl ether group, an aryl thioether group, an aryl group, a heterocyclic group, a halogen atom, cyano group, an aldehyde group, a carbonyl group, a carboxyl group, an amino group, a nitro group, a silyl group, and a fused ring formed with an adjacent substituent.

$Ar^1$'s may be the same as or different from each other, and represents an arylene group or a heteroarylene group. $Ar^2$'s may be the same as or different from each other, and represents an aryl group or a heteroaryl group. However, at least one of $Ar^1$ and $Ar^2$ has a substituent or forms a fused ring with an adjacent substituent. n represents an integer of 0 to 3. When n represents 0, no unsaturated structure portion is present. When n represents 3, $R^1$ is not present.

Among these substituents, the alkyl group represents a saturated aliphatic hydrocarbon group such as a methyl group, an ethyl group, a propyl group, or a butyl group. This saturated aliphatic hydrocarbon group may be unsubstituted or substituted. The substituent in a case of being substituted is not particularly limited, and examples thereof include an alkyl group, an aryl group, and a heterocyclic group, and this point is also common to the following description. The number of carbon atoms in the alkyl group is not particularly limited, but is usually in a range of 1 to 20 from a viewpoint of availability and cost.

The cycloalkyl group represents a saturated alicyclic hydrocarbon group such as a cyclopropyl, a cyclohexyl, a norbornyl, or an adamantyl. This saturated alicyclic hydrocarbon group may be unsubstituted or substituted. The carbon number of the alkyl group moiety is not particularly limited, but is usually in a range of 3 to 20.

Furthermore, the aralkyl group represents an aromatic hydrocarbon group via an aliphatic hydrocarbon, such as a benzyl group or a phenylethyl group. Both the aliphatic hydrocarbon and the aromatic hydrocarbon may be unsubstituted or substituted. The carbon number of the aliphatic moiety is not particularly limited, but is usually in a range of 1 to 20.

The alkenyl group represents an unsaturated aliphatic hydrocarbon group containing a double bond, such as a vinyl group, an allyl group, or a butadienyl group. This unsaturated aliphatic hydrocarbon group may be unsubstituted or substituted. The carbon number of the alkenyl group is not particularly limited, but is usually in a range of 2 to 20.

The cycloalkenyl group represents an unsaturated alicyclic hydrocarbon group containing a double bond, such as a cyclopentenyl group, a cyclopentadienyl group, or a cyclohexene group. This unsaturated alicyclic hydrocarbon group may be unsubstituted or substituted.

The alkynyl group represents an unsaturated aliphatic hydrocarbon group containing a triple bond, such as an acetylenyl group. This unsaturated aliphatic hydrocarbon group may be unsubstituted or substituted. The carbon number of the alkynyl group is not particularly limited, but is usually in a range of 2 to 20.

The alkoxy group represents an aliphatic hydrocarbon group via an ether bond, such as a methoxy group. The aliphatic hydrocarbon group may be unsubstituted or substituted. The carbon number of the alkoxy group is not particularly limited, but is usually in a range of 1 to 20.

Furthermore, the alkylthio group is a group in which an oxygen atom of an ether bond of an alkoxy group is substituted by a sulfur atom.

Furthermore, the cycloalkylthio group is a group in which an oxygen atom of an ether bond of a cycloalkoxy group is substituted by a sulfur atom.

The aryl ether group represents an aromatic hydrocarbon group via an ether bond, such as a phenoxy group. The aromatic hydrocarbon group may be unsubstituted or substituted. The carbon number of the aryl ether group is not particularly limited, but is usually in a range of 6 to 40.

Furthermore, the aryl thioether group is a group in which an oxygen atom of an ether bond of an aryl ether group is substituted by a sulfur atom.

Furthermore, the aryl group represents an aromatic hydrocarbon group such as a phenyl group, a naphthyl group, a biphenylyl group, a phenanthryl group, a terphenyl group, or a pyrenyl group. The aryl group may be unsubstituted or substituted. The carbon number of the aryl group is not particularly limited, but is usually in a range of 6 to 40.

Furthermore, the heterocyclic group represents a cyclic structural group having an atom other than a carbon atom, such as a furanyl group, a thiophenyl group, an oxazolyl group, a pyridyl group, a quinolinyl group, or a carbazolyl group. This cyclic structural group may be unsubstituted or substituted. The carbon number of the heterocyclic group is not particularly limited, but is usually in a range of 2 to 30.

The halogen refers to fluorine, chlorine, bromine, and iodine.

The aldehyde group, the carbonyl group, and the amino group can include a group substituted by an aliphatic hydrocarbon, an alicyclic hydrocarbon, an aromatic hydrocarbon, a heterocyclic ring, or the like.

Furthermore, the aliphatic hydrocarbon, the alicyclic hydrocarbon, the aromatic hydrocarbon, and the heterocyclic ring may be unsubstituted or substituted.

The silyl group represents, for example, a silicon compound group such as a trimethylsilyl group. This silicon compound group may be unsubstituted or substituted. The number of carbon atoms of the silyl group is not particularly limited, but is usually in a range of 3 to 20. The number of silicon atoms is usually 1 to 6.

The fused ring formed with an adjacent substituent is, for example, a conjugated or unconjugated fused ring formed between $Ar^1$ and $R^2$, $Ar^1$ and $R^3$, $Ar^2$ and $R^2$, $Ar^2$ and $R^3$, $R^2$ and $R^3$, or $Ar^1$ and $Ar^2$. Here, when n is 1, two $R^{11}$'s may form a conjugated or unconjugated fused ring. These fused rings may contain a nitrogen atom, an oxygen atom, or a sulfur atom in the ring structure, or may be fused with another ring.

Specific examples of this phosphine oxide derivative include the following compounds.

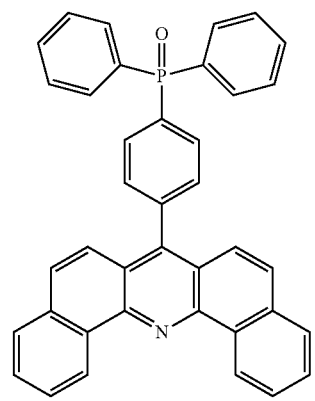

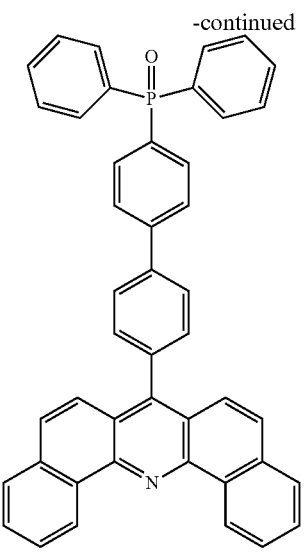

This phosphine oxide derivative can be manufactured using known raw materials and known synthesis methods.

<Pyrimidine Derivative>

The pyrimidine derivative is, for example, a compound represented by the following formula (ETM-8), and preferably a compound represented by the following formula (ETM-8-1). Details are also described in WO 2011/021689 A.

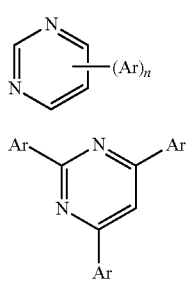

(ETM-8)

(ETM-8-1)

Ar's each independently represent an optionally substituted aryl or an optionally substituted heteroaryl. n represents an integer of 1 to 4, preferably an integer of 1 to 3, and more preferably 2 or 3.

Examples of the "aryl" as the "optionally substituted aryl" include an aryl having 6 to 30 carbon atoms. An aryl having 6 to 24 carbon atoms is preferable, an aryl having 6 to 20 carbon atoms is more preferable, and an aryl having 6 to 12 carbon atoms is still more preferable.

Specific examples of the "aryl" include phenyl which is a monocyclic aryl; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; quaterphenylyl-(5'-phenyl-m-terphenyl-2-yl, 5'-phenyl-m-terphenyl-3-yl, 5'-phenyl-m-terphenyl-4-yl, m-quaterphenylyl) which is a tetracyclic aryl; triphenylene-(1-, 2-)yl, pyrene-(1-, 2-, 4-)yl, and naphthacene-(1-, 2-, 5-)yl which are fused tetracyclic aryls; and perylene-(1-, 2-, 3-)yl and pentacene-(1-, 2-, 5-, 6-)yl which are fused pentacyclic aryls.

Examples of the "heteroaryl" as the "optionally substituted heteroaryl" include a heteroaryl having 2 to 30 carbon atoms. A heteroaryl having 2 to 25 carbon atoms is preferable, a heteroaryl having 2 to 20 carbon atoms is more preferable, a heteroaryl having 2 to 15 carbon atoms is still more preferable, and a heteroaryl having 2 to 10 carbon atoms is particularly preferable. In addition, examples of the "heteroaryl" include a heterocyclic ring containing 1 to 5 heteroatoms selected from an oxygen atom, a sulfur atom, and a nitrogen atom in addition to a carbon atom as a ring-constituting atom.

Specific examples of the "heteroaryl" include furyl, thienyl, pyrrolyl, oxazolyl, isoxazolyl, thiazolyl, isothiazolyl, imidazolyl, pyrazolyl, oxadiazolyl, furazanyl, thiadiazolyl, triazolyl, tetrazolyl, pyridyl, pyrimidinyl, pyridazinyl, pyrazinyl, triazinyl, benzofuranyl, isobenzofuranyl, benzo[b]thienyl, indolyl, isoindolyl, 1H-indazolyl, benzoimidazolyl, benzoxazolyl, benzothiazolyl, 1H-benzotriazolyl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl, and indolizinyl.

The above aryl and heteroaryl may be substituted, and may be each substituted by, for example, the above aryl or heteroaryl.

Specific examples of this pyrimidine derivative include the following compounds.

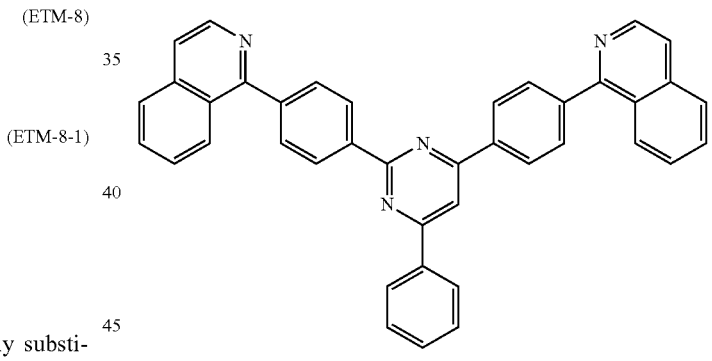

This pyrimidine derivative can be manufactured using known raw materials and known synthesis methods.

<Carbazole Derivative>

The carbazole derivative is, for example, a compound represented by the following formula (ETM-9), or a multimer obtained by bonding a plurality of the compounds with a single bond or the like. Details are described in US 2014/0197386 A.

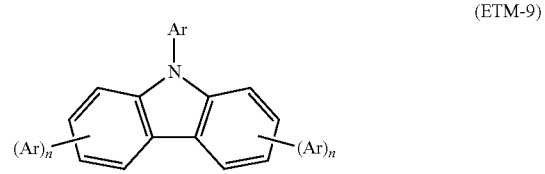

(ETM-9)

Ar's each independently represent an optionally substituted aryl or an optionally substituted heteroaryl. n independently represents an integer of 0 to 4, preferably an integer of 0 to 3, and more preferably 0 or 1.

Examples of the "aryl" as the "optionally substituted aryl" include an aryl having 6 to 30 carbon atoms. An aryl having 6 to 24 carbon atoms is preferable, an aryl having 6 to 20 carbon atoms is more preferable, and an aryl having 6 to 12 carbon atoms is still more preferable.

Specific examples of the "aryl" include phenyl which is a monocyclic aryl; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; quaterphenylyl-(5'-phenyl-m-terphenyl-2-yl, 5'-phenyl-m-terphenyl-3-yl, 5'-phenyl-m-terphenyl-4-yl, m-quaterphenylyl) which is a tetracyclic aryl; triphenylene-(1-, 2-)yl, pyrene-(1-, 2-, 4-)yl, and naphthacene-(1-, 2-, 5-)yl which are fused tetracyclic aryls; and perylene-(1-, 2-, 3-)yl and pentacene-(1-, 2-, 5-, 6-)yl which are fused pentacyclic aryls.

Examples of the "heteroaryl" as the "optionally substituted heteroaryl" include a heteroaryl having 2 to 30 carbon atoms. A heteroaryl having 2 to 25 carbon atoms is preferable, a heteroaryl having 2 to 20 carbon atoms is more preferable, a heteroaryl having 2 to 15 carbon atoms is still more preferable, and a heteroaryl having 2 to 10 carbon atoms is particularly preferable. In addition, examples of the "heteroaryl" include a heterocyclic ring containing 1 to 5 heteroatoms selected from an oxygen atom, a sulfur atom, and a nitrogen atom in addition to a carbon atom as a ring-constituting atom.

Specific examples of the "heteroaryl" include furyl, thienyl, pyrrolyl, oxazolyl, isoxazolyl, thiazolyl, isothiazolyl, imidazolyl, pyrazolyl, oxadiazolyl, furazanyl, thiadiazolyl, triazolyl, tetrazolyl, pyridyl, pyrimidinyl, pyridazinyl, pyrazinyl, triazinyl, benzofuranyl, isobenzofuranyl, benzo[b]thienyl, indolyl, isoindolyl, 1H-indazolyl, benzoimidazolyl, benzoxazolyl, benzothiazolyl, 1H-benzotriazolyl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl, and indolizinyl.

The above aryl and heteroaryl may be substituted, and may be each substituted by, for example, the above aryl or heteroaryl.

The carbazole derivative may be a multimer obtained by bonding a plurality of compounds represented by the above formula (ETM-9) with a single bond or the like. In this case, the compounds may be bonded with an aryl ring (preferably, a polyvalent benzene ring, naphthalene ring, anthracene ring, fluorene ring, benzofluorene ring, phenalene ring, phenanthrene ring or triphenylene ring) in addition to a single bond.

Specific examples of this carbazole derivative include the following compounds.

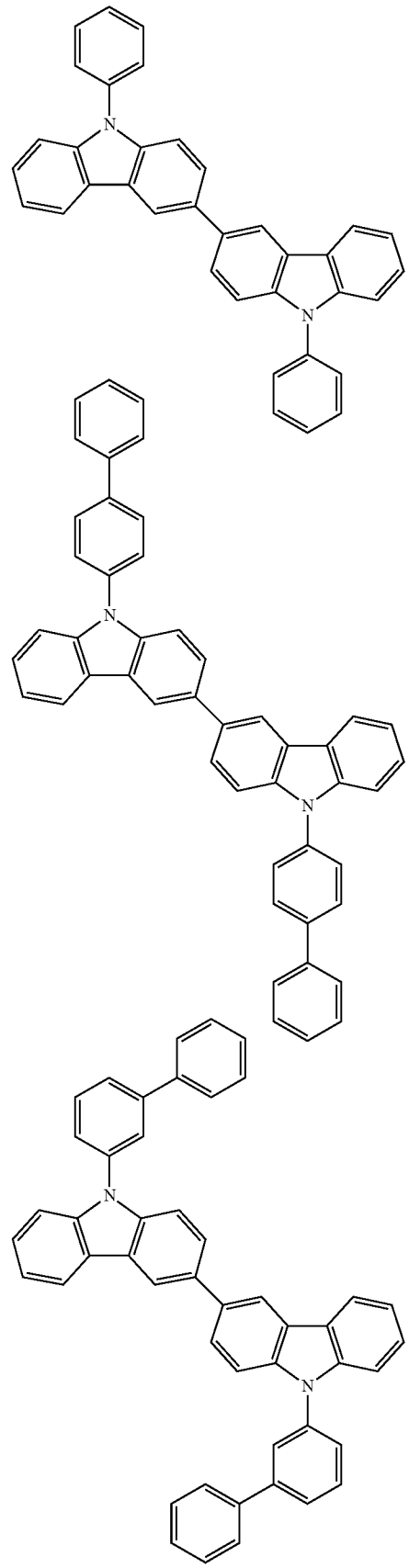

This carbazole derivative can be manufactured using known raw materials and known synthesis methods.

<Triazine Derivative>

The triazine derivative is, for example, a compound represented by the following formula (ETM-10), and preferably a compound represented by the following formula (ETM-10-1). Details are described in US 2011/0156013 A.

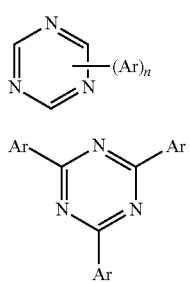

(ETM-10)

(ETM-10-1)

Ar's each independently represent an optionally substituted aryl or an optionally substituted heteroaryl. n represents an integer of 1 to 4, preferably an integer of 1 to 3, and more preferably 2 or 3.

Examples of the "aryl" as the "optionally substituted aryl" include an aryl having 6 to 30 carbon atoms. An aryl having 6 to 24 carbon atoms is preferable, an aryl having 6 to 20 carbon atoms is more preferable, and an aryl having 6 to 12 carbon atoms is still more preferable.

Specific examples of the "aryl" include phenyl which is a monocyclic aryl; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; quaterphenylyl-(5'-phenyl-m-terphenyl-2-yl, 5'-phenyl-m-terphenyl-3-yl, 5'-phenyl-m-terphenyl-4-yl, m-quaterphenylyl) which is a tetracyclic aryl; triphenylene-(1-, 2-)yl, pyrene-(1-, 2-, 4-)yl, and naphthacene-(1-, 2-, 5-)yl which are fused tetracyclic aryls; and perylene-(1-, 2-, 3-)yl and pentacene-(1-, 2-, 5-, 6-)yl which are fused pentacyclic aryls.

Examples of the "heteroaryl" as the "optionally substituted heteroaryl" include a heteroaryl having 2 to 30 carbon atoms. A heteroaryl having 2 to 25 carbon atoms is preferable, a heteroaryl having 2 to 20 carbon atoms is more preferable, a heteroaryl having 2 to 15 carbon atoms is still more preferable, and a heteroaryl having 2 to 10 carbon atoms is particularly preferable. In addition, examples of the "heteroaryl" include a heterocyclic ring containing 1 to 5 heteroatoms selected from an oxygen atom, a sulfur atom, and a nitrogen atom in addition to a carbon atom as a ring-constituting atom.

Specific examples of the "heteroaryl" include furyl, thienyl, pyrrolyl, oxazolyl, isoxazolyl, thiazolyl, isothiazolyl, imidazolyl, pyrazolyl, oxadiazolyl, furazanyl, thiadiazolyl, triazolyl, tetrazolyl, pyridyl, pyrimidinyl, pyridazinyl, pyrazinyl, triazinyl, benzofuranyl, isobenzofuranyl, benzo[b]thienyl, indolyl, isoindolyl, 1H-indazolyl, benzoimidazolyl, benzoxazolyl, benzothiazolyl, 1H-benzotriazolyl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl, and indolizinyl.

The above aryl and heteroaryl may be substituted, and may be each substituted by, for example, the above aryl or heteroaryl.

Specific examples of this triazine derivative include the following compounds.

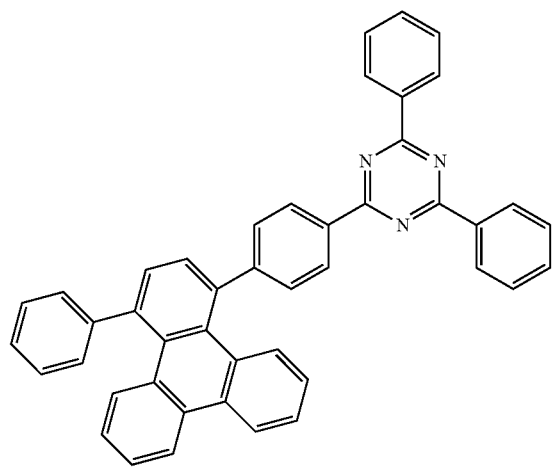

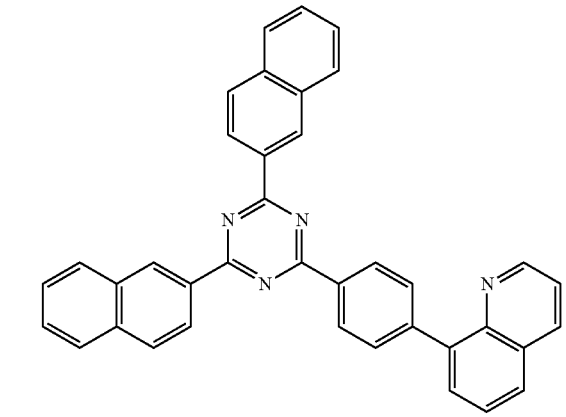

This triazine derivative can be manufactured using known raw materials and known synthesis methods.

<Benzimidazole Derivative>

The benzimidazole derivative is, for example, a compound represented by the following formula (ETM-11).

φ-(Benzimidazole-based substituent)$_n$     (ETM-11)

φ represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4. A "benzimidazole-based substituent" is a substituent in which the pyridyl group in the "pyridine-based substituent" in the formulas (ETM-2), (ETM-2-1), and (ETM-2-2) is substituted by a benzimidazole group, and at least one hydrogen atom in the benzimidazole derivative may be substituted by a deuterium atom.

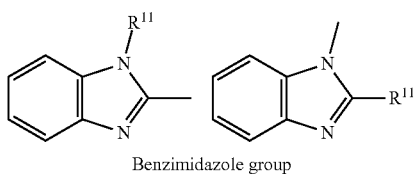

Benzimidazole group $R^{11}$ in the above benzimidazole represents a hydrogen atom, an alkyl having 1 to 24 carbon atoms, a cycloalkyl having 3 to 12 carbon atoms, or an aryl having 6 to 30 carbon atoms. The description of $R^{11}$ in the above formulas (ETM-2-1), and (ETM-2-2) can be cited.

Furthermore, p is preferably an anthracene ring or a fluorene ring. For the structure in this case, the structure of the above formula (ETM-2-1) or (ETM-2-2) can be cited. For $R^{11}$ to $R^{18}$ in each formula, the groups described in the above formula (ETM-2-1) or (ETM-2-2) can be cited. In the above formula (ETM-2-1) or (ETM-2-2), a form in which two pyridine-based substituents are bonded has been described. However, when these substituents are substituted by benzimidazole-based substituents, both the pyridine-based substituents may be substituted by benzimidazole-based substituents (that is, n=2), or one of the pyridine-based substituents may be substituted by a benzimidazole-based substituent and the other pyridine-based substituent may be substituted by any one of $R^{11}$ to $R^{18}$ (that is, n=1). Furthermore, for example, at least one of $R^{11}$ to $R^{18}$ in the above formula (ETM-2-1) may be substituted by a benzimidazole-based substituent and the "pyridine-based substituent" may be substituted by any one of $R^{11}$ to $R^{18}$.

Specific examples of this benzimidazole derivative include 1-phenyl-2-(4-(10-phenylanthracen-9-yl)phenyl)-1H-benzo[d]imidazole, 2-(4-(10-(naphthalen-2-yl)anthracen-9-yl)phenyl)-1-phenyl-1H-benzo[d]imidazole, 2-(3-(10-(naphthalen-2-yl)anthracen-9-yl)phenyl)-1-phenyl-1H-benzo[d]imidazole, 5-(10-(naphthlen-2-yl)anthracen-9-yl)-1,2-diphenyl-1H-benzo[d]imidazole, 1-(4-(10-(naphthalen-2-yl)anthracen-9-yl)phenyl)-2-phenyl-1H-benzo[d]imidazole, 2-(4-(9,10-di(naphthalen-2-yl)anthracen-2-yl)phenyl)-1-phenyl-1H-benzo[d]imidazole, 1-(4-(9,10-di(naphthalen-2-yl)anthracen-2-yl)phenyl)-2-phenyl-1H-benzo[d]imidazole, and 5-(9,10-di(naphthalen-2-yl)anthracen-2-yl)-1,2-diphenyl-1H-benzo[d]imidazole.

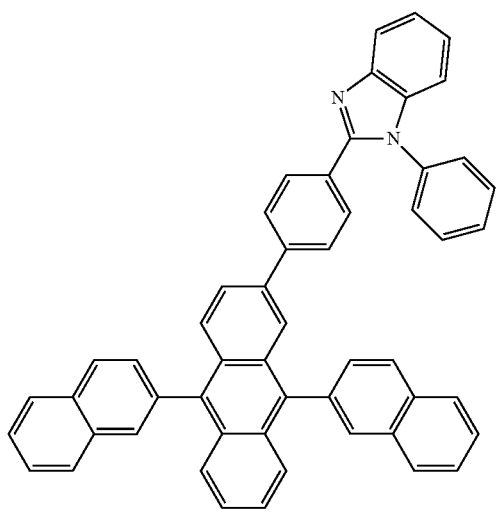

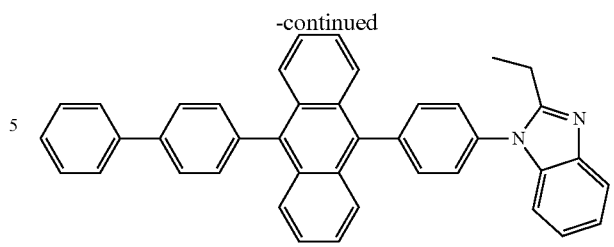

This benzimidazole derivative can be manufactured using known raw materials and known synthesis methods.

<Phenanthroline Derivative>

The phenanthroline derivative is, for example, a compound represented by the following formula (ETM-12) or (ETM-12-1). Details are described in WO 2006/021982 A.

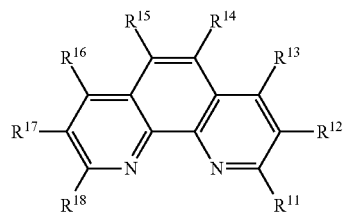

(ETM-12)

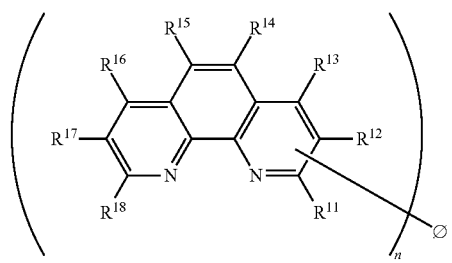

(ETM-12-1)

φ represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4.

In each formula, $R^{11}$ to $R^{18}$ each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms). In the above formula (ETM-12-1), any one of $R^{11}$ to $R^{18}$ is bonded to p which is an aryl ring.

At least one hydrogen atom in each phenanthroline derivative may be substituted by a deuterium atom.

For the alkyl, cycloalkyl, and aryl in $R^{11}$ to $R^{18}$, the description of $R^{11}$ to $R^{18}$ in the above formula (ETM-2) can be cited. Furthermore, in addition to the above structures, examples of p include those having the following structural formulas. Note that R's in the following structural formulas each independently represent a hydrogen atom, methyl, ethyl, isopropyl, cyclohexyl, phenyl, 1-naphthyl, 2-naphthyl, biphenylyl, or terphenylyl.

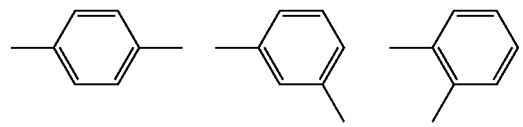

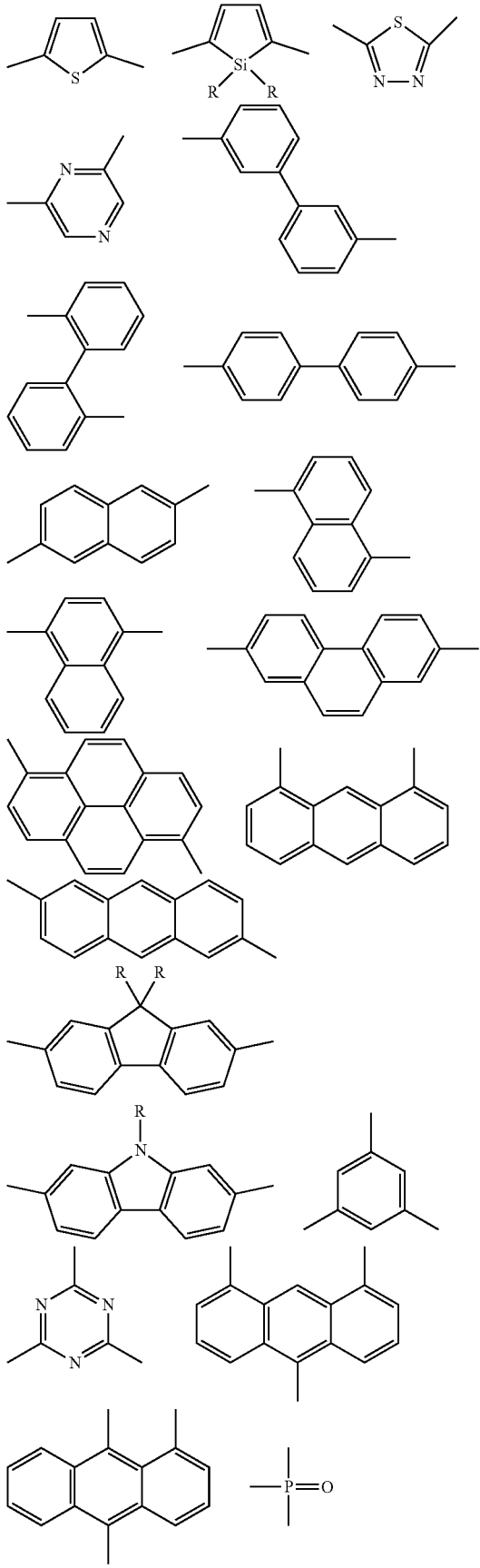
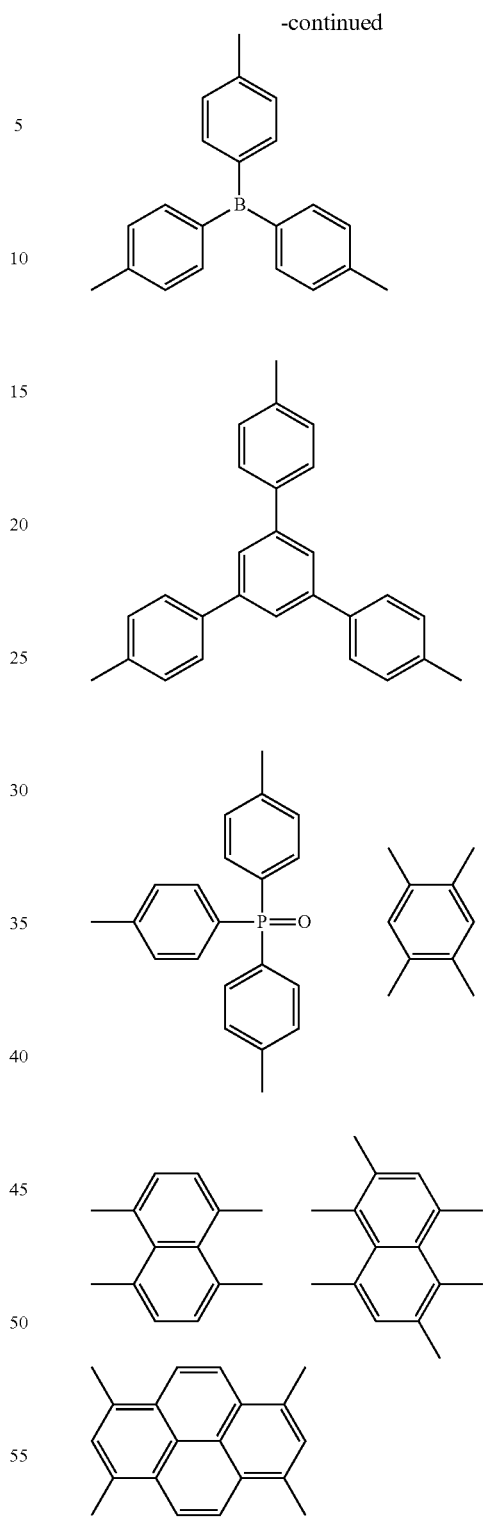

Specific examples of this phenanthroline derivative include 4,7-diphenyl-1,10-phenanthroline, 2,9-dimethyl-4,7-diphenyl-1,10-phenanthroline, 9,10-di(1,10-phenanthrolin-2-yl)anthracene, 2,6-di(1,10-phenanthrolin-5-yl)pyridine, 1,3,5-tri(1,10-phenanthrolin-5-yl)benzene, 9,9'-difluoro-bis(1,10-phenanthrolin-5-yl), bathocuproine, 1,3-bis(2-phenyl-1,10-phenanthrolin-9-yl) benzene, and a compound represented by the following structural formula.

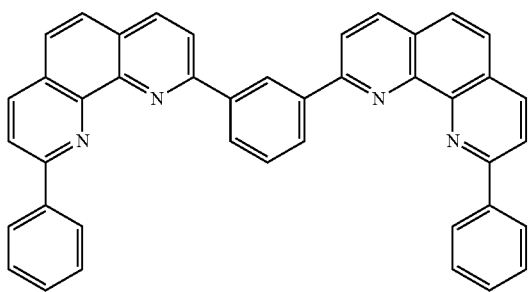 [SMILES: c1ccc(-c2ccc3ccc4ccc(-c5cccc(-c6ccc7ccc8ccc(-c9ccccc9)nc8c7n6)c5)nc4c3n2)cc1]

This phenanthroline derivative can be manufactured using known raw materials and known synthesis methods.

<Quinolinol-Based Metal Complex>

The quinolinol-based metal complex is, for example, a compound represented by the following general formula (ETM-13).

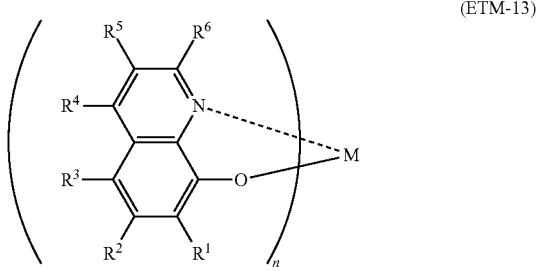

(ETM-13)

In the formula, $R^1$ to $R^6$ each independently represent a hydrogen atom, a fluorine atom, an alkyl, a cycloalkyl, an aralkyl, an alkenyl, cyano, an alkoxy, or an aryl, M represents Li, Al, Ga, Be, or Zn, and n represents an integer of 1 to 3.

Specific examples of the quinolinol-based metal complex include 8-quinolinol lithium, tris(8-quinolinolato) aluminum, tris(4-methyl-8-quinolinolato) aluminum, tris(5-methyl-8-quinolinolato) aluminum, tris(3,4-dimethyl-8-quinolinolato) aluminum, tris(4,5-dimethyl-8-quinolinolato) aluminum, tris(4,6-dimethyl-8-quinolinolato) aluminum, bis(2-methyl-8-quinolinolato) (phenolato) aluminum, bis(2-methyl-8-quinolinolato) (2-methylphenolato) aluminum, bis(2-methyl-8-quinolinolato) (3-methylphenolato) aluminum, bis(2-methyl-8-quinolinolato) (4-methylphenolato) aluminum, bis(2-methyl-8-quinolinolato) (2-phenylphenolato) aluminum, bis(2-methyl-8-quinolinolato) (3-phenylphenolato) aluminum, bis(2-methyl-8-quinolinolato) (4-phenylphenolato) aluminum, bis(2-methyl-8-quinolinolato) (2,3-dimethylphenolato) aluminum, bis(2-methyl-8-quinolinolato) (2,6-dimethylphenolato) aluminum, bis(2-methyl-8-quinolinolato) (3,4-dimethylphenolato) aluminum, bis(2-methyl-8-quinolinolato) (3,5-dimethylphenolato) aluminum, bis(2-methyl-8-quinolinolato) (3,5-di-t-butylphenolato) aluminum, bis(2-methyl-8-quinolinolato) (2,6-diphenylphenolato) aluminum, bis(2-methyl-8-quinolinolato) (2,4,6-triphenylphenolato) aluminum, bis(2-methyl-8-quinolinolato) (2,4,6-trimethylphenolato) aluminum, bis(2-methyl-8-quinolinolato) (2,4,5,6-tetramethylphenolato) aluminum, bis(2-methyl-8-quinolinolato) (1-naphtholato) aluminum, bis(2-methyl-8-quinolinolato) (2-naphtholato) aluminum, bis(2,4-dimethyl-8-quinolinolato) (2-phenylphenolato) aluminum, bis(2,4-dimethyl-8-quinolinolato) (3-phenylphenolato) aluminum, bis(2,4-dimethyl-8-quinolinolato) (4-phenylphenolato) aluminum, bis(2,4-dimethyl-8-quinolinolato) (3,5-dimethylphenolato) aluminum, bis(2,4-dimethyl-8-quinolinolato) (3,5-di-t-butylphenolato) aluminum, bis(2-methyl-8-quinolinolato) aluminum-p-oxo-bis(2-methyl-8-quinolinolato) aluminum, bis(2,4-dimethyl-8-quinolinolato) aluminum-p-oxo-bis(2,4-dimethyl-8-quinolinolato) aluminum, bis(2-methyl-4-ethyl-8-quinolinolato) aluminum-p-oxo-bis(2-methyl-4-ethyl-8-quinolinolato) aluminum, bis(2-methyl-4-methoxy-8-quinolinolato) aluminum-p-oxo-bis(2-methyl-4-methoxy-8-quinolinolato) aluminum, bis(2-methyl-5-cyano-8-quinolinolato) aluminum-p-oxo-bis(2-methyl-5-cyano-8-quinolinolato) aluminum, bis(2-methyl-5-trifluoromethyl-8-quinolinolato) aluminum-p-oxo-bis(2-methyl-5-trifluoromethyl-8-quinolinolato) aluminum, and bis(10-hydroxybenzo[h]quinoline) beryllium.

This quinolinol-based metal complex can be manufactured using known raw materials and known synthesis methods.

<Thiazole Derivative and Benzothiazole Derivative>

The thiazole derivative is, for example, a compound represented by the following formula (ETM-14-1).

φ-(Thiazole-based substituent)$_n$ (ETM-14-1)

The benzothiazole derivative is, for example, a compound represented by the following formula (ETM-14-2).

φ-(Benzothiazole-based substituent)$_n$ (ETM-14-2)

φ in each formula represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4. A "thiazole-based substituent" or a "benzothiazole-based substituent" is a substituent in which the pyridyl group in the "pyridine-based substituent" in the formulas (ETM-2), (ETM-2-1), and (ETM-2-2) is substituted by the following thiazole group or benzothiazole group, and at least one hydrogen atom in the thiazole derivative and the benzothiazole derivative may be substituted by a deuterium atom.

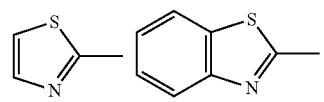

Thiazole group   Benzothiazole group

Furthermore, 9 is preferably an anthracene ring or a fluorene ring. For the structure in this case, the structure of the above formula (ETM-2-1) or (ETM-2-2) can be cited. For $R^{11}$ to $R^{18}$ in each formula, the groups described in the above formula (ETM-2-1) or (ETM-2-2) can be cited. In the above formula (ETM-2-1) or (ETM-2-2), a form in which two pyridine-based substituents are bonded has been described. However, when these substituents are substituted by thiazole-based substituents (or benzothiazole-based substituents), both the pyridine-based substituents may be substituted by thiazole-based substituents (or benzothiazole-based substituents) (that is, n=2), or one of the pyridine-based substituents may be substituted by a thiazole-based substituent (or benzothiazole-based substituent) and the other pyridine-based substituent may be substituted by any one of $R^{11}$ to $R^{18}$ (that is, n=1). Furthermore, for example, at least one of $R^{11}$ to $R^{18}$ in the above formula (ETM-2-1) may be substituted by a thiazole-based substituent (or benzothiazole-based substituent) and the "pyridine-based substituent" may be substituted by any one of $R^{11}$ to $R^{18}$.

These thiazole derivatives or benzothiazole derivatives can be manufactured using known raw materials and known synthesis methods.

An electron transport layer or an electron injection layer may further contain a substance that can reduce a material to form an electron transport layer or an electron injection layer. As this reducing substance, various substances are used as long as having reducibility to a certain extent. For example, at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal, can be suitably used.

Preferable examples of the reducing substance include an alkali metal such as Na (work function 2.36 eV), K (work function 2.28 eV), Rb (work function 2.16 eV), or Cs (work function 1.95 eV); and an alkaline earth metal such as Ca (work function 2.9 eV), Sr (work function 2.0 to 2.5 eV), or Ba (work function 2.52 eV). A substance having a work function of 2.9 eV or less is particularly preferable. Among these substances, an alkali metal such as K, Rb, or Cs is a more preferable reducing substance, Rb or Cs is a still more preferable reducing substance, and Cs is the most preferable reducing substance. These alkali metals have particularly high reducing ability, and can enhance emission luminance of an organic EL element or can lengthen a lifetime thereof by adding the alkali metals in a relatively small amount to a material to form an electron transport layer or an electron injection layer. Furthermore, as the reducing substance having a work function of 2.9 eV or less, a combination of two or more kinds of these alkali metals is also preferable, and particularly, a combination including Cs, for example, a combination of Cs with Na, a combination of Cs with K, a combination of Cs with Rb, or a combination of Cs with Na and K, is preferable. By inclusion of Cs, reducing ability can be efficiently exhibited, and emission luminance of an organic EL element is enhanced or a lifetime thereof is lengthened by adding Cs to a material to form an electron transport layer or an electron injection layer.

<Negative Electrode in Organic EL Element>

The negative electrode 108 plays a role of injecting an electron to the light emitting layer 105 through the electron injection layer 107 and the electron transport layer 106.

A material to form the negative electrode 108 is not particularly limited as long as being a substance capable of efficiently injecting an electron to an organic layer. However, a material similar to a material to form the positive electrode 102 can be used. Among these materials, a metal such as tin, indium, calcium, aluminum, silver, copper, nickel, chromium, gold, platinum, iron, zinc, lithium, sodium, potassium, cesium, or magnesium, and an alloy thereof (a magnesium-silver alloy, a magnesium-indium alloy, an aluminum-lithium alloy such as lithium fluoride/aluminum, or the like) are preferable. In order to enhance element characteristics by increasing electron injection efficiency, lithium, sodium, potassium, cesium, calcium, magnesium, or an alloy containing these low work function-metals is effective. However, many of these low work function-metals are generally unstable in air. In order to ameliorate this problem, for example, a method for using an electrode having high stability obtained by doping an organic layer with a trace amount of lithium, cesium, or magnesium is known. Other examples of a dopant that can be used include an inorganic salt such as lithium fluoride, cesium fluoride, lithium oxide, or cesium oxide. However, the dopant is not limited thereto.

Furthermore, in order to protect an electrode, a metal such as platinum, gold, silver, copper, iron, tin, aluminum, or indium, an alloy using these metals, an inorganic substance such as silica, titania, or silicon nitride, polyvinyl alcohol, vinyl chloride, a hydrocarbon-based polymer compound, or the like may be laminated as a preferable example. These method for manufacturing an electrode are not particularly limited as long as being capable of conduction, such as resistance heating, electron beam, sputtering, ion plating, or coating.

<Binder that May be Used in Each Layer>

The materials used in the above-described hole injection layer, hole transport layer, light emitting layer, electron transport layer, and electron injection layer can form each layer by being used singly. However, it is also possible to use the materials by dispersing the materials in a solvent-soluble resin such as polyvinyl chloride, polycarbonate, polystyrene, poly(N-vinylcarbazole), polymethyl methacrylate, polybutyl methacrylate, polyester, polysulfone, polyphenylene oxide, polybutadiene, a hydrocarbon resin, a ketone resin, a phenoxy resin, polyamide, ethyl cellulose, a vinyl acetate resin, an ABS resin, or a polyurethane resin; or a curable resin such as a phenolic resin, a xylene resin, a petroleum resin, a urea resin, a melamine resin, an unsaturated polyester resin, an alkyd resin, an epoxy resin, or a silicone resin.

<Method for Manufacturing Organic EL Element>

Each layer constituting an organic EL element can be formed by forming thin films of the materials to constitute each layer by methods such as a vapor deposition method, resistance heating deposition, electron beam deposition, sputtering, a molecular lamination method, a printing method, a spin coating method, a casting method, and a coating method. The film thickness of each layer thus formed is not particularly limited, and can be appropriately set according to a property of a material, but is usually within a range of 2 nm to 5000 nm. The film thickness can be usually measured using a crystal oscillation type film thickness analyzer or the like. In a case of forming a thin film using a vapor deposition method, deposition conditions depend on the kind of a material, an intended crystal structure and association structure of the film, and the like. It is preferable to appropriately set the vapor deposition conditions generally in ranges of a boat heating temperature of +50 to +400° C., a degree of vacuum of $10^{-6}$ to $10^{-3}$ Pa, a rate of vapor deposition of 0.01 to 50 nm/sec, a substrate temperature of −150 to +300° C., and a film thickness of 2 nm to 5 μm.

Next, as an example of a method for manufacturing an organic EL element, a method for manufacturing an organic EL element formed of positive electrode/hole injection layer/hole transport layer/light emitting layer including a host material and a dopant material/electron transport layer/electron injection layer/negative electrode will be described. A thin film of a positive electrode material is formed on an appropriate substrate by a vapor deposition method or the like to manufacture a positive electrode, and then thin films of a hole injection layer and a hole transport layer are formed on this positive electrode. A thin film is formed thereon by co-depositing a host material and a dopant material to obtain a light emitting layer. An electron transport layer and an electron injection layer are formed on this light emitting layer, and a thin film formed of a substance for a negative electrode is formed by a vapor deposition method or the like to obtain a negative electrode. An intended organic EL element is thereby obtained. Incidentally, in manufacturing the above organic EL element, it is also possible to manufacture the organic EL element by reversing the manufacturing order, that is, in order of a negative electrode, an electron injection layer, an electron transport layer, a light emitting layer, a hole transport layer, a hole injection layer, and a positive electrode.

In a case where a direct current voltage is applied to the organic EL element thus obtained, it is only required to apply the voltage by assuming a positive electrode as a positive polarity and assuming a negative electrode as a negative polarity. By applying a voltage of about 2 to 40 V, light emission can be observed from a transparent or semi-transparent electrode side (the positive electrode or the negative electrode, or both the electrodes). This organic EL element also emits light even in a case where a pulse current or an alternating current is applied. Note that a waveform of an alternating current applied may be any waveform.

<Application Example of Organic EL Element>

The present invention can also be applied to a display apparatus including an organic EL element, a lighting apparatus including an organic EL element, or the like.

The display apparatus or lighting apparatus including an organic EL element can be manufactured by a known method such as connecting the organic EL element according to the present embodiment to a known driving apparatus, and can be driven by appropriately using a known driving method such as direct driving, pulse driving, or alternating driving.

Examples of the display apparatus include a panel display such as a color flat panel display and a flexible display such as a flexible color organic EL display (see, for example, JP H10-335066 A, JP 2003-321546 A, JP 2004-281086 A, and the like). Examples of a display method of the display include a matrix method and/or a segment method. Note that the matrix display and the segment display may co-exist in the same panel.

In the matrix, pixels for display are arranged two-dimensionally as in a lattice form or a mosaic form, and characters or images are displayed by an assembly of pixels. The shape or size of a pixel depends on intended use. For example, for display of images and characters of a personal computer, a monitor, or a television, square pixels each having a size of 300 μm or less on each side are usually used, and in a case of a large-sized display such as a display panel, pixels having a size in the order of millimeters on each side are used. In a case of monochromic display, it is only required to arrange pixels of the same color. However, in a case of color display, display is performed by arranging pixels of red, green and blue. In this case, typically, delta type display and stripe type display are available. For this matrix driving method, either a line sequential driving method or an active matrix method may be employed. The line sequential driving method has an advantage of having a simpler structure. However, in consideration of operation characteristics, the active matrix method may be superior. Therefore, it is necessary to use the line sequential driving method or the active matrix method properly according to intended use.

In the segment method (type), a pattern is formed so as to display predetermined information, and a determined region emits light. Examples of the segment method include display of time or temperature in a digital clock or a digital thermometer, display of a state of operation in an audio instrument or an electromagnetic cooker, and panel display in an automobile.

Examples of the lighting apparatus include a lighting apparatuses for indoor lighting or the like, and a backlight of a liquid crystal display apparatus (see, for example, JP 2003-257621 A, JP 2003-277741 A, and JP 2004-119211 A). The backlight is mainly used for enhancing visibility of a display apparatus that is not self-luminous, and is used in a liquid crystal display apparatus, a timepiece, an audio apparatus, an automotive panel, a display plate, a sign, and the like. Particularly, in a backlight for use in a liquid crystal display apparatus, among the liquid crystal display apparatuses, for use in a personal computer in which thickness reduction has been a problem to be solved, in consideration of difficulty in thickness reduction because a conventional type backlight is formed from a fluorescent lamp or a light guide plate, a backlight using the luminescent element according to the present embodiment is characterized by its thinness and lightweightness.

EXAMPLES

Hereinafter, the present invention will be described more specifically by way of Examples, but the present invention is not limited thereto. First, Synthesis Examples of a compound used in Examples will be described below.

Synthesis Example (1-1)

Synthesis of Compound (3-199)

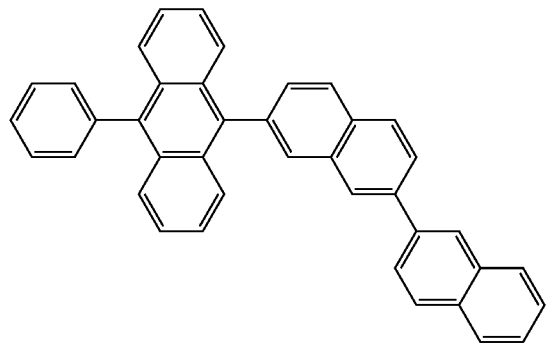

(3-199)

Compound (1-199) was synthesized according to a method described in "Synthesis example of a compound represented by formula (1-55)" in JP 2012-104806 A.

Synthesis Example (1-2)

Synthesis of Compound (3-192)

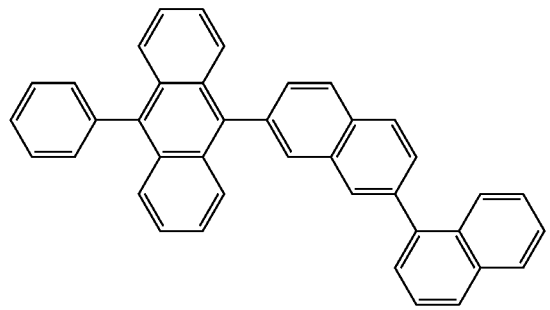

(3-192)

Compound (1-192) was synthesized according to a method described in "Synthesis example of a compound represented by formula (1-46)" in JP 2012-104806 A.

Synthesis Example (1-3)

Synthesis of Compound (3-222)

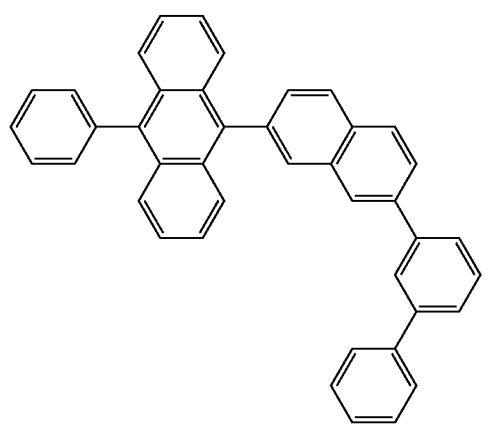

(3-222)

Compound (3-222) was synthesized according to a method described in "Synthesis example of a compound represented by formula (1-2)" in JP 2012-104806 A.

Synthesis Example (1-4)

Synthesis of Compound (3-221)

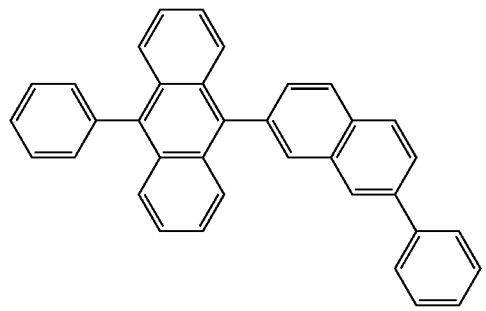

(3-221)

Compound (3-221) was synthesized according to a method described in "Synthesis example of a compound represented by formula (1-1)" in JP 2012-104806 A.

Synthesis Example (1-5)

Synthesis of Compound (3-195)

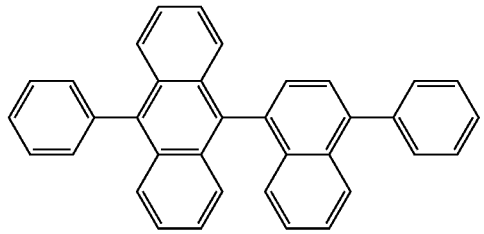

(3-195)

Compound (3-195) was synthesized according to a method described in "Synthesis example 30: Synthesis of compound (CH-AP41)" in JP 2016-88927 A.

Synthesis Example (1-6)

Synthesis of Compound (3-134-O): 2-(10-phenylanthracen-9-yl) naphtho[2,3-b]benzofuran

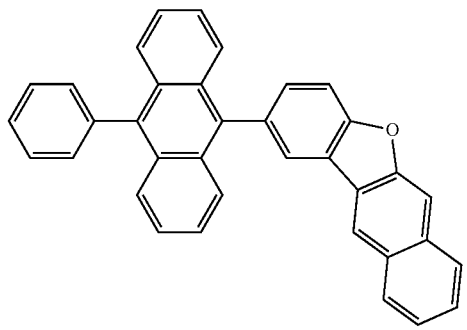

(3-134-O)

Compound (3-134-O) was synthesized according to a method described in paragraph [0106] of WO 2014/141725 A.

Synthesis Example (2-1)

Synthesis of Compound (1-41): 2,12-di-t-butyl-5,9-bis(4-(t-butyl)phenyl)-7-methyl-5,9-dihydro-5,9-diaza-13b-boranaphtho[3,2,1-de]anthracene

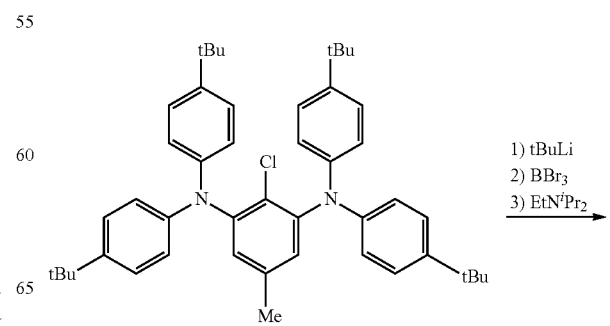

1) tBuLi
2) BBr$_3$
3) EtN$^i$Pr$_2$

-continued

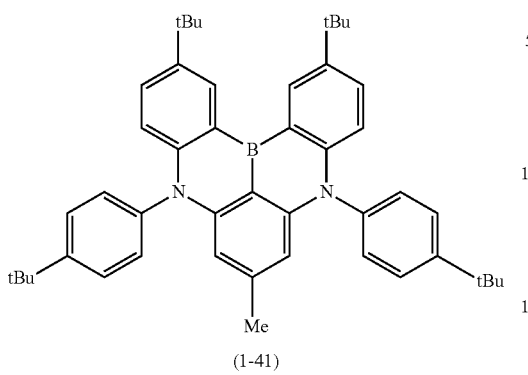

(1-41)

Compound (1-41) was synthesized according to a method described in "Synthesis Example (32)" of WO 2015/102118 A.

The structure of a compound thus obtained was identified by an NMR analysis.

¹H-NMR (500 MHz, CDCl₃): δ=1.47 (s, 36H), 2.17 (s, 3H), 5.97 (s, 2H), 6.68 (d, 2H), 7.28 (d, 4H), 7.49 (dd, 2H), 7.67 (d, 4H), 8.97 (d, 2H).

Synthesis Example (2-2)

Synthesis of Compound (1-31): 2,12-di-t-butyl-5,9-bis(4-(t-butyl)phenyl)-5,9-dihydro-5,9-diaza-13b-boranaphtho[3,2,1-de]anthracene

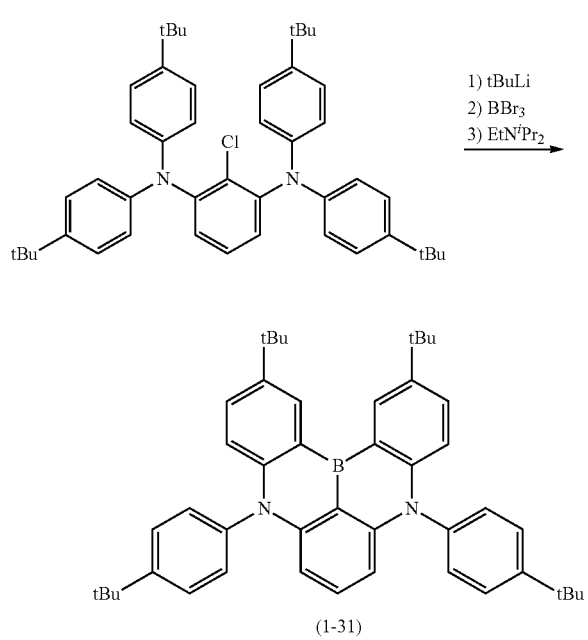

(1-31)

Compound (1-31) was synthesized according to a method described in "Synthesis Example (32)" of WO 2015/102118 A.

The structure of a compound thus obtained was identified by an NMR analysis.

¹H-NMR (500 MHz, CDCl₃): δ=1.46 (s, 18H), 1.47 (s, 18H), 6.14 (d, 2H), 6.75 (d, 2H), 7.24 (t, 1H), 7.29 (d, 4H), 7.52 (dd, 2H), 7.67 (d, 4H), 8.99 (d, 2H).

Synthesis Example (2-3)

Synthesis of Compound (1-53): 2,12-di-t-butyl-5,9-bis(4-(t-butyl)phenyl)-7-(9H-carbazol-9-yl)-5,9-dihydro-5,9-diaza-13b-boranaphtho[3,2,1-de]anthracene

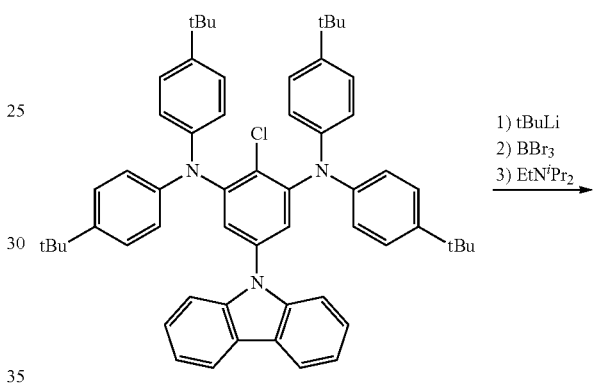

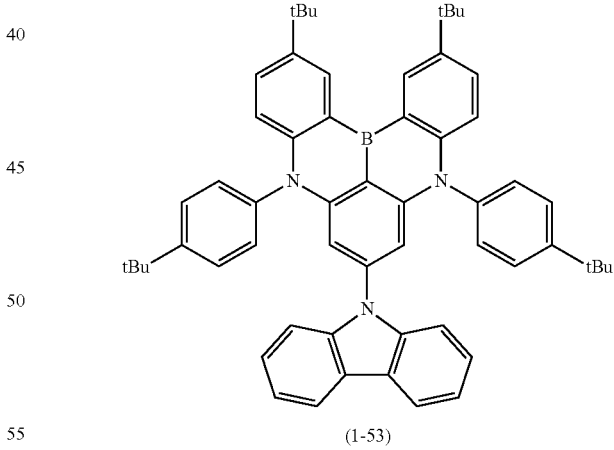

(1-53)

Compound (1-53) was synthesized according to a method described in "Synthesis Example (32)" of WO 2015/102118 A.

The structure of a compound thus obtained was identified by an NMR analysis.

¹H-NMR (CDCl₃): δ=1.35 (s, 18H), 1.50 (s, 18H), 6.34 (s, 2H), 6.85 (d, 2H), 7.16 (t, 2H), 7.23 (t, 2H), 7.32 to 7.35 (m, 6H), 7.56 (dd, 2H), 7.63 (d, 4H), 7.99 (d, 2H), 9.05 (d, 2H).

Synthesis Example (2-4)

Synthesis of Compound (1-37): 3,12-di-t-butyl-9-(4-(t-butyl)phenyl)-5-(3,5-di-t-butylphenyl)-5,9-dihydro-5,9-diaza-13b-boranaphtho[3,2,1-de]anthracene

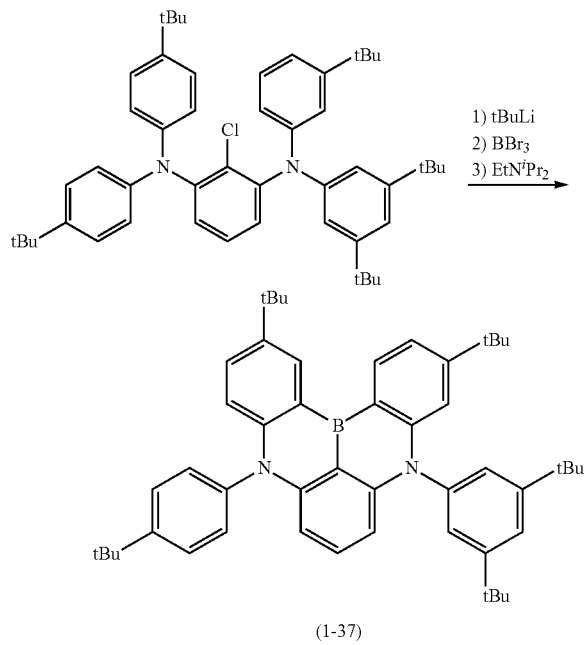

Compound (1-37) was synthesized according to a method described in "Synthesis Example (32)" of WO 2015/102118 A.

The structure of a compound thus obtained was identified by an NMR analysis.

$^1$H-NMR (CDCl$_3$): δ=1.20 (s, 9H), 1.36 (s, 18H), 1.46 (s, 9H), 1.47 (s, 9H), 6.14 (d, 1H), 6.25 (d, 1H), 6.68 (d, 1H), 6.73 (d, 1H), 7.21 (d, 2H), 7.29 (d, 3H), 7.34 (dd, 1H), 7.51 (dd, 1H), 7.61 (t, 1H), 7.67 (d, 2H), 8.86 (d, 1H), 8.96 (d, 1H).

Synthesis Example (2-5)

Synthesis of Compound (1-46): 3,12-di-t-butyl-9-(4-(t-butyl)phenyl)-5-(3,5-di-t-butylphenyl)-7-methyl-5,9-dihydro-5,9-diaza-13b-boranaphtho[3,2,1-de]anthracene

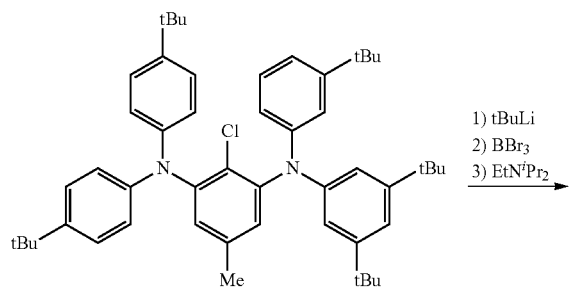

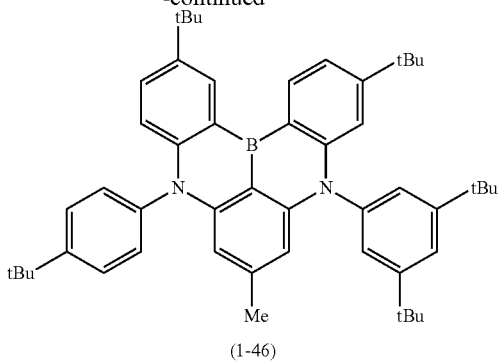

Compound (1-46) was synthesized according to a method described in "Synthesis Example (32)" of WO 2015/102118 A.

The structure of a compound thus obtained was identified by an NMR analysis.

$^1$H-NMR (CDCl$_3$): δ=1.20 (s, 9H), 1.37 (s, 18H), 1.46 (s, 9H), 1.47 (s, 9H), 2.18 (s, 3H), 5.97 (s, 1H), 6.08 (d, 1H), 6.63 (d, 1H), 6.66 (d, 1H), 7.20 (d, 2H), 7.27 (d, 2H), 7.32 (dd, 1H), 7.48 (dd, 1H), 7.61 (t, 1H), 7.67 (d, 2H), 8.84 (d, 1H), 8.94 (d, 1H).

Synthesis Example (2-6)

Synthesis of Compound (1-50): 2,12-di-t-butyl-N,N,5,9-tetrakis(4-(t-butyl) phenyl)-5,9-dihydro-5,9-diaza-13b-boranaphtho[3,2,1-de]anthracene-7-amine

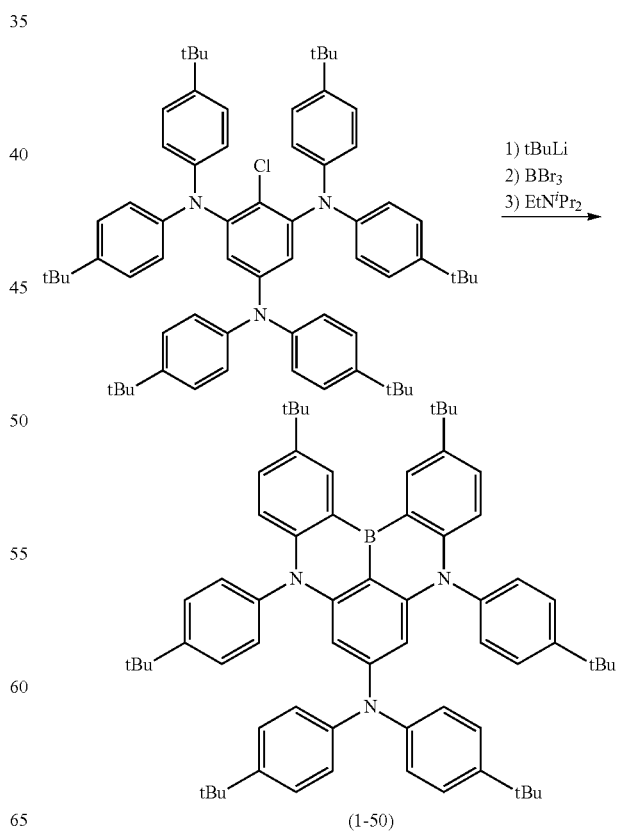

Compound (1-50) was synthesized according to a method described in "Synthesis Example (32)" of WO 2015/102118 A.

The structure of a compound thus obtained was identified by an NMR analysis.

$^1$H-NMR (CDCl$_3$): δ=1.3 (s, 18H), 1.3 (s, 18H), 1.5 (s, 18H), 5.8 (s, 2H), 6.6 (d, 2H), 6.8 (dd, 4H), 7.1 (dd, 4H), 7.1 (dd, 4H), 7.4 to 7.5 (m, 6H), 8.9 (d, 2H).

Synthesis Example (2-7)

Synthesis of Compound (1-49): 2,12-di-t-butyl-5,9-bis(4-(t-butyl) phenyl)-N,N-dipheny-5,9-dihydro-5,9-diaza-13b-boranaphtho[3,2,1-de]anthracene-7-amine

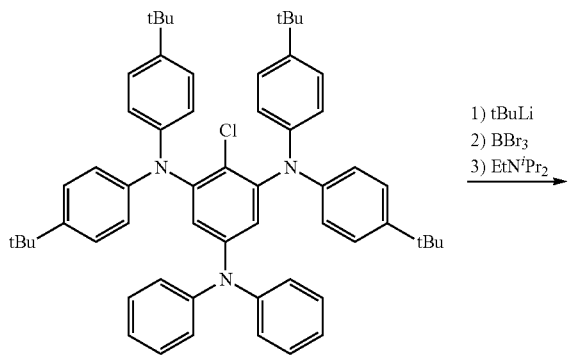

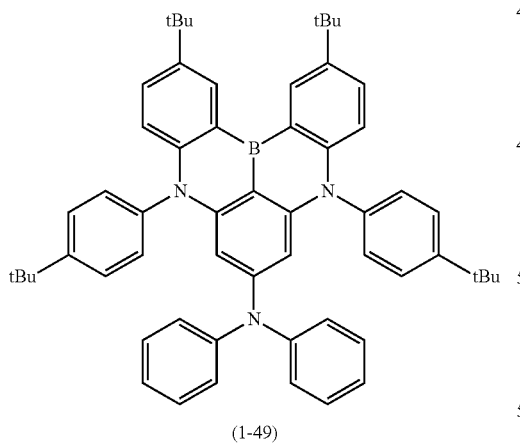

(1-49)

Compound (1-49) was synthesized according to a method described in "Comparative Synthesis Example (1)" of JP 2016-88927 A.

The structure of a compound thus obtained was identified by an NMR analysis.

$^1$H-NMR (CDCl$_3$): δ=1.33 (s, 18H), 1.46 (s, 18H), 5.55 (s, 2H), 6.75 (d, 2H), 6.89 (t, 2H), 6.94 (d, 4H), 7.06 (t, 4H), 7.13 (d, 4H), 7.43 to 7.46 (m, 6H), 8.95 (d, 2H).

Synthesis Example (3-1)

Synthesis of compound (BD-1)

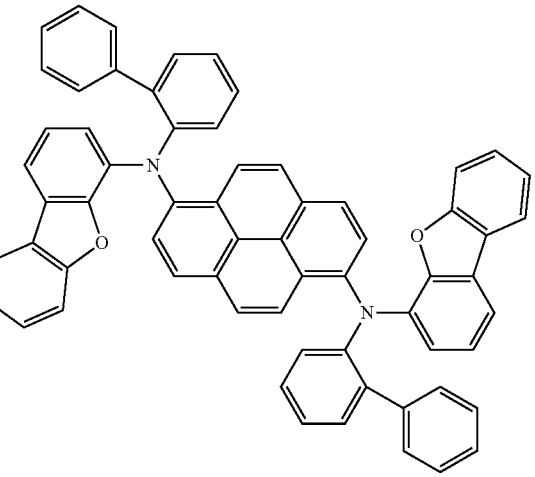

Compound (BD-1) was synthesized according to a method described in "Manufacture Example 8" of JP 2013-080961 A.

Other compounds of the present invention can be synthesized by a method according to those in Synthesis Examples described above by appropriately changing the compounds of raw materials.

Hereinafter, Examples of an organic EL element using the compounds according to an embodiment of the present invention will be described in order to describe the present invention in more detail, but the present invention is not limited thereto.

Organic EL elements according to Examples 1 to 5 and Comparative Examples 1 to 7 were manufactured. For each of these elements, voltage (V), emission wavelength (nm), CIE chromaticity (x, y), and external quantum efficiency (%) were measured at the time of light emission at a specific luminance. Time (element lifetime) to retain specific luminance was also measured.

A quantum efficiency of a luminescent element includes an internal quantum efficiency and an external quantum efficiency. The internal quantum efficiency indicates a ratio at which external energy injected as electrons (or holes) into a light emitting layer of the luminescent element is purely converted into photons. Meanwhile, the external quantum efficiency is calculated based on the amount of these photons emitted to an outside of the luminescent element. Some of the photons generated in the light emitting layer are absorbed or reflected continuously inside the luminescent element, and are not emitted to the outside of the luminescent element. Therefore, the external quantum efficiency is lower than the internal quantum efficiency.

A method for measuring the external quantum efficiency is as follows. Using a voltage/current generator R6144 manufactured by Advantest Corporation, a voltage at which luminance of an element was 1000 cd/m$^2$ was applied to cause the element to emit light. Using a spectral radiance meter SR-3AR manufactured by TOPCON Co., spectral radiance in a visible light region was measured from a direction perpendicular to a light emitting surface. Assuming that the light emitting surface is a perfectly diffusing surface, a numerical value obtained by dividing a spectral radiance value of each measured wavelength component by wavelength energy and multiplying the obtained value by π is the number of photons at each wavelength. Subsequently, the number of photons was integrated in the observed entire wavelength region, and this number was taken as the total number of photons emitted from the element. A numerical value obtained by dividing an applied current value by an elementary charge is taken as the number of carriers injected into the element. The external quantum efficiency is a numerical value obtained by dividing the total number of photons emitted from the element by the number of carriers injected into the element.

The following Tables 1, 2A, and 2B indicate a material configuration of each layer and EL characteristic data in organic EL elements manufactured according to Examples 1 to 5 and Comparative Examples 1 to 7.

TABLE 1

| Ex. | Hole injection layer 1 (40 nm) | Hole injection layer 2 (5 nm) | Hole transport layer 1 (15 nm) | Hole transport layer 2 (10 nm) | Light emitting layer 1 (12.5 nm) Host 1 (Concentration; % by mass) | Light emitting layer 1 (12.5 nm) Dopant 1 (Concentration; % by mass) | Light emitting layer 2 (12.5 nm) Host 2 (Concentration; % by mass) | Light emitting layer 2 (12.5 nm) Dopant 2 (Concentration; % by mass) | Electron transport layer (30 nm) | Negative electrode (1 nm/ 100 nm) |
|---|---|---|---|---|---|---|---|---|---|---|
| 1 | HI | HAT-CN | HT-1 | HT-2 | 3-134-O (95) | 1-41 (5) | 3-134-O (99) | 1-41 (1) | ET-1 + Liq | Liq/MgAg |
| 2 | HI | HAT-CN | HT-1 | HT-2 | 3-134-O (95) | 1-31 (5) | 3-134-O (99) | 1-31 (1) | ET-1 + Liq | Liq/MgAg |
| 3 | HI | HAT-CN | HT-1 | HT-2 | 3-134-O (95) | 1-37 (5) | 3-134-O (99) | 1-37 (1) | ET-1 + Liq | Liq/MgAg |
| 4 | HI | HAT-CN | HT-1 | HT-2 | 3-134-O (95) | 1-50 (5) | 3-134-O (99) | 1-50 (1) | ET-1 + Liq | Liq/MgAg |

Element characteristics at 1000 cd/m$^2$

| Ex. | Wavelength (nm) | Chromaticity (x, y) | Voltage (V) | External quantum efficiency (%) | Time to retain 90% of initial luminance (hr) |
|---|---|---|---|---|---|
| 1 | 462 | (0.131, 0.084) | 3.4 | 7.0 | 88 |
| 2 | 463 | (0.131, 0.094) | 3.5 | 7.0 | 86 |
| 3 | 462 | (0.128, 0.110) | 3.8 | 5.6 | 68 |
| 4 | 460 | (0.134, 0.077) | 3.5 | 6.5 | 98 |

| Ex. | Hole injection layer 1 (40 nm) | Hole injection layer 2 (5 nm) | Hole transport layer 1 (15 nm) | Hole transport layer 2 (10 nm) | Light emitting layer 1 (12.5 nm) Host 1 (Concentration; % by mass) | Light emitting layer 1 (12.5 nm) Dopant 1 (Concentration; % by mass) | Light emitting layer 2 (12.5 nm) Host 2 (Concentration; % by mass) | Light emitting layer 2 (12.5 nm) Dopant 2 (Concentration; % by mass) | Electron transport layer 1 (5 nm) | Electron transport layer 2 (25 nm) | Negative electrode (1 nm/ 100 nm) |
|---|---|---|---|---|---|---|---|---|---|---|---|
| 5 | HI | HAT-CN | HT-1 | HT-2 | 3-134-O (95) | 1-41 (5) | 3-134-O (99) | 1-41 (1) | ET-2 | ET-3 + Liq | Liq/MgAg |

Element characteristics at 1000 cd/m$^2$

| Ex. | Wavelength (nm) | Chromaticity (x, y) | Voltage (V) | External quantum efficiency (%) | Time to retain 95% of initial luminance (hr) |
|---|---|---|---|---|---|
| 5 | 463 | (0.130, 0.089) | 3.6 | 7.1 | 162 |

TABLE 2A

| Com. Ex. | Hole injection layer 1 (40 nm) | Hole injection layer 2 (5 nm) | Hole transport layer 1 (15 nm) | Hole transport layer 2 (10 nm) | Light emitting layer 1 (12.5 nm) Host 1 (Concentration; % by mass) | Light emitting layer 1 (12.5 nm) Dopant 1 (Concentration; % by mass) | Light emitting layer 2 (12.5 nm) Host 2 (Concentration; % by mass) | Light emitting layer 2 (12.5 nm) Dopant 2 (Concentration; % by mass) | Electron transport layer (30 nm) | Negative electrode (1 nm/ 100 nm) |
|---|---|---|---|---|---|---|---|---|---|---|
| 1 | HI | HAT-CN | HT-1 | HT-2 | 3-134-O (95) | BD-1 (5) | 3-134-O (99) | BD-1 (1) | ET-1 + Liq | Liq/MgAg |

Element characteristics at 1000 cd/m$^2$

| Com. Ex. | Wavelength (nm) | Chromaticity (x, y) | Voltage (V) | External quantum efficiency (%) | Time to retain 90% of initial luminance (hr) |
|---|---|---|---|---|---|
| 1 | 459 | (0.137, 0.119) | 3.3 | 6.3 | 23 |

| Com. Ex. | Hole injection layer 1 (40 nm) | Hole injection layer 2 (5 nm) | Hole transport layer 1 (15 nm) | Hole transport layer 2 (10 nm) | Light emitting layer (25 nm) Host (Concentration; % by mass) | Light emitting layer (25 nm) Dopant (Concentration; % by mass) | Electron transport layer (30 nm) | Negative electrode (1 nm/ 100 nm) |
|---|---|---|---|---|---|---|---|---|
| 2 | HI | HAT-CN | HT-1 | HT-2 | 3-134-O (97) | 1-41 (3) | ET-1 + Liq | Liq/MgAg |
| 3 | HI | HAT-CN | HT-1 | HT-2 | 3-134-O (97) | BD-1 (3) | ET-1 + Liq | Liq/MgAg |

TABLE 2A-continued

| Com. Ex. | | | | | Host (Concentration; % by mass) | Dopant (Concentration; % by mass) | | |
|---|---|---|---|---|---|---|---|---|
| 4 | HI | HAT-CN | HT-1 | HT-2 | 3-134-O (97) | 1-31 (3) | ET-1 + Liq | Liq/MgAg |
| 5 | HI | HAT-CN | HT-1 | HT-2 | 3-134-O (97) | 1-37 (3) | ET-1 + Liq | Liq/MgAg |
| 6 | HI | HAT-CN | HT-1 | HT-2 | 3-134-O (97) | 1-50 (3) | ET-1 + Liq | Liq/MgAg |

| | Element characteristics at 1000 cd/m² | | | | |
|---|---|---|---|---|---|
| Com. Ex. | Wavelength (nm) | Chromaticity (x, y) | Voltage (V) | External quantum efficiency (%) | Time to retain 90% of initial luminance (hr) |
| 2 | 461 | (0.132, 0.080) | 3.4 | 6.8 | 60 |
| 3 | 460 | (0.135, 0.126) | 3.4 | 6.3 | 51 |
| 4 | 463 | (0.128, 0.091) | 3.5 | 6.8 | 62 |
| 5 | 460 | (0.130, 0.094) | 3.6 | 5.6 | 46 |
| 6 | 459 | (0.134, 0.077) | 3.5 | 6.5 | 81 |

TABLE 2B

| | | | | Light emitting layer (25 nm) | | | | |
|---|---|---|---|---|---|---|---|---|
| Com. Ex. | Hole injection layer 1 (40 nm) | Hole injection layer 2 (5 nm) | Hole transport layer 1 (15 nm) | Hole transport layer 2 (10 nm) | Host (Concentration; % by mass) | Dopant (Concentration; % by mass) | Electron transport layer 1 (5 nm) | Electron transport layer 2 (25 nm) | Negative electrode (1 nm/ 100 nm) |
| 7 | HI | HAT-CN | HT-1 | HT-2 | 3-134-O (97) | 1-41 (3) | ET-2 | ET-3 + Liq | Liq/MgAg |

| | Element characteristics at 1000 cd/m² | | | | |
|---|---|---|---|---|---|
| Com. Ex. | Wavelength (nm) | Chromaticity (x, y) | Voltage (V) | External quantum efficiency (%) | Time to retain 95% of initial luminance (hr) |
| 7 | 4 62 | (0.131, 0.083) | 3.5 | 7.0 | 117 |

In each of the above Tables, "HI" represents $N^4,N^{4'}$-diphenyl-$N^4,N^{4'}$-bis(9-phenyl-9H-carbazol-3-yl)-[1,1'-biphenyl]-4,4'-diamine, "HAT-CN" represents 1,4,5,8,9,12-hexaazatriphenylene hexacarbonitrile, "HT-1" represents N-([1,1'-biphenyl]-4-yl)-N-(4-(9-phenyl-9H-carbazol-3-yl) phenyl)-[1,1'-biphenyl]-4-amine, "HT-2" represents N,N-bis (4-(dibenzo[b, d]furan-4-yl) phenyl)-[1,1': 4',1"-terphenyl]-4-amine, "ET-1" represents 9-[4-([1,4]benzoxaborinino[2,3,4-kl]phenoxaborinin-7-yl) phenyl]-9H-carbazole, "ET-2" represents 4,6,8,10-tetraphenyl[1,4]benzoxaborinino[2,3,4-kl]phenoxaborinine, and "ET-3" represents 3,3'-((2-phenylanthracene-9,10-diyl) bis(4,1-phenylene)) bis(4-methylpyridine). Chemical structures are indicated below together with "Liq".

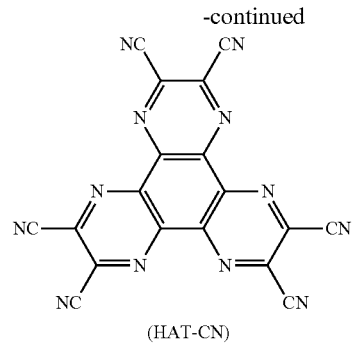

(HAT-CN)

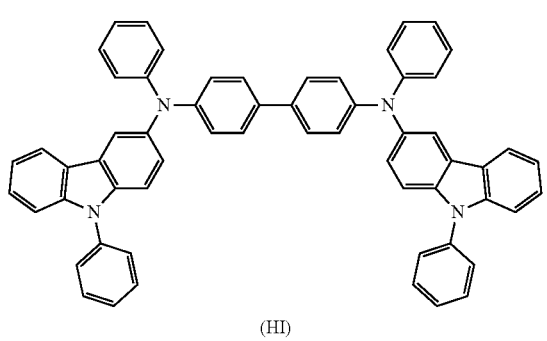

(HI)

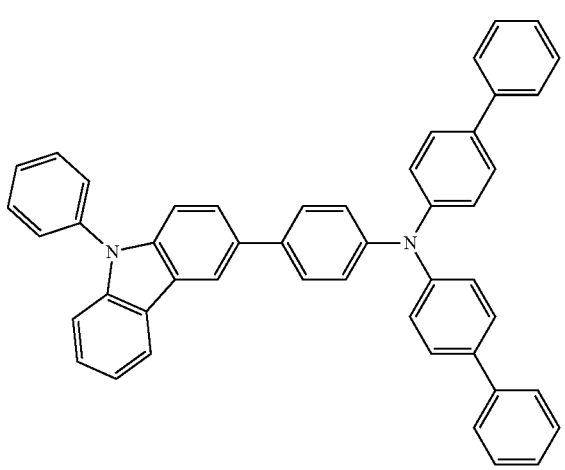

(HT-1)

-continued

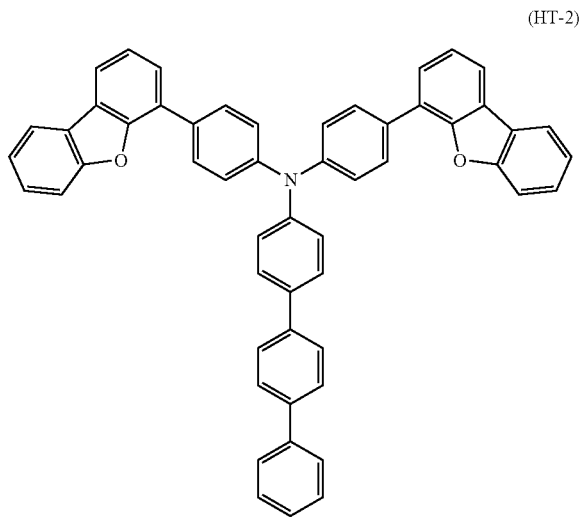
(HT-2)

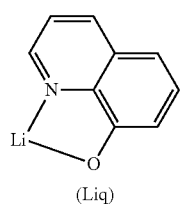
(Liq)

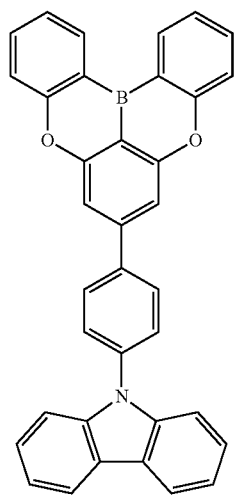
(ET-1)

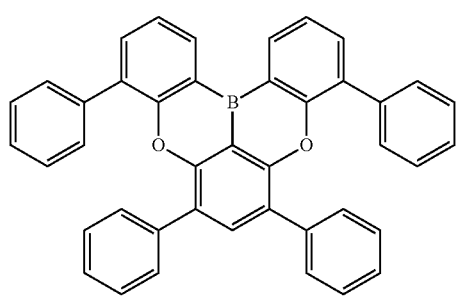
(ET-2)

-continued

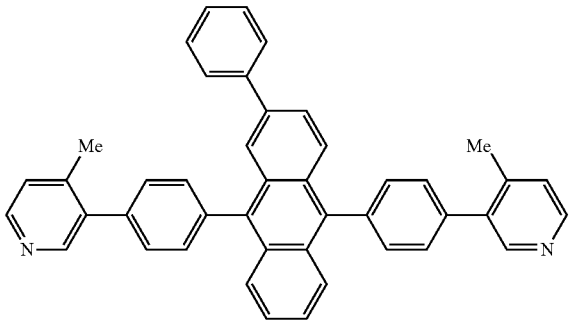
(ET-3)

Example 1

<Host material: compound (3-134-O), Dopant material: element of compound (1-41)>

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent supporting substrate was fixed to a substrate holder of a commercially available vapor deposition apparatus (manufactured by Choshu Industry Co., Ltd.). Tantalum vapor deposition boats containing HI, HAT-CN, HT-1, HT-2, compound (3-134-O), compound (1-41), and ET-1, respectively, and aluminum nitride vapor deposition boats containing Liq, magnesium, and silver, respectively, were mounted thereon.

The following various layers were sequentially formed on the ITO film of the transparent supporting substrate as illustrated in Table 1. A vacuum chamber was depressurized to $5\times10^{-4}$ Pa, and HI, HAT-CN, HT-1, and HT-2 were vapor-deposited in this order to form a hole injection layer 1 (film thickness: 40 nm), a hole injection layer 2 (film thickness: 5 nm), a hole transport layer 1 (film thickness: 15 nm), and a hole transport layer 2 (film thickness: 10 nm). Subsequently, compounds (3-134-O) and (1-41) were simultaneously heated, and vapor deposition was performed so as to obtain a film thickness of 12.5 nm. Thus, a light emitting layer 1 was formed. The rate of vapor deposition was adjusted such that a mass ratio between compound (3-134-O) and compound (1-41) was approximately 95:5. Subsequently, compounds (3-134-O) and (1-41) were simultaneously heated, and vapor deposition was performed so as to obtain a film thickness of 12.5 nm. Thus, a light emitting layer 2 was formed. The rate of vapor deposition was adjusted such that a mass ratio between compound (3-134-O) and compound (1-41) was approximately 99:1. Subsequently, ET-1 and Liq were simultaneously heated, and vapor deposition was performed so as to obtain a film thickness of 30 nm. Thus, an electron transport layer was formed. The rate of vapor deposition was adjusted such that a mass ratio between ET-1 and Liq was approximately 50:50. The rate of vapor deposition for each layer was 0.01 to 1 nm/sec. Thereafter, Liq was heated, and vapor deposition was performed at a rate of vapor deposition of 0.01 to 0.1 nm/sec so as to obtain a film thickness of 1 nm. Subsequently, magnesium and silver were simultaneously heated, and vapor deposition was performed so as to obtain a film thickness of 100 nm. Thus, a negative electrode was formed to obtain an organic EL element. At this time, the rate of vapor deposition was adjusted in a range of 0.1 to 10 nm/sec such that the ratio of the numbers of atoms between magnesium and silver was 10:1.

A direct current voltage was applied using an ITO electrode as a positive electrode and a magnesium/silver electrode as a negative electrode, and characteristics at the time of light emission at 1000 cd/m$^2$ were measured. As a result, as illustrated in Table 1, driving voltage was 3.4 V, external quantum efficiency was 7.0%, and blue light emission with a wavelength of 462 nm and CIE chromaticity (x, y)=(0.131, 0.084) was obtained. Next, the manufactured element was subjected to a low current drive test (current density=10 mA/cm$^2$), and time to retain 90% or more of initial luminance was 88 hours.

Examples 2 to 4

Each organic EL element was manufactured according to Example 1 with a layer configuration described in Table 1, and EL characteristic data was measured (Table 1)

Example 5

<Host material: compound (3-134-O), Dopant material: element of compound (1-41)>

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent supporting substrate was fixed to a substrate holder of a commercially available vapor deposition apparatus (manufactured by Choshu Industry Co., Ltd.). Tantalum vapor deposition boats containing HI, HAT-CN, HT-1, HT-2, compound (3-134-O), compound (1-41), ET-2, and ET-3, respectively, and aluminum nitride vapor deposition boats containing Liq, magnesium, and silver, respectively, were mounted thereon.

The following various layers were sequentially formed on the ITO film of the transparent supporting substrate as illustrated in Table 1. A vacuum chamber was depressurized to 5×10$^{-4}$ Pa, and HI, HAT-CN, HT-1, and HT-2 were vapor-deposited in this order to form a hole injection layer 1 (film thickness: 40 nm), a hole injection layer 2 (film thickness: 5 nm), a hole transport layer 1 (film thickness: 15 nm), and a hole transport layer 2 (film thickness: 10 nm). Subsequently, compounds (3-134-O) and (1-41) were simultaneously heated, and vapor deposition was performed so as to obtain a film thickness of 12.5 nm. Thus, a light emitting layer 1 was formed. The rate of vapor deposition was adjusted such that a mass ratio between compound (3-134-O) and compound (1-41) was approximately 95:5. Subsequently, compounds (3-134-O) and (1-41) were simultaneously heated, and vapor deposition was performed so as to obtain a film thickness of 12.5 nm. Thus, a light emitting layer 2 was formed. The rate of vapor deposition was adjusted such that a mass ratio between compound (3-134-O) and compound (1-41) was approximately 99:1. Subsequently, ET-2 was heated, and vapor deposition was performed so as to obtain a film thickness of 5 nm. Thus, an electron transport layer 1 was formed. Subsequently, ET-3 and Liq were simultaneously heated, and vapor deposition was performed so as to obtain a film thickness of 25 nm. Thus, an electron transport layer 2 was formed. The rate of vapor deposition was adjusted such that a mass ratio between ET-3 and Liq was approximately 50:50. The rate of vapor deposition for each layer was 0.01 to 1 nm/sec. Thereafter, Liq was heated, and vapor deposition was performed at a rate of vapor deposition of 0.01 to 0.1 nm/sec so as to obtain a film thickness of 1 nm. Subsequently, magnesium and silver were simultaneously heated, and vapor deposition was performed so as to obtain a film thickness of 100 nm. Thus, a negative electrode was formed to obtain an organic EL element. At this time, the rate of vapor deposition was adjusted in a range of 0.1 to 10 nm/sec such that the ratio of the numbers of atoms between magnesium and silver was 10:1.

A direct current voltage was applied using an ITO electrode as a positive electrode and a magnesium/silver electrode as a negative electrode, and characteristics at the time of light emission at 1000 cd/m$^2$ were measured. As a result, as illustrated in Table 1, driving voltage was 3.6 V, external quantum efficiency was 7.1%, and blue light emission with a wavelength of 463 nm and CIE chromaticity (x, y)=(0.130, 0.089) was obtained. Next, the manufactured element was subjected to a low current drive test (current density=10 mA/cm$^2$), and time to retain 95% or more of initial luminance was 162 hours.

Comparative Example 1

<Host material: compound (3-134-O), dopant material: element of compound (BD-1)>

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent supporting substrate was fixed to a substrate holder of a commercially available vapor deposition apparatus (manufactured by Choshu Industry Co., Ltd.). Tantalum vapor deposition boats containing HI, HAT-CN, HT-1, HT-2, compound (3-134-O), compound (BD-1), and ET-1, respectively, and aluminum nitride vapor deposition boats containing Liq, magnesium, and silver, respectively, were mounted thereon.

The following various layers were sequentially formed on the ITO film of the transparent supporting substrate as illustrated in Table 2A. A vacuum chamber was depressurized to 5×10$^{-4}$ Pa, and HI, HAT-CN, HT-1, and HT-2 were vapor-deposited in this order to form a hole injection layer 1 (film thickness: 40 nm), a hole injection layer 2 (film thickness: 5 nm), a hole transport layer 1 (film thickness: 15 nm), and a hole transport layer 2 (film thickness: 10 nm). Subsequently, compounds (3-134-O) and (BD-1) were simultaneously heated, and vapor deposition was performed so as to obtain a film thickness of 12.5 nm. Thus, a light emitting layer 1 was formed. The rate of vapor deposition was adjusted such that a mass ratio between compound (3-134-O) and compound (BD-1) was approximately 95:5. Subsequently, compounds (3-134-O) and (BD-1) were simultaneously heated, and vapor deposition was performed so as to obtain a film thickness of 12.5 nm. Thus, a light emitting layer 2 was formed. The rate of vapor deposition was adjusted such that a mass ratio between compound (3-134-O) and compound (BD-1) was approximately 99:1. Subsequently, ET-1 and Liq were simultaneously heated, and vapor deposition was performed so as to obtain a film thickness of 30 nm. Thus, an electron transport layer was formed. The rate of vapor deposition was adjusted such that a mass ratio between ET-1 and Liq was approximately 50:50. The rate of vapor deposition for each layer was 0.01 to 1 nm/sec. Thereafter, Liq was heated, and vapor deposition was performed at a rate of vapor deposition of 0.01 to 0.1 nm/sec so as to obtain a film thickness of 1 nm.

Subsequently, magnesium and silver were simultaneously heated, and vapor deposition was performed so as to obtain a film thickness of 100 nm. Thus, a negative electrode was formed to obtain an organic EL element. At this time, the rate of vapor deposition was adjusted in a range of 0.1 to 10 nm/sec such that the ratio of the numbers of atoms between magnesium and silver was 10:1.

A direct current voltage was applied using an ITO electrode as a positive electrode and a magnesium/silver electrode as a negative electrode, and characteristics at the time of light emission at 1000 cd/m$^2$ were measured. As a result, as illustrated in Table 2A, driving voltage was 3.3 V, external quantum efficiency was 6.3%, and blue light emission with a wavelength of 459 nm and CIE chromaticity (x, y)=(0.137, 0.119) was obtained. Next, the manufactured element was subjected to a low current drive test (current density=10 mA/cm$^2$), and time to retain 90% or more of initial luminance was 23 hours.

Comparative Example 2

<Host material: compound (3-134-O), Dopant material: element of compound (1-41)>

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent supporting substrate was fixed to a substrate holder of a commercially available vapor deposition apparatus (manufactured by Choshu Industry Co., Ltd.). Tantalum vapor deposition boats containing HI, HAT-CN, HT-1, HT-2, compound (3-134-O), compound (1-41), and ET-1, respectively, and aluminum nitride vapor deposition boats containing Liq, magnesium, and silver, respectively, were mounted thereon.

The following various layers were sequentially formed on the ITO film of the transparent supporting substrate as illustrated in Table 2A. A vacuum chamber was depressurized to 5×10$^{-4}$ Pa, and HI, HAT-CN, HT-1, and HT-2 were vapor-deposited in this order to form a hole injection layer 1 (film thickness: 40 nm), a hole injection layer 2 (film thickness: 5 nm), a hole transport layer 1 (film thickness: 15 nm), and a hole transport layer 2 (film thickness: 10 nm). Subsequently, compounds (3-134-O) and (1-41) were simultaneously heated, and vapor deposition was performed so as to obtain a film thickness of 25 nm. Thus, a light emitting layer was formed. The rate of vapor deposition was adjusted such that a mass ratio between compound (3-134-O) and compound (1-41) was approximately 97:3. Subsequently, ET-1 and Liq were simultaneously heated, and vapor deposition was performed so as to obtain a film thickness of 30 nm. Thus, an electron transport layer was formed. The rate of vapor deposition was adjusted such that a mass ratio between ET-1 and Liq was approximately 50:50. The rate of vapor deposition for each layer was 0.01 to 1 nm/sec. Thereafter, Liq was heated, and vapor deposition was performed at a rate of vapor deposition of 0.01 to 0.1 nm/sec so as to obtain a film thickness of 1 nm. Subsequently, magnesium and silver were simultaneously heated, and vapor deposition was performed so as to obtain a film thickness of 100 nm. Thus, a negative electrode was formed to obtain an organic EL element. At this time, the rate of vapor deposition was adjusted in a range of 0.1 to 10 nm/sec such that the ratio of the numbers of atoms between magnesium and silver was 10:1.

A direct current voltage was applied using an ITO electrode as a positive electrode and a magnesium/silver electrode as a negative electrode, and characteristics at the time of light emission at 1000 cd/m$^2$ were measured. As a result, as illustrated in Table 2A, driving voltage was 3.4 V, external quantum efficiency was 6.8%, and blue light emission with a wavelength of 461 nm and CIE chromaticity (x, y)=(0.132, 0.080) was obtained. Next, the manufactured element was subjected to a low current drive test (current density=10 mA/cm$^2$), and time to retain 90% or more of initial luminance was 60 hours.

Comparative Examples 3 to 6

Each organic EL element was manufactured according to Comparative Example 2 with a layer configuration described in Table 2A, and EL characteristic data was measured (Table 2A).

Comparative Example 7

<Host material: compound (3-134-O), Dopant material: element of compound (1-41)>

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent supporting substrate was fixed to a substrate holder of a commercially available vapor deposition apparatus (manufactured by Choshu Industry Co., Ltd.). Tantalum vapor deposition boats containing HI, HAT-CN, HT-1, HT-2, compound (3-134-O), compound (1-41), ET-2, and ET-3, respectively, and aluminum nitride vapor deposition boats containing Liq, magnesium, and silver, respectively, were mounted thereon.

The following various layers were sequentially formed on the ITO film of the transparent supporting substrate as illustrated in Table 2B. A vacuum chamber was depressurized to 5×10$^{-4}$ Pa, and HI, HAT-CN, HT-1, and HT-2 were vapor-deposited in this order to form a hole injection layer 1 (film thickness: 40 nm), a hole injection layer 2 (film thickness: 5 nm), a hole transport layer 1 (film thickness: 15 nm), and a hole transport layer 2 (film thickness: 10 nm). Subsequently, compounds (3-134-O) and (1-41) were simultaneously heated, and vapor deposition was performed so as to obtain a film thickness of 25 nm. Thus, a light emitting layer was formed. The rate of vapor deposition was adjusted such that a mass ratio between compound (3-134-O) and compound (1-41) was approximately 97:3. Subsequently, ET-2 was heated, and vapor deposition was performed so as to obtain a film thickness of 5 nm. Thus, an electron transport layer 1 was formed. Subsequently, ET-3 and Liq were simultaneously heated, and vapor deposition was performed so as to obtain a film thickness of 25 nm. Thus, an electron transport layer 2 was formed. The rate of vapor deposition was adjusted such that a mass ratio between ET-3 and Liq was approximately 50:50. The rate of vapor deposition for each layer was 0.01 to 1 nm/sec. Thereafter, Liq was heated, and vapor deposition was performed at a rate of vapor deposition of 0.01 to 0.1 nm/sec so as to obtain a film thickness of 1 nm. Subsequently, magnesium and silver were simultaneously heated, and vapor deposition was performed so as to obtain a film thickness of 100 nm. Thus, a negative electrode was formed to obtain an organic EL element. At this time, the rate of vapor deposition was adjusted in a range of 0.1 to 10 nm/sec such that the ratio of the numbers of atoms between magnesium and silver was 10:1.

A direct current voltage was applied using an ITO electrode as a positive electrode and a magnesium/silver electrode as a negative electrode, and characteristics at the time of light emission at 1000 cd/m² were measured. As a result, as illustrated in Table 2B, driving voltage was 3.5 V, external quantum efficiency was 7.0%, and blue light emission with a wavelength of 462 nm and CIE chromaticity (x, y)=(0.131, 0.083) was obtained. Next, the manufactured element was subjected to a low current drive test (current density=10 mA/cm²), and time to retain 95% or more of initial luminance was 117 hours.

Some of the compounds according to an embodiment of the present invention have been evaluated as a material for a light emitting layer of an organic EL element, and usefulness thereof has been described above. However, other compounds that have not been evaluated also have the same basic skeleton and have similar structures as a whole. A person skilled in the art can understand that the other compounds that have not been evaluated are similarly materials for a light emitting layer with excellent characteristics.

INDUSTRIAL APPLICABILITY

According to a preferable embodiment of the present invention, in an organic EL element, by constituting a light emitting layer so as to include a polycyclic aromatic compound or a multimer thereof and an anthracene-based compound and changing the concentration of the polycyclic aromatic compound or a multimer thereof from a positive electrode layer or a layer on the positive electrode side to a negative electrode layer or a layer on the negative electrode side, which sandwich the light emitting layer, either element efficiency or element lifetime, particularly preferably both element efficiency and element lifetime can be improved.

REFERENCE SIGNS LIST

100 Organic electroluminescent element
101 Substrate
102 Positive electrode
103 Hole injection layer
104 Hole transport layer
105 Light emitting layer
106 Electron transport layer
107 Electron injection layer
108 Negative electrode

The invention claimed is:

1. An organic electroluminescent element comprising: a pair of electrode layers comprising a positive electrode layer and a negative electrode layer; and a light emitting layer disposed between the pair of electrode layers, wherein
the light emitting layer comprises a polycyclic aromatic compound represented by the following formula (1) or a multimer of the polycyclic aromatic compound having a plurality of structures each represented by the following formula (1) and an anthracene-based compound represented by the following formula (3), and
in the light emitting layer, a concentration of the polycyclic aromatic compound or a multimer thereof decreases from the positive electrode layer or a layer on the positive electrode side to the negative electrode layer or a layer on the negative electrode side, which sandwich the light emitting layer,

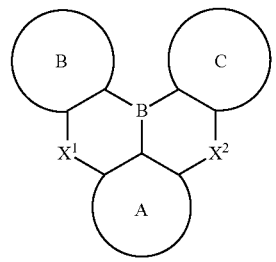

(1)

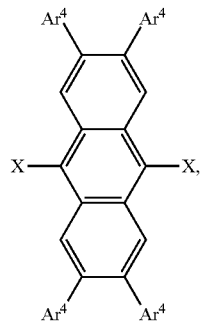

(3)

wherein in the formula (1),
ring A, ring B, and ring C each independently represent an aryl ring or a heteroaryl ring, and at least one hydrogen atom in these rings may be substituted,
$X^1$ and $X^2$ each independently represent >O, >N—R, >C(—R)$_2$, >S, or >Se, R in the moiety >N—R represents an optionally substituted aryl, an optionally substituted heteroaryl, an optionally substituted alkyl, or an optionally substituted cycloalkyl, R in the moiety >C(—R)$_2$ represents a hydrogen atom, an optionally substituted aryl, an optionally substituted alkyl, or an optionally substituted cycloalkyl, and R in the moiety >N—R and/or R in the moiety >C(—R)$_2$ may be bonded to at least one of the ring A, the ring B, and the ring C via a linking group or a single bond,
at least one hydrogen atom in the compound or structure represented by formula (1) may be substituted by a deuterium atom, cyano, or a halogen atom, and
in the formula (3),
X's and $Ar^4$'s each independently represent a hydrogen atom, an optionally substituted aryl, an optionally substituted heteroaryl, an optionally substituted diarylamino, an optionally substituted diheteroarylamino, an optionally substituted arylheteroarylamino, an optionally substituted alkyl, an optionally substituted cycloalkyl, an optionally substituted alkenyl, an optionally substituted alkoxy, an optionally substituted aryloxy, an optionally substituted arylthio, or an optionally substituted silyl, and not all X's and $Ar^4$'s represent hydrogen atoms simultaneously, and
at least one hydrogen atom in the compound represented by formula (3) may be substituted by a deuterium atom, cyano, a halogen atom, or an optionally substituted heteroaryl.

2. The organic electroluminescent element according to claim 1, wherein
in the formula (1),
ring A, ring B, and ring C each independently represent an aryl ring or a heteroaryl ring, at least one hydrogen atom in these rings may be substituted by a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino, a substituted or unsubstituted diarylboryl (the two aryls may be bonded to each other via a single bond or a linking group), a substituted or unsubstituted alkyl, a substituted or unsubstituted cycloalkyl, a substituted or unsubstituted alkoxy, or a substituted or unsubstituted aryloxy, and each of these rings has a 5-membered or 6-membered ring sharing a bond with a fused bicyclic structure at a center of the formula constituted by B, $X^1$, and $X^2$, $X^1$ and $X^2$ each independently represent >O, >N—R, >C(—R)$_2$, >S, or >Se, R in the moiety >N—R represents an aryl optionally substituted by an alkyl or a cycloalkyl, a heteroaryl optionally substituted by an alkyl or a cycloalkyl, an alkyl, or a cycloalkyl, R in the moiety >C(—R)$_2$ represents a hydrogen atom, an aryl optionally substituted by an alkyl or a cycloalkyl, an alkyl, or a cycloalkyl, R in the moiety >N—R and/or R in the moiety >C(—R)$_2$ may be bonded to at least one of the ring A, the ring B, and the ring C via —O—, —S—, —C(—R)$_2$—, or a single bond, and R in the moiety —C(—R)$_2$— represents a hydrogen atom, an alkyl, or a cycloalkyl, at least one hydrogen atom in the compound or structure represented by formula (1) may be substituted by a deuterium atom, cyano, or a halogen atom, and in a case of the multimer, the multimer is a dimer or a trimer having two or three structures each represented by formula (1).

3. The organic electroluminescent element according to claim 1, wherein the polycyclic aromatic compound or a multimer thereof is a polycyclic aromatic compound represented by the following formula (2) or a multimer of the polycyclic aromatic compound having a plurality of structures each represented by the following formula (2),

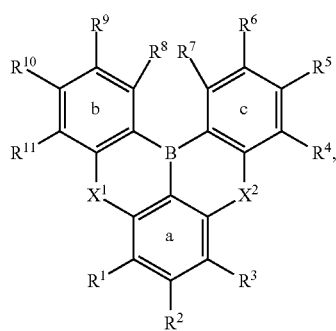

(2)

wherein in the formula (2), $R^1$, $R^2$, $R^3$, $R^4$, $R^5$, $R^6$, $R^7$, $R^8$, $R^9$, $R^{10}$ and $R^{11}$ each independently represent a hydrogen atom, an aryl, a heteroaryl, a diarylamino, a diheteroarylamino, an arylheteroarylamino, a diarylboryl (the two aryls may be bonded to each other via a single bond or a linking group), an alkyl, a cycloalkyl, an alkoxy, or an aryloxy, at least one hydrogen atom in these may be substituted by an aryl, a heteroaryl, an alkyl, or a cycloalkyl, adjacent groups among $R^1$ to $R^{11}$ may be bonded to each other to form an aryl ring or a heteroaryl ring together with at least one of ring a, ring b, and ring c, at least one hydrogen atom in the ring thus formed may be substituted by an aryl, a heteroaryl, a diarylamino, a diheteroarylamino, an arylheteroarylamino, a diarylboryl (the two aryls may be bonded to each other via a single bond or a linking group), an alkyl, a cycloalkyl, an alkoxy, or an aryloxy, and at least one hydrogen atom in these may be substituted by an aryl, a heteroaryl, an alkyl, or a cycloalkyl, $X^1$ and $X^2$ each independently represent >O, >N—R, >C(—R)$_2$, >S, or >Se, R in the moiety >N—R represents an aryl having 6 to 12 carbon atoms, optionally substituted by an alkyl having 1 to 6 carbon atoms or a cycloalkyl having 3 to 14 carbon atoms, a heteroaryl having 2 to 15 carbon atoms, optionally substituted by an alkyl having 1 to 6 carbon atoms or a cycloalkyl having 3 to 14 carbon atoms, an alkyl having 1 to 6 carbon atoms, or a cycloalkyl having 3 to 14 carbon atoms, R in the moiety >C(—R)$_2$ represents a hydrogen atom, an aryl having 6 to 12 carbon atoms, optionally substituted by an alkyl having 1 to 6 carbon atoms or a cycloalkyl having 3 to 14 carbon atoms, an alkyl having 1 to 6 carbon atoms, or a cycloalkyl having 3 to 14 carbon atoms, R in the moiety >N—R and/or R in the moiety >C(—R)$_2$ may be bonded to at least one of the ring a, the ring b, and the ring c via —O—, —S—, —C(—R)$_2$—, or a single bond, and R in the moiety —C(—R)$_2$— represents an alkyl having 1 to 6 carbon atoms or a cycloalkyl having 3 to 14 carbon atoms, at least one hydrogen atom in the compound or structure represented by formula (2) may be substituted by a deuterium atom, cyano, or a halogen atom, and in a case of the multimer, the multimer is a dimer or a trimer having two or three structures each represented by formula (2).

4. The organic electroluminescent element according to claim 3, wherein in the formula (2), $R^1$, $R^2$, $R^3$, $R^4$, $R^5$, $R^6$, $R^7$, $R^8$, $R^9$, $R^{10}$ and $R^{11}$ each independently represent a hydrogen atom, an aryl having 6 to 30 carbon atoms, optionally substituted by an alkyl having 1 to 6 carbon atoms or a cycloalkyl having 3 to 14 carbon atoms, a heteroaryl having 2 to 30 carbon atoms, optionally substituted by an alkyl having 1 to 6 carbon atoms or a cycloalkyl having 3 to 14 carbon atoms, a diarylamino (the aryl is an aryl having 6 to 12 carbon atoms, optionally substituted by an alkyl having 1 to 6 carbon atoms or a cycloalkyl having 3 to 14 carbon atoms), a diarylboryl (the aryl is an aryl having 6 to 12 carbon atoms, optionally substituted by an alkyl having 1 to 6 carbon atoms or a cycloalkyl having 3 to 14 carbon atoms), an alkyl having 1 to 24 carbon atoms, or a cycloalkyl having 3 to 24 carbon atoms, adjacent groups among $R^1$ to $R^{11}$ may be bonded to each other to form an aryl ring having 9 to 16 carbon atoms or a heteroaryl ring having 6 to 15 carbon atoms together with at least one of ring a, ring b, and ring c, and at least one hydrogen atom in the ring thus formed may be substituted by an aryl having 6 to 30 carbon atoms, optionally substituted by an alkyl having 1 to 6 carbon atoms or a cycloalkyl having 3 to 14 carbon atoms, a heteroaryl having 2 to 30 carbon atoms, optionally substituted by an alkyl having 1 to 6 carbon atoms or a cycloalkyl having 3 to 14 carbon atoms, a diarylamino (the aryl is an aryl having 6 to 12 carbon atoms, optionally substituted by an alkyl having 1 to 6 carbon atoms or a cycloalkyl having 3 to 14 carbon atoms), a diarylboryl (the aryl is an aryl having 6 to 12 carbon atoms, optionally substituted by an alkyl having 1 to 6 carbon atoms or a cycloalkyl having 3 to 14 carbon atoms), an alkyl having 1 to 24 carbon atoms, or a cycloalkyl having 3 to 24 carbon atoms, $X^1$ and $X^2$ each independently represent >O, >N—R, >C(—R)$_2$, or >S, R in the moiety >N—R represents an aryl having 6 to 10 carbon atoms, optionally substituted by an alkyl having 1 to 4 carbon atoms or a cycloalkyl having 5 to 10 carbon atoms, an alkyl having 1 to 4 carbon atoms, or a cycloalkyl having 5 to 10 carbon atoms, and R in the moiety >C(—R)$_2$ represents a hydrogen atom, an aryl having 6 to 10 carbon atoms, optionally substituted by an alkyl having 1 to 4 carbon atoms or a cycloalkyl having 5 to 10 carbon atoms, an alkyl having 1 to 4 carbon atoms, or a cycloalkyl having 5 to 10 carbon atoms, at least one hydrogen atom in the compound or structure represented by formula (2) may be substituted by a deuterium atom, cyano, or a halogen atom, and in a case of the multimer, the multimer is a dimer or a trimer having two structures each represented by formula (2).

5. The organic electroluminescent element according to claim 3, wherein in the formula (2), $R^1$, $R^2$, $R^3$, $R^4$, $R^5$, $R^6$, $R^7$, $R^8$, $R^9$, $R^{10}$ and $R^{11}$ each independently represent a hydrogen atom, an aryl having 6 to 16 carbon atoms, optionally substituted by an alkyl having 1 to 4 carbon atoms or a cycloalkyl having 5 to 10 carbon atoms, a heteroaryl having 2 to 20 carbon atoms, optionally substituted by an alkyl having 1 to 4 carbon atoms or a cycloalkyl having 5 to 10 carbon atoms, a diarylamino (the aryl is an aryl having 6 to 10 carbon atoms, optionally substituted by an alkyl having 1 to 4 carbon atoms or a cycloalkyl having 5 to 10 carbon atoms), a diarylboryl (the aryl is an aryl having 6 to 10 carbon atoms, optionally substituted by an alkyl having 1 to 4 carbon atoms or a cycloalkyl having 5 to 10 carbon atoms), an alkyl having 1 to 12 carbon atoms, or a cycloalkyl having 3 to 16 carbon atoms, $X^1$ and $X^2$ each independently represent >O, >N—R, or >C(—R)$_2$, R in the moiety >N—R represents an aryl having 6 to 10 carbon atoms, optionally substituted by an alkyl having 1 to 4 carbon atoms or a cycloalkyl having 5 to 10 carbon atoms, an alkyl having 1 to 4 carbon atoms, or a cycloalkyl having 5 to 10 carbon atoms, R in the moiety >C(—R)$_2$ represents a hydrogen atom, an aryl having 6 to 10 carbon atoms, optionally substituted by an alkyl having 1 to 4 carbon atoms or a cycloalkyl having 5 to 10 carbon atoms, an alkyl having 1 to 4 carbon atoms, or a cycloalkyl having 5 to 10 carbon atoms, and at least one hydrogen atom in the compound represented by formula (2) may be substituted by a deuterium atom, cyano, or a halogen atom.

6. The organic electroluminescent element according to claim 3, wherein in the formula (2), $R^1$, $R^2$, $R^3$, $R^4$, $R^5$, $R^6$, $R^7$, $R^8$, $R^9$, $R^{10}$ and $R^{11}$ each independently represent a hydrogen atom, an aryl having 6 to 16 carbon atoms, optionally substituted by an alkyl having 1 to 4 carbon atoms or a cycloalkyl having 5 to 10 carbon atoms, a heteroaryl having 2 to 20 carbon atoms, optionally substituted by an alkyl having 1 to 4 carbon atoms or a cycloalkyl having 5 to 10 carbon atoms, a diarylamino (the aryl is an aryl having 6 to 10 carbon atoms, optionally substituted by an alkyl having 1 to 4 carbon atoms or a cycloalkyl having 5 to 10 carbon atoms), a diarylboryl (the aryl is an aryl having 6 to 10 carbon atoms, optionally substituted by an alkyl having 1 to 4 carbon atoms or a cycloalkyl having 5 to 10 carbon atoms), an alkyl having 1 to 12 carbon atoms, or a cycloalkyl having 3 to 16 carbon atoms, $X^1$ and $X^2$ each independently represent >O or >N—R, R in the moiety >N—R represents an aryl having 6 to 10 carbon atoms, optionally substituted by an alkyl having 1 to 4 carbon atoms or a cycloalkyl having 5 to 10 carbon atoms, an alkyl having 1 to 4 carbon atoms, or a cycloalkyl having 5 to 10 carbon atoms, and at least one hydrogen atom in the compound represented by formula (2) may be substituted by a deuterium atom, cyano, or a halogen atom.

7. The organic electroluminescent element according to claim 1, wherein the polycyclic aromatic compound is represented by any one of the following structural formulas,

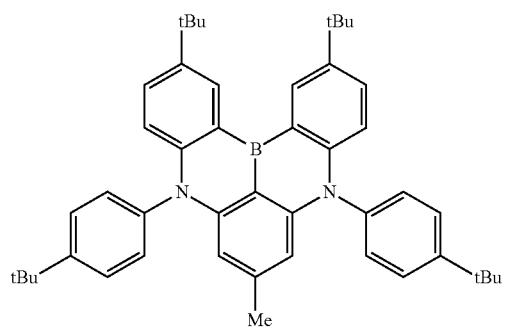

(1-41)

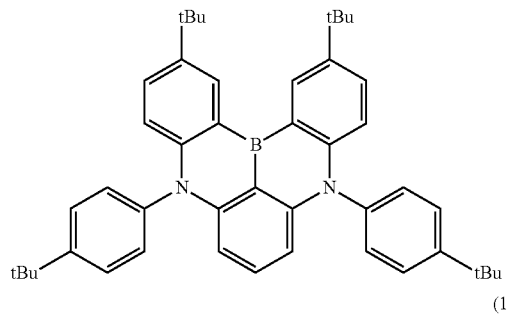

(1-31)

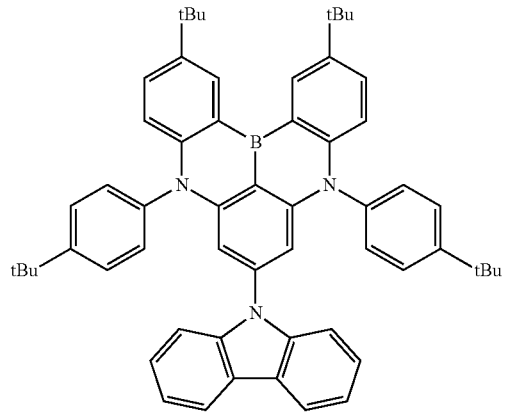

(1-53)

225
-continued (1-37)
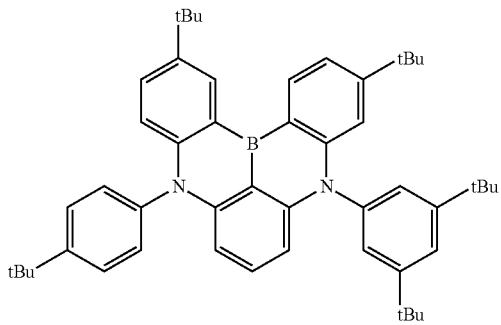

(1-46)
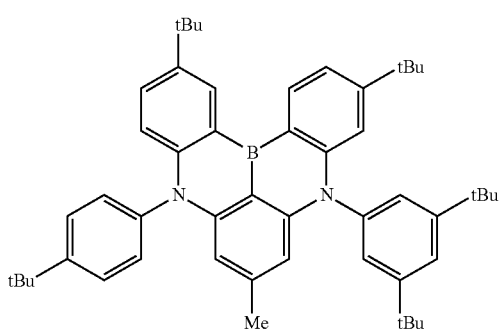

(1-50)
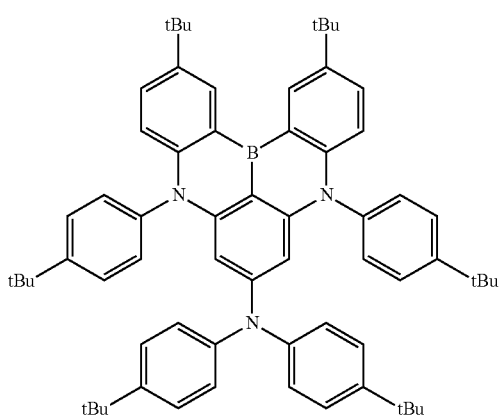

(1-49)
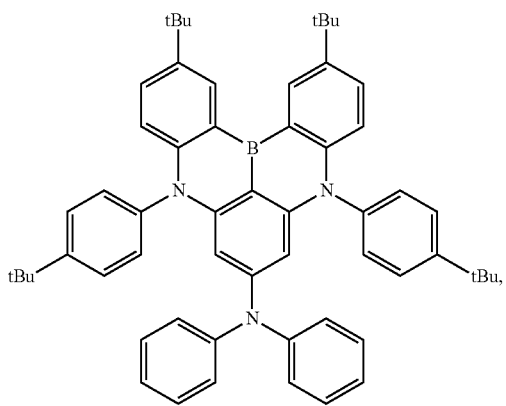

wherein in the above structural formulas, Me represents a methyl group, and tBu represents a tertiary butyl group.

8. The organic electroluminescent element according to claim 1, wherein

226 in the following formula (3), (3)
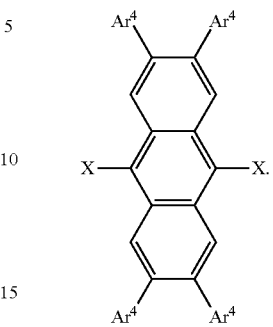

X's each independently represent a group represented by the following formula (3-X1), (3-X2), or (3-X3), (3-X1)
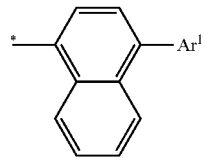

(3-X2)
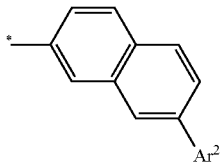

(3-X3)
*—Ar³, a naphthylene moiety in formula (3-X1) or (3-X2) may be fused with one benzene ring, the group represented by formula (3-X1), (3-X2), or (3-X3) is bonded to an anthracene ring of the formula (3) at a symbol *, Ar¹, Ar², and Ar³ each independently represent a hydrogen atom (except for Ar³), phenyl, biphenylyl, terphenylyl, quaterphenylyl, naphthyl, phenanthryl, fluorenyl, benzofluorenyl, chrysenyl, triphenylenyl, pyrenyl, or a group represented by the following formula (A), (A)
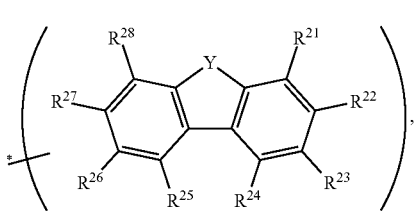

and at least one hydrogen atom in Ar³ may be further substituted by phenyl, biphenylyl, terphenylyl, naphthyl, phenanthryl, fluorenyl, chrysenyl, triphenylenyl, pyrenyl, or a group represented by the formula (A), Ar⁴'s each independently represent a hydrogen atom, phenyl, biphenylyl, terphenylyl, naphthyl, or a silyl substituted by an alkyl having 1 to 4 carbon atoms and/or a cycloalkyl having 5 to 10 carbon atoms, at least one hydrogen atom in the compound represented by formula (3) may be substituted by a halogen atom, cyano, a deuterium atom, or a group represented by the formula (A), and in the formula (A), Y represents —O—, —S—, or >N $R^{29}$, $R^{21}$, $R^{22}$, $R^{23}$, $R^{24}$, $R^{25}$, $R^{26}$, $R^{27}$ and $R^{28}$ each independently represent a hydrogen atom, an optionally substituted alkyl, an optionally substituted cycloalkyl, an optionally substituted aryl, an optionally substituted heteroaryl, an optionally substituted alkoxy, an optionally substituted aryloxy, an optionally substituted arylthio, a trialkylsilyl, a tricycloalkylsilyl, a dialkylcycloalkylsilyl, an alkyldicycloalkylsilyl, an optionally substituted amino, a halogen atom, hydroxy, or cyano, adjacent groups out of $R^{21}$, $R^{22}$, $R^{23}$, $R^{24}$, $R^{25}$, $R^{26}$, $R^{27}$ and $R^{28}$ may be bonded to each other to form a hydrocarbon ring, an aryl ring, or a heteroaryl ring, $R^{29}$ represents a hydrogen atom or an optionally substituted aryl, the group represented by formula (A) is bonded to a naphthalene ring of formula (3-X1) or (3-X2), a single bond of formula (3-X3), or $Ar^a$ of formula (3-X3) at the symbol *, or at least one hydrogen atom in the compound represented by formula (3) is substituted by the group represented by formula (A), and the group represented by formula (A) is bonded thereto at any position in formula (A).

9. The organic electroluminescent element according to claim 1, wherein in the following formula (3),

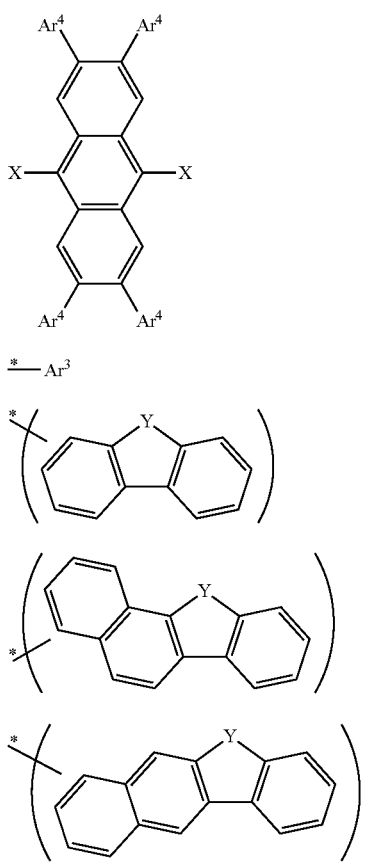

X's each independently represent a group represented by the following formula (3-X1), (3-X2), or (3-X3),

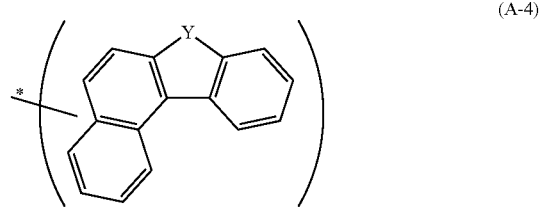

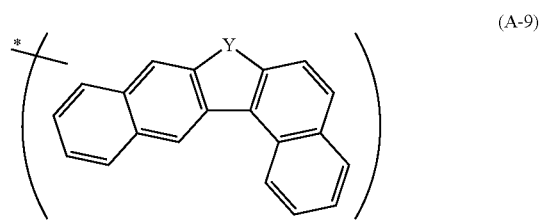

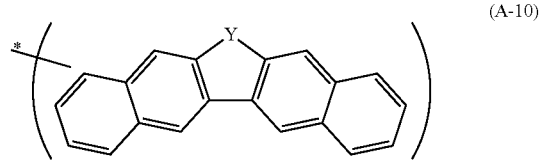

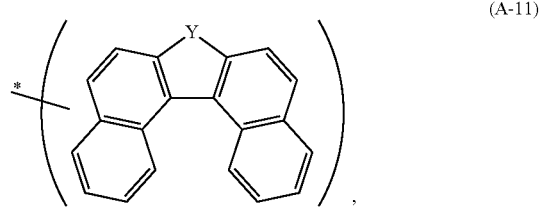

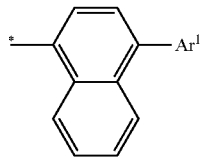

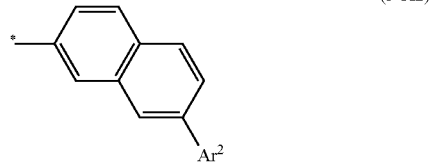

the group represented by formula (3-X1), (3-X2), or (3-X3) is bonded to an anthracene ring of formula (3) at a symbol *, $Ar^1$, $Ar^2$, and $Ar^3$ each independently represent a hydrogen atom (except for $Ar^3$), phenyl, biphenylyl, terphenylyl, naphthyl, phenanthryl, fluorenyl, chrysenyl, triphenylenyl, pyrenyl, or a group represented by any one of the following formulas (A-1) to (A-11),

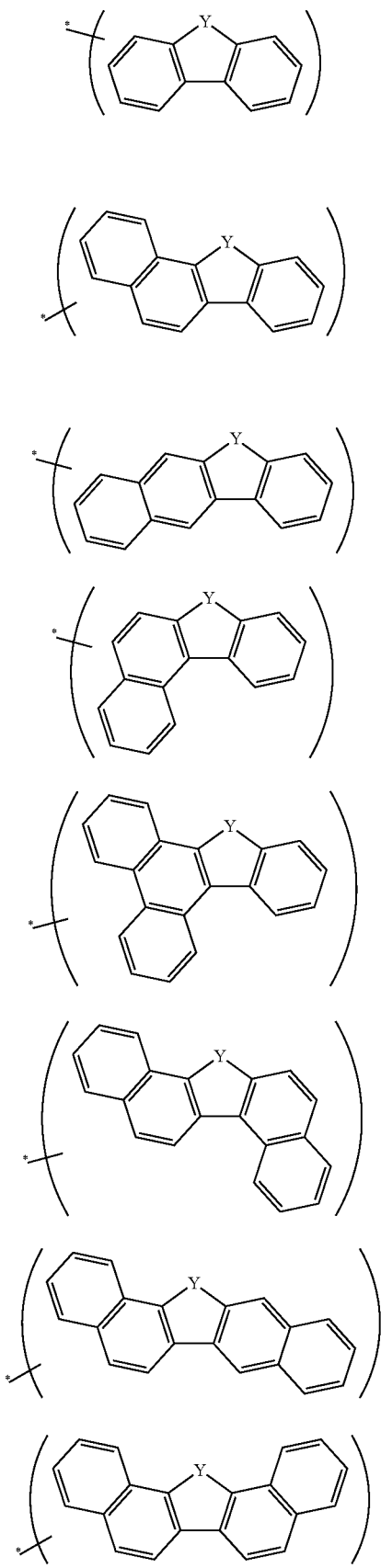

(A-1)
(A-2)
(A-3)
(A-4)
(A-5)
(A-6)
(A-7)
(A-8)

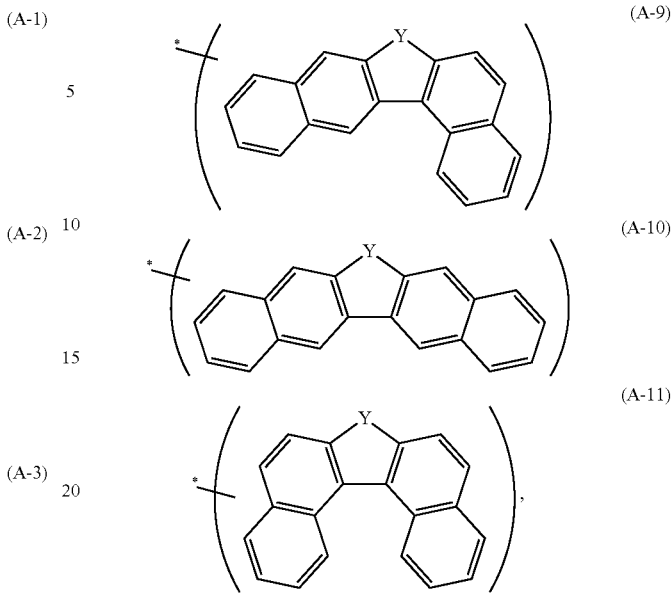

(A-9)
(A-10)
(A-11)

and at least one hydrogen atom in AO may be further substituted by phenyl, biphenylyl, terphenylyl, naphthyl, phenanthryl, fluorenyl, chrysenyl, triphenylenyl, pyrenyl, or a group represented by any one of the above formulas (A-1) to (A-11), $Ar^4$'s each independently represent a hydrogen atom, phenyl, or naphthyl, at least one hydrogen atom in the compound represented by formula (3) may be substituted by a halogen atom, cyano, or a deuterium atom, and in the formulas (A-1) to (A-11), Y represents —O—, —S—, or >N—$R^{29}$, $R^{29}$ represents a hydrogen atom or an aryl, at least one hydrogen atom in groups represented by formulas (A-1) to (A-11) may be substituted by an alkyl, a cycloalkyl, an aryl, a heteroaryl, an alkoxy, an aryloxy, an arylthio, a trialkylsilyl, a tricycloalkylsilyl, a dialkylcycloalkylsilyl, an alkyldicycloalkylsilyl, a diaryl substituted amino, a diheteroaryl substituted amino, an aryl heteroaryl substituted amino, a halogen atom, hydroxy, or cyano, and each of the groups represented by formulas (A-1) to (A-11) is bonded to a naphthalene ring of formula (3-X1) or (3-X2), a single bond of formula (3-X3), or AP of formula (3-X3) at the symbol * and bonded thereto at any position in structures of formulas (A-1) to (A-11).

10. The organic electroluminescent element according to claim 9, wherein in the formula (3), X's each independently represent a group represented by the formula (3-X1), (3-X2), or (3-X3), the group represented by formula (3-X1), (3-X2), or (3-X3) is bonded to an anthracene ring of formula (3) at a symbol *, $Ar^1$, $Ar^2$, and $Ar^3$ each independently represent a hydrogen atom (except for $Ar^3$), phenyl, biphenylyl, terphenylyl, naphthyl, phenanthryl, fluorenyl, or a group represented by any one of the formulas (A-1) to (A-4), and at least one hydrogen atom in AP may be further substituted by phenyl, naphthyl, phenanthryl, fluorenyl, or a group represented by any one of the formulas (A-1) to (A-4), $Ar^4$'s each independently represent a hydrogen atom, phenyl, or naphthyl, and at least one hydrogen atom in the compound represented by formula (3) may be substituted by a halogen atom, cyano, or a deuterium atom.

11. The organic electroluminescent element according to claim 1, wherein the anthracene-based compound of formula (3) is represented by any one of the following structural formulas, (3-199)

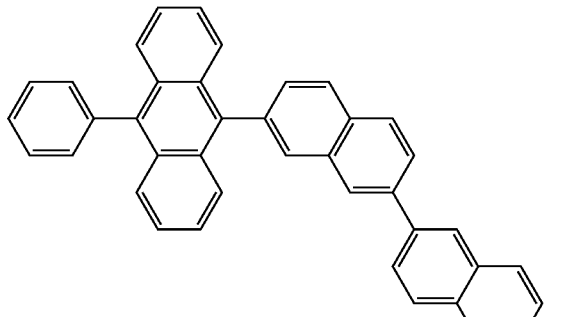

(3-192)

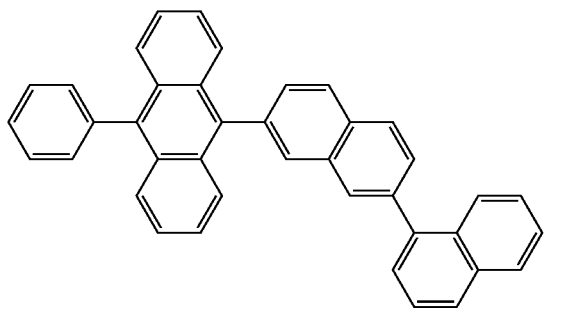

(3-222)

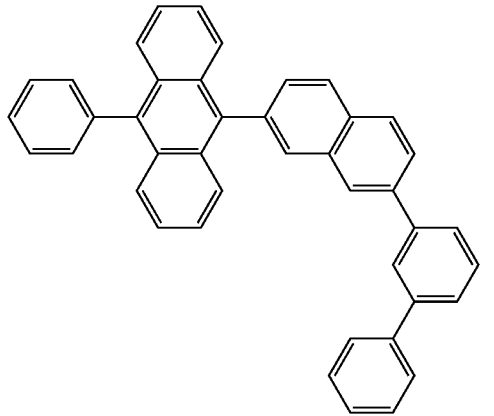

(3-221)

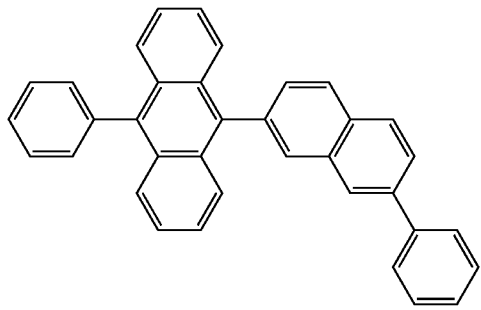

-continued (3-195)

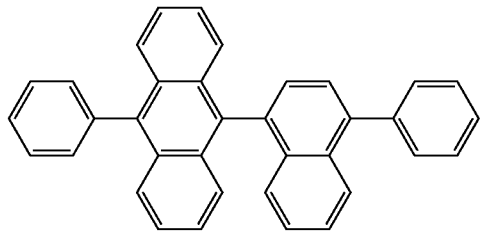

(3-134-O)

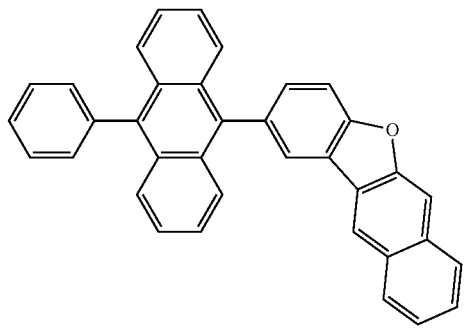

12. The organic electroluminescent element according to claim 1, wherein the light emitting layer comprises a plurality of layers, and a concentration of the polycyclic aromatic compound or a multimer thereof in each of the layers decreases from the positive electrode layer or a layer on the positive electrode side to the negative electrode layer or a layer on the negative electrode side, which sandwich the light emitting layer.

13. The organic electroluminescent element according to claim 1, wherein the light emitting layer comprises a first light emitting layer and a second light emitting layer, the first light emitting layer and the second light emitting layer are disposed in this order from the positive electrode layer or a layer on the positive electrode side to the negative electrode layer or a layer on the negative electrode side, which sandwich the light emitting layer, and a concentration of the polycyclic aromatic compound or a multimer thereof included in the second light emitting layer is lower than a concentration of the polycyclic aromatic compound or a multimer thereof in the first light emitting layer.

14. The organic electroluminescent element according to claim 1, further comprising an electron transport layer and/or an electron injection layer disposed between the negative electrode layer and the light emitting layer, wherein at least one of the electron transport layer and the electron injection layer comprises at least one selected from the group consisting of a borane derivative, a pyridine derivative, a fluoranthene derivative, a BO-based derivative, an anthracene derivative, a benzofluorene derivative, a phosphine oxide derivative, a pyrimidine derivative, a carbazole derivative, a triazine derivative, a benzimidazole derivative, a phenanthroline derivative, and a quinolinol-based metal complex, wherein the BO-based derivative is a polycyclic aromatic compound represented by the following formula (ETM-4) or a multimer of the polycyclic aromatic compound having a plurality of structures each represented by the following formula (ETM-4),

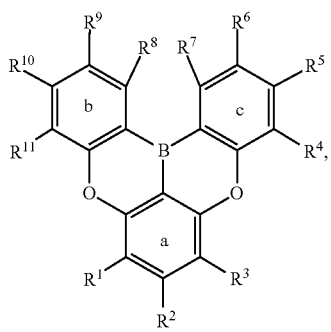

(ETM-4)

wherein $R^1$, $R^2$, $R^3$, $R^4$, $R^5$, $R^6$, $R^7$, $R^8$, $R^9$, $R^{10}$ and $R^{11}$ each independently represent a hydrogen atom, an aryl, a heteroaryl, a diarylamino, a diheteroarylamino, an arylheteroarylamino, a diarylboryl (the two aryls may be bonded to each other via a single bond or a linking group), an alkyl, a cycloalkyl, an alkoxy, or an aryloxy, and at least one hydrogen atom in these may be substituted by an aryl, a heteroaryl, an alkyl, or a cycloalkyl, and wherein adjacent groups among $R^1$, $R^2$, $R^3$, $R^4$, $R^5$, $R^6$, $R^7$, $R^8$, $R^9$, $R^{10}$ and $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, a diarylboryl (the two aryls may be bonded to each other via a single bond or a linking group), an alkyl, a cycloalkyl, an alkoxy, or an aryloxy, and at least one hydrogen atom in these may be substituted by an aryl, a heteroaryl, an alkyl, or a cycloalkyl, and at least one hydrogen atom in the compound or structure represented by formula (ETM-4) may be substituted by a halogen atom or a deuterium atom.

15. The organic electroluminescent element according to claim 14, wherein the electron transport layer and/or the electron injection layer further comprises at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

16. A display apparatus or a lighting apparatus comprising the organic electroluminescent element according to claim 1.

17. The organic electroluminescent element according to claim 1, wherein a gradient of the decrease in concentration in the light emitting layer is a concentration on the positive electrode layer side of 400 times or less of a concentration on the negative electrode layer side.

* * * * *